United States Patent
Nagata et al.

(10) Patent No.: US 7,106,225 B2
(45) Date of Patent: Sep. 12, 2006

(54) CODING APPARATUS AND IMAGING APPARATUS

(75) Inventors: Taichi Nagata, Takatsuki (JP); Shinji Kitamura, Nagaokakyo (JP); Yasuharu Tanaka, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/204,378

(22) Filed: Aug. 16, 2005

(65) Prior Publication Data
US 2006/0055571 A1 Mar. 16, 2006

(30) Foreign Application Priority Data
Aug. 27, 2004 (JP) .............................. 2004-249300

(51) Int. Cl.
*H03M 7/40* (2006.01)
(52) U.S. Cl. ......................................... 341/67; 382/246
(58) Field of Classification Search .................. 341/67, 341/50, 65; 382/246, 238
See application file for complete search history.

(56) References Cited

U.S. PATENT DOCUMENTS 5,995,171 A * 11/1999 Enari et al. ............ 375/240.27
6,571,019 B1 * 5/2003 Kim et al. .................. 382/246

* cited by examiner

*Primary Examiner*—Peguy JeanPierre
(74) *Attorney, Agent, or Firm*—McDermott Will & Emery LLP

(57) ABSTRACT

The present invention aims to provide a variable-length coding apparatus that achieves a short processing cycle without causing an increase in circuit scale.

Such a variable-length coding apparatus judges whether a VLC table has a variable-length code (VLC) corresponding to a combination (Last, Run, Level), by using an LMAX and an RMAX for the combination (Last, Run, Level). Based on the result of the judgment, the variable-length coding apparatus generates and outputs a code assigned to the combination (Last, Run, Level).

58 Claims, 39 Drawing Sheets

FIG. 4A  VLC TABLE 251

| LAST | RUN | LEVEL ABSOLUTE VALUE | VLC |
|---|---|---|---|
| 0 | 0 | 1 | 10s |
| 0 | 0 | 3 | 1111s |
| 0 | 0 | 6 | 010101s |
| 0 | 0 | 9 | 0010111s |
| 0 | 0 | 10 | 00011111s |
| 0 | 0 | 13 | 000100101s |
| 0 | 0 | 14 | 000100100s |
| 0 | 0 | 17 | 0000100001s |
| ⋮ | ⋮ | ⋮ | ⋮ |

252, 253, 254

FIG. 4B  LMAX TABLE 261

| LAST | RUN | LMAX |
|---|---|---|
| 0 | 0 | 27 |
| 0 | 1 | 10 |
| 0 | 2 | 5 |
| 0 | 3 | 4 |
| 0 | 4–7 | 3 |
| 0 | 8–9 | 2 |
| 0 | 10–14 | 1 |
| 0 | OTHERS | — |
| 1 | 0 | 8 |
| 1 | 1 | 3 |
| 1 | 2–6 | 2 |
| 1 | 7–20 | 1 |
| 1 | OTHERS | — |

262, 263, 264, 265

FIG. 4C  RMAX TABLE 266

| LAST | LEVEL ABSOLUTE VALUE | RMAX |
|---|---|---|
| 0 | 1 | 14 |
| 0 | 2 | 9 |
| 0 | 3 | 7 |
| 0 | 4 | 3 |
| 0 | 5 | 2 |
| 0 | 6–10 | 1 |
| 0 | 11–27 | 0 |
| 0 | OTHERS | — |
| 1 | 1 | 20 |
| 1 | 2 | 6 |
| 1 | 3 | 1 |
| 1 | 4–8 | 0 |
| 1 | OTHERS | — |

267, 268, 269, 270

FIG. 5A VLC TABLE 351a

| LAST | RUN | LEVEL ABSOLUTE VALUE | VLC | |
|---|---|---|---|---|
| 0 | 0 | 1 | 10s | ~352 |
| 0 | 0 | 2 | 110s | ~353 |
| 0 | 0 | 3 | 1111s | ~354 |
| ⋮ | ⋮ | ⋮ | ⋮ | ⋮ |
| 0 | 0 | 27 | 000001010010s | ~356 |
| 0 | 1 | 1 | 1110s | ~357 |
| 0 | 1 | 2 | 010100s | ~358 |
| ⋮ | ⋮ | ⋮ | ⋮ | ⋮ |
| 0 | 1 | 10 | 000001010101s | ~359 |
| 0 | 2 | 1 | 01011s | ~361 |
| 0 | 2 | 2 | 0010101s | ~362 |
| ⋮ | ⋮ | ⋮ | ⋮ | ⋮ |
| 0 | 2 | 5 | 000001010110s | |
| 0 | 3 | 1 | 010001s | |
| ⋮ | ⋮ | ⋮ | ⋮ | |

FIG. 5B VLC TABLE 351b

| LAST | RUN | LEVEL ABSOLUTE VALUE | VLC | |
|---|---|---|---|---|
| 0 | 0 | 1 | 10s | ~371 |
| 0 | 1 | 1 | 1110s | ~372 |
| 0 | 2 | 1 | 01011s | ~373 |
| ⋮ | ⋮ | ⋮ | ⋮ | ⋮ |
| 0 | 14 | 1 | 000001011000s | ~374 |
| 0 | 0 | 2 | 110s | ~376 |
| 0 | 1 | 2 | 010100s | ~377 |
| ⋮ | ⋮ | ⋮ | ⋮ | ⋮ |
| 0 | 9 | 2 | 000000100011s | ~378 |
| 0 | 0 | 3 | 1111s | ~379 |
| 0 | 1 | 3 | 0010110s | ~381 |
| ⋮ | ⋮ | ⋮ | ⋮ | ⋮ |
| 0 | 7 | 3 | 000001010111s | |
| 0 | 0 | 4 | 01101s | |
| ⋮ | ⋮ | ⋮ | ⋮ | |

FIG. 14

| FIRST MODE SIGNAL | 00 | 00 | 00 | 01 | 10 | 10 | 10 |
|---|---|---|---|---|---|---|---|
| SECOND MODE SIGNAL | 00 | (01) | (10) | 00 | (00) | 01 | 10 |
| SELECTING INSTRUCTION | N | | | L | | R | F |

N···NORMAL VLC GENERATING CIRCUIT
L···LMAX VLC GENERATING CIRCUIT
R···RMAX VLC GENERATING CIRCUIT
F···FLC GENERATING CIRCUIT

FIG. 18

| FIRST MODE SIGNAL | 00 | 00 | 00 | 01 | 01 | 10 | 10 | 10 |
|---|---|---|---|---|---|---|---|---|
| SECOND MODE SIGNAL | 00 | (01) | (10) | (00) | 01 | 10 | (00) | 01 | 10 |
| SELECTING INSTRUCTION (REGISTER) | 1 | | | | 1 | 1 | | 2 | – |
| SELECTING INSTRUCTION (SELECTING CIRCUIT) | N | | | | L | L | | R | F |

1···FIRST VLC
2···SECOND VLC
N···NORMAL VLC GENERATING CIRCUIT
L···LMAX VLC GENERATING CIRCUIT
R···RMAX VLC GENERATING CIRCUIT
F···FLC GENERATING CIRCUIT

FIG. 22

| FIRST MODE SIGNAL | 00 | 00 | 00 | 01 | 10 | 10 | 10 |
|---|---|---|---|---|---|---|---|
| SECOND MODE SIGNAL | 00 | (01) | (10) | 00 | (00) | 01 | 10 |
| SELECTING INSTRUCTION | N | | | R | | L | F |

N···NORMAL VLC GENERATING CIRCUIT
L···LMAX VLC GENERATING CIRCUIT
R···RMAX VLC GENERATING CIRCUIT
F···FLC GENERATING CIRCUIT

FIG. 26

| FIRST MODE SIGNAL | 00 | 00 | 00 | 01 | 01 | 10 | 10 | 10 |
|---|---|---|---|---|---|---|---|---|
| SECOND MODE SIGNAL | 00 | (01) | (10) | (00) | 01 | 10 | (00) | 01 | 10 |
| SELECTING INSTRUCTION (FIRST SELECTING CIRCUIT) | LMAX | | | | LMAX | LMAX | | RMAX | — |
| SELECTING INSTRUCTION (SECOND SELECTING CIRCUIT) | N | | | | L | L | | R | F |

LMAX···LMAX JUDGING CIRCUIT
RMAX···RMAX JUDGING CIRCUIT
N···NORMAL VLC GENERATING CIRCUIT
L···LMAX VLC GENERATING CIRCUIT
R···RMAX VLC GENERATING CIRCUIT
F···FLC GENERATING CIRCUIT

FIG. 32

| FIRST MODE SIGNAL | 00 | 00 | 00 | 01 | 01 | 01 | 10 | 10 | 10 |
|---|---|---|---|---|---|---|---|---|---|
| SECOND MODE SIGNAL | 00 | (01) | 10 | (00) | 01 | 10 | 00 | 01 | 10 |
| SELECTING INSTRUCTION (FIRST SELECTING CIRCUIT) | LMAX | / | LMAX | / | LMAX | LMAX | RMAX | RMAX | LMAX |
| SELECTING INSTRUCTION (SECOND SELECTING CIRCUIT) | N | / | N | / | L | L | N | R | — |

LMAX···LMAX JUDGING UNIT
RMAX···RMAX JUDGING UNIT
N···NORMAL VLC GENERATING CIRCUIT
L···LMAX VLC GENERATING CIRCUIT
R···RMAX VLC GENERATING CIRCUIT

FIG. 34

| FIRST MODE SIGNAL | SECOND MODE SIGNAL | SELECTING INSTRUCTION (FIRST SELECTING CIRCUIT) | SELECTING INSTRUCTION (SECOND SELECTING CIRCUIT) |
|---|---|---|---|
| 00 | 00 | LMAX | N |
| 00 | (01) | / | / |
| 00 | (10) | / | / |
| 00 | 11 | LMAX | N |
| 01 | (00) | / | / |
| 01 | 01 | LMAX | L |
| 01 | 10 | LMAX | L |
| 01 | 11 | LMAX | L |
| 10 | (00) | / | / |
| 10 | 01 | RMAX | R |
| 10 | 10 | — | F |
| 10 | 11 | LMAX | — |
| 11 | 00 | RMAX | N |
| 11 | 01 | RMAX | R |
| 11 | 10 | LMAX | — |
| 11 | 11 | LMAX | — |

LMAX ··· LMAX JUDGING UNIT
RMAX ··· RMAX JUDGING UNIT
N ··· NORMAL VLC GENERATING CIRCUIT
L ··· LMAX VLC GENERATING CIRCUIT
R ··· RMAX VLC GENERATING CIRCUIT

US 7,106,225 B2

CODING APPARATUS AND IMAGING APPARATUS

This application is based on an application No. 2004-249300 filed in Japan, the content of which is hereby incorporated by reference.

BACKGROUND OF THE INVENTION (1) Field of the Invention

The present invention relates to a variable-length coding technique.

(2) Related Art

As digital still and video cameras have become widely used and communication technologies have advanced, image data compressing techniques are increasingly utilized. A representative example of such compressing techniques is the ISO-standardized Moving Picture Experts Group (MPEG) format.

The MPEG technique realizes image data compression in the following manner. A frame is divided into a plurality of blocks each consisting of a plurality of pixels, based on intraframe correlation. After this, the data in each block is subjected to a discrete cosine transform (DCT) operation, which is one of orthogonal transformations, quantized, and then variable-length coded.

The variable-length coding process is described in detail in the following. Based on the DCT coefficients obtained as a result of the DCT operation, a Level value, a Last value, and a Run value are generated. The Level value indicates a value of a nonzero DCT coefficient, the Last value indicates whether the nonzero DCT coefficient is the last in the block, and the Run value indicates the number of continuous zero DCT coefficients prior to the nonzero DCT coefficient. Then, a code is uniquely assigned to a combination of the generated Last value, Run value, and Level value. In the present specification, the combination of the Last value, Run value, and Level value is denoted as a combination (Last, Run, Level), and an absolute value of the Level value is referred to as a Level absolute value.

Here, the MPEG-4 format stipulates a variable-length code (VLC) table which defines a unique code for each combination (Last, Run, Level absolute value). In the following, each unique code defined on the VLC table is referred to as a VLC. A code to be assigned to a combination (Last, Run, Level) is generated by a VLC corresponding to a combination (Last, Run, Level absolute value) and a value indicating the sign of the Level value.

If there is no VLC corresponding to the combination (Last, Run, Level absolute value) on the VLC table, one of the following three escape modes is used to generate a code to be assigned to the combination (Last, Run, Level).

According to a first escape mode, an LMAX is retrieved from the VLC table, for the combination (Last, Run, Level absolute value). The LMAX is a maximum Level absolute value corresponding to the pair of the Last value and Run value. Subsequently, the retrieved LMAX is subtracted from the Level absolute value, so that New level (=the Level absolute value–the LMAX) is calculated. Following this, the VLC table is searched again for a VLC corresponding to a combination (Last, Run, New Level). If there is a corresponding VLC on the VLC table, based on the corresponding VLC, a code to be assigned to the combination (Last, Run, Level) is generated.

According to a second escape mode, an RMAX is retrieved for the combination (Last, Run, Level absolute value) from the VLC table. The RMAX is a maximum Run value corresponding to the pair of the Last value and Level absolute value. Subsequently, a value obtained by adding 1 to the retrieved RMAX is subtracted from the Run value, so that New Run (=the Run value–(the RMAX+1)) is calculated. Following this, the VLC table is searched to detect a VLC corresponding to a combination (Last, New Run, Level absolute value). If there is a corresponding VLC on the VLC table, a code is generated based on the corresponding VLC, and assigned to the combination (Last, Run, Level).

According to a third escape mode, a code having a fixed length is generated based on the combination (Last, Run, Level), and assigned to the combination (Last, Run, Level).

Conventionally, the VLC table is searched first for retrieving the VLC corresponding to the combination (Last, Run, Level absolute value). If detected, the retrieved VLC and the value indicating the sign of the Level value are used to generate a code assigned to the combination (Last, Run, Level).

If there is no VLC corresponding to the combination (Last, Run, Level absolute value) on the VLC table, a code generating operation is conducted according to the above-described first escape mode. If there is no VLC corresponding to the combination (Last, Run, New Level) on the VLC table, a code generating operation is conducted according to the second escape mode. If there is no VLC corresponding to the combination (Last, New Run, Level absolute value) on the VLC table, a code generating operation is conducted according to the third escape mode.

In the case of performing the variable-length coding process defined by MPEG-4 in this way, the VLC table needs to be searched many times until the fixed-length code is obtained as a last resort. This creates a problem of slow processing rate for data which requires the third escape mode frequently.

To solve this problem, a patent document 1 (Japanese patent application publication No. 2001-586928) discloses a variable-length coding method that uses three VLC tables for conducting the above-described four types of code generating operations, in parallel, based on a VLC corresponding to a combination (Last, Run, Level absolute value) and according to the first to third escape modes. As a result, four codes are generated. According to preset priorities among the generated four codes, an appropriate code is selected and output. By doing so, a time required for variable-length coding can be shortened.

SUMMARY OF THE INVENTION

While shortening a processing cycle, however, the variable-length coding method disclosed in the patent document 1 has a problem that a large-scale circuit is required because of the necessity for three VLC retrieving mechanisms that can operate in parallel. In light of these problems, the present invention aims to provide a coding apparatus and an imaging apparatus that can achieve a short processing cycle without increasing a circuit scale.

The aim is realized by a coding apparatus that outputs a code corresponding to input data, comprising: a storing unit storing a boundary value corresponding to a group, the group being made up of a plurality of input data candidates that have a same property, the group being divided into (i) a code presence sub-group made up of one or more input data candidates which have a corresponding variable-length code on a code table, and (ii) a code absence sub-group made up of one or more input data candidates which do not have a corresponding variable-length code on the code table, the boundary value indicating a boundary between the code presence sub-group and the code absence sub-group; an obtaining unit operable to obtain input data; a first judging unit operable to judge whether the obtained input data belongs to the group; a reading unit operable to, if the first judging unit judges affirmatively, read the boundary value from the storing unit; a second judging unit operable to judge whether the obtained input data is included in the code presence sub-group, using the read boundary value; and a generating unit operable to, if the second judging unit judges negatively, generate and output a substitute code in substitution for a variable-length code corresponding to the obtained input data.

According to this construction, the second judging unit uses the boundary value prestored on the storing unit to judge whether the obtained input data is included in the code-presence sub-group, and if the second judging unit judges negatively, the generating unit generates the substitute code. Suppose the obtained input data does not have a corresponding code on the code table. With the above construction, the generating unit does not need to make an unnecessary attempt of reading a variable-length code corresponding to the obtained input data, before generating the substitute code. As a result, the processing cycle required by the coding apparatus to generate the code can be shortened.

Here, the obtained input data and the plurality of input data candidates each include at least a first coefficient and a second coefficient, the plurality of input data candidates making up the group have first coefficients of a same absolute value, the boundary value is a maximum among absolute values of second coefficients of the input data candidates making up the code presence sub-group, and the second judging unit compares an absolute value of a second coefficient of the obtained input data with the boundary value to judge whether the obtained input data is included in the code presence sub-group.

According to this construction, the boundary value stored on the storing unit is a maximum among the absolute values of the second coefficients of the input data candidates making up the code presence sub-group. Accordingly, simply by comparing the absolute value of the second coefficient of the obtained input data with the maximum stored on the storing unit, the second judging unit can judge whether the obtained input data is included in the code-presence sub-group, within a short time period.

Here, when the second judging unit judges that the obtained input data is not included in the code presence sub-group, the generating unit (i) performs a first subtraction on the obtained input data using the boundary value to generate first subtraction data, and uses the boundary value to judge whether the first subtraction data is included in the code presence sub-group, and (ii) if judging affirmatively, extracts a variable-length code corresponding to the first subtraction data from the code table, and generates the substitute code including the extracted variable-length code, a first subtraction defining code indicating the first subtraction has been performed, and a sign code indicating whether one of first and second coefficients of the obtained input data is positive or negative.

According to this construction, when the second judging unit judges that the obtained input data does not have a corresponding variable-length code on the code table, the generating unit judges whether the first subtraction data is included in the code-presence sub-group to generate the substitute code. As mentioned above, the input data candidates making up the code presence sub-group have a corresponding variable-length code on the code table. Suppose the first subtraction data does not have a corresponding variable-length code on the code table. With the above construction, the generating unit does not make an unnecessary attempt of reading a code corresponding to the first subtraction data from the code table. As a result, the processing cycle required by the coding apparatus to output the code can be further shortened.

Here, the generating unit performs the first subtraction on the absolute value of the second coefficient of the obtained input data to calculate a subtracted second coefficient, the generated first subtraction data includes the first coefficient of the obtained input data and the subtracted second coefficient, and the generating unit compares the calculated subtracted second coefficient with the boundary value, and if the subtracted second coefficient is equal to or smaller than the boundary value, judges that the first subtraction data is included in the code presence sub-group.

According to this construction, the generating unit can easily judge whether the first subtraction data has a corresponding variable-length code on the code table, by examining which one of the subtracted second coefficient and the boundary value is larger.

Here, the generating unit performs the first subtraction on the absolute value of the second coefficient of the obtained input data to calculate a subtracted second coefficient, the generated first subtraction data includes the first coefficient of the obtained input data and the subtracted second coefficient, and the generating unit generates an intermediate value by doubling the boundary value, and subtracting the doubled boundary value from the absolute value of the second coefficient of the obtained input data, and if the generated intermediate value is zero or smaller, judges that the first subtraction data is included in the code presence sub-group.

According to this construction, the generating unit uses the intermediate value to judge whether the first subtraction data is included in the code presence sub-group. In this way, the generating unit can perform, in parallel, the generation of the first subtraction data, and the judgment by using the intermediate value. In other words, a mechanism to make the judgment by using the intermediate value and a mechanism to generate the first subtraction data can be arranged in parallel. As a consequence, the coding apparatus can achieve a shortened path between the input of the obtained input data, and the output of the code corresponding to the obtained input data.

Here, the generating unit doubles the boundary value by shifting the boundary value by one bit.

According to this construction, the generating unit can easily generate the intermediate value.

Also, the storing unit further stores thereon an alternate boundary value for an alternate group made up of a plurality of input data candidates having second coefficients of a same absolute value, the alternate group is divided into (i) an alternate code presence sub-group made up of one or more input data candidates which have a corresponding variable-length code on the code table, and (ii) an alternate code absence sub-group made up of one or more input data candidates which do not have a corresponding variable-length code on the code table, and the alternate boundary value indicates a boundary between the alternate code presence sub-group and the alternate code absence sub-group, when the second judging unit judges that the obtained input data is not included in the code presence sub-group, and the generating unit judges that the first subtraction data is not included in the code presence sub-group, the generating unit (i) uses the second coefficient of the obtained input data to judge whether the obtained input data belongs to the alternate group, (ii) if judging affirmatively, reads the alternate boundary value from the storing unit, performs a second subtraction on the obtained input data using the read alternate boundary value to generate second subtraction data, and uses the alternate boundary value to judge whether the generated second subtraction data is included in the alternate code presence sub-group, and (iii) if judging affirmatively, extracts a variable-length code corresponding to the second subtraction data from the code table, and generates the substitute code including the extracted variable-length code, and a second subtraction defining code indicating the second subtraction has been performed, and the sign code indicating whether one of the first and second coefficients of the obtained input data is positive or negative.

According to this construction, the input data candidates making up the alternate code presence sub-group have a corresponding variable-length code on the code table, and the storing unit prestores thereon the alternate boundary value. To generate the substitute code, the generating unit judges whether the second subtraction data is included in the alternate code presence sub-group. Here, suppose the second subtraction data does not have a corresponding variable-length code on the code table. With the above construction, the generating unit does not make an unnecessary attempt of reading the variable-length code corresponding to the second subtraction data. As a result, the processing cycle required by the coding apparatus to output the code can be further shortened.

Here, in a case where the second judging unit judges that the obtained input data is not included in the code presence sub-group, and the generating unit judges that the first subtraction data is not included in the code presence sub-group, and that the second subtraction data is not included in the alternate code presence sub-group, the generating unit generates the substitute code including the obtained input data and an input data defining code indicating the obtained input data is included.

According to this construction, when judging that the second subtraction data does not have a corresponding variable-length code on the code table, the generating unit generates the substitute code including the obtained input data and the input data defining code indicating the obtained input data is included. In this way, to output the code corresponding to the obtained input data, the coding apparatus searches the code table only once, irrespective of whether or not any or none of the obtained input data, the first subtraction data, and the second subtraction data have a corresponding variable-length code on the code table. This means that the coding apparatus is required to have only one code table.

Here, a block image constituted by a predetermined number of pixels is subjected to orthogonal transformation, so that a block formed by the predetermined number of coefficients arranged in a matrix is generated, and the obtained input data and the plurality of input data candidates each include (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block.

According to this construction, the coding apparatus processes data including a Run value, a Last value, and a Level value. Therefore, the present invention has a wide use in electronic appliances that compress image data.

Here, the obtained input data and the plurality of input data candidates each include a Run value as the first coefficient, and a Level value as the second coefficient, the plurality of input data candidates making up the group have a same pair of a Last value and a Run value, the boundary value is an LMAX which is a maximum among absolute values of Level values of the input data candidates making up the code presence sub-group, and the second judging unit compares an absolute value of a Level value of the obtained input data with the LMAX, and if the absolute value of the Level value of the obtained input data is larger than the LMAX, judges that the obtained input data is not included in the code presence sub-group.

According to this construction, the LMAX is a maximum among the absolute values of the Level values of the input data candidates making up the code presence sub-group. The second judging unit can easily judge whether the obtained input data has a corresponding variable-length code on the code table, by comparing the absolute value of the Level value of the obtained input data with the LMAX.

Also, when the second judging unit judges that the obtained input data is not included in the code presence sub-group, the generating unit (i) subtracts the LMAX from the absolute value of the Level value of the obtained input data, to calculate New Level, and generates first subtraction data including a Last value and a Run value of the obtained input data and the calculated New Level, (ii) compares the New Level with the LMAX, to judge whether the first subtraction data is included in the code presence sub-group, and (iii) if judging affirmatively, extracts a variable-length code corresponding to the first subtraction data from the code table, and generates the substitute code including the extracted variable-length code, a first subtraction defining code indicating the subtraction has been performed, and a sign code indicating whether the Level value of the obtained input data is positive or negative.

According to this construction, when judging that the first subtraction data is included in the code-presence sub-group, the generating unit reads the variable-length code corresponding to the first subtraction data from the code table. Suppose the first subtraction data does not have a corresponding variable-length code on the code table. With the above-described construction, the coding apparatus does not have to make an unnecessary attempt of reading the variable-length code corresponding to the first subtraction data.

Furthermore, when judging that the first subtraction data including the New Level has a corresponding variable-length code on the code table, the coding apparatus can conclude that the code corresponding to the obtained input data, i.e. the combination of the Last value, Run value, and Level value, can be generated according to the first escape mode.

Here, when the second judging unit judges that the obtained input data is not included in the code presence sub-group, the generating unit (i) subtracts the LMAX from the absolute value of the Level value of the obtained input data, to calculate New Level, and generates first subtraction data including a Last value and a Run value of the obtained input data and the calculated New Level, (ii) doubles the LMAX, and compares the absolute value of the Level value of the obtained input data with the doubled LMAX to judge whether the first subtraction data is included in the code presence sub-group, and (iii) if judging affirmatively, extracts a variable-length code corresponding to the first subtraction data from the code table, and generates the substitute code including the extracted variable-length code, a first subtraction defining code indicating the subtraction has been performed, and a sign code indicating whether the Level value of the obtained input data is positive or negative.

According to this construction, the generating unit judges whether the first subtraction data has a corresponding variable-length code on the code table, by comparing the absolute value of the Level value with the doubled LMAX. Thus, the generating unit can perform the judgment in parallel with the generation of the first subtraction data. In other words, a mechanism to make the judgment and a mechanism to generate the first subtraction data can be arranged in parallel. As a result, the coding apparatus can achieve a short path between the input of the obtained input data and the generation of the code corresponding to the obtained input data.

Here, the obtained input data and the plurality of input data candidates each include a Level value as the first coefficient, and a Run value as the second coefficient, the plurality of input data candidates making up the group have a same pair of a Last value and an absolute value of a Level value, the boundary value is an RMAX which is a maximum among Run values of the input data candidates making up the code presence sub-group, and the second judging unit compares a Run value of the obtained input data with the RMAX, and if the Run value of the obtained input data is larger than the RMAX, judges that the obtained input data is not included in the code presence sub-group.

According to this construction, the RMAX is a maximum among the Run values of the input data candidates making up the code presence sub-group. The second judging unit can easily judge whether the obtained input data has a corresponding variable-length code on the code table, by comparing the Run value of the obtained input data with the RMAX.

Here, when the second judging unit judges that the obtained input data is not included in the code presence sub-group, the generating unit (i) subtracts a value obtained by adding 1 to the RMAX, from the Run value of the obtained input data, to calculate New Run, and generates second subtraction data including a Last value and an absolute value of a Level value of the obtained input data, and the calculated New Run, (ii) compares the New Run with the RMAX to judge whether the second subtraction data is included in the code presence sub-group, and (iii) if judging affirmatively, extracts a variable-length code corresponding to the second subtraction data from the code table, and generates the substitute code including the extracted variable-length code, a second subtraction defining code indicating the subtraction has been performed, and a sign code indicating whether the Level value of the obtained input data is positive or negative.

According to this construction, when judging that the second subtraction data is included in the code-presence sub-group, the generating unit reads the variable-length code corresponding to the second subtraction data from the code table. Suppose the second subtraction data does not have a corresponding variable-length code on the code table. With the above-described construction, the coding apparatus does not need to make an unnecessary attempt of reading the variable-length code corresponding to the second subtraction data. Furthermore, when judging that the second subtraction data has a corresponding variable-length code on the code table, the coding apparatus can conclude that the code corresponding to the obtained input data, i.e. the combination of the Last value, Run value, and Level value, can be generated according to the second escape mode.

According to the above-described construction, the coding apparatus uses the RMAX, as the boundary value, in order to make the judgment and generate the second subtraction data. In this way, in a case where a code generated according to the first escape mode and a code generated according to the second escape mode are both possible to be assigned to the obtained input data, the coding apparatus preferentially outputs the code generated according to the second escape mode.

Here, when the second judging unit judges that the obtained input data is not included in the code presence sub-group, the generating unit (i) subtracts a value obtained by adding 1 to the RMAX, from the Run value of the obtained input data, to calculate New Run, and generates second subtraction data including a Last value and an absolute value of a Level value of the obtained input data, and the calculated New Run, (ii) doubles the RMAX, and compares the Run value with a value obtained by adding 1 to the doubled RMAX, to judge whether the second subtraction data is included in the code presence sub-group, and (iii) if judging affirmatively, extracts a variable-length code corresponding to the second subtraction data from the code table, and generates the substitute code including the extracted variable-length code, a second subtraction defining code indicating the subtraction has been performed, and a sign code indicating whether the Level value of the obtained input data is positive or negative.

According to this construction, the generating unit judges whether the second subtraction data has a corresponding variable-length code on the code table, by comparing the Run value with the value obtained by adding 1 to the doubled RMAX. Thus, the generating unit can make the judgment in parallel with the generation of the second subtraction data. In other words, a mechanism to make the judgment and a mechanism to generate the second subtraction data can be arranged in parallel. As a result, the coding apparatus can achieve a short path between the input of the obtained input data and the generation of the code corresponding to the obtained input data.

Here, the second judging unit stores thereon a predetermined threshold value, and when judging that a Run value of the obtained input data is equal to or smaller than the predetermined threshold value, the second judging unit makes the judgment.

The coding apparatus is thought to be used in imaging apparatuses such as digital cameras, as an example. Such imaging apparatuses generate image data, and subject the image data to quantization, motion compensation, and orthogonal transformation, to generate coefficients at regular time intervals. Here, the number of continuous zero coefficients is counted, to obtain a Run value for input data. Therefore, it seems that the time required to generate the input data is dependent on the value of the Run value in the input data.

According to the above-described construction, when the Run value of the obtained input data is larger than the threshold value, the second judging unit does not make the judgment. In this case, under an assumption that the coding apparatus has only one code table, the coding apparatus operates in the same manner as conventional coding apparatuses. In detail, the coding apparatus first searches the code table for the variable-length code corresponding to the combination (Last, Run, Level). If there is no corresponding variable-length code, the coding apparatus attempts to generate the substitute code according to the first to third escape modes sequentially. Accordingly, a longer time period is generally required to generate the code corresponding to the obtained input data, when the judging unit does not make the judgment than when the judging unit makes the judgment.

Considering this, by appropriately setting the threshold value, the coding apparatus can attain a good balance between a time period required to generate pieces of input data and a time period required to generate corresponding codes.

Here, the coding apparatus further comprises a receiving unit operable to receive an input of the predetermined threshold value, and the second judging unit stores thereon the predetermined threshold value which is received by the receiving unit.

According to this construction, the coding apparatus can receive an input of the threshold value via the receiving unit. Thus, the operator of the coding apparatus can freely change the threshold value so as to attain the best balance between the time required to generate pieces of input data, and the time required to generate corresponding codes.

Here, the obtained input data and the plurality of input data candidates each include at least a first coefficient and a second coefficient, the second judging unit stores thereon a predetermined fixed-length code threshold value, and when an absolute value of a first coefficient of the obtained input data exceeds the fixed-length code threshold value, the second judging unit does not make the judgment, and the generating unit generates the substitute code including the obtained input data and an input data defining code indicating the obtained input data is included.

Here, a block image constituted by a predetermined number of pixels is subjected to orthogonal transformation, so that a block formed by the predetermined number of coefficients arranged in a matrix is generated, and the obtained input data and the plurality of input data candidates each include (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block.

Here, the obtained input data and the plurality of input data candidates each include a Level value as the first coefficient, and when an absolute value of a Level value of the obtained input data exceeds the fixed-length code threshold value, the second judging unit does not make the judgment.

Here, the obtained input data and the plurality of input data candidates each include a Run value as the first coefficient, and when a Run value of the obtained input data exceeds the fixed-length code threshold value, the second judging unit does not make the judgment.

According to these constructions, when the absolute value of the first coefficient of the obtained input data exceeds the fixed-length code threshold value, the second judging unit does not make the judgment, and the generating unit generates the substitute code including the obtained input data and the input data defining code. When the absolute value of the first coefficient of the obtained input data exceeds the largest value among absolute values of the first coefficients of the input data candidates which have a corresponding variable-length code on the code table, the coding apparatus can not use the code table to generate the code.

Suppose the code table can not be used to generate the code corresponding to the obtained input data. With the above-described constructions, by appropriately setting the fixed-length code threshold value, the coding apparatus does not need to search the code table, does not need to make the judgment, and thus can generate the substitute code including the obtained input data and the input data defining code within a short time period.

Here, the above aim is also achieved by a coding apparatus that outputs a code corresponding to input data, comprising: an obtaining unit operable to obtain input data including at least a first coefficient and a second coefficient; a first storing unit storing a first boundary value corresponding to a first group, the first group being made up of a plurality of input data candidates which each have at least a first coefficient and a second coefficient and have first coefficients of a same absolute value, the first group being divided into (i) a first code presence sub-group made up of one or more input data candidates which have a corresponding variable-length code on a code table, and (ii) a first code absence sub-group made up of one or more input data candidates which do not have a corresponding variable-length code on the code table, the first boundary value indicating a boundary between the first code presence sub-group and the first code absence sub-group; a first judging unit operable to judge whether the obtained input data belongs to the first group, and if judging affirmatively, read the first boundary value from the first storing unit; a second judging unit operable to judge whether the obtained input data and first equivalent data equivalent to the obtained input data are included in the first code present sub-group, using the first boundary value; a second storing unit storing a second boundary value corresponding to a second group, the second group being made up of a plurality of input data candidates which each have at least a first coefficient and a second coefficient and have second coefficients of a same absolute value, the second group being divided into (a) a second code presence sub-group made up of one or more input data candidates which have a corresponding variable-length code on the code table, and (b) a second code absence sub-group made up of one or more input data candidates which do not have a corresponding variable-length code on the code table, the second boundary value indicating a boundary between the second code presence sub-group and the second code absence sub-group; a third judging unit operable to judge whether the obtained input data belongs to the second group, and if judging affirmatively, read the second boundary value from the second storing unit; a fourth judging unit operable to judge whether the obtained input data and second equivalent data equivalent to the obtained input data are included in the second code presence sub-group, using the second boundary value; a judgment control unit operable to select one of judgment results obtained by the second and fourth judging units; and a generating unit operable to (I), if the selected judgment result is affirmative, generate and output a code based on the selected judgment result, (II), if the selected judgment result is negative, refer to the unselected judgment result, (III), if the unselected judgment result is affirmative, generate and output a code based on the unselected judgment result, and (IV), if the unselected judgment result is negative, output the obtained input data and an input data defining code indicating the obtained input data is included.

Here, when judging that the obtained input data is not included in the first code presence sub-group, the second judging unit (i) performs a first subtraction on the obtained input data with a use of the first boundary value, to generate first subtraction data, as the first equivalent data, and (ii) uses the first boundary value to judge whether the generated first subtraction data is included in the first code presence sub-group, and when judging that the obtained input data is not included in the second code presence sub-group, the fourth judging unit (a) performs a second subtraction on the obtained input data with a use of the second boundary value, to generate second subtraction data, as the second equivalent data, and (b) uses the second boundary value to judge whether the generated second subtraction data is included in the second code presence sub-group.

Here, when the judgment result obtained by the second judging unit is affirmative, at least one of the obtained input data and the first equivalent data is included in the first code presence sub-group. When the judgment result obtained by the second judging unit is negative, neither the obtained input data nor the first equivalent data is included in the first code presence sub-group. When the judgment result obtained by the fourth judging unit is affirmative, at least one of the obtained input data and the second equivalent data is included in the second code presence sub-group. When the judgment result obtained by the fourth judging unit is negative, neither the obtained input data nor the second equivalent data is included in the second code presence sub-group.

According to these constructions, the generating unit refers to one or both of the judgment results obtained by the second and fourth judging units. When both of the judgment results are negative, the generating unit outputs the obtained input data and the input data defining code. As mentioned above, the input data candidates making up the first and second code presence sub-groups have a corresponding variable-length code on the code table. Suppose none of the obtained input data, the first equivalent data, and the second equivalent data has a corresponding variable-length code on the code table. With the above-described constructions, the coding-apparatus does not need to unnecessarily search the code table.

Here, the second judging unit makes the judgment before the fourth judging unit makes the judgment, and the judgment control unit selects the judgment result obtained by the second judging unit.

Here, when the second judging unit judges that the first subtraction data is included in the first code presence sub-group, the fourth judging unit does not judge whether the second subtraction data is included in the second code presence sub-group.

According to these constructions, when the second judging unit judges that the first subtraction data is included in the first code presence sub-group, the fourth judging unit does not make the judgment. Thus, when the first subtraction data is judged to be included in the first code presence sub-group, the fourth judging unit does not need to perform the unnecessary judgment process. Suppose this construction is realized by the second and fourth judging units connected to each other in series. The second judging unit outputs the judgment result and one of the obtained input data and first subtraction data, to the fourth judging unit, and the fourth judging unit makes the judgment based on one of the obtained input data and first subtraction data output from the second judging unit. When judging that the first subtraction data is included in the first code presence sub-group, the second judging unit outputs the judgment result and first subtraction data to the fourth judging unit. In this case, the fourth judging unit does not make the judgment, and the coding apparatus is thus prevented from mistakenly performing the second subtraction on the first subtraction data. As a result, the coding apparatus can generate a correct substitute code.

Here, the second judging unit and fourth judging unit make the respective judgments in parallel.

According to this construction, the judging operations by the second and fourth judging units can be completed within a shorter time period. Furthermore, when this construction is realized by arranging the second and fourth judging units in parallel, the coding apparatus can attain a shorter path between the input of the obtained input data and the output of the code corresponding to the obtained input data.

Here, the judgment control unit preferentially selects the judgment result obtained by the second judging unit.

According to this construction, the judgment control unit preferentially selects the judgment result obtained by the second judging unit. Suppose the judgment results obtained by the second and fourth judging units are both affirmative. With the above construction, the coding apparatus can preferentially generate a code based on the judgment result obtained by the second judging unit. In particular, suppose the second judging unit judges that the first subtraction data is included in the first code presence sub-group, and the fourth judging unit judges that the second subtraction data is included in the second code presence sub-group. With the above construction, the coding apparatus can preferentially generate and output a code corresponding to the first subtraction data.

Here, the coding apparatus further comprises a receiving unit operable to receive a priority instruction indicating which one of the judgment result obtained by the second judging unit and the judgment result obtained by the fourth judging unit is preferentially selected, wherein the judgment control unit preferentially selects one of the judgment result obtained by the second judging unit and the judgment result obtained by the fourth judging unit, in accordance with the priority instruction.

According to this construction, the coding apparatus is provided with the receiving unit. Thus, the operator of the coding apparatus can freely choose which one of the judgment results obtained by the second and fourth judging units should be preferentially selected.

Here, a block image constituted by a predetermined number of pixels is subjected to orthogonal transformation, so that a block formed by the predetermined number of coefficients arranged in a matrix is generated, and the obtained input data and the plurality of input data candidates each include (i) a Run value indicating a number of continuous zero coefficients among the predetermined number of coefficients, as the first coefficient, (ii) a Level value indicating a value of a nonzero coefficient following the continuous zero coefficients, as the second coefficient, and (iii) a Last value indicating whether the nonzero coefficient is a last coefficient in the block.

According to this construction, the coding apparatus outputs a code for input data including a Run value, a Last value, and a Level value. Therefore, the coding apparatus has a use in a variety of electronic appliances with an imaging function, such as digital still and video cameras, and mobile telephones with an imaging function.

Here, the plurality of input data candidates making up the first group have a same pair of a Last value and a Run value, the first boundary value is an LMAX which is a maximum among absolute values of Level values of the input data candidates making up the first code presence sub-group, if an absolute value of a Level value of the obtained input data is larger than the LMAX, the second judging unit judges that the obtained input data is not included in the first code presence sub-group, the plurality of input data candidates making up the second group have a same pair of a Last value and an absolute value of a Level value, the second boundary value is an RMAX which is a maximum among Run values of the input data candidates making up the second code presence sub-group, and if a Run value of the obtained input data is larger than the RMAX, the fourth judging unit judges that the obtained input data is not included in the second code presence sub-group.

According to this construction, the second judging unit can make the judgment simply by comparing the absolute value of the Level value with the LMAX, and the fourth judging unit can make the judgment simply by comparing the Run value with the RMAX.

Here, when judging that the obtained input data is not included in the first code presence sub-group, the second judging unit (i) performs a first subtraction on the absolute value of the Level value of the obtained input data by using the LMAX to calculate New Level, (ii) generates, as the first equivalent data, first subtraction data including the calculated New Level and the Run value and a Last value of the obtained input data, and (iii) compares the New Level with the LMAX to judge whether the generated first subtraction data is included in the first code presence sub-group, and when judging that the obtained input data is not included in the second code presence sub-group, the fourth judging unit (a) performs a second subtraction on the Run value of the obtained input data by using the RMAX to calculate New Run, (b) generates, as the second equivalent data, second subtraction data including the calculated New Run and the absolute value of the Level value and the Last value of the obtained input data, and (c) compares the New Run with the RMAX to judge whether the generated second subtraction data is included in the second code presence sub-group.

Here, the second judging unit makes the judgment before the fourth judging unit makes the judgment, and the judgment control unit selects the judgment result obtained by the second judging unit.

According to these constructions, the second judging unit makes the judgment before the fourth judging unit makes the judgment, and the judgment control unit selects the judgment result obtained by the second judging unit. Thus, the generating unit preferentially outputs the variable-length code corresponding to the first subtraction data, when compared with the variable-length code corresponding to the second subtraction data.

Here, the second judging unit and fourth judging unit make the respective judgments in parallel.

According to this construction, the second and fourth judging units can be arranged in parallel. As a result, the coding apparatus can attain a shorter path.

Here, the second judging unit stores thereon a predetermined first threshold value, and makes the judgment only when a Run value of the obtained input data is equal to or smaller than the first threshold value, and the fourth judging unit stores thereon a predetermined second threshold value, and makes the judgment only when the Run value of the obtained input data is equal to or smaller than the second threshold value.

The coding apparatus is thought to be used in imaging apparatuses such as digital cameras, as an example. Such imaging apparatuses generate image data, and subject the image data to quantization, motion compensation, and orthogonal transformation, to generate coefficients at regular time intervals. Here, the number of continuous zero coefficients is counted, to obtain a Run value for input data. Therefore, it seems that the time required to generate the input data is dependent on the value of the Run value included in the input data.

According to the above-described construction, only when the Run value of the obtained input data is equal to or smaller than the first threshold value, the second judging unit makes the judgment, and only when the Run value of the obtained input data is equal to or smaller than the second threshold value, the fourth judging unit makes the judgment. If the Run value is larger than both the first and second threshold values, the coding apparatus operates in the same manner as conventional coding apparatuses, under an assumption that the coding apparatus has only one code table. In detail, the coding apparatus first searches the code table for the variable-length code corresponding to the combination (Last, Run, Level). If the code table does not have the corresponding variable-length code, the coding apparatus attempts to generate the substitute code according to the first to third escape modes sequentially. Accordingly, a longer time period is generally required to generate the code corresponding to the obtained input data-when the second and fourth judging units do not make the judgments, than when the second and fourth judging units make the judgments. Accordingly, by appropriately setting the first and second threshold values, the coding apparatus can attain a good balance between the time period required to generate pieces of input data and the time period required to generate corresponding codes.

Here, the second judging unit outputs, as the judgment result, (i) a normal judgment signal, when judging that the obtained input data is included in the first code presence sub-group, (ii) an equivalent judgment signal, when judging that the obtained input data is not included in the first code presence sub-group, but the first equivalent data is included in the first code presence sub-group, and (iii) a no judgment signal, when not making the judgment or when judging that neither the obtained input data nor the first equivalent data is included in the first code presence sub-group, and the fourth judging unit outputs, as the judgment result, (a) a normal judgment signal, when judging that the obtained input data is included in the second code presence sub-group, (b) an equivalent judgment signal, when judging that the obtained input data is not included in the second code presence sub-group, but the second equivalent data is included in the second code presence sub-group, and (c) a no judgment signal, when not making the judgment or when judging that neither the obtained input data nor the second equivalent data is included in the second code presence sub-group.

According to this construction, the second and fourth judging units output, as the judgment result, one of the normal judgment signal, equivalent judgment signal, and no judgment signal. Therefore, the generating unit can easily know that the second and fourth judging units have not made the respective judgments, when detecting that the judgment result selected by the judgment control unit is a no judgment signal, and that the unselected judgment result is a no judgment signal.

Here, the second judging unit outputs, as the judgment result, (i) a no judgment signal, when the Run value of the obtained input data is larger than the first threshold value, (ii) a normal judgment signal, when judging that the obtained input data is included in the first code presence sub-group, (iii) an equivalent judgment signal, when judging that the obtained input data is not included in the first code presence sub-group, but the first equivalent data is included in the first code presence sub-group, and (iv) a different code signal, when judging that neither the obtained input data nor the first equivalent data is included in the first code presence sub-group, and the fourth judging unit outputs, as the judgment result, (a) a no judgment signal, when the Run value of the obtained input data is larger than the second threshold value, (b) a normal judgment signal, when judging that the obtained input data is included in the second code presence sub-group, (c) an equivalent judgment signal, when judging that the obtained input data is not included in the second code presence sub-group, but the second equivalent data is included in the second code presence sub-group, and (d) a different code signal, when judging that neither the obtained input data nor the second equivalent data is included in the second code presence sub-group.

According to this construction, the second and fourth judging units output, as the judgment result, one of the no judgment signal, normal judgment signal, equivalent judgment signal, and different code signal.

Thus, the generating unit can easily judge whether the second judging unit has made the judgment or not, whether the obtained input data has a corresponding variable-length code on the code table, and whether the first equivalent data has a corresponding variable-length code on the code table. Similarly, the generating unit can easily judge whether the fourth judging unit has made the judgment or not, whether the obtained input data has a corresponding variable-length code on the code table, and whether the second equivalent data has a corresponding variable-length code on the code table.

Here, the coding apparatus further comprises a receiving unit operable to receive an input of the first and second threshold values, wherein the second judging unit stores thereon the first threshold value received by the receiving unit, and the fourth judging unit stores thereon the second threshold value received by the receiving unit.

According to this construction, the operator of the coding apparatus can freely set the first and second threshold values.

Here, the second judging unit stores thereon a predetermined first fixed-length code threshold value, and when an absolute value of the first coefficient of the obtained input data exceeds the first fixed-length code threshold value, the second judging unit does not make the judgment, and the generating unit outputs the obtained input data and the input data defining code indicating the obtained input data is included, irrespective of the judgment result obtained by the fourth judging unit.

When the obtained input data has a value exceeding the largest value among the first coefficients of the input data candidates which have a corresponding variable-length code on the code table, the coding apparatus can not use the code table to generate the code corresponding to the obtained input data. Suppose the code table can not be used to generate the code corresponding to the obtained input data. With the above-described construction, by appropriately setting the first fixed-length code threshold value, the coding apparatus does not need to unnecessarily make the judgment, does not need to unnecessarily search the code table, and therefore can generate the code corresponding to the obtained input data within a short time period.

Here, the above aim is also achieved by a coding apparatus that outputs a code corresponding to input data including at least a first coefficient and a second coefficient, the coding apparatus comprising: a storing unit storing a first boundary value corresponding to a first group, and a second boundary value corresponding to a second group, the first group being made up of a plurality of input data candidates which each have at least a first coefficient and a second coefficient and have first coefficients of a same absolute value, the first group being divided into (i) a first code presence sub-group made up of one or more input data candidates which have a corresponding variable-length code on a code table, and (ii) a first code absence sub-group made up of one or more input data candidates which do not have a corresponding variable-length code on the code table, the first boundary value indicating a boundary between the first code presence sub-group and the first code absence sub-group, the second group being made up of a plurality of input data candidates which each have at least a first coefficient and a second coefficient and have second coefficients of a same absolute value, the second group being divided into (a) a second code presence sub-group made up of one or more input data candidates which have a corresponding variable-length code on the code table, and (b) a second code absence sub-group made up of one or more input data candidates which do not have a corresponding variable-length code on the code table, the second boundary value indicating a boundary between the second code presence sub-group and the second code absence sub-group; an obtaining unit operable to obtain input data; a first judging unit operable to (I) judge whether the obtained input data belongs to the first group, and if judging affirmatively, read the first boundary value from the storing unit, and (II) judge whether the obtained input data belongs to the second group, and if judging affirmatively, read the second boundary value from the storing unit; a selecting unit operable to select one of the first boundary value and the second boundary value, and output the selected boundary value; a second judging unit operable to judge whether or not one of the obtained input data and equivalent data equivalent to the obtained input data is included in one of the first code presence sub-group and second code presence sub-group corresponding to the selected boundary value, using the selected boundary value; a selection control unit operable to instruct the selecting unit to first select the first boundary value and then the second boundary value; a judgment control unit operable to select one of judgment results respectively made, by the second judging unit, with reference to the first boundary value and the second boundary value; and a generating unit operable to (A), when the selected judgment result is affirmative, generate and output a code based on the selected judgment result, (B) when the selected judgment result is negative, refer to the unselected judgment result, (C) when the unselected judgment result is affirmative, generate and output a code based on the unselected judgment result, and (D) when the unselected judgment result is negative, output the obtained input data and an input data defining code indicating the obtained input data is included.

Here, when the judgment result made with reference to the first boundary value is affirmative, at least one of the obtained input data and the equivalent data is included in the first code presence sub-group. When the judgment result made with reference to the first boundary value is negative, neither the obtained input data nor the equivalent data is included in the first code presence sub-group. When the judgment result made with reference to the second boundary value is affirmative, at least one of the obtained input data and the equivalent data is included in the second code presence sub-group. When the judgment result made with reference to the second boundary value is negative, neither the obtained input data nor the equivalent data is included in the second code presence sub-group.

According to this construction, the storing unit stores thereon the first and second boundary values. The selection control unit instructs the selecting unit to first select the first boundary value, and then the second boundary value. In accordance with the instruction issued by the selection control unit, the selecting unit first selects and outputs the first boundary value, and then selects and outputs the second boundary value. The second judging unit first makes the judgment with reference to the first boundary value, and then makes the judgment with reference to the second boundary value. Thus, the single second judging unit can make both of the judgment with reference to the first boundary value and the judgment with reference to the second boundary value. This enables the coding apparatus to achieve a reduced circuit scale.

Here, when the selecting unit selects the first boundary value, and the second judging unit judges that the obtained input data is not included in the first code presence sub-group, the second judging unit performs a first subtraction on the obtained input data with a use of the first boundary value to generate, as the equivalent data, first subtraction data, and uses the first boundary value to judge whether the generated first subtraction data is included in the first code presence sub-group, and when the selecting unit selects the second boundary value, and the second judging unit judges that the obtained input data is not included in the second code presence sub-group, the second judging unit performs a second subtraction on the obtained input data with a use of the second boundary value to generate, as the equivalent data, second subtraction data, and uses the second boundary value to judge whether the generated second subtraction data is included in the second code presence sub-group.

Here, the judgment control unit selects the judgment result made with reference to the first boundary value.

According to these constructions, the judgment control unit first selects the judgment result made with reference to the first boundary value. If the judgment result made with reference to the first boundary value is negative, the generating unit selects the judgment result made with reference to the second boundary value. Suppose the judgment results respectively made with reference to the first and second boundary values are both affirmative. With the above construction, the coding apparatus can preferentially select the judgment result made with reference to the first boundary value. In particular, suppose the judgment result made with reference to the first boundary value indicates that the first subtraction data has a corresponding variable-length code on the code table, and the judgment result made with reference to the second boundary value indicates that the second subtraction data has a corresponding variable-length code on the code table. With the above construction, the coding apparatus can preferentially output the variable-length code corresponding to the first subtraction data.

Here, the coding apparatus further comprises a receiving unit operable to receive a priority instruction indicating which one of the judgment result made with reference to the first boundary value and the judgment result made with reference to the second boundary value is preferentially selected, wherein the judgment control unit preferentially selects one of the judgment result made with reference to the first boundary value and the judgment result made with reference to the second boundary value, in accordance with the priority instruction.

According to this construction, the coding apparatus is provided with the receiving unit. Thus, the operator of the coding apparatus can freely choose which one of the judgment results made with reference to the first and second boundary values should be preferentially selected.

Here, the coding apparatus further comprises a clock control unit operable to suspend and resume inputting a clock signal into the obtaining unit.

The circuits constituting the coding apparatus receive clock signals at regular time intervals, and receive more than one clock signal during a period from when the obtaining unit obtains the input data to when the code corresponding to the obtained input data is output. Here, when receiving each clock signal during the above-mentioned period, the circuits constituting the obtaining unit perform a predetermined procedure to output the obtained input data to the circuits constituting the second judging unit and the like. In the coding apparatus, however, the obtaining unit is only required to continue outputting the obtained input data, from when the coding apparatus obtains the input data to when the coding apparatus outputs the code corresponding to the obtained input data. Therefore, during this period, the obtaining unit does not need to perform the predetermined procedure to output the obtained input data to the circuits constituting the second judging unit and the like every time receiving a clock signal. Considering this, the clock control unit stops clock signals from being input into the obtaining unit during the period from when the obtaining unit obtains the input data until when the code corresponding to the obtained input data is output. In this way, the power consumption of the obtaining unit can be reduced.

Here, the code table is defined by the MPEG-4 format.

According to this construction, the coding apparatus has a wide use in a variety of electronic appliances using the MPEG-4 format.

BRIEF DESCRIPTION OF THE DRAWINGS

These and other objects, advantages, and features of the invention will become apparent from the following description thereof taken in conjunction with the accompanying drawings, which illustrate a specific embodiment of the invention.

In the drawings:

FIGS. 4A, 4B and 4C respectively illustrate, in detail, a VLC table 251, an LMAX table 261, and an RMAX table 266;

FIGS. 5A and 5B respectively illustrate, in detail, a VLC table 351a generated based on the VLC table 251 by grouping combinations in terms of the pair of Last and Run, and a VLC table 351b generated based on the VLC table 251 by grouping combinations in terms of the pair of Last and Level;

FIG. 14 illustrates a relation between a first mode signal, a second mode signal, and a selecting instruction output to a selecting circuit 215c in the variable-length coding circuit 200c;

FIG. 18 illustrates a relation between a first mode signal, a second mode signal, a selecting instruction output to a register 208d, and a selecting instruction output to the selecting circuit 215c in the variable-length coding circuit 200d;

FIG. 22 illustrates a relation between a first mode signal, a second mode signal, and a selecting instruction output to a selecting circuit 215e in the variable-length coding circuit 200e;

FIG. 26 illustrates a relation between a first mode signal, a second mode signal, a selecting instruction output to a first selecting circuit 205f, and a selecting instruction output to the second selecting circuit 215 in the variable-length coding circuit 200f;

FIG. 32 illustrates a relation between a first mode signal, a second mode signal, a selecting instruction output to a first selecting circuit 205g, and a selecting instruction output to the second selecting circuit 215 in the variable-length coding circuit 200g;

FIG. 34 illustrates a relation between a first mode signal, a second mode signal, a selecting instruction output to the first selecting circuit 205g, and a selecting instruction output to the second selecting circuit 215, in a modification example of the sixth embodiment;

DESCRIPTION OF THE PREFERRED EMBODIMENT

1. First Embodiment

The following describes an imaging system 100 relating to a first embodiment of the present invention.

Figure 1:
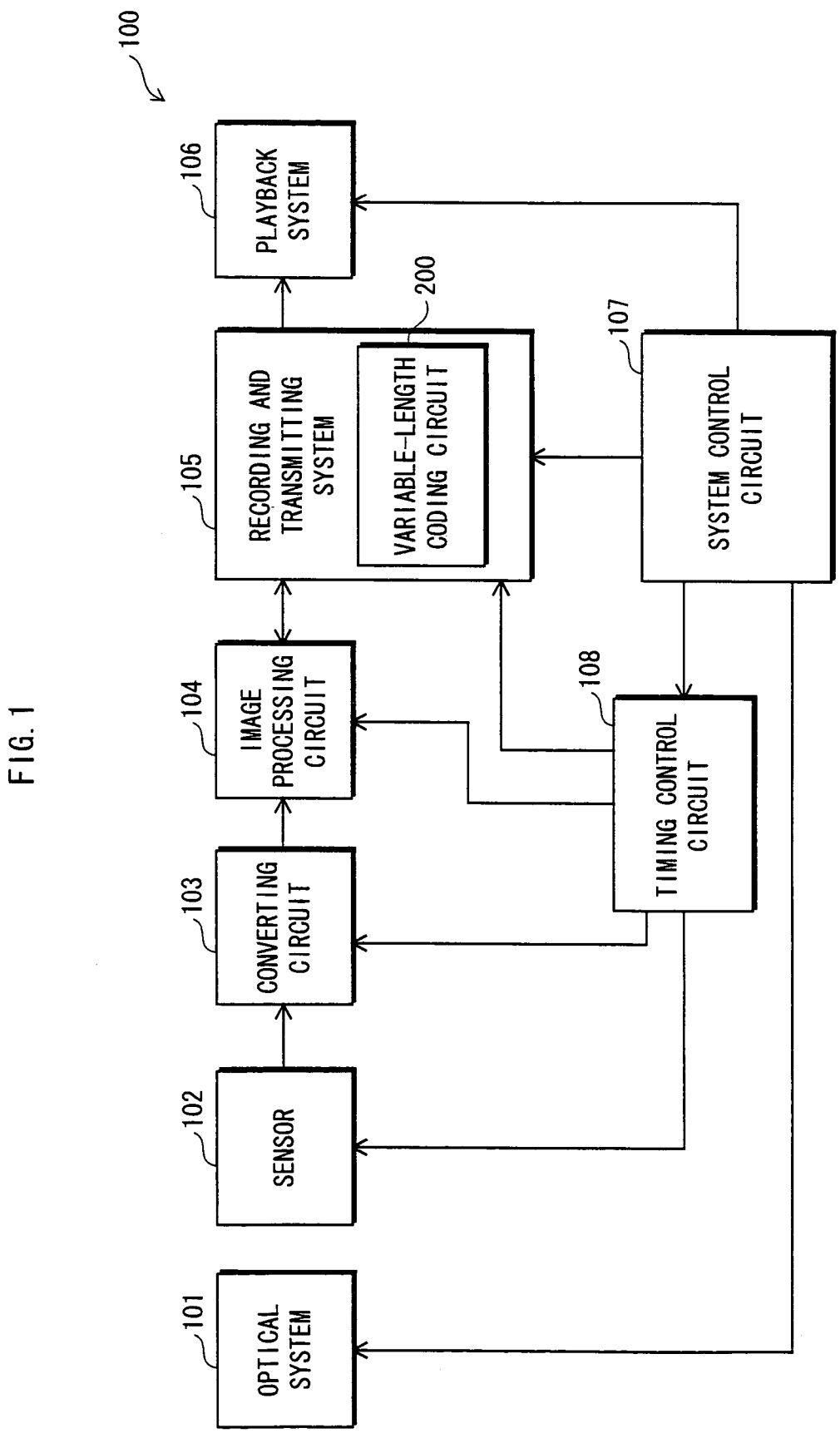
FIG. 1 is a block diagram illustrating a construction of an imaging apparatus 100.

As shown in FIG. 1, the imaging system 100 relating to the first embodiment of the present invention is constituted by an optical system 101, a sensor 102, a converting circuit 103, an image processing circuit 104, a recording and transmitting system 105, a playback system 106, a timing control circuit 108, and a system control circuit 107.

The optical system 101 includes a lens, a color filter, and the like. The optical system 101 collects light that enters the imaging system 100. The sensor 102 is formed by using an imaging element such as a charge coupled device (CCD). The sensor 102 converts an amount of the light that enters the imaging system 100 through the optical system 101, into an electric charge, and stores the electric charge. Also, the sensor 102 outputs the stored electric charge to the converting circuit 103, in synchronization with a clock signal output from the timing control circuit 108. The converting circuit 103 converts the electric charge received from the sensor 102 into a digital signal, and outputs the digital signal to the image processing circuit 104. The image processing circuit 104 includes a quantizing circuit, a DCT circuit, a motion compensation circuit, and the like. The image processing circuit 104 performs an image compressing operation based on intraframe and interframe correlation. The image processing circuit 104 outputs compressed image data to the recording and transmitting system 105. The recording and transmitting system 105 includes a data generating circuit, a variable-length coding circuit 200, a buffer, and the like. The recording and transmitting system 105 generates combinations (Last, Run, Level) based on the compressed image data obtained by the image processing circuit 104. The recording and transmitting system 105 generates variable-length codes from the generated combinations (Last, Run, Level), and temporarily stores the generated variable-length codes in the buffer. The recording and transmitting system 105 outputs the data stored in the buffer to the playback system 106 or a memory card. The variable-length coding circuit 200 is described in detail later.

The playback system 106 includes an inverse variable-length coding circuit, an inverse DCT circuit, an inverse quantizing circuit, a motion compensation circuit, a display, and the like. In accordance with a control performed by the system control circuit 107, the playback system 106 reads coded and compressed data from the recording and transmitting systems 105, generates image data by decoding and decompressing the read data, and displays the image data on the display.

The timing control unit 108 generates a clock signal, and outputs the generated clock signal to the circuits. Although not illustrated specifically in FIG. 1, the system control circuit 107 receives a variety of button operations made by a user, and controls the circuits based on the received button operations.

1.1 Variable-length Coding Circuit 200

The variable-length coding circuit 200 first judges a type of a code to be assigned to a combination (Last, Run, Level), and generates the code based on the result of the judgment. The following specifically describes a code generating operation of the variable-length coding circuit 200, and a construction to realize the code generating function.

(Operation of Variable-length Coding Circuit 200)

Figure 2:
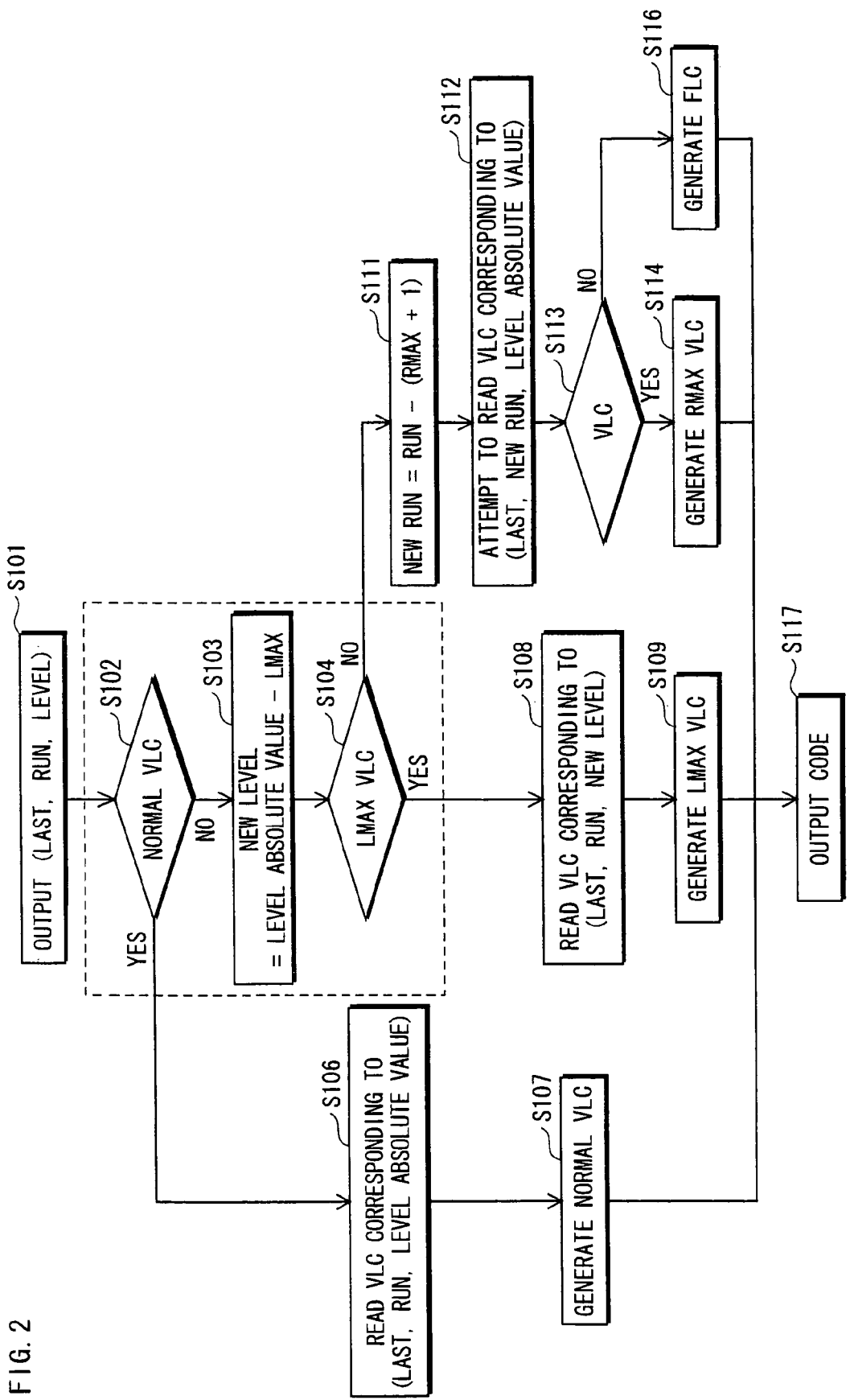
FIG. 2 is a flow chart illustrating an operation of a variable-length coding circuit 200.

The following describes an operation of the variable-length coding circuit 200, with reference to a flow chart shown in FIG. 2.

The variable-length coding circuit 200 starts a code generating operation, with an output of data including a combination (Last, Run, Level) to the circuits included in the variable-length coding circuit 200 (step S101). To start with, the variable-length coding circuit 200 judges whether a code to be assigned to the combination (Last, Run, Level) is a normal VLC or not, by comparing a Level absolute value and an LMAX (step S102). In the present specification, the normal VLC denotes a code generated based on a VLC uniquely defined for a combination (Last, Run, Level absolute value) on a VLC table (described in detail later), if such a VLC is defined on the VLC table.

When judging the code to be a normal VLC (step S102: YES), the variable-length coding circuit 200 reads a VLC corresponding a combination (Last, Run, Level absolute value) (step S106), and generates a normal VLC based on the read VLC (step S107). After this, the variable-length coding circuit 200 outputs the generated normal VLC as the code assigned to the combination (Last, Run, Level) (step S117).

When judging the code not to be a normal VLC (step S102:NO), the variable-length coding circuit 200 calculates New Level by subtracting the LMAX from the Level absolute value (step S103). Then, the variable-length coding circuit 200 judges whether the code to be assigned to the combination (Last, Run, Level) is an LMAX VLC, by comparing the calculated New Level with the LMAX (step S104). In the present specification, the LMAX VLC denotes a code generated based on a VLC uniquely defined for a combination (Last, Run, New Level) on the VLC table, according to the first escape mode, if such a VLC is defined on the VLC table.

When judging the code to be an LMAX VLC in the step S104, the variable-length coding circuit 200 reads a VLC corresponding to a combination (Last, Run, New Level) (step S108). The variable-length coding circuit 200 generates an LMAX VLC based on the read VLC (step S109), and outputs the generated LMAX VLC (step S117).

When judging the code not to be an LMAX VLC in the step S104, the variable-length coding circuit 200 calculates New Run=the Run value−(an RMAX+1) (step S111). The variable-length coding circuit 200 attempts to read a VLC defined for a combination (Last, New Run, Level absolute value) on the VLC table (step S112). If there is a VLC defined for the combination (Last, New Run, Level absolute value) on the VLC table (step S113:YES), the variable-length coding circuit 200 generates an RMAX VLC based on the read VLC (step S114). In the present specification, the RMAX VLC denotes a code generated based on a VLC uniquely defined for the combination (Last, New Run, Level absolute value) on the VLC table, according to the second escape mode, if such a VLC is defined on the VLC table. The variable-length coding circuit 200 outputs the generated RMAX VLC (step S117).

When judging there is no corresponding VLC in the step S113 (step S113:NO), the variable-length coding circuit 200 generates a 28-bit fixed-length code based on the combination (Last, Run, Level) (step S116), and outputs the fixed-length code (step S117). In the present specification, the fixed-length code (FLC) denotes a code generated based on a combination (Last, Run, Level), according to the third escape mode.

(Construction of Variable-length Coding Circuit 200)

Figure 3:
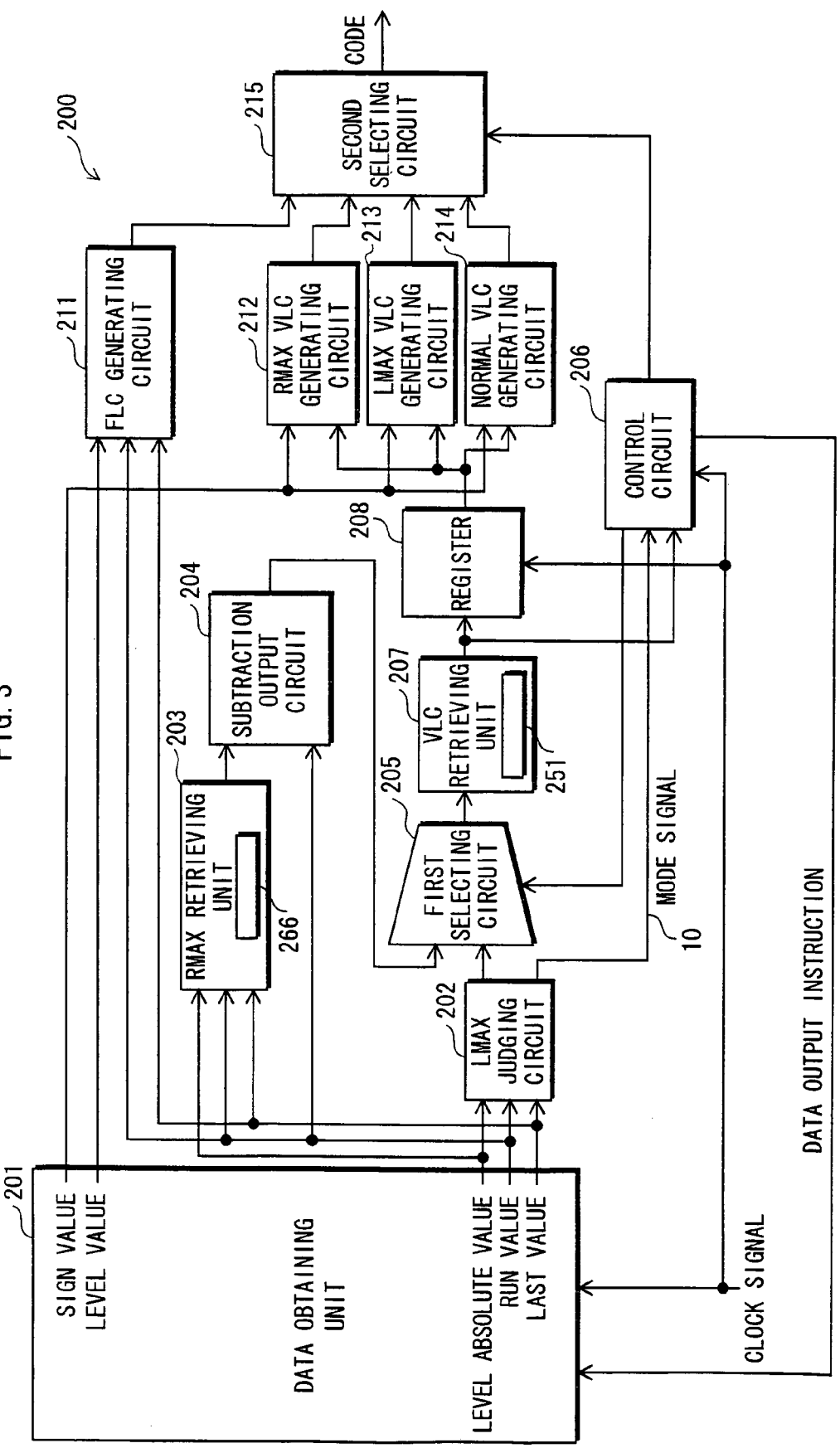
FIG. 3 is a block diagram illustrating a construction of the variable-length coding circuit 200.

As shown in FIG. 3, the variable-length coding circuit 200 is constituted by a data obtaining unit 201, an LMAX judging circuit 202, an RMAX retrieving unit 203, a subtraction output circuit 204, a first selecting circuit 205, a control circuit 206, a VLC retrieving unit 207, a register 208, an FLC generating circuit 211, an RMAX VLC generating circuit 212, an LMAX VLC generating circuit 213, a normal VLC generating circuit 214, and a second selecting circuit 215.

(1) Data Obtaining Unit 201

The data obtaining unit 201 receives data which includes a set of a Run value, a Level value, a Last value, a Sign value, and a Level absolute value, from the data generating circuit, and stores the received data temporarily.

The Level value indicates a value of a nonzero DCT coefficient among DCT coefficients output continuously from the image processing circuit 104. The Level value is output as a 12-bit signal. The Run value indicates the number of zero DCT coefficients prior to the nonzero DCT coefficient. The Run value is output as a 6-bit signal. The Last value indicates whether the nonzero DCT coefficient that is referred to when determining the Level value is the last signal in a block of eight pixels×eight lines, which is a processing unit of image data. When the nonzero DCT coefficient is the last signal in the block, the Last value is one. When the nonzero DCT coefficient is not the last signal in the block, the Last value is zero. The Last value is output as a 1-bit signal. The Sign value indicates a sign of the Level value. When the Level value is positive, the Sign value is zero. When the Level value is negative, the Sign value is one. The Sign value is output as a 1-bit signal. The Level absolute value is an absolute value of the Level value. The Level absolute value is output as a 12-bit signal.

Furthermore, the data obtaining unit 201 receives clock signals from the timing control circuit 108 at regular time intervals. Also, the data obtaining unit 201 receives a data output instruction from the control circuit 206.

Every time receiving a data output instruction, the data obtaining unit 201 outputs data including a Run value, a Level value, a Last value, a Sign value, and a Level absolute value, to the circuits constituting the variable-length coding circuit 200, in synchronization with a next clock signal.

Specifically speaking, the data obtaining unit 201 outputs the Last value, Run value, and Level value to the FLC generating circuit 211, and outputs the Last value, Run value, and Level absolute value to the LMAX judging circuit 202. Also, the data obtaining unit 201 outputs the Last value, Run value, and Level absolute value to the RMAX retrieving unit 203, and outputs the Run value to the subtraction output circuit 204.

(2) LMAX Judging Circuit 202

Figure 6A:
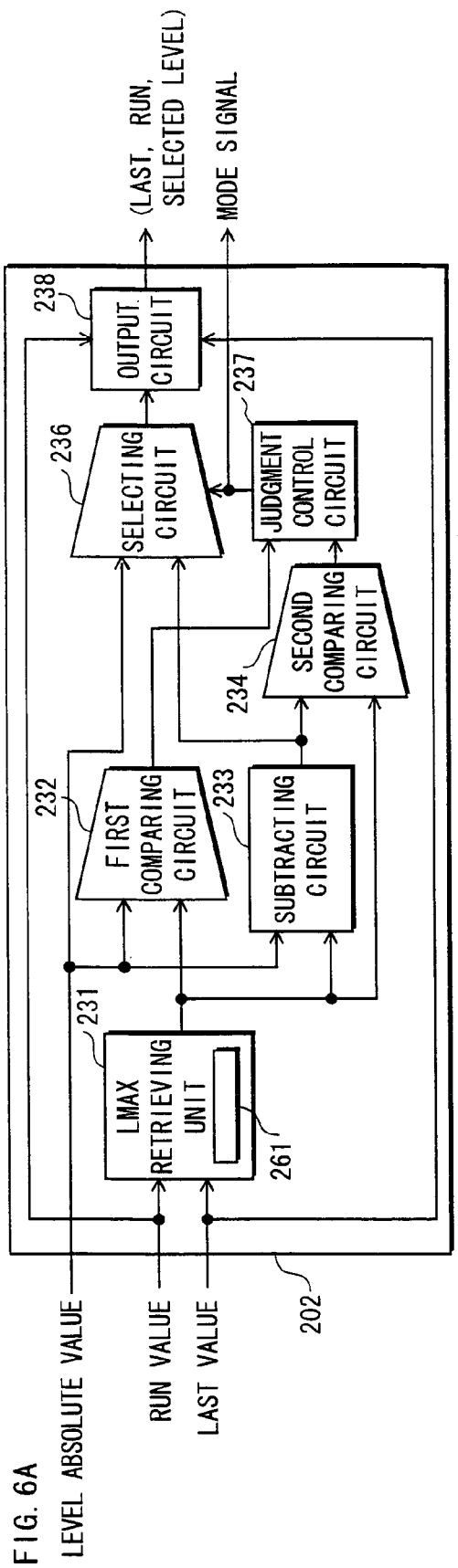
FIGS. 6A and 6B are block diagrams each illustrating an example of a construction of an LMAX judging circuit 202.

As shown in FIG. 6A, the LMAX judging circuit 202 is constituted by an LMAX retrieving unit 231, a first comparing circuit 232, a subtracting circuit 233, a second comparing circuit 234, a selecting circuit 236, a judgment control circuit 237, and an output circuit 238.

(2-1) LMAX Retrieving Unit 231

The LMAX retrieving unit 231 stores thereon an LMAX table 261 and an LMAX error value "0". The LMAX table 261 includes a plurality of pieces of LMAX information 262, 263, . . . as shown in FIG. 4B, and each piece of LMAX information includes a Last value, a Run value, and an LMAX (In FIG. 4B, Last and Run respectively indicate a Last value and a Run value.).

The LMAX table 261 is generated based on a VLC table 251. The VLC table 251 includes a plurality of pieces of VLC information 252, 253, . . . as shown in FIG. 4A, and each piece of VLC information includes a Last value, a Run value, a Level absolute value, and a VLC (In FIGS. 4A and 5A, Last and Run respectively indicate a Last value and a Run value.). Here, the VLC indicates a code uniquely corresponding to the combination of the Last value, Run value, and Level absolute value included in each piece of VLC information. The code indicated by the VLC includes "s", which is referred to as a sign bit. A Sign value indicating a sign of the Level value is assigned to the sign bit. Here, take a VLC table 351a which is generated by realigning the plurality of pieces of VLC information included in the VLC table 251 so as to group together pieces of VLC information in terms of the pair of a Last value and a Run value.

In the VLC table 351a shown in FIG. 5A, a plurality of pieces of VLC information 352, 353, 354, . . . 356 including the pair of a Last value=0 and a Run value=0 are consecutively arranged, and a plurality of pieces of VLC information 357, 358, . . . 359 including the pair of a Last value=0 and a Run value=1 are consecutively arranged.

In a group of the pieces of VLC information 352, 353, 354, . . . 356 including the pair of a Last value=0 and a Run value=0, a Level absolute value in each piece of VLC information indicates one of continuous numbers from 1 to 27. The maximum Level absolute value is 27 in this group, and an LMAX corresponding to the pair of a Last value=0 and a Run value=0 is thus 27. Based on this, the LMAX information 262 including a Last value=0, a Run value=0, and an LMAX=27 is formed.

Similarly in a group of the pieces of VLC information 357, 358, . . . 359 including the pair of a Last value=0 and a Run value=1, a Level absolute value in each piece of VLC information indicates one of continuous numbers from 1 to 10. The maximum Level absolute value is 10 in this group, and an LMAX corresponding to the pair of a Last value=0 and a Run value=1 is thus 10. Based on this, the LMAX information 263 including a Last value=0, a Run value=1, and an LMAX=10 is formed.

In the manner described above, an LMAX which indicates a maximum Level absolute value is extracted for each group of pieces of VLC information including the same pair of a Last value and a Run value. Thus, one piece of LMAX information is generated for each group. As a result, the plurality of pieces of LMAX information 262, 263, . . . are generated, so as to constitute the LMAX table 261.

Here, LMAX information 264 indicates that an LMAX is not defined for a pair of a Last value=0 and a Run value≧15, and LMAX information 265 indicates that an LMAX is not defined for a pair of a Last value=1 and a Run value≧21.

As mentioned above, a Level absolute value in each of the pieces of VLC information having the same pair of a Last value and a Run value indicates one of continuous numbers from 1 to an LMAX, on the VLC table 251. In other words, a VLC is defined, on the VLC table 251, for each of the combinations (Last, Run, 1), (Last, Run, 2), (Last, Run, 3), . . . (Last, Run, LMAX). Considering this, if LMAX≧Level absolute value, it can be judged that there is a VLC corresponding to a combination (Last, Run, Level absolute value) on the VLC table 251.

The LMAX retrieving unit 231 may store a table, for example, the LMAX table 261 shown in FIG. 4B, or store an LMAX at an address calculated based on each pair of (Last, Run).

The LMAX error value "0" is data which is to be output as a substitute for an LMAX, when a corresponding LMAX is not defined on the LMAX table 261.

The LMAX retrieving unit 231 receives a Last value and a Run value from the data obtaining unit 201. When receiving the Last value and Run value, the LMAX retrieving unit 231 attempts to read an LMAX corresponding to the received pair of (Last, Run), from the LMAX table 261. The LMAX retrieving unit 231 then outputs the read LMAX to the first comparing circuit 232, subtracting circuit 233, and second comparing circuit 234, if there is a corresponding LMAX.

Here, if there is no LMAX defined for the received pair of (Last, Run) on the LMAX table 261, the LMAX retrieving unit 231 outputs the LMAX error value "0" as a substitute for an LMAX.

(2-2) First Comparing Circuit 232

The first comparing circuit 232 receives a Level absolute value from the data obtaining unit 201, and receives an LMAX from the LMAX retrieving unit 231. When receiving the Level absolute value and LMAX, the first comparing circuit 232 compares the received Level absolute value and LMAX, and sends the result of the comparison to the judgment control circuit 237.

(2-3) Subtracting Circuit 233

The subtracting circuit 233 receives a Level absolute value from the data obtaining unit 201, and receives an LMAX from the LMAX retrieving unit 231. When receiving the Level absolute value and LMAX, the subtracting circuit 233 subtracts the LMAX from the Level absolute value, to calculate New Level. The subtracting circuit 233 outputs the calculated New Level to the second comparing circuit 234 and selecting circuit 236.

(2-4) Second Comparing Circuit 234

The second comparing circuit 234 receives an LMAX from the LMAX retrieving unit 231, and receives New Level from the subtracting circuit 233. When receiving the LMAX and New Level, the second comparing circuit 234 compares the received LMAX and New Level, and sends the result of the comparison to the judgment control circuit 237.

(2-5) Judgment Control Circuit 237

The judgment control circuit 237 receives a result of comparing a Level absolute value and an LMAX from the first comparing circuit 232, and receives a result of comparing an LMAX and New Level from the second comparing circuit 234.

When the result of the comparison received from the first comparing circuit 232 indicates the LMAX≧the Level absolute value, it can be judged that there is a VLC corresponding to the combination (Last, Run, Level absolute value) on the VLC table 251, in light of the configuration of the LMAX table 261 and VLC table 251, as described above. Accordingly, the judgment control circuit 237 ignores the result of the comparison received from the second comparing circuit 234. Subsequently, the judgment control circuit 237 generates a mode signal "00" that indicates there is a VLC corresponding to the combination (Last, Run, Level absolute value) on the VLC table 251 and a code to be assigned to the combination (Last, Run, Level) is a normal VLC. The judgment control circuit 237 outputs the generated mode signal "00" to the selecting circuit 236 and control circuit 206.

When the result of the comparison received from the first comparing circuit 232 indicates the LMAX<the Level absolute value, and the result of the comparison received from the second comparing circuit 234 indicates the LMAX≧the New Level, the judgment control circuit 237 generates a mode signal "01". The mode signal "01" indicates that there is no VLC corresponding to the combination (Last, Run, Level absolute value) on the VLC table 251, but there is a VLC corresponding to a combination (Last, Run, New Level) on the VLC table 251, and that the code to be assigned to the combination (Last, Run, Level) is an LMAX VLC which is generated according to the first escape mode. The judgment control circuit 237 outputs the generated mode signal "01" to the control circuit 206 and selecting circuit 236.

When the result of the comparison received from the first comparing circuit 232 indicates the LMAX<the Level absolute value, and the result of the comparison received from the second comparing circuit 234 indicates the LMAX<the New Level, there is neither a VLC corresponding to the combination (Last, Run, Level absolute value) nor a VLC corresponding to the combination (Last, Run, New Level) on the VLC table 251. The judgment control circuit 237 therefore generates a mode signal "10" which indicates that the code to be assigned to the combination (Last, Run, Level) is neither a normal VLC nor LMAX VLC. The judgment control circuit 237 outputs the generated mode signal "10" to the control circuit 206 and selecting circuit 236.

(2-6) Selecting Circuit 236

The selecting circuit 236 receives a Level absolute value from the data obtaining unit 201, and receives New Level from the subtracting circuit 233. Also, the selecting circuit 236 receives a mode signal from the judgment control circuit 237.

When the received mode signal indicates "00" or "10", the selecting circuit 236 outputs the Level absolute value received from the data obtaining unit 201 to the output circuit 238, as a selected Level.

When the received mode signal indicates "01", the selecting circuit 236 outputs the New Level received from the subtracting circuit 233 to the output circuit 238, as a selected Level.

(2-7) Output Circuit 238

The output circuit 238 receives a Run value and a Last value from the data obtaining unit 201, and receives a selected Level from the selecting circuit 236. Also, the output circuit 238 outputs a combination (Last, Run, selected Level) to the first selecting circuit 205.

(3) RMAX Retrieving Unit 203 and Subtraction Output Circuit 204

The RMAX retrieving unit 203 stores thereon an RMAX table 266 and an RMAX error value "−1". The RMAX table 266 includes a plurality of pieces of RMAX information 267, 268, . . . as shown in FIG. 4C, and each piece of RMAX information includes a Last value, a Level absolute value, and an RMAX (In FIG. 4C, Last indicates a Last value).

The RMAX table 266 is generated based on the VLC table 251. The VLC table 251 has been explained above. Here, take a VLC table 351b which is generated by realigning the plurality of pieces of VLC information included in the VLC table 251, so as to group together the pieces of VLC information in terms of the pair of a Last value and a Level absolute value. In the VLC table 351b shown in FIG. 5B, pieces of VLC information 371, 372, 373, . . . 374 including the same pair of a Last value=0 and a Level absolute value=1 are consecutively arranged, and pieces of VLC information 376, 377, . . . 378 including the same pair of a Last value=0 and a Level absolute value=2 are consecutively arranged.

In a group of the pieces of VLC information 371, 372, 373, . . . 374 including the same pair of a Last value=0 and a Level absolute value=1, a Run value in each piece of VLC information indicates one of continuous numbers from 1 to 14. The maximum Run value is 14 in this group, and an RMAX corresponding to the pair of a Last value=0 and a Level absolute value=1 is thus 14. Based on this, the RMAX information 267 including a Last value=0, a Level absolute value=1, and RMAX=14 is formed.

Similarly in a group of the pieces of VLC information 376, 377, . . . 378 including the same pair of a Last value=0 and a Level absolute value=2, the maximum Run value is 9 in this group, and an RMAX corresponding to the pair of a Last value=0 and a Level absolute value=2 is thus 9. Based on this, the RMAX information 268 including a Last value=0, a Level absolute value=2, and an RMAX=9 is formed.

In the manner described above, an RMAX indicating a maximum Run value is extracted for each group of pieces of VLC information including the same pair of a Last value and a Level absolute value. Thus, one piece of RMAX information including the extracted RMAX is generated for each group. As a result, the plurality of pieces of RMAX information 267, 268, . . . are generated, so as to constitute the RMAX table 266.

Here, RMAX information 269 indicates that an RMAX is not defined for a pair of a Last value=0 and a Level absolute value≧28, and RMAX information 270 indicates that an RMAX is not defined for a pair of a Last value=1 and a Level absolute value≧9.

The RMAX retrieving unit 203 may store a table, for example, the RMAX table 266 shown in FIG. 4C, or store an RMAX at an address calculated based on a pair of a Last value and a Level absolute value.

The RMAX error value "−1" is data which is to be output as a substitute for an RMAX, when there is no corresponding RMAX on the RMAX table 266.

The RMAX retrieving unit 203 receives a Last value, a Run value, and a Level absolute value from the data obtaining unit 201. The RMAX retrieving unit 203 attempts to read an RMAX corresponding to the received Last value and Level absolute value. The RMAX retrieving unit 203 then outputs the received Last value, Level absolute value, and the read RMAX, to the subtraction output circuit 204.

Here, if there is no RMAX defined for the pair of the received Last value and Level absolute value on the RMAX table 266, the RMAX retrieving unit 203 outputs the RMAX error value "−1" as a substitute for an RMAX.

The subtraction output circuit 204 receives the Last value, Level absolute value, and RMAX from the RMAX retrieving unit 203, and receives a Run value from the data obtaining unit 201.

After this, the subtraction output circuit 204 calculates New Run=the Run value−(the RMAX+1), and outputs a combination (Last, New Run, Level absolute value) including the calculated New Run, to the first selecting circuit 205.

(4) First Selecting Circuit 205

The first selecting circuit 205 receives a combination (Last, New Run, Level absolute value) from the subtraction output circuit 204, and receives a combination (Last, Run, selected Level) from the LMAX judging circuit 202. Also, the first selecting circuit 205 receives a selecting instruction from the control circuit 206. Here, the selecting instruction indicates which to select between the combination (Last, New Run, Level absolute value) output from the subtraction output circuit 204, and the combination (Last, Run, selected Level) output from the LMAX judging circuit 202.

Based on the received selecting instruction, the first selecting circuit 205 selects one of the combination (Last, New Run, Level absolute value) output from the subtraction output circuit 204, and the combination (Last, Run, selected Level) output from the LMAX judging circuit 202, and outputs the selected combination to the VLC retrieving unit 207.

(5) VLC Retrieving Unit 207

The VLC retrieving unit 207 stores thereon the VLC table 251 shown in FIG. 4A, which is defined by MPEG-4. The VLC table 251 has already been described in the section (2) LMAX JUDGING CIRCUIT 202, and therefore not explained here. The VLC retrieving unit 207 may store a table, for example, the table shown in FIG. 4A, or store a VLC at an address calculated based on a combination (Last, Run, Level absolute value).

The VLC retrieving unit 207 receives one of a combination (Last, New Run, Level absolute value) and a combination (Last, Run, selected Level), from the first selecting circuit 205.

The VLC retrieving unit 207 subsequently attempts to read, from the VLC table 251, a VLC corresponding to the received one of the combination (Last, New Run, Level absolute value) and combination (Last, Run, selected Level). If there is a VLC corresponding to the received one of the combination (Last, New Run, Level absolute value) and combination (Last, Run, selected Level) on the VLC table 251, the VLC retrieving unit 207 reads and outputs the VLC to the register 208, and outputs an OK signal to the control circuit 206. The OK signal indicates that a VLC has been successfully read.

If there is no VLC corresponding to the received one of the combination (Last, New Run, Level absolute value) and combination (Last, Run, selected Level) on the VLC table 251, the VLC retrieving unit 207 outputs a VLC error signal to the control circuit 206 and register 208. The VLC error signal indicates that there is no corresponding VLC on the VLC table 251.

(6) Register 208

The register 208 receives clock signals from the timing control circuit 108 at regular time intervals. Also, the register 208 receives a VLC or VLC error signal from the VLC retrieving unit 207.

When receiving a VLC, the register 208 temporarily stores the received VLC. When detecting a clock signal subsequently, the register 208 outputs the received VLC to the RMAX VLC generating circuit 212, LMAX VLC generating circuit 213, and normal VLC generating circuit 214. When receiving a VLC error signal, the register 208 does nothing.

(7) Control Circuit 206

The control circuit 206 receives clock signals from the timing control circuit 108 at regular time intervals, and receives a mode signal from the LMAX judging circuit 202.

When the mode signal received from the LMAX judging circuit 202 indicates "00" denoting a normal VLC, the control circuit 206 outputs a selecting instruction, to the first selecting circuit 205, which indicates a selection of a combination (Last, Run, selected Level) output from the LMAX judging circuit 202. After this, the control circuit 206 receives, from the VLC retrieving unit 207, an OK signal indicating that a VLC has been successfully read. When detecting a clock signal after receiving the OK signal, the control circuit 206 outputs a selecting instruction, to the second selecting circuit 215, which indicates a selection of a normal VLC output from the normal VLC generating circuit 214. After this, the control circuit 206 outputs a data output instruction, to the data obtaining unit 201, which requests an output of new data.

When the mode signal received from the LMAX judging circuit 202 indicates "01" denoting an LMAX VLC, the control circuit 206 outputs a selecting instruction, to the first selecting circuit 205, which indicates a selection of a combination (Last, Run, selected Level) output from the LMAX judging circuit 202. After this, the control circuit 206 receives, from the VLC retrieving unit 207, an OK signal indicating that a VLC has been successfully read. When detecting a clock signal after receiving the OK signal, the control circuit 206 outputs a selecting instruction, to the second selecting circuit 215, which indicates a selection of an LMAX VLC output from the LMAX VLC generating circuit 213. After this, the control circuit 206 outputs a data output instruction, to the data obtaining unit 201, which requests an output of new data.

When the mode signal received from the LMAX judging circuit 202 indicates "10" denoting a code other than a normal VLC and an LMAX VLC, the control circuit 206 outputs a selecting instruction, to the first selecting circuit 205, which indicates a selection of a combination (Last, New Run, Level absolute value) output from the subtraction output circuit 204. After this, the control circuit 206 receives, from the VLC retrieving unit 207, an OK signal indicating that a VLC has been successfully read, or a VLC error signal indicating that there is no corresponding VLC.

When receiving an OK signal, the control circuit 206 outputs a selecting instruction, to the second selecting circuit 215, which indicates a selection of an RMAX VLC output from the RMAX VLC generating circuit 212, in synchronization with detection of a clock signal. After this, the control circuit 206 outputs a data output instruction, to the data obtaining unit 201, which requests an output of new data in synchronization with detection of a next clock signal.

When receiving a VLC error signal, the control circuit 206 outputs a selecting instruction, to the second selecting circuit 215, which indicates a selection of an FLC output from the FLC generating circuit 211, in synchronization with detection of a clock signal. After this, the control circuit 206 outputs a data output instruction, to the data obtaining unit 201, which requests an output of new data.

(8) FLC Generating Circuit 211

The FLC generating circuit 211 stores thereon an escape ID and an FLC escape code. The escape ID is 7-bit data "0000011" indicating that a code assigned to a combination (Last, Run, Level) is not a normal VLC. The FLC escape code is 2-bit data "11" indicating that the code assigned to the combination (Last, Run, Level) is generated according to the third escape mode.

The FLC generating circuit 211 receives a Level value, a Run value, and a Last value from the data obtaining unit 201.

The FLC generating circuit 211 generates a 28-bit FLC by combining the stored escape ID "0000011" and FLC escape code "11", and the received Level value, Run value, and Last value. The FLC generating circuit 211 outputs the generated FLC to the second selecting circuit 215.

(9) RMAX VLC Generating Circuit 212

The RMAX VLC generating circuit 212 stores thereon an escape ID and an RMAX escape code. The escape ID is 7-bit data "0000011" indicating that a code assigned to a combination (Last, Run, Level) is not a normal VLC. The RMAX escape code is 2-bit data "10" indicating that the code assigned to the combination (Last, Run, Level) is generated according to the second escape mode.

The RMAX VLC generating circuit 212 receives a VLC from the register 208, and a Sign value from the data obtaining unit 201.

The RMAX VLC generating circuit 212 assigns the Sign value to a sign bit "s" included in the received VLC. The RMAX VLC generating circuit 212 then generates an RMAX VLC by combining the stored escape ID "0000011" and RMAX escape code "10", and this VLC. The RMAX VLC generating circuit 212 outputs the generated RMAX VLC to the second selecting circuit 215.

(10) LMAX VLC Generating Circuit 213

The LMAX VLC generating circuit 213 stores thereon an escape ID and an LMAX escape code. The escape ID is 7-bit data "0000011" indicating that a code assigned to a combination (Last, Run, Level) is not a normal VLC. The LMAX escape code is 1-bit data "1" indicating that the code assigned to the combination (Last, Run, Level) is generated according to the first escape mode.

The LMAX VLC generating circuit 213 receives a VLC from the register 208, and receives a Sign value from the data obtaining unit 201.

The LMAX VLC generating circuit 213 assigns the Sign value to a sign bit "s" included in the received VLC. The LMAX VLC generating circuit 213 then generates an LMAX VLC by combining the stored escape ID "0000011" and LMAX escape code "1", and this VLC.

The LMAX VLC generating circuit 213 outputs the generated LMAX VLC to the second selecting circuit 215.

(11) Normal VLC Generating Circuit 214

The normal VLC generating circuit 214 receives a VLC from the register 208, and receives a Sign value from the data obtaining unit 201.

The normal VLC generating circuit 214 assigns the Sign value to a sign bit "s" included in the received VLC, to generate a normal VLC. The normal VLC generating circuit 214 outputs the generated normal VLC to the second selecting circuit 215.

(12) Second Selecting Circuit 215

The second selecting circuit 215 receives an FLC from the FLC generating circuit 211, receives an RMAX VLC from the RMAX VLC generating circuit 212, receives an LMAX VLC from the LMAX VLC generating circuit 213, and receives a normal VLC from the normal VLC generating circuit 214. Also, the second selecting circuit 215 receives a selecting instruction from the control circuit 206. The second selecting circuit 215 selects one of the FLC, RMAX VLC, LMAX VLC, and normal VLC, as a code assigned to a combination (Last, Run, Level) in accordance with the received selecting instruction. The second selecting circuit 215 outputs the selected code to the buffer included in the recording and transmitting system 105.

(13) Operation Cycle of Variable-length Coding Circuit 200

Figure 7:
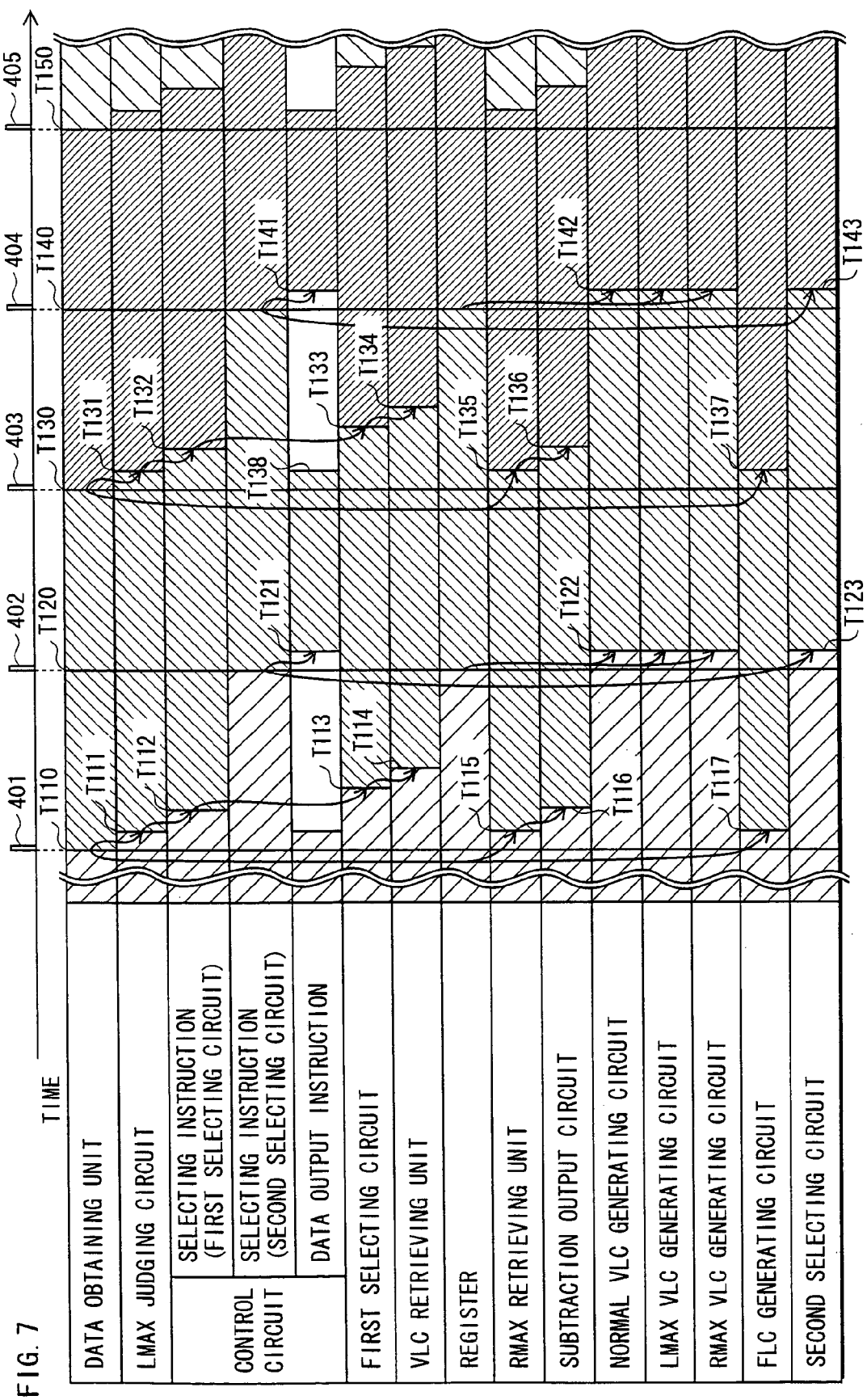
FIG. 7 is a time chart illustrating timings of operations of the circuits constituting the variable-length coding circuit 200.

The following describes an operation cycle of the variable-length coding circuit 200, with reference to a time chart shown in FIG. 7.

In the time chart shown in FIG. 7, the names of the circuits constituting the variable-length coding circuit 200 are arranged vertically, and a time is plotted horizontally. This time chart illustrates how pieces of data are sequentially processed, in relation to time.

Clock signals 401, 402, 403, 404 and 405 are supplied at regular time intervals, i.e., at times T110, T120, T130, T140, and T150, to the data obtaining unit 201, control circuit 206, and register 208. Note that a predetermined time interval between clock signals is referred to as a clock cycle.

The arrow shown in FIG. 7 indicates that an operation performed at a circuit specified by the starting point of the arrow at a particular time causes an operation to start at a different circuit specified by the ending point of the arrow at a particular time. For example, the data obtaining unit 201 outputs data at the time T110. As a result of this, the LMAX judging circuit 202 starts an operation, at a time T111, to judge a type of a code to be assigned to a combination (Last, Run, Level) included in the data output from the data obtaining unit 201.

At the time T110, the data obtaining unit 201 detects the clock signal 401, and outputs a Sign value, a Level value, a Level absolute value, a Run value, and a Last value stored thereon, to the LMAX judging circuit 202, RMAX retrieving unit 203, subtraction output circuit 204, FLC generating circuit 211, RMAX VLC generating circuit 212, LMAX VLC generating circuit 213, and normal VLC generating circuit 214. This output continues until the time T130. The output Sign value, Level value, Level absolute value, Run value, and Last value are collectively referred to as data A.

At a time T111, the LMAX judging circuit 202 receives a combination (Last, Run, Level absolute value) included in the data A. The LMAX judging circuit 202 judges a type of a code to be assigned to a combination (Last, Run, Level) included in the data A, based on the received combination (Last, Run, Level absolute value). The LMAX judging circuit 202 generates a mode signal and a combination (Last, Run, selected Level) as a result of the judgment. The LMAX judging circuit 202 outputs the generated mode signal to the control circuit 206, and outputs the generated combination of (Last, Run, selected Level) to the first selecting circuit 205. This output continues until a time T131.

At a time T112, the control circuit 206 receives the mode signal, and outputs a selecting instruction in accordance with the received mode signal to the first selecting circuit 205. This output continues until a time T132.

At a time T115, the RMAX retrieving unit 203 receives the combination (Last, Run, Level absolute value) included in the data A from the data obtaining unit 201. The RMAX retrieving unit 203 reads an RMAX, and outputs the read RMAX to the subtraction output circuit 204. This output continues until a time T135.

At a time T116, the subtraction output circuit 204 receives the RMAX from the RMAX retrieving unit 203. The subtraction output circuit 204 calculates New Run based on the received RMAX, and outputs a combination (Last, New Run, Level absolute value) including the calculated New Run, to the first selecting circuit 205. This output continues until a time T136.

At a time T113, the first selecting circuit 205 receives the selecting instruction from the control circuit 206. In accordance with the received selecting instruction, the first selecting circuit 205 selects and outputs one of the combination (Last, New Run, Level absolute value) and the combination (Last, Run, selected Level) to the VLC retrieving unit 207. This output continues until a time T133.

At a time T114, the VLC retrieving unit 207 receives one of the combination (Last, New Run, Level absolute value) and the combination (Last, Run, selected Level) from the first selecting circuit 205, and attempts to read a corresponding VLC from the VLC table 251. If there is a corresponding VLC on the VLC table 251, the VLC retrieving unit 207 outputs the read VLC to the register 208, and outputs an OK signal to the control circuit 206. This output continues until a time T134. If there is no corresponding VLC on the VLC table 251, the VLC retrieving unit 207 outputs a VLC error signal to the control circuit 206 and register 208. This output also continues until the time T134.

At a time T117, the FLC generating circuit 211 receives the combination (Last, Run, Level) included in the data A from the data obtaining unit 201. The FLC generating circuit 211 generates an FLC based on the received combination (Last, Run, Level), and outputs the generated FLC to the second selecting circuit 215. This output continues until a time T137.

The register 208 receives the VLC from the VLC retrieving unit 207, and stores thereon the received VLC temporarily. At the time T120, the register 208 detects the clock signal 402. The register 208 then outputs the stored VLC to the normal VLC generating circuit 214, LMAX VLC generating circuit 213, and RMAX VLC generating circuit 212. This output continues until the time T140.

At a time T122, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the second selecting circuit 215. This output continues until a time T142.

At the time T120, the control circuit 206 detects the clock signal 402, and outputs a selecting instruction to the second selecting circuit 215. This output continues until the time T140. The control circuit 206 generates the selecting instruction based on the OK signal or VLC error signal received from the VLC retrieving unit 207, and the mode signal received from the LMAX judging circuit 202. After outputting the selecting instruction to the second selecting circuit 215, the control circuit 206 outputs a data output instruction requesting an output of new data to the data obtaining unit 201 at a time T121. This output continues until a time T138.

At a time T123, the second selecting circuit 215 receives the selecting instruction from the control circuit 206. In accordance with the selecting instruction, the second selecting circuit 215 selects and outputs one of the normal VLC, LMAX VLC, RMAX VLC, and FLC, to the buffer included in the recording and transmitting system 105. This output continues until a time T143.

At the time T130, the data obtaining unit 201 detects the clock signal 403, and receives the data output instruction from the control circuit 206. Therefore, the data obtaining unit 201 outputs a new set of a Sign value, a Level value, a Level absolute value, a Run value, and a Last value, to the LMAX judging circuit 202, RMAX retrieving unit 203, subtraction output circuit 204, FLC generating circuit 211, RMAX VLC generating circuit 212, LMAX VLC generating circuit 213, and normal VLC generating circuit 214. This output continues until the time T150. The output Sign value, Level value, Level absolute value, Run value, and Last value are collectively referred to as data B.

The LMAX judging circuit 202, control circuit 206, . . . second selecting circuit 215 perform the same procedure for the data B as for the data A. Consequently, the variable-length coding circuit 200 generates and outputs a code corresponding to a combination (Last, Run, Level) included in the data B within two clock cycles.

1.2 Summary

According to the variable-length coding circuit 200 constituting the imaging system 100 relating to the first embodiment of the present invention, the LMAX judging circuit 202 judges whether a code to be assigned to a combination (Last, Run, Level) is a normal VLC, an LMAX VLC, or something else. When the LMAX judging circuit 202 judges the code to be a normal VLC, the variable-length coding circuit 200 reads a VLC corresponding to a combination (Last, Run, Level absolute value) from the VLC table 251, generates a normal VLC based on the read VLC, and outputs the generated normal VLC as a code assigned to the combination (Last, Run, Level).

When the LMAX judging circuit 202 judges the code to be an LMAX VLC, the variable-length coding circuit 200 reads a VLC corresponding to a combination (Last, Run, New Level) from the VLC table 251, generates an LMAX VLC based on the read VLC, and outputs the generated LMAX VLC as the code assigned to the combination (Last, Run, Level).

In parallel to this judging operation performed by the LMAX judging circuit 202, the RMAX retrieving unit 203 reads an RMAX, and the subtraction output circuit 204 calculates New Run.

When the LMAX judging circuit 202 judges that the code to be assigned to the combination (Last, Run, Level) is neither a normal VLC nor LMAX VLC, the variable-length coding circuit 200 attempts to read a VLC corresponding to a combination (Last, New Run, Level absolute value) from the VLC table 251. If there is a VLC corresponding to the combination (Last, New Run, Level absolute value) on the VLC table 251, the variable-length coding circuit 200 generates an RMAX VLC, and outputs the generated RMAX VLC as the code assigned to the combination (Last, Run, Level).

If there is no VLC corresponding to the combination (Last, New Run, Level absolute value) on the VLC table 251, the variable-length coding circuit 200 outputs an FLC generated by the FLC generating circuit 211 as the code assigned to the combination (Last, Run, Level).

In the manner described above, the variable-length coding circuit 200 can generate and output the code assigned to the combination (Last, Run, Level), within two clock cycles, irrespective of whether the code is a normal VLC, LMAX VLC, RMAX VLC, or FLC.

In addition, the LMAX judging circuit 202 judges the type of the code to be assigned to the combination (Last, Run, Level) before a VLC is read from the VLC table 251. For this construction, the variable-length coding circuit 200 is required to have only one VLC table. This can reduce an increase in circuit scale.

1.3 Modification Example of First Embodiment

Figure 6B:
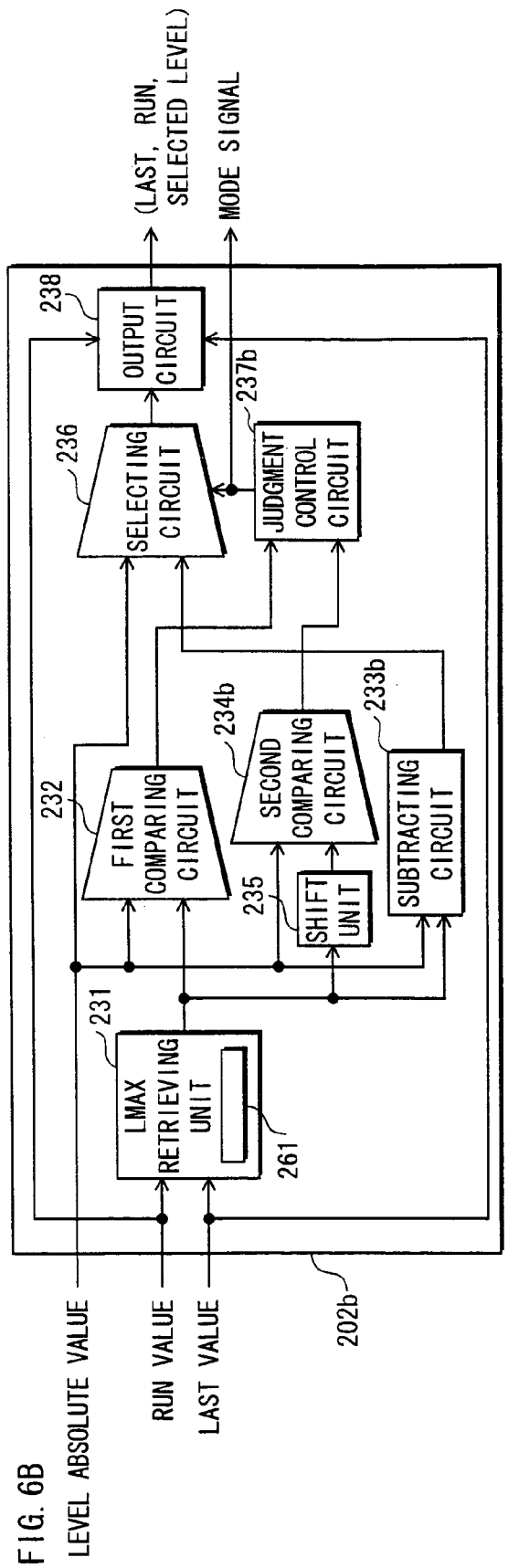

The LMAX judging circuit 202 relating to the first embodiment may be modified to have a construction of an LMAX judging circuit 202b shown in FIG. 6B.

The LMAX judging circuit 202b is constituted by the LMAX retrieving unit 231, the first comparing circuit 232, a subtracting circuit 233b, a second comparing circuit 234b, a shift unit 235, the selecting circuit 236, a judgment control circuit 237b, and the output circuit 238.

The LMAX retrieving unit 231, first comparing circuit 232, selecting circuit 236, and output circuit 238 perform the same operations as in the first embodiment.

(1) Shift Unit 235

The shift unit 235 receives an LMAX from the LMAX retrieving unit 231.

When receiving the LMAX, the shift unit 235 shifts the received LMAX by one bit to left, in other words, doubles the received LMAX. The doubled LMAX is hereinafter expressed as 2×LMAX.

Subsequently, the shift unit 235 outputs the 2×LMAX to the second comparing circuit 234b.

(2) Second Comparing Circuit 234b

The second comparing circuit 234b receives a Level absolute value from the data obtaining unit 201, and receives 2×LMAX from the shift unit 235.

The second comparing circuit 234b compares the received Level absolute value and 2×LMAX, and outputs the result of the comparison to the judgment control circuit 237b.

(3) Subtracting Circuit 233b

The subtracting circuit 233b receives a Level absolute value from the data obtaining unit 201, and receives an LMAX from the LMAX retrieving unit 231. When receiving the Level absolute value and LMAX, the subtracting circuit 233b calculates New Level=the Level absolute value−the LMAX. The subtracting circuit 233b outputs the calculated New Level to the selecting circuit 236.

(4) Judgment Control Circuit 237b

The judgment control circuit 237b receives a result of comparing a Level absolute value and an LMAX from the first comparing circuit 232, and receives a result of comparing the Level absolute value and 2×LMAX from the second comparing circuit 234b.

When the result of the comparison received from the first comparing circuit 232 indicates the LMAX≧the Level absolute value, the judgment control circuit 237b ignores the result of the comparison received from the second comparing circuit 234b, and generates and outputs a mode signal "00" to the selecting circuit 236 and control circuit 206.

When the result of the comparison received from the first comparing circuit 232 indicates the LMAX<the Level absolute value, and the result of the comparison received from the second comparing circuit 234b indicates the 2×LMAX≧the Level absolute value, the judgment control circuit 237b generates and outputs a mode signal "01" to the selecting circuit 236 and control circuit 206.

When the result of the comparison received from the first comparing circuit 232 indicates the LMAX<the Level absolute value, and the result of the comparison received from the second comparing circuit 234b indicates the 2×LMAX<the Level absolute value, the judgment control circuit 237b generates and outputs a mode signal "10" to the selecting circuit 236 and control circuit 206.

(5) Summary

Since the subtracting circuit 233b and second comparing circuit 234b are configured in parallel as described above, the LMAX judging circuit 202b can achieve a shorter path between data input and output. As a consequence, the LMAX judging circuit 202b can realize higher-speed processing.

2. Second Embodiment

The following describes an imaging system relating to a second embodiment of the present invention.

The imaging system relating to the second embodiment is constituted by an optical system, a sensor, a converting circuit, an imaging processing circuit, a recording and transmitting system, a playback system, a timing control circuit, and a system control circuit, similarly to the imaging system 100 relating to the first embodiment. Except for a variable-length coding circuit 200b included in the recording and transmitting system, the imaging system relating to the second embodiment has the same construction as the imaging system 100 relating to the first embodiment. Accordingly, the following only describes the variable-length coding circuit 200b, which characterizes the second embodiment.

2.1 Variable-length Coding Circuit 200b

The variable-length coding circuit 200b first judges whether a type of a code to be assigned to a combination (Last, Run, Level) is a normal VLC, an RMAX VLC, or something else. The variable-length coding circuit 200b then generates the code based on the result of the judgment. The following specifically describes a code generating operation of the variable-length coding circuit 200b, and a construction to realize the code generating function.

(Operation of Variable-length Coding Circuit 200b)

Figure 8:
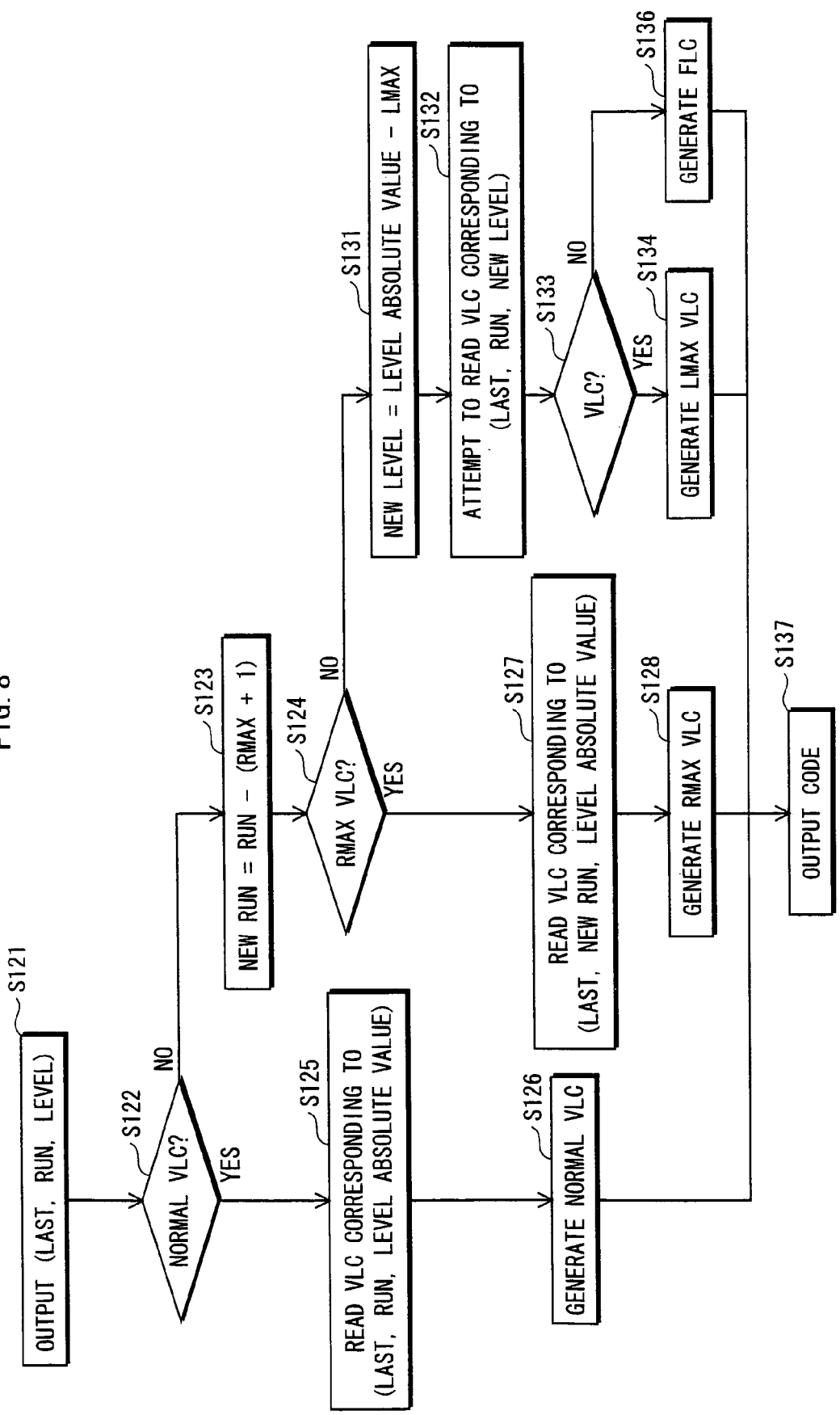
FIG. 8 is a flow chart illustrating an operation of a variable-length coding circuit 200b relating to a second embodiment.

The following describes an operation of the variable-length coding circuit 200b, with reference to a flow chart shown in FIG. 8.

The variable-length coding circuit 200b starts a code generating operation, with an output of data including a combination (Last, Run, Level) to the circuits included in the variable-length coding circuit 200b (step S121). To start with, the variable-length coding circuit 200b judges whether a code to be assigned to the combination (Last, Run, Level) is a normal VLC or not, by comparing an RMAX for a pair of (Last, Level absolute value) and the Run value (step S122). When judging the code to be a normal VLC (step S122:YES), the variable-length coding circuit 200b reads a VLC corresponding a combination (Last, Run, Level absolute value) from a VLC table (step S125), and generates a normal VLC based on the read VLC (step S126). After this, the variable-length coding circuit 200b outputs the generated normal VLC as the code assigned to the combination (Last, Run, Level) (step S137).

When judging the code not to be a normal VLC (step S122: NO), the variable-length coding circuit 200b calculates New Run=the Run value−(the RMAX+1) (step S123). Then, the variable-length coding circuit 200b judges whether the code to be assigned to the combination (Last, Run, Level) is an RMAX VLC, by comparing the calculated New Run with the RMAX (step S124).

When judging the code to be an RMAX VLC (step S124:YES), the variable-length coding circuit 200b reads a VLC corresponding to a combination (Last, New Run, Level absolute value) from the VLC table (step S127). The variable-length coding circuit 200b generates an RMAX VLC based on the read VLC (step S128), and outputs the generated RMAX VLC as the code assigned to the combination (Last, Run, Level) (step S137).

When judging the code not to be an RMAX VLC in the step S124, the variable-length coding circuit 200b calculates New Level=the Level absolute value−an LMAX (step S131). The variable-length coding circuit 200b attempts to read a VLC defined for a combination (Last, Run, New Level) from the VLC table (step S132). If there is a VLC defined for the combination (Last, Run, New Level) on the VLC table (step S133:YES), the variable-length coding circuit 200b generates an LMAX VLC based on the read VLC (step S134). The variable-length coding circuit 200b then outputs the generated LMAX VLC as the code assigned to the combination (Last, Run, Level) (step S137).

When judging there is no VLC corresponding to the combination (Last, Run, New Level) on the VLC table (step S133:NO), the variable-length coding circuit 200b generates an FLC (step S136), and outputs the generated FLC as the code assigned to the combination (Last, Run, Level) (step S137).

(Construction of Variable-length Coding Circuit 200b)

Figure 9:
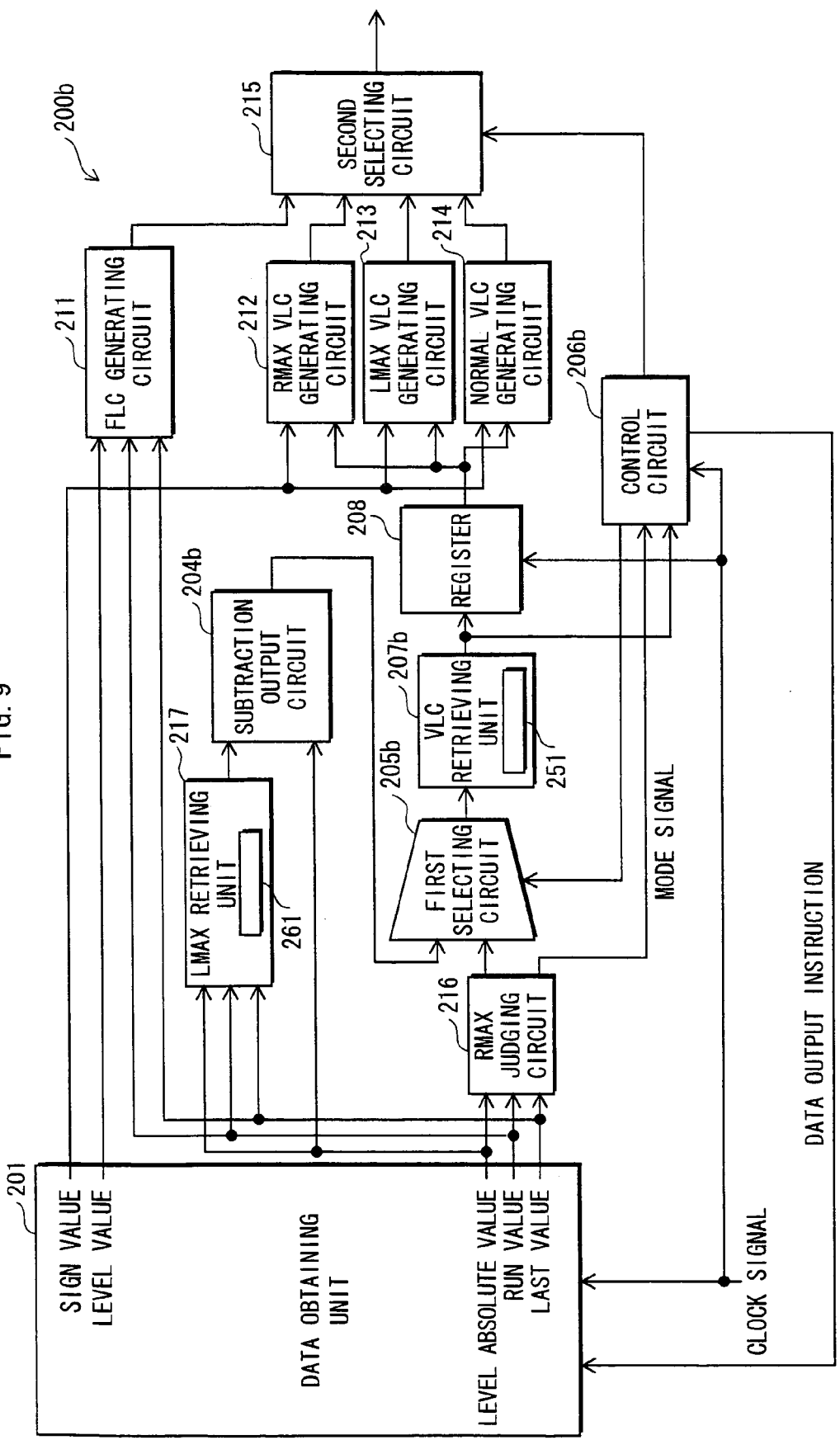
FIG. 9 is a block diagram illustrating a construction of the variable-length coding circuit 200b relating to the second embodiment.

As shown in FIG. 9, the variable-length coding circuit 200b is constituted by the data obtaining unit 201, a subtraction output circuit 204b, a first selecting circuit 205b, a control circuit 206b, a VLC retrieving unit 207b, the register 208, the FLC generating circuit 211, the RMAX VLC generating circuit 212, the LMAX VLC generating circuit 213, the normal VLC generating circuit 214, the second selecting circuit 215, an RMAX judging circuit 216, and an LMAX retrieving unit 217. The data obtaining unit 201, register 208, FLC generating circuit 211, RMAX VLC generating circuit 212, LMAX VLC generating circuit 213, normal VLC generating circuit 214, and the second selecting circuit 215 have the same constructions and perform the same operations as in the first embodiment. Accordingly, these constituents are not described here.

(1) RMAX Judging Circuit 216

Figure 10A:
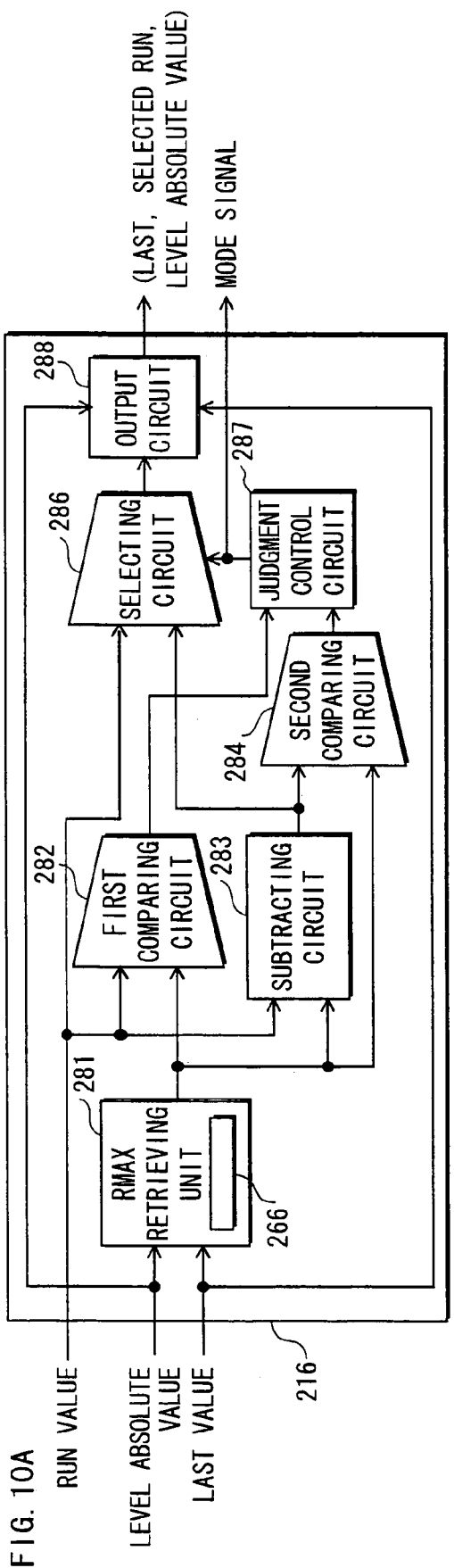
FIGS. 10A and 10B are block diagrams each illustrating an example of a construction of an RMAX judging circuit 216.

As shown in FIG. 10A, the RMAX judging circuit 216 is constituted by an RMAX retrieving unit 281, a first comparing circuit 282, a subtracting circuit 283, a second comparing circuit 284, a selecting circuit 286, a judgment control circuit 287, and an output circuit 288.

(1-1) RMAX Retrieving Unit 281

The RMAX retrieving unit 281 stores thereon the RMAX table 266 shown in FIG. 4C and an RMAX error value "−1". The RMAX table 266 and RMAX error value "−1" are the same as the RMAX table 266 and RMAX error value "−1" stored in the RMAX retrieving unit 203 relating to the first embodiment.

As mentioned above, the Run value in each piece of VLC information indicates one of continuous numbers from 1 to an RMAX, in each group of pieces of VLC information having the same pair of a Last value and a Level absolute value on the VLC table 251. In other words, a VLC is defined, on the VLC table 251, for each of the combinations (Last, 1, Level absolute value), (Last, 2, Level absolute value), (Last, 3, Level absolute value), . . . (Last, RMAX, Level absolute value). Considering this, if RMAX≧Run value, it can be judged that the VLC table 251 has a VLC corresponding to a combination (Last, Run, Level absolute value).

The RMAX retrieving unit 281 receives a Last value and a Level absolute value from the data obtaining unit 201. When receiving the Last value and Level absolute value, the RMAX retrieving unit 281 reads an RMAX corresponding to the received pair (Last, Level absolute value) from the RMAX table 266. The RMAX retrieving unit 281 then outputs the read RMAX to the first comparing circuit 282, subtracting circuit 283, and second comparing circuit 284. Here, if there is no RMAX defined for the received pair (Last, Level absolute value) on the RMAX table 266, the RMAX retrieving unit 281 outputs the RMAX error value "−1" as a substitute for an RMAX.

(1-2) First Comparing Circuit 282

The first comparing circuit 282 receives a Run value from the data obtaining unit 201, and receives an RMAX from the RMAX retrieving unit 281. The first comparing circuit 282 compares the received Run value and RMAX, and sends the result of the comparison to the judgment control circuit 287.

(1-3) Subtracting Circuit 283

The subtracting circuit 283 receives a Run value from the data obtaining unit 201, and receives an RMAX from the RMAX retrieving unit 281. When receiving the Run value and RMAX, the subtracting circuit 283 calculates New Run=the Run value−(the RMAX+1) based on the received Run value and RMAX. The subtracting circuit 283 outputs the calculated New Run to the second comparing circuit 284 and selecting circuit 286.

(1-4) Second Comparing Circuit 284

The second comparing circuit 284 receives an RMAX from the RMAX retrieving unit 281, and receives New Run from the subtracting circuit 283. When receiving the RMAX and New Run, the second comparing circuit 284 compares the received RMAX and New Run, and sends the result of the comparison to the judgment control circuit 287.

(1-5) Judgment Control Circuit 287

The judgment control circuit 287 receives a result of comparing a Run value and an RMAX from the first comparing circuit 282, and receives a result of comparing an RMAX and New Run from the second comparing circuit 284.

When the result of the comparison received from the first comparing circuit 282 indicates the RMAX≧the Run value, it can be judged that there is a VLC corresponding to a combination (Last, Run, Level absolute value) on the VLC table 251, in the light of the configuration of the RMAX table 266 and VLC table 251, as mentioned above. Accordingly, the judgment control circuit 287 ignores the result of the comparison received from the second comparing circuit 284. Subsequently, the judgment control circuit 287 generates a mode signal "00" that indicates that a code to be assigned to a combination (Last, Run, Level) is a normal VLC. The judgment control circuit 287 outputs the generated mode signal "00" to the selecting circuit 286 and control circuit 206b.

When the result of the comparison received from the first comparing circuit 282 indicates the RMAX<the Run value, and the result of the comparison received from the second comparing circuit 284 indicates the RMAX≧the New Run, there is no VLC corresponding to the combination (Last, Run, Level absolute value) on the VLC table 251, but that there is a VLC corresponding to a combination (Last, New Run, Level absolute value) on the VLC table 251. The judgment control circuit 287 therefore generates a mode signal "01". The mode signal "01" indicates that the code to be assigned to the combination (Last, Run, Level) is an RMAX VLC. The judgment control circuit 287 outputs the generated mode signal "01" to the control circuit 206b and selecting circuit 286.

When the result of the comparison received from the first comparing circuit 282 indicates the RMAX<the Run value, and the result of the comparison received from the second comparing circuit 284 indicates the RMAX<the New Run, the judgment control circuit 287 judges that there is neither a VLC corresponding to the combination (Last, Run, Level absolute value) nor a VLC corresponding to the combination (Last, New Run, Level absolute value) on the VLC table 251. The judgment control circuit 287 generates a mode signal "10" which indicates that the code to be assigned to the combination (Last, Run, Level) is neither a normal VLC nor RMAX VLC. The judgment control circuit 287 outputs the generated mode signal "10" to the control circuit 206b and selecting circuit 286.

(1-6) Selecting Circuit 286

The selecting circuit 286 receives a Run value from the data obtaining unit 201, and receives New Run from the subtracting circuit 283. Also, the selecting circuit 286 receives a mode signal from the judgment control circuit 287.

When the received mode signal indicates "00" or "10", the selecting circuit 286 outputs the Run value received from the data obtaining unit 201 to the output circuit 288, as a selected Run.

When the received mode signal indicates "01", the selecting circuit 286 outputs the New Run received from the subtracting circuit 283 to the output circuit 288, as a selected Run.

(1-7) Output Circuit 288

The output circuit 288 receives a Last value and a Level absolute value from the data obtaining unit 201, and receives a selected Run from the selecting circuit 286. After this, the output circuit 288 outputs a combination of (Last, selected Run, Level absolute value) to the first selecting circuit 205b.

(2) LMAX Retrieving Unit 217 and Subtraction Output Circuit 204b

The LMAX retrieving unit 217 stores thereon the LMAX table 261 and an LMAX error value "0". The LMAX table 261 has been described in the first embodiment.

The LMAX error value "0" is data which is output as a substitute for an LMAX, when no LMAX is defined on the LMAX table 261.

The LMAX retrieving unit 217 receives a Last value, a Run value, and a Level absolute value from the data obtaining unit 201. The LMAX retrieving unit 217 reads an LMAX corresponding to the pair of the received Last value and Run value, from the LMAX table 261. The LMAX retrieving unit 217 then outputs the received Last value and Run value, and the read LMAX, to the subtraction output circuit 204b.

Here, if there is no LMAX defined for the pair of the received Last value and Run value on the LMAX table 261, the LMAX retrieving unit 217 outputs the LMAX error value "0" as a substitute for an LMAX.

The subtraction output circuit 204b receives the Last value, Run value, and LMAX from the LMAX retrieving unit 217, and receives a Level absolute value from the data obtaining unit 201.

After this, the subtraction output circuit 204b calculates New Level=the Level absolute value−the LMAX, and outputs a combination (Last, Run, New Level) including the calculated New Level, to the first selecting circuit 205b.

(3) First Selecting Circuit 205b

The first selecting circuit 205b receives a combination (Last, Run, New Level) from the subtraction output circuit 204b, and receives a combination (Last, selected Run, Level absolute value) from the RMAX judging circuit 216. Also, the first selecting circuit 205b receives a selecting instruction from the control circuit 206b. Here, the selecting instruction indicates which to select between the combination (Last, Run, New Level) output from the subtraction output circuit 204b, and the combination (Last, selected Run, Level absolute value) output from the RMAX judging circuit 216.

Based on the received selecting instruction, the first selecting circuit 205b selects one of the combination (Last, Run, New Level) output from the subtraction output circuit 204b, and the combination (Last, selected Run, Level absolute value) output from the RMAX judging circuit 216, and outputs the selected combination to the VLC retrieving unit 207b.

(4) VLC Retrieving Unit 207b

The VLC retrieving unit 207b stores thereon the VLC table 251. The VLC table 251 has been described in the first embodiment.

The VLC retrieving unit 207b receives a combination (Last, Run, New Level) or combination (Last, selected Run, Level absolute value) from the first selecting circuit 205b.

The VLC retrieving unit 207b subsequently attempts to read, from the VLC table 251, a VLC corresponding to the received one of the combination (Last, Run, New Level) and combination (Last, selected Run, Level absolute value). If there is a VLC corresponding to the received one of the combination (Last, Run, New Level) and combination (Last, selected Run, Level absolute value) on the VLC table 251, the VLC retrieving unit 207b reads and outputs the VLC to the register 208, and outputs an OK signal to the control circuit 206b. The OK signal indicates that a VLC has been successfully read.

If there is no VLC corresponding to the received one of the combination (Last, Run, New Level) and combination (Last, selected Run, Level absolute value) on the VLC table 251, the VLC retrieving unit 207b outputs a VLC error signal to the control circuit 206b and register 208. The VLC error signal indicates that there is no corresponding VLC on the VLC table 251.

(5) Control Circuit 206b

The control circuit 206b receives clock signals from the timing control circuit at regular time intervals, and receives a mode signal from the RMAX judging circuit 216.

When the mode signal received from the RMAX judging circuit 216 indicates "00" denoting a normal VLC, the control circuit 206b outputs a selecting instruction, to the first selecting circuit 205b, which indicates a selection of a combination (Last, selected Run, Level absolute value) output from the RMAX judging circuit 216. After this, the control circuit 206b receives, from the VLC retrieving unit 207b, an OK signal indicating that a VLC has been successfully read. When detecting a clock signal after receiving the OK signal, the control circuit 206b outputs a selecting instruction, to the second selecting circuit 215, which indicates a selection of a normal VLC output from the normal VLC generating circuit 214. After this, the control circuit 206b outputs a data output instruction, to the data obtaining unit 201, which requests an output of new data.

When the mode signal received from the RMAX judging circuit 216 indicates "01" denoting an RMAX VLC, the control circuit 206b outputs a selecting instruction, to the first selecting circuit 205b, which indicates a selection of a combination (Last, selected Run, Level absolute value) output from the RMAX judging circuit 216. After this, the control circuit 206b receives, from the VLC retrieving unit 207b, an OK signal indicating that a VLC has been successfully read. When detecting a clock signal after receiving the OK signal, the control circuit 206b outputs a selecting instruction, to the second selecting circuit 215, which indicates a selection of an RMAX VLC output from the RMAX VLC generating circuit 212. After this, the control circuit 206b outputs a data output instruction, to the data obtaining unit 201, which requests an output of new data.

When the mode signal received from the RMAX judging circuit 216 indicates "10" denoting a code other than a normal VLC and an RMAX VLC, the control circuit 206b outputs a selecting instruction, to the first selecting circuit 205b, which indicates a selection of a combination (Last, Run, New Level) output from the subtraction output circuit 204b. After this, the control circuit 206b receives, from the VLC retrieving unit 207b, an OK signal indicating that a VLC has been successfully read, or a VLC error signal indicating that there is no corresponding VLC.

When receiving an OK signal, the control circuit 206b outputs a selecting instruction, to the second selecting circuit 215, which indicates a selection of an LMAX VLC output from the LMAX VLC generating circuit 213, in synchronization with detection of a next clock signal. After this, the control circuit 206b outputs a data output instruction, to the data obtaining unit 201, which requests an output of new data.

When receiving a VLC error signal, the control circuit 206b outputs a selecting instruction, to the second selecting circuit 215, which indicates a selection of an FLC output from the FLC generating circuit 211, in synchronization with detection of a next clock signal. After this, the control circuit 206b outputs a data output instruction, to the data obtaining unit 201, which requests an output of new data.

(6) Operation Cycle of Variable-length Coding Circuit 200b

Figure 11:
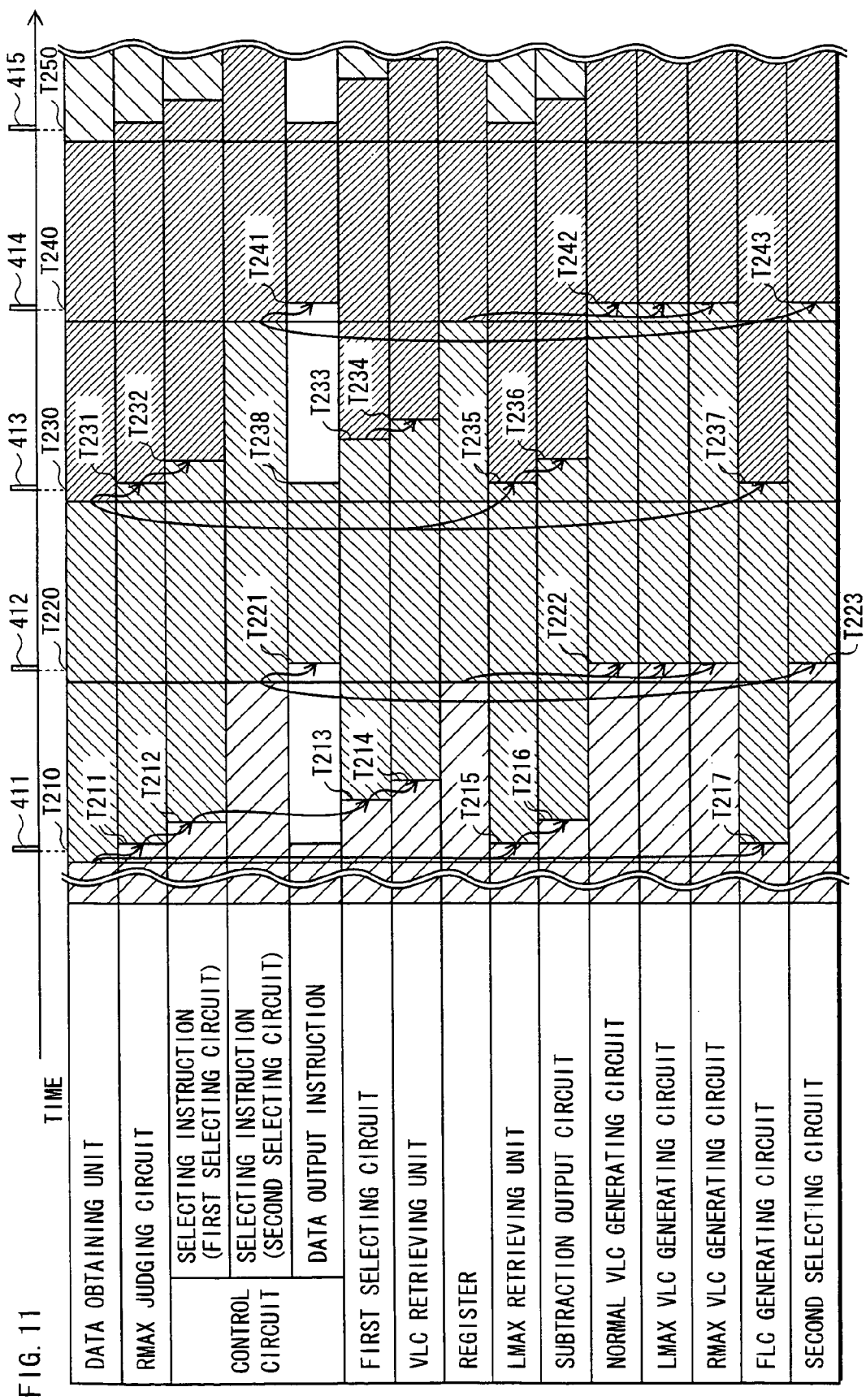
FIG. 11 is a time chart illustrating, in a chronological order, timings of operations of the circuits constituting the variable-length coding circuit 200b.

The following describes an operation cycle of the variable-length coding circuit 200b, with reference to a time chart shown in FIG. 11.

In the time chart shown in FIG. 11, the names of the circuits constituting the variable-length coding circuit 200b are arranged vertically, and a time is plotted horizontally. This time chart illustrates how pieces of data are sequentially processed, in relation to time.

Clock signals 411, 412, 413, 414 and 415 are supplied at regular time intervals, i.e., at times T210, T220, T230, T240, and T250, to the data obtaining unit 201, control circuit 206b, and register 208. Note that a predetermined time interval between clock signals is referred to as a clock cycle.

The arrow shown in FIG. 11 indicates that an operation performed at a circuit specified by the starting point of the arrow at a particular time causes an operation to start at a different circuit specified by the ending point of the arrow at a particular time.

At the time T210, the data obtaining unit 201 detects the clock signal 411, and outputs a Sign value, a Level value, a Level absolute value, a Run value, and a Last value stored thereon, to the RMAX judging circuit 216, LMAX retrieving unit 217, subtraction output circuit 204b, and FLC generating circuit 211. This output continues until the time T230. The output Sign value, Level value, Level absolute value, Run value, and Last value are collectively referred to as data C.

At a time T211, the RMAX judging circuit 216 receives a combination (Last, Run, Level absolute value) included in the data C. The RMAX judging circuit 216 judges a type of a code to be assigned to a combination (Last, Run, Level), based on the received combination (Last, Run, Level absolute value). The RMAX judging circuit 216 generates a mode signal and a combination (Last, selected Run, Level absolute value) as a result of the judgment. The RMAX judging circuit 216 outputs the generated mode signal to the control circuit 206b, and outputs the generated combination (Last, selected Run, Level absolute value) to the first selecting circuit 205b. This output continues until a time T231.

At a time T212, the control circuit 206b receives the mode signal, and outputs a selecting instruction in accordance with the received mode signal to the first selecting circuit 205b. This output continues until a time T232.

At a time T215, the LMAX retrieving unit 217 receives the combination (Last, Run, Level absolute value) included in the data C from the data obtaining unit 201. The LMAX retrieving unit 217 reads an LMAX, and outputs the read LMAX to the subtraction output circuit 204b. This output continues until a time T235.

At a time T216, the subtraction output circuit 204b receives the LMAX from the LMAX retrieving unit 217. The subtraction output circuit 204b calculates New Level based on the received LMAX, and outputs a combination (Last, Run, New Level) including the calculated New Level, to the first selecting circuit 205b. This output continues until a time T236.

At a time T213, the first selecting circuit 205b receives the selecting instruction from the control circuit 206b. In accordance with the received selecting instruction, the first selecting circuit 205b selects and outputs one of the combination (Last, Run, New Level) and the combination (Last, selected Run, Level absolute value) to the VLC retrieving unit 207b. This output continues until a time T233.

At a time T214, the VLC retrieving unit 207b receives one of the combination (Last, Run, New Level) and the combination (Last, selected Run, Level absolute value) from the first selecting circuit 205b, and attempts to read a corresponding VLC from the VLC table 251. If there is a corresponding VLC on the VLC table 251, the VLC retrieving unit 207b outputs the read VLC to the register 208, and outputs an OK signal to the control circuit 206b. This output continues until a time T234. If there is no corresponding VLC on the VLC table 251, the VLC retrieving unit 207b outputs a VLC error signal to the control circuit 206b and register 208. This output also continues until the time T234.

At a time T217, the FLC generating circuit 211 receives the combination (Last, Run, Level) included in the data C from the data obtaining unit 201. The FLC generating circuit 211 generates an FLC based on the received combination (Last, Run, Level), and outputs the generated FLC to the second selecting circuit 215. This output continues until a time T237.

The register 208 receives the VLC from the VLC retrieving unit 207b, and stores thereon the received VLC temporarily. At the time T220, the register 208 detects the clock signal 412. The register 208 then outputs the stored VLC to the normal VLC generating circuit 214, LMAX VLC generating circuit 213, and RMAX VLC generating circuit 212. This output continues until the time T240.

At a time T222, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the second selecting circuit 215. This output continues until a time T242.

At the time T220, the control circuit 206b detects the clock signal 412, and outputs a selecting instruction to the second selecting circuit 215. This output continues until the time T240. The control circuit 206b generates the selecting instruction based on the OK signal or VLC error signal received from the VLC retrieving unit 207b, and the mode signal received from the RMAX judging circuit 216. After outputting the selecting instruction to the second selecting circuit 215, the control circuit 206b outputs a data output instruction requesting an output of new data to the data obtaining unit 201 at a time T221. This output continues until a time T238.

At a time T223, the second selecting circuit 215 receives the selecting instruction from the control circuit 206b. In accordance with the selecting instruction, the second selecting circuit 215 outputs one of the normal VLC, LMAX VLC, RMAX VLC, and FLC, to the buffer included in the recording and transmitting system. This output continues until a time T243.

At the time T230, the data obtaining unit 201 detects the clock signal 413, and receives the data output instruction from the control circuit 206b. Therefore, the data obtaining unit 201 outputs a new set of a Sign value, a Level value, a Level absolute value, a Run value, and a Last value, to the RMAX judging circuit 216, LMAX retrieving unit 217, subtraction output circuit 204b, and FLC generating circuit 211. This output continues until the time T250. The output Sign value, Level value, Level absolute value, Run value, and Last value are collectively referred to as data D.

The data obtaining unit 201, the RMAX judging circuit 216, control circuit 206b, . . . second selecting circuit 215 perform the same procedure for the data D as for the data C. Consequently, the variable-length coding circuit 200b generates and outputs a code corresponding to a combination (Last, Run, Level) included in the data D within two clock cycles.

2.2 Summary

According to the variable-length coding circuit 200b relating to the second embodiment, the RMAX judging circuit 216 judges whether a code to be assigned to a combination (Last, Run, Level) is a normal VLC, an RMAX VLC, or something else.

When the RMAX judging circuit 216 judges the code to be a normal VLC, the variable-length coding circuit 200b reads a VLC corresponding to a combination (Last, Run, Level absolute value) from the VLC table 251, generates a normal VLC based on the read VLC, and outputs the generated normal VLC.

When the RMAX judging circuit 216 judges the code to be an RMAX VLC, the variable-length coding circuit 200b reads a VLC corresponding to a combination (Last, New Run, Level absolute value) from the VLC table 251, generates an RMAX VLC based on the read VLC, and outputs the generated RMAX VLC as the code assigned to the combination (Last, Run, Level).

In parallel to the above-mentioned judging operation performed by the RMAX judging circuit 216, the LMAX retrieving unit 217 reads an LMAX, and the subtraction output circuit 204b calculates New Level.

When the RMAX judging circuit 216 judges that the code to be assigned to the combination (Last, Run, Level) is neither a normal VLC nor RMAX VLC, the variable-length coding circuit 200b attempts to read a VLC corresponding to a combination (Last, Run, New Level) from the VLC table 251. If there is a VLC corresponding to the combination (Last, Run, New Level) on the VLC table 251, the variable-length coding circuit 200b generates an LMAX VLC, and outputs the generated LMAX VLC as the code assigned to the combination (Last, Run, Level).

If there is no VLC corresponding to the combination (Last, Run, New Level) on the VLC table 251, the variable-length coding circuit 200b outputs an FLC generated by the FLC generating circuit 211 as the code assigned to the combination (Last, Run, Level).

In the manner described above, the variable-length coding circuit 200b can generate and output the code assigned to the combination (Last, Run, Level), within two clock cycles, irrespective of whether the code is a normal VLC, LMAX VLC, RMAX VLC, or FLC.

In addition, the variable-length coding circuit 200b searches the VLC table 251 for a VLC only once. Therefore, the variable-length coding circuit 200b is required to have only one VLC table. This can reduce a circuit scale.

2.3 Modification Example of Second Embodiment

Figure 10B:
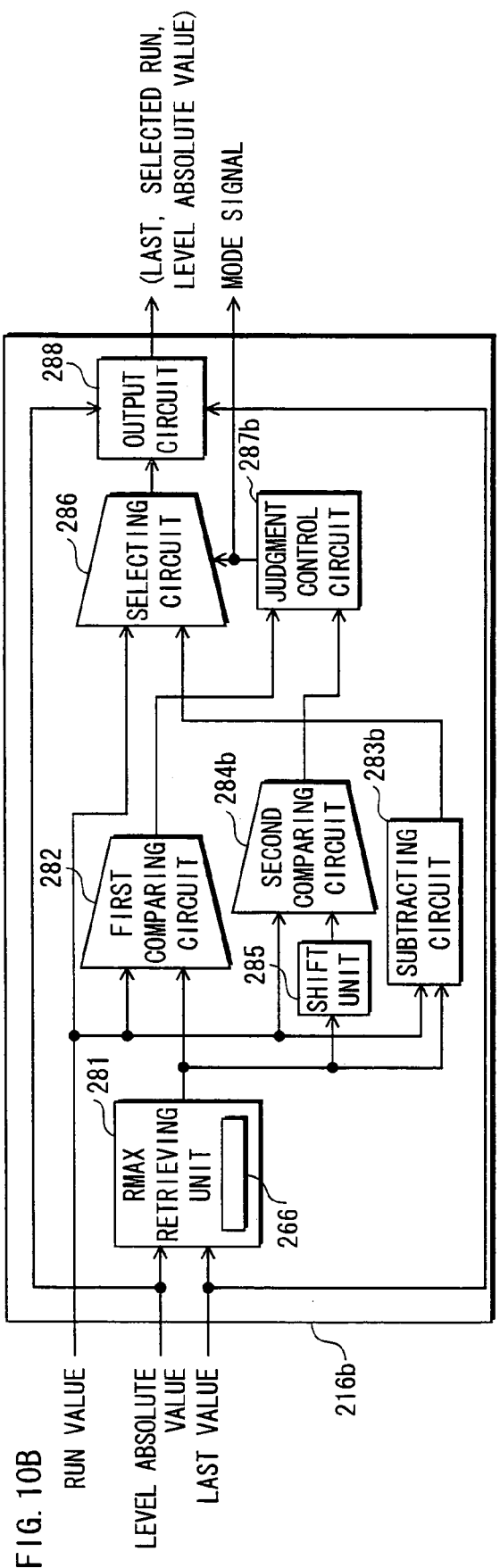

The RMAX judging circuit 216 relating to the second embodiment may be modified to have a construction of an RMAX judging circuit 216b shown in FIG. 10B.

The RMAX judging circuit 216b is constituted by the RMAX retrieving unit 281, the first comparing circuit 282, a subtracting circuit 283b, a second comparing circuit 284b, a shift unit 285, the selecting circuit 286, a judgment control circuit 287b, and the output circuit 288.

The RMAX retrieving unit 281, first comparing circuit 282, selecting circuit 286, and output circuit 288 perform the same operations as the RMAX retrieving unit 281, first comparing circuit 282, selecting circuit 286, and output circuit 288 in the RMAX judging circuit 216, and therefore are not explained here.

(1) Shift Unit 285

The shift unit 285 receives an RMAX from the RMAX retrieving unit 281. When receiving the RMAX, the shift unit 285 shifts the received RMAX by one bit to left, and adds one to the result. The resultant RMAX is hereinafter expressed as 2×RMAX+1. Subsequently, the shift unit 285 outputs the 2×RMAX+1 to the second comparing circuit 284b.

(2) Second Comparing Circuit 284b

The second comparing circuit 284b receives a Run value from the data obtaining unit 201, and receives 2×RMAX+1 from the shift unit 285. The second comparing circuit 284b compares the received Run value and 2×RMAX+1, and outputs the result of the comparison to the judgment control circuit 287b.

(3) Subtracting Circuit 283b

The subtracting circuit 283b calculates New Run=a Run value−(an RMAX+1), similarly to the subtracting circuit 283. The subtracting circuit 283b outputs the calculated New Run to the selecting circuit 286.

(4) Judgment Control Circuit 287b

The judgment control circuit 287b receives a result of comparing a Run value and an RMAX from the first comparing circuit 282, and receives a result of comparing the Run value and 2×RMAX+1 from the second comparing circuit 284b.

When the result of the comparison received from the first comparing circuit 282 indicates the RMAX≧the Run value, the judgment control circuit 287b ignores the result of the comparison received from the second comparing circuit 284b, and generates and outputs a mode signal "00" to the selecting circuit 286 and control circuit 206b.

When the result of the comparison received from the first comparing circuit 282 indicates the RMAX<the Run value, and the result of the comparison received from the second comparing circuit 284b indicates the 2×RMAX+1≧the Run value, the judgment control circuit 287b generates and outputs a mode signal "01" to the selecting circuit 286 and control circuit 206b.

When the result of the comparison received from the first comparing circuit 282 indicates the RMAX<the Run value, and the result of the comparison received from the second comparing circuit 284b indicates the 2×RMAX+1<the Run value, the judgment control circuit 287b generates and outputs a mode signal "10" to the selecting circuit 286 and control circuit 206b.

As shown in FIG. 10B, the subtracting circuit 283b and second comparing circuit 284b are arranged in parallel. By doing this, the RMAX judging circuit 216b can achieve a shorter path between data input and output. As a consequence, the RMAX judging circuit 216b can realize higher-speed processing.

3. Third Embodiment

The following describes an imaging system relating to a third embodiment of the present invention.

Similarly to the imaging system 100 relating to the first embodiment, the imaging system relating to the third embodiment is constituted by an optical system, a sensor, a converting circuit, an image processing circuit, a recording and transmitting system, a playback system, a timing control circuit, and a system control circuit. Except for a variable-length coding circuit 200c included in the recording and transmitting system, the third embodiment is the same as the first embodiment. Accordingly, the following only describes the variable-length coding circuit 200c.

3.1 Variable-length Coding Circuit 200c

The variable-length coding circuit 200c judges which one of a normal VLC, an LMAX VLC, an RMAX VLC, and an FLC is to be assigned to a combination (Last, Run, Level), and generates a code based on the result of the judgment. The following describes a code generating operation of the variable-length coding circuit 200c, and a construction to realize the code generating function.

(Operation of Variable-length Coding Circuit 200c)

Figure 12:
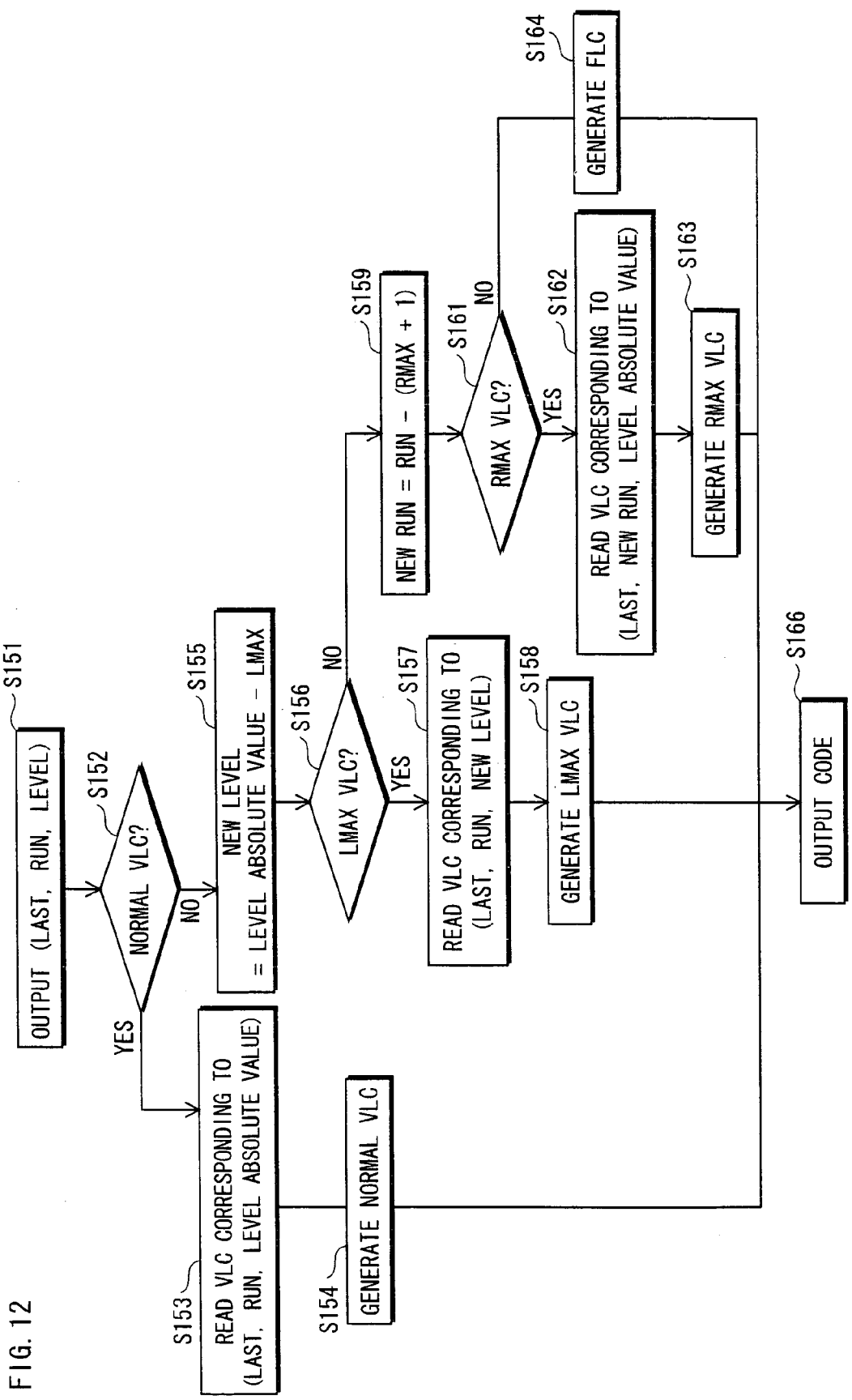
FIG. 12 is a flow chart illustrating an operation of a variable-length coding circuit 200c relating to a third embodiment.

The following describes an operation of the variable-length coding circuit 200c, with reference to a flow chart shown in FIG. 12.

The variable-length coding circuit 200c starts a code generating operation, with an output of data including a combination (Last, Run, Level) to the circuits included in the variable-length coding circuit 200c (step S151). To start with, the variable-length coding circuit 200c judges whether a code to be assigned to the combination (Last, Run, Level) is a normal VLC or not, by comparing a Level absolute value and an LMAX (step S152). When judging the code to be a normal VLC (step S152:YES), the variable-length coding circuit 200c reads a VLC corresponding a combination (Last, Run, Level absolute value) from a VLC table (step S153), and generates a normal VLC based on the read VLC (step S154). After this, the variable-length coding circuit 200c outputs the generated normal VLC (step S166).

When judging the code not to be a normal VLC (step S152:NO), the variable-length coding circuit 200c calculates New Level=the Level absolute value−the LMAX (step S155). Then, the variable-length coding circuit 200c judges whether the code to be assigned to the combination (Last, Run, Level) is an LMAX VLC, by comparing the calculated New Level with the LMAX (step S156). When judging the code to be an LMAX VLC (step S156:YES), the variable-length coding circuit 200c reads a VLC corresponding to a combination (Last, Run, New Level) from the VLC table (step S157). The variable-length coding circuit 200c generates an LMAX VLC based on the read VLC (step S158), and outputs the generated LMAX VLC (step S166).

When judging the code not to be an LMAX VLC in the step S156, the variable-length coding circuit 200c calculates New Run=the Run value−(an RMAX+1) (step S159). The variable-length coding circuit 200c judges whether the code to be assigned to the combination (Last, Run, Level) is an RMAX VLC, by comparing the calculated New Run with the RMAX (step S161). When judging the code to be an RMAX VLC (step S161:YES), the variable-length coding circuit 200c reads a VLC corresponding to a combination (Last, New Run, Level absolute value) from the VLC table (step S162). The variable-length coding circuit 200c generates an RMAX VLC based on the read VLC (step S163), and outputs the generated RMAX VLC (step S166).

When judging the code not to be an RMAX VLC in the step S161, the variable-length coding circuit 200c generates an FLC based on the combination (Last, Run, Level) (step S164), and outputs the generated FLC (step S166).

(Construction of Variable-length Coding Circuit 200c)

Figure 13:
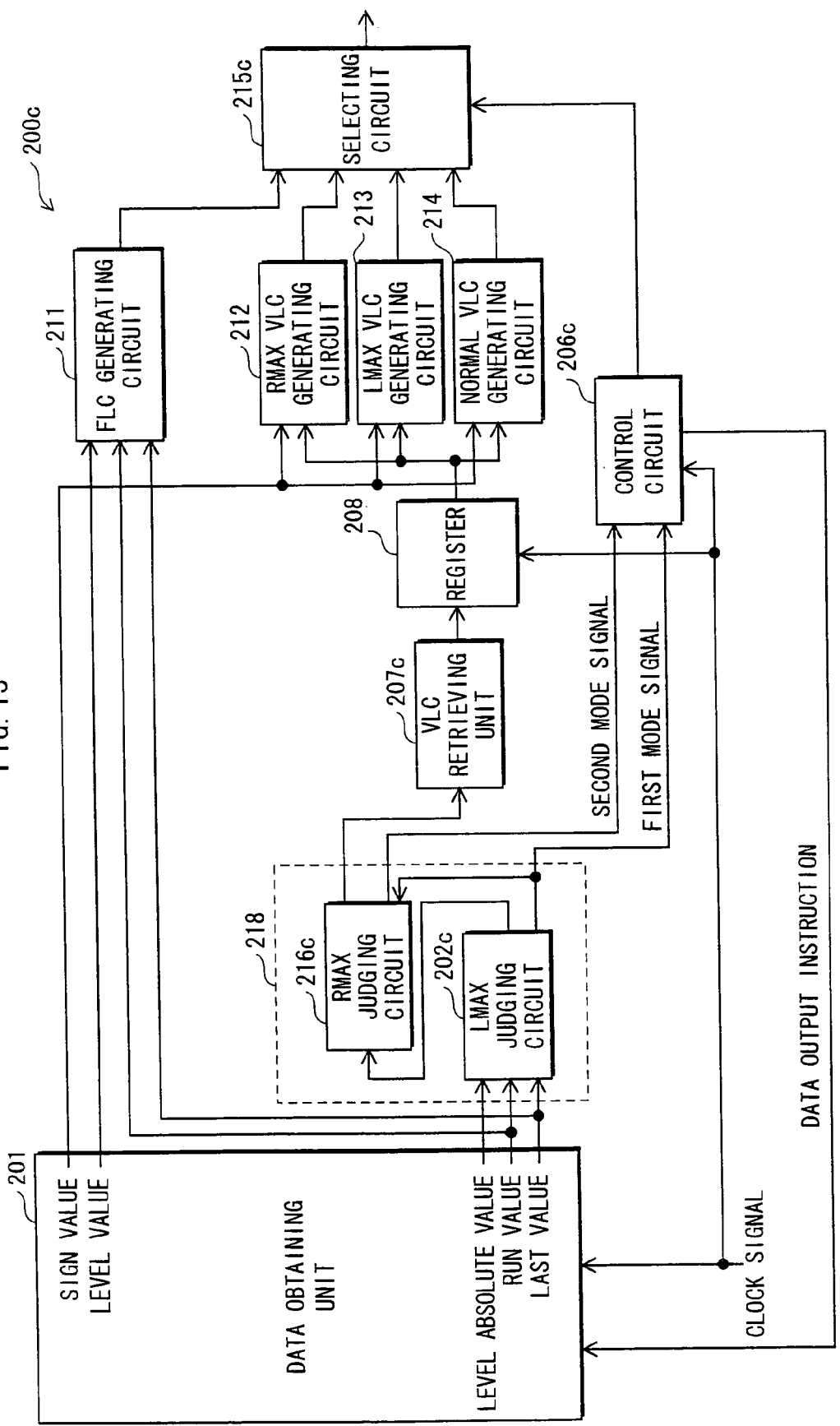
FIG. 13 is a block diagram illustrating a construction of the variable-length coding circuit 200c.

As shown in FIG. 13, the variable-length coding circuit 200c is constituted by the data obtaining unit 201, a control circuit 206c, a VLC retrieving unit 207c, the register 208, the FLC generating circuit 211, the RMAX VLC generating circuit 212, the LMAX VLC generating circuit 213, the normal VLC generating circuit 214, a selecting circuit 215c, and an escape mode judging circuit 218. The escape mode judging circuit 218 includes an LMAX judging circuit 202c and an RMAX judging circuit 216c.

The data obtaining unit 201, register 208, FLC generating circuit 211, RMAX VLC generating circuit 212, LMAX VLC generating circuit 213, and normal VLC generating circuit 214 have the same constructions and perform the same operations as in the first embodiment. Also, the selecting circuit 215c has the same construction and performs the same operation as the second selecting circuit 215 relating to the first embodiment. Therefore, these constituents are not described in the following.

(1) Escape Mode Judging Circuit 218

As shown in FIG. 13, the escape mode judging circuit 218 is constituted by the LMAX judging circuit 202c and RMAX judging circuit 216c.

The LMAX judging circuit 202c is the same as the LMAX judging circuit 202 relating to the first embodiment in terms of construction and operation. In detail, the LMAX judging circuit 202c receives a Last value, a Run value, and a Level absolute value from the data obtaining unit 201, and outputs a mode signal and a combination (Last, Run, selected Level). Here, the LMAX judging circuit 202c outputs the mode signal and combination (Last, Run, selected Level) to the RMAX judging circuit 216c, and outputs the mode signal to the control circuit 206c. For better intelligibility, the mode signal output by the LMAX judging circuit 202c is referred to as a first mode signal, and a mode signal output by the RMAX judging circuit 216c is referred to as a second mode signal.

The RMAX judging circuit 216c is constituted by an RMAX retrieving unit, a first comparing circuit, a subtracting circuit, a second comparing circuit, a selecting circuit, a judgment control circuit, and an output circuit, similarly to the RMAX judging circuit 216 relating to the second embodiment.

The RMAX retrieving unit, first comparing circuit, subtracting circuit, second comparing circuit, selecting circuit, and output circuit respectively perform the same operations on the combination (Last, Run, selected Level) output from the LMAX judging circuit 202c, as the RMAX retrieving unit 281, first comparing circuit 282, subtracting circuit 283, second comparing circuit 284, selecting circuit 286, and output circuit 288 included in the RMAX judging circuit 216 relating to the second embodiment. Thus, the RMAX judging circuit 216c outputs a combination (Last, selected Run, selected Level) to the VLC retrieving unit 207c.

The judgment control circuit receives the first mode signal from the LMAX judging circuit 202c. When the received first mode signal indicates "01", the judgment control circuit ignores comparison results received from the first comparing circuit and second comparing circuit. The judgment control circuit generates a second mode signal "00", and outputs the generated second mode signal "00" to the control circuit 206c and selecting circuit in the RMAX judging circuit 216c.

When the first mode signal received from the LMAX judging circuit 202c indicates "00" or "10", the judgment control circuit performs the same operation as the judgment control circuit 287 included in the RMAX judging circuit 216 relating to the second embodiment. Thus, the judgment control circuit outputs a second mode signal to the control circuit 206c and selecting circuit included in the RMAX judging circuit 216c.

(2) VLC Retrieving Unit 207c

The VLC retrieving unit 207c stores thereon the VLC table 251 shown in FIG. 4A. The VLC table 251 has been described in the first embodiment.

The VLC retrieving unit 207c receives a combination (Last, selected Run, selected Level) from the escape mode judging circuit 218. When receiving the combination (Last, selected Run, selected Level), the VLC retrieving unit 207c subsequently attempts to read, from the VLC table 251, a VLC corresponding to the received combination (Last, selected Run, selected Level). The VLC retrieving unit 207c outputs the read VLC to the register 208c.

If there is no VLC corresponding to the received combination (Last, selected Run, selected Level) on the VLC table 251, the VLC retrieving unit 207c outputs a VLC error signal to the register 208.

(3) Control Circuit 206c

The control circuit 206c receives clock signals from the timing control circuit at regular time intervals, and receives a first mode signal and a second mode signal from the escape mode judging circuit 218.

When receiving the first and second mode signals, the control circuit 206c outputs a selecting instruction to the selecting circuit 215c in synchronization with detection of a next clock signal. The selecting instruction indicates a selection of one of a normal VLC output from the normal VLC generating circuit 214, an LMAX VLC output from the LMAX VLC generating circuit 213, an RMAX VLC output from the RMAX VLC generating circuit 212, and an FLC output from the FLC generating circuit 211. The following explains the selecting instruction output from the control circuit 206c in detail with reference to FIG. 14, and an operation performed by the control circuit 206c after outputting the selecting instruction.

FIG. 14 illustrates a correspondence between a combination of first and second mode signals and a selecting instruction output from the control circuit 206c to the selecting circuit 215c. The alphabetical letter "N" in "SELECTING INSTRUCTION" section indicates that a selecting instruction output to the selecting circuit 215c instructs a selection of a normal VLC output from the normal VLC generating circuit 214. The letter "L" indicates that a selecting instruction output to the selecting circuit 215c instructs a selection of an LMAX VLC output from the LMAX VLC generating circuit 213. The letter "R" indicates that a selecting instruction output to the selecting circuit 215c instructs a selection of an RMAX VLC output from the RMAX VLC generating circuit 212. The letter "F" indicates that a selecting instruction output to the selecting circuit 215c instructs a selection of an FLC output from the FLC generating circuit 211.

It should be noted that there is no such a case where a first mode signal indicates "00" and a second mode signal indicates "01" or "10", considering the constructions of the VLC table 251, LMAX table 261, and RMAX table 266. Similarly, there is no such a case where a first mode signal indicates "10" and a second mode signal indicates "00".

When the received first mode signal and second mode signal respectively indicate "00" and "00", the control circuit 206c outputs a selecting instruction instructing a selection of a normal VLC output from the normal VLC generating circuit 214.

When the received first mode signal and second mode signal respectively indicate "01" and "00", the control circuit 206c outputs a selecting instruction instructing a selection of an LMAX VLC output from the LMAX VLC generating circuit 213.

When the received first mode signal and second mode signal respectively indicate "10" and "01", the control circuit 206c outputs a selecting instruction instructing a selection of an RMAX VLC output from the RMAX VLC generating circuit 212.

When the received first mode signal and second mode signal respectively indicate "10" and "10", the control circuit 206c outputs a selecting instruction instructing a selection of an FLC output from the FLC generating circuit 211.

After outputting the selecting instruction which is determined in the manner described above to the selecting circuit 215c, the control circuit 206c outputs a data output instruction, to the data obtaining unit 201, which requests an output of new data.

(4) Operation Cycle of Variable-length Coding Circuit 200c

Figure 15:
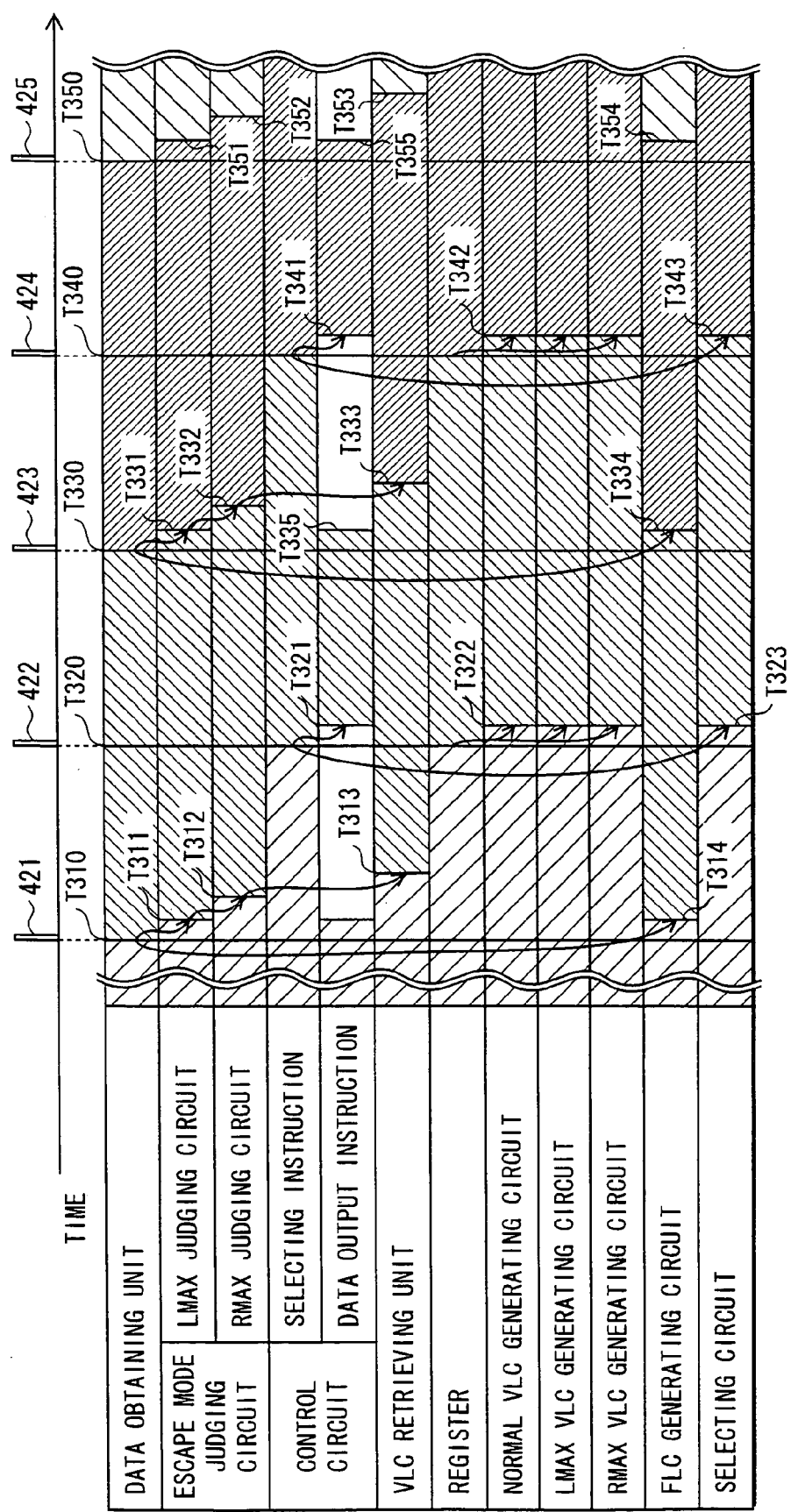
FIG. 15 is a time chart illustrating timings of operations of the circuits constituting the variable-length coding circuit 200c.

The following describes an operation cycle of the variable-length coding circuit 200c, with reference to a time chart shown in FIG. 15.

In the time chart shown in FIG. 15, the names of the circuits constituting the variable-length coding circuit 200c are arranged vertically, and a time is plotted horizontally. This time chart illustrates how pieces of data are sequentially processed, in relation to time.

Clock signals 421, 422, 423, 424 and 425 are supplied at regular time intervals, i.e., at times T310, T320, T330, T340, and T350, to the data obtaining unit 201, control circuit 206c, and register 208.

The arrow shown in FIG. 15 indicates that an operation performed at a circuit specified by the starting point of the arrow at a particular time causes an operation to start at a different circuit specified by the ending point of the arrow at a particular time.

At the time T310, the data obtaining unit 201 detects the clock signal 421, and outputs a Sign value, a Level value, a Level absolute value, a Run value, and a Last value stored thereon, to the escape mode judging circuit 218 and FLC generating circuit 211. This output continues until the time T330. The output Sign value, Level value, Level absolute value, Run value, and Last value are collectively referred to as data E.

At a time T311, the LMAX judging circuit 202c in the escape mode judging circuit 218 receives a combination (Last, Run, Level absolute value) included in the data E. The LMAX judging circuit 202c judges a type of a code to be assigned to a combination (Last, Run, Level), based on the received combination (Last, Run, Level absolute value). The LMAX judging circuit 202c generates a first mode signal and a combination (Last, Run, selected Level) as a result of the judgment. The LMAX judging circuit 202c outputs the generated first mode signal to the control circuit 206c, and outputs the generated first mode signal and combination (Last, Run, selected Level) to the RMAX judging circuit 216c. This output continues until a time T331.

At a time T312, the RMAX judging circuit 216c receives the first mode signal and combination (Last, Run, selected Level) from the LMAX judging circuit 202c. The RMAX judging circuit 216c judges the type of the code to be assigned to the combination (Last, Run, Level), based on the received first mode signal and combination (Last, Run, selected Level). The RMAX judging circuit 216c generates a second mode signal and a combination (Last, selected Run, selected Level) as a result of the judgment. The RMAX judging circuit 216c outputs the generated second mode signal to the control circuit 206c, and outputs the generated combination (Last, selected Run, selected Level) to the VLC retrieving unit 207c. This output continues until a time T332.

At a time T313, the VLC retrieving unit 207c receives the combination (Last, selected Run, selected Level) from the escape mode judging circuit 218, and attempts to read a VLC, from the VLC table 251, corresponding to the received combination (Last, selected Run, selected Level). If there is a corresponding VLC on the VLC table 251, the VLC retrieving unit 207c outputs the read VLC to the register 208. If there is no corresponding VLC on the VLC table 251, the VLC retrieving unit 207c outputs a VLC error signal to the register 208. This output continues until a time T333.

At a time T314, the FLC generating circuit 211 receives the combination (Last, Run, Level) included in the data E from the data obtaining unit 201. The FLC generating circuit 211 generates an FLC based on the received combination (Last, Run, Level), and outputs the generated FLC to the selecting circuit 215c. This output continues until a time T334.

The register 208 receives the VLC from the VLC retrieving unit 207c, and stores thereon the received VLC temporarily. At the time T320, the register 208 detects the clock signal 422. The register 208 then outputs the stored VLC to the normal VLC generating circuit 214, LMAX VLC generating circuit 213, and RMAX VLC generating circuit 212. This output continues until the time T340.

At a time T322, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the selecting circuit 215c. This output continues until a time T342.

At the time T320, the control circuit 206c detects the clock signal 422, and outputs a selecting instruction to the selecting circuit 215c. This output continues until the time T340. The control circuit 206c generates the selecting instruction based on the first and second mode signals received from the escape mode judging circuit 218. After outputting the selecting instruction to the selecting circuit 215c, the control circuit 206c outputs a data output instruction requesting an output of new data to the data obtaining unit 201 at a time T321. This output continues until a time T335.

At a time T323, the selecting circuit 215c receives the selecting instruction from the control circuit 206c. In accordance with the received selecting instruction, the selecting circuit 215c selects and outputs one of the normal VLC, LMAX VLC, RMAX VLC, and FLC, to the buffer included in the recording and transmitting system. This output continues until a time T343.

At the time T330, the data obtaining unit 201 detects the clock signal 423, and receives the data output instruction from the control circuit 206c. When receiving the data output instruction, the data obtaining unit 201 outputs a new set of a Sign value, a Level value, a Level absolute value, a Run value, and a Last value, to the escape mode judging circuit 218 and FLC generating circuit 211. This output continues until the time T350. The output Sign value, Level value, Level absolute value, Run value, and Last value are collectively referred to as data F.

The data obtaining unit 201, escape mode judging circuit 218, control circuit 206c, . . . selecting circuit 215c in the variable-length coding circuit 200c perform the same procedure for the data F as for the data E. Consequently, the variable-length coding circuit 200c generates and outputs a code corresponding to a combination (Last, Run, Level) included in the data F within two clock cycles.

3.3 Summary

According to the variable-length coding circuit 200c relating to the third embodiment, the LMAX judging circuit 202c and RMAX judging circuit 216c included in the escape mode judging circuit 218 judge which one of a normal VLC, an LMAX VLC, an RMAX VLC, and an FLC is to be assigned to a combination (Last, Run, Level). The escape mode judging circuit 218 appropriately selects a combination (Last, selected Run, selected Level) based on the judgment. The variable-length coding circuit 200c reads a VLC corresponding to the selected combination (Last, selected Run, selected Level) from the VLC table 251, and generates a code.

In the manner described above, the variable-length coding circuit 200c can generate and output the code assigned to the combination (Last, Run, Level), within two clock cycles, irrespective of whether the code is a normal VLC, LMAX VLC, RMAX VLC, or FLC.

In addition, the escape mode judging circuit 218 judges the type of the code to be assigned to the combination (Last, Run, Level) before a VLC is read from the VLC table 251. For this construction, the VLC table 251 is searched for a VLC only once. As a result, the variable-length coding circuit 200c is required to have only one VLC table. This can reduce the circuit scale.

3.4 First Modification Example of Third Embodiment

According to the third embodiment, the variable-length coding circuit 200c includes the escape mode judging circuit 218 constituted by the LMAX judging circuit 202c and RMAX judging circuit 216c. However, the third embodiment may be modified, and a variable-length coding circuit 200d shown in FIG. 16 including an escape mode judging circuit 218d is realized.

Figure 16:
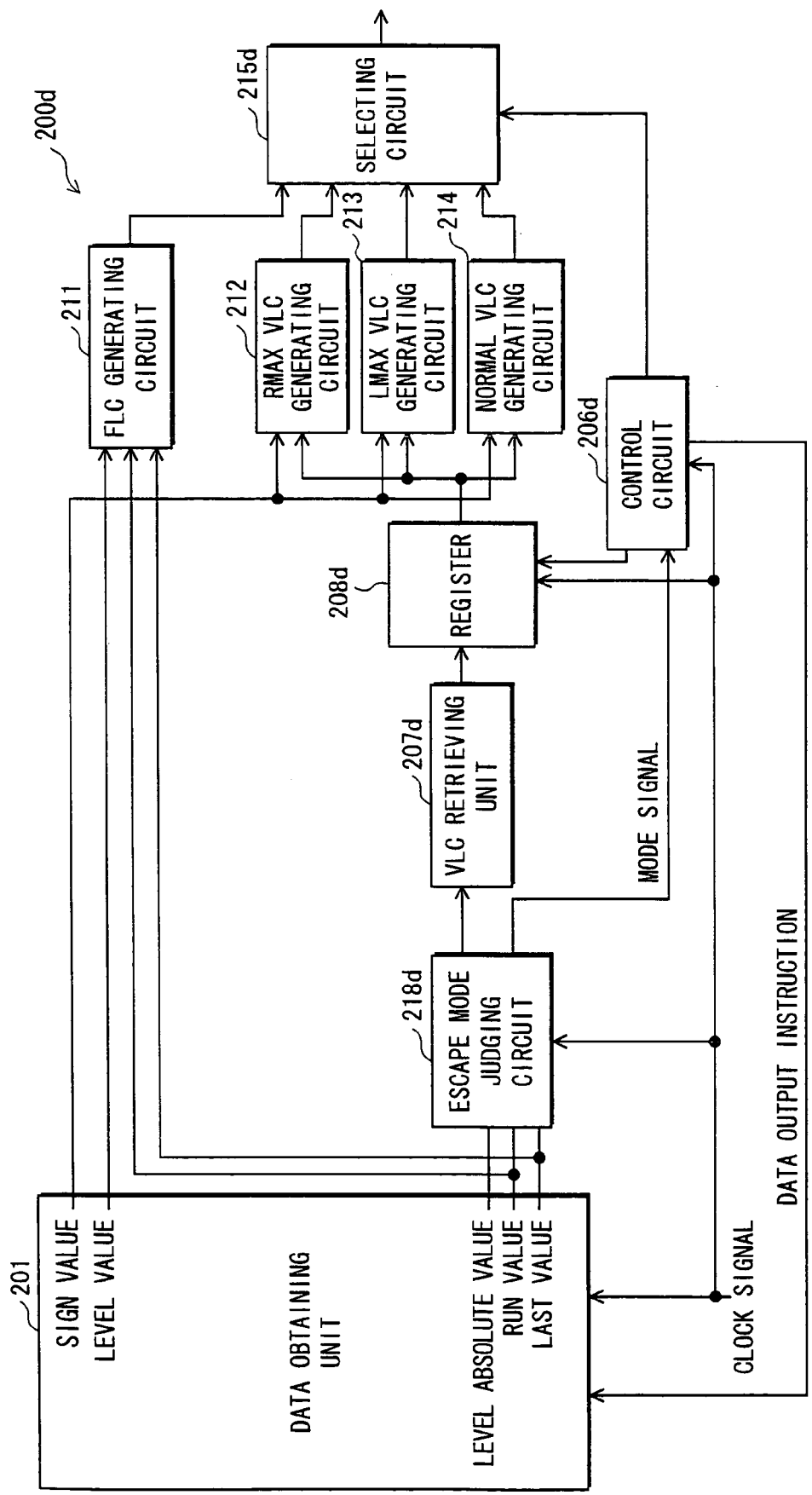
FIG. 16 is a block diagram illustrating a construction of a variable-length coding circuit 200d.

The variable-length coding circuit 200d is constituted by the data obtaining unit 201, a control circuit 206d, a VLC retrieving unit 207d, a register 208d, the FLC generating circuit 211, the RMAX VLC generating circuit 212, the LMAX VLC generating circuit 213, the normal VLC generating circuit 214, a selecting circuit 215d, and the escape mode judging circuit 218d, as shown in FIG. 16. The data obtaining unit 201, VLC retrieving unit 207d, FLC generating circuit 211, RMAX VLC generating circuit 212, LMAX VLC generating circuit 213, normal VLC generating circuit 214, and selecting circuit 215d have the same constructions, and perform the same operations as in the third embodiment. Therefore, these constituents are not described in the following.

(1) Escape Mode Judging Circuit 218d

Figure 17:
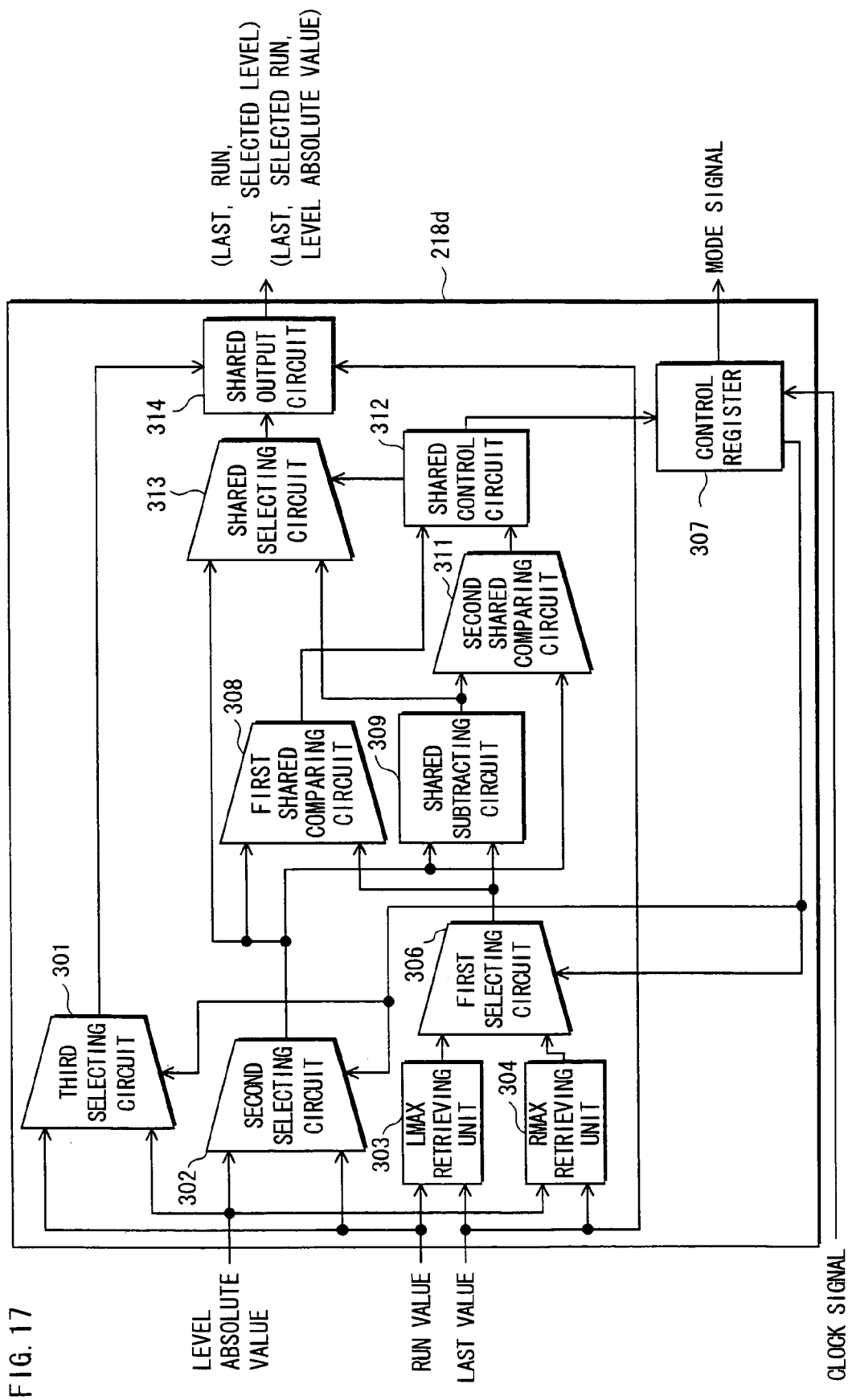
FIG. 17 is a block diagram illustrating a construction of an escape mode judging circuit 218d.

As shown in FIG. 17, the escape mode judging circuit 218d is constituted by a third selecting circuit 301, a second selecting circuit 302, an LMAX retrieving unit 303, an RMAX retrieving unit 304, a first selecting circuit 306, a control register 307, a first shared comparing circuit 308, a shared subtracting circuit 309, a second shared comparing circuit 311, a shared control circuit 312, a shared selecting circuit 313, and a shared output circuit 314.

(First Selecting Circuit 306, Second Selecting Circuit 302, and Third Selecting Circuit 301)

The first selecting circuit 306 receives an LMAX from the LMAX retrieving unit 303, and receives an RMAX from the RMAX retrieving unit 304. Also, the first selecting circuit 306 receives, from the control register 307, a selecting instruction indicating one of the LMAX retrieving unit 303 and RMAX retrieving unit 304. When receiving this selecting instruction, the first selecting circuit 306 selects and outputs one of the LMAX output from the LMAX retrieving unit 303 and the RMAX output from the RMAX retrieving unit 304, to the first shared comparing circuit 308, shared subtracting circuit 309, and second shared comparing circuit 311.

The second selecting circuit 302 receives a Run value and a Level absolute value from the data obtaining unit 201, and receives a selecting instruction indicating a selection of one of the Run value and Level absolute value, from the control register 307. When receiving the selecting instruction, the second selecting circuit 302 outputs one of the Run value and Level absolute value, to the shared selecting circuit 313, first shared comparing circuit 308, and shared subtracting circuit 309, in accordance with the received selecting instruction.

The third selecting circuit 301 receives a Run value and a Level absolute value from the data obtaining unit 201, and receives a selecting instruction indicating a selection of one of the Run value and Level absolute value from the control register 307. When receiving the selecting instruction, the third selecting circuit 301 outputs one of the Run value and Level absolute value, to the shared output circuit 314, in accordance with the received selecting instruction.

(LMAX Retrieving Unit 303 and RMAX Retrieving Unit 304)

The LMAX retrieving unit 303 stores thereon the LMAX table 261 and LMAX error value "0", similarly to the LMAX retrieving unit 231 relating to the first embodiment. The LMAX retrieving unit 303 attempts to read an LMAX corresponding to a pair of a Last value and a Run value received from the data obtaining unit 201, and outputs the read LMAX to the first selecting circuit 306. If there is no corresponding LMAX on the LMAX table 261, the LMAX retrieving unit 303 outputs the LMAX error value "0" as a substitute for the LMAX.

The RMAX retrieving unit 304 stores thereon the RMAX table 266 and RMAX error value "−1", similarly to the RMAX retrieving unit 281 relating to the second embodiment. The RMAX retrieving unit 304 attempts to read an RMAX corresponding to a pair of a Last value and a Level absolute value received from the data obtaining unit 201, and outputs the read RMAX to the first selecting circuit 306. If there is no corresponding RMAX on the RMAX table 266, the RMAX retrieving unit 304 outputs the RMAX error value "−1" as a substitute for the LMAX to the first selecting circuit 306.

(First Shared Comparing Circuit 308)

The first shared comparing circuit 308 receives one of a Level absolute value and a Run value from the second selecting circuit 302. Also, the first shared comparing circuit 308 receives one of an LMAX and an RMAX from the first selecting circuit 306. Here, when receiving a Level absolute value from the second selecting circuit 302, the first shared comparing circuit 308 receives an LMAX from the first selecting circuit 306. When receiving a Run value from the second selecting circuit 302, the first shared comparing circuit 308 receives an RMAX from the first selecting circuit 306.

When receiving a Level absolute value and an LMAX, the first shared comparing circuit 308 compares the received Level absolute value and LMAX, and outputs the result of the comparison to the shared control circuit 312. When receiving a Run value and an RMAX, the first shared comparing circuit 308 compares the received Run value and RMAX, and outputs the result of the comparison to the shared control circuit 312.

(Shared Subtracting Circuit 309)

The shared subtracting circuit 309 receives one of an LMAX and an RMAX from the first selecting circuit 306. Also, the shared subtracting circuit 309 receives one of a Level absolute value and a Run value from the second selecting circuit 302. Here, when receiving an LMAX from the first selecting circuit 306, the shared subtracting circuit 309 receives a Level absolute value from the second selecting circuit 302. When receiving an RMAX from the first selecting circuit 306, the shared subtracting circuit 309 receives a Run value from the second selecting circuit 302.

When receiving a Level absolute value and an LMAX, the shared subtracting circuit 309 calculates New Level=the Level absolute value−the LMAX, and outputs the calculated New Level to the shared selecting circuit 313 and second shared comparing circuit 311.

When receiving a Run value and an RMAX, the shared subtracting circuit 309 calculates New Run=the Run value−(the RMAX+1), and outputs the calculated New Run to the shared selecting circuit 313 and second shared comparing circuit 311.

(Second Shared Comparing Circuit 311)

The second shared comparing circuit 311 receives one of an LMAX and an RMAX from the first selecting circuit 306. Also, the second shared comparing circuit 311 receives one of New Level and New Run from the shared subtracting circuit 309.

When receiving an LMAX and New Level, the second shared comparing circuit 311 compares the received LMAX and New Level, and outputs the result of the comparison to the shared control circuit 312.

When receiving an RMAX and New Run, the second shared comparing circuit 311 compares the received RMAX and New Run, and outputs the result of the comparison to the shared control circuit 312.

(Shared Selecting Circuit 313)

The shared selecting circuit 313 receives one of a Level absolute value and a Run value from the second selecting circuit 302, and receives one of New Level and New Run from the shared subtracting circuit 309. Furthermore, the shared selecting circuit 313 receives a mode signal from the shared control circuit 312.

Suppose the shared selecting circuit 313 receives a Level absolute value, New Level and a mode signal. When the received mode signal indicates "00" or "10", the shared selecting circuit 313 selects and outputs the Level absolute value received from the second selecting circuit 302 to the shared output circuit 314 as a selected Level. When the received mode signal indicates "01", the shared selecting circuit 313 selects and outputs the New Level received from the shared subtracting circuit 309 to the shared output circuit 314 as the selected Level.

Suppose the shared selecting circuit 313 receives a Run value, New Run and a mode signal. When the received mode signal indicates "00" or "10", the shared selecting circuit 313 selects and outputs the Run value received from the second selecting circuit 302 to the shared output circuit 314 as a selected Run. When the received mode signal indicates "01", the shared selecting, circuit 313 selects and outputs the New Run received from the shared subtracting circuit 309 to the shared output circuit 314 as the selected Run.

(Control Register 307)

The control register 307 stores a variety of instructions including a selecting instruction.

Furthermore, the control register 307 includes a clock counter that counts the number of times of receiving a clock signal, from zero to two. The clock counter is initially set to indicate zero.

The control register 307 receives clock signals at regular time intervals from the timing control circuit.

Suppose the control register 307 receives a clock signal when the clock counter indicates zero. In this case, the control register 307 adds one to the value indicated by the clock counter. After this, the control register 307 outputs a selecting instruction indicating a selection of an LMAX output from the LMAX retrieving unit 303 to the first selecting circuit 306, outputs a selecting instruction indicating a selection of a Level absolute value to the second selecting circuit 302, and outputs a selecting instruction indicating a selection of a Run value to the third selecting circuit 301. Following this, the control register 307 receives a mode signal from the shared control circuit 312, and outputs the received mode signal to the control circuit 206d as a first mode signal.

Suppose the control register 307 receives a clock signal when the clock counter indicates one. In this case, the control register 307 adds one to the value indicated by the clock counter. After this, the control register 307 outputs a selecting instruction indicating a selection of an RMAX output from the RMAX retrieving unit 304 to the first selecting circuit 306, outputs a selecting instruction indicating a selection of a Run value to the second selecting circuit 302, and outputs a selecting instruction indicating a selection of a Level absolute value to the third selecting circuit 301. Following this, the control register 307 receives a mode signal from the shared control circuit 312, and outputs the received mode signal to the control circuit 206d as a second mode signal.

Suppose the control register 307 receives a clock signal when the clock counter indicates two. In this case, the control register 307 initializes the clock counter to indicate zero.

(Shared Control Circuit 312)

The shared control circuit 312 receives a result of comparing a Level absolute value and an LMAX, or a result of comparing a Run value and an RMAX, from the first shared comparing circuit 308. Also, the shared control circuit 312 receives a result of comparing New Level and an LMAX, or a result of comparing New Run and an RMAX, from the second shared comparing circuit 311.

Suppose the shared control circuit 312 receives a result of comparing a Level absolute value and an LMAX from the first shared comparing circuit 308, and receives a result of comparing an LMAX and New Level from the second shared comparing circuit 311. If the result of the comparison received from the first shared comparing circuit 308 indicates the LMAX≧the Level absolute value, the shared control circuit 312 ignores the result of the comparison received from the second shared comparing circuit 311, generates a mode signal "00", and outputs the generated mode signal "00" to the shared selecting circuit 313 and control register 307.

If the result of the comparison received from the first shared comparing circuit 308 indicates the LMAX<the Level absolute value, and the result of the comparison received from the second shared comparing circuit 311 indicates the LMAX≧the New Level, the shared control circuit 312 generates a mode signal "01", and outputs the generated mode signal "01" to the shared selecting circuit 313 and control register 307.

If the result of the comparison received from the first shared comparing circuit 308 indicates the LMAX<the Level absolute value, and the result of the comparison received from the second shared comparing circuit 311 indicates the LMAX<the New Level, the shared control circuit 312 generates a mode signal "10", and outputs the generated mode signal "10" to the shared selecting circuit 313 and control register 307.

Suppose the shared control circuit 312 receives a result of comparing a Run value and an RMAX from the first shared comparing circuit 308, and receives a result of comparing an RMAX and New Run from the second shared comparing circuit 311. If the result of the comparison received from the first shared comparing circuit 308 indicates the RMAX≧the Run value, the shared control circuit 312 ignores the result of the comparison received from the second shared comparing circuit 311, generates a mode signal "00", and outputs the generated mode signal "00" to the shared selecting circuit 313 and control register 307.

If the result of the comparison received from the first shared comparing circuit 308 indicates the RMAX<the Run value, and the result of the comparison received from the second shared comparing circuit 311 indicates the RMAX≧the New Run, the shared control circuit 312 generates a mode signal "01", and outputs the generated mode signal "01" to the shared selecting circuit 313 and control register 307.

If the result of the comparison received from the first shared comparing circuit 308 indicates the RMAX<the Run value, and the result of the comparison received from the second shared comparing circuit 311 indicates the RMAX<the New Run, the shared control circuit 312 generates a mode signal "10", and outputs the generated mode signal "10" to the shared selecting circuit 313 and control register 307.

(Shared Output Circuit 314)

The shared output circuit 314 receives a Last value from the data obtaining unit 201, receives a selected Level from the shared selecting circuit 313, and receives a Run value from the third selecting circuit 301. The shared output circuit 314 outputs the received combination (Last, Run, selected Level) to the VLC retrieving unit 207d.

Also, the shared output circuit 314 receives a Last value from the data obtaining unit 201, receives a selected Run from the shared selecting circuit 313, and receives a Level absolute value from the third selecting circuit 301. The shared output circuit 314 outputs the received combination (Last, selected Run, Level absolute value) to the VLC retrieving unit 207d.

(2) Register 208d

The register 208d is constituted by a writing circuit, a first storing unit, a second storing unit, and a reading circuit. The writing circuit includes a clock counter that can count the number of times of receiving a clock signal, from zero to two. The clock counter is initially set to indicate zero.

Note that a value indicated by the clock counter in the register 208d is always the same as the value indicated by the clock counter in the control register 307 in the escape mode judging circuit 218d.

The writing circuit receives clock signals from the timing control circuit at regular time intervals.

Suppose the writing circuit receives a clock signal when the clock counter indicates zero. The writing circuit adds one to the value indicated by the clock counter. After this, the writing circuit receives a VLC or VLC error signal from the VLC retrieving unit 207d. In the case of receiving a VLC, the writing circuit writes the received VLC into the first storing unit. In the case of receiving a VLC error signal, the writing circuit does nothing.

Suppose the writing circuit receives a clock signal when the clock counter indicates one. The writing circuit adds one to the value indicated by the clock counter. After this, the writing circuit receives a VLC or VLC error signal from the VLC retrieving unit 207d. In the case of receiving a VLC, the writing circuit writes the received VLC into the second storing unit. In the case of receiving a VLC error signal, the writing circuit does nothing.

Suppose the writing circuit receives a clock signal when the clock counter indicates two. In this case, the writing circuit initializes the clock counter to indicate zero.

For better intelligibility, the VLC stored in the first storing unit is referred to as a first VLC, and the VLC stored in the second storing unit is referred to as a second VLC.

The reading circuit receives clock signals from the timing control circuit at regular time intervals. Also, the reading circuit receives a selecting instruction, from the control circuit 206d, indicating a selection of one of the first VLC and second VLC.

When receiving the selecting instruction, the reading circuit reads one of the first VLC and second VLC in accordance with the received selecting instruction. When detecting a clock signal subsequently, the reading circuit outputs the read one of the first VLC and second VLC to the normal VLC generating circuit 214, LMAX VLC generating circuit 213, and RMAX VLC generating circuit 212.

(3) Control Circuit 206d

The control circuit 206d receives clock signals from the timing control circuit at regular time intervals.

The control circuit 206d receives a first mode signal from the escape mode judging circuit 218d, and temporarily stores thereon the received first mode signal. After this, the control circuit 206d receives a second mode signal from the escape mode judging circuit 218d.

When receiving the first and second mode signals, the control circuit 206d outputs a selecting instruction to the register 208d indicating a selection of one of a first VLC and a second VLC, and outputs a selecting instruction to the selecting circuit 215d indicating one of a normal VLC, an LMAX VLC, and RMAX VLC, and an FLC. The following describes the selecting instructions output from the control circuit 206d in detail with reference to FIG. 18, and an operation performed by the control circuit 206 after the output of the selecting instructions.

FIG. 18 illustrates selecting instructions output from the control circuit 206d, which are determined according to a combination of a first mode signal and a second mode signal, as an example. The number "1" in the SELECTING INSTRUCTION (REGISTER) section indicates that a selecting instruction output to the register 208d instructs a selection of a first VLC. The number "2" indicates that a selecting instruction output to the register 208d instructs a selection of a second VLC. The alphabetical letter "N" in the SELECTING INSTRUCTION (SELECTING CIRCUIT) section indicates that a selecting instruction output to the selecting circuit 215d instructs a selection of a normal VLC output from the normal VLC generating circuit 214. The letter "L" indicates that a selecting instruction output to the selecting circuit 215d instructs a selection of an LMAX VLC output from the LMAX VLC generating circuit 213. The letter "R" indicates that a selecting instruction output to the selecting circuit 215d instructs a selection of an RMAX VLC output from the RMAX VLC generating circuit 212. The letter "F" indicates that a selecting instruction output to the selecting circuit 215d instructs a selection of an FLC output from the FLC generating circuit 211.

Considering the constructions of the VLC table 251, LMAX table 261, and RMAX table 266, there is no such a case where a first mode signal indicates "00", and a second mode signal indicates "01" or "10". Also, there is no such a case where a first mode signal indicates "01", and a second mode signal indicates "00", and there is no such a case where a first mode signal indicates "10", and a second mode signal indicates "00".

When the received first and second mode signals both indicate "00", the control circuit 206d outputs a selecting instruction, to the register 208d, indicating a selection of a first VLC. When detecting a clock signal subsequently, the control circuit 206d outputs a selecting instruction, to the selecting circuit 215d, indicating the normal VLC generating circuit 214.

When the received first and second mode signals both indicate "01", the control circuit 206d outputs a selecting instruction, to the register 208d, indicating a selection of a first VLC. When detecting a clock signal subsequently, the control circuit 206d outputs a selecting instruction, to the selecting circuit 215d, indicating the LMAX VLC generating circuit 213.

When the received first mode signal indicates "01" and the received second mode signal indicates "10", the control circuit 206d outputs a selecting instruction, to the register 208d, indicating a selection of a first VLC. When detecting a clock signal subsequently, the control circuit 206d outputs a selecting instruction, to the selecting circuit 215d, indicating the LMAX VLC generating circuit 213.

When the received first mode signal indicates "10" and the received second mode signal indicates "01", the control circuit 206d outputs a selecting instruction, to the register 208d, indicating a selection of a second VLC. When detecting a clock signal subsequently, the control circuit 206d outputs a selecting instruction, to the selecting circuit 215d, indicating the RMAX VLC generating circuit 212.

When the received first and second mode signals both indicate "10", the control circuit 206d does not output a selecting instruction to the register 208d. When detecting a next clock signal, the control circuit 206d outputs a selecting instruction, to the selecting circuit 215d, indicating the FLC generating circuit 211.

After outputting the selecting instruction to the selecting circuit 215d, the control circuit 206d outputs a data output instruction to the data obtaining unit 201.

(4) Operation Cycle of Variable-length Coding Circuit 200d

Figure 19:
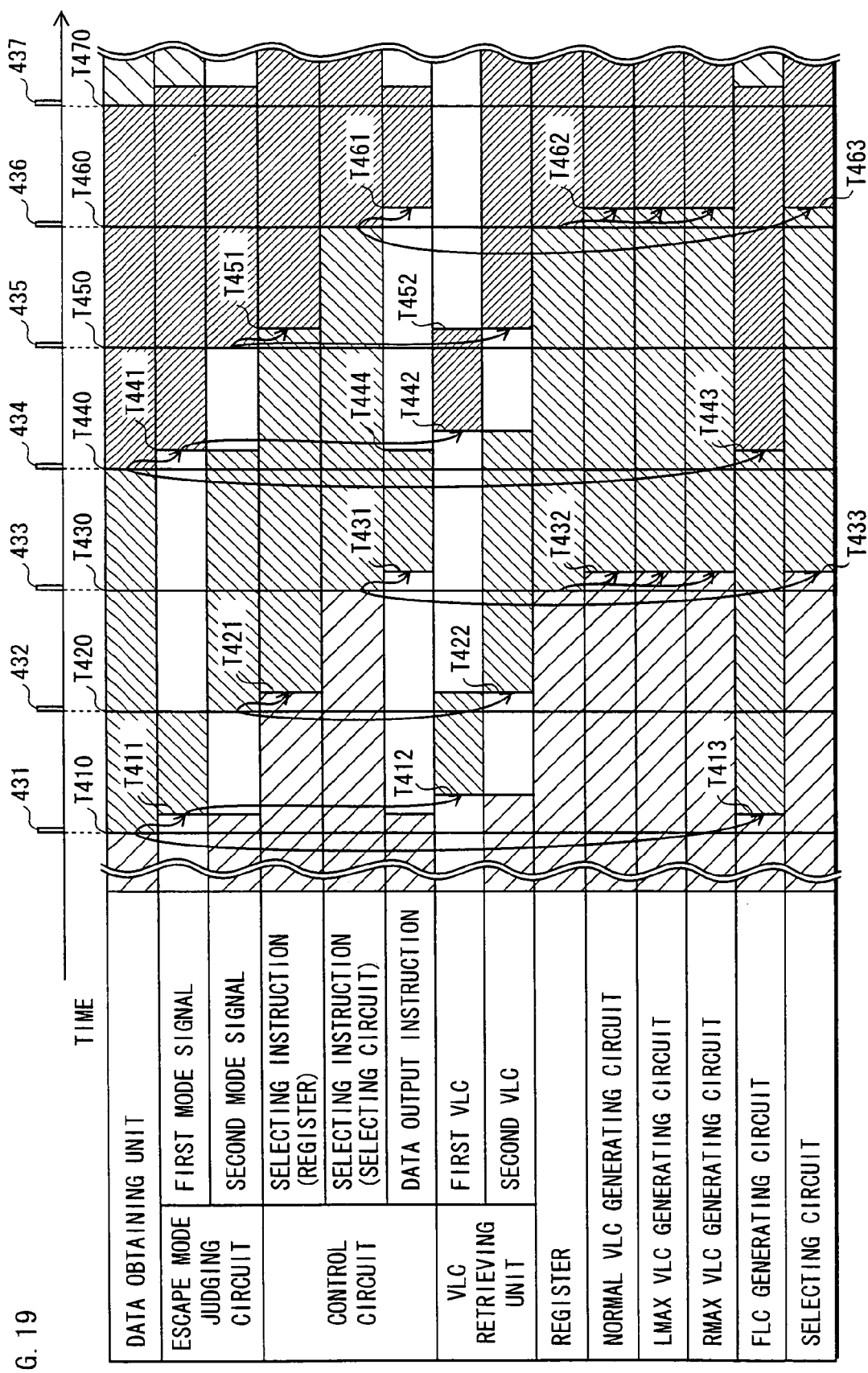
FIG. 19 is a time chart illustrating, in a chronological order, timings of operations of the circuits constituting the variable-length coding circuit 200d.

The following describes an operation cycle of the variable-length coding circuit 200d, with reference to a time chart shown in FIG. 19. In the time chart shown in FIG. 19, the names of the circuits constituting the variable-length coding circuit 200d are arranged vertically, and a time is plotted horizontally. This time chart illustrates how pieces of data are sequentially processed, in relation to time.

Clock signals 431, 432, 433, . . . 437 are supplied at regular time intervals, i.e., at times T410, T420, T430, . . . T470, to the data obtaining unit 201, escape mode judging circuit 218d, control circuit 206d, and register 208d. Note that a predetermined time interval between clock signals is referred to as a clock cycle.

The arrow shown in FIG. 19 indicates that an operation performed at a circuit specified by the starting point of the arrow at a particular time causes an operation to start at a different circuit specified by the ending point of the arrow at a particular time.

At the time T410, the data obtaining unit 201 detects the clock signal 431, and outputs a Sign value, a Level value, a Level absolute value, a Run value, and a Last value stored thereon, to the escape mode judging circuit 218d and FLC generating circuit 211. This output continues until the time T440. The output Sign value, Level value, Level absolute value, Run value, and Last value are collectively referred to as data G.

At a time T411, the escape mode judging circuit 218d receives a combination (Last, Run, Level absolute value) included in the data G. The escape mode judging circuit 218d judges whether a type of a code to be assigned to a combination (Last, Run, Level) included in the data G is a normal VLC, LMAX VLC or something else. The escape mode judging circuit 218d generates a first mode signal and a combination (Last, Run, selected Level), as a result of the judgment. The escape mode judging circuit 218d outputs the generated first mode signal to the control circuit 206d, and outputs the combination (Last, Run, selected Level) to the VLC retrieving unit 207d. This output continues until the time T420.

At a time T412, the VLC retrieving unit 207d receives the combination (Last, Run, selected Level) from the escape mode judging circuit 218d, and attempts to read a VLC corresponding to the combination (Last, Run, selected Level) from the VLC table 251. If there is a corresponding VLC on the VLC table 251, the VLC retrieving unit 207d outputs the read VLC to the register 208d. If there is no corresponding VLC on the VLC table 251, the VLC retrieving unit 207d outputs a VLC error signal to the register 208d. This output continues until a time T422. The VLC referred here is a first VLC, and the register 208d stores the first VLC on the first storing unit.

At a time T413, the FLC generating circuit 211 receives a combination (Last, Run, Level) from the data obtaining unit 201. The FLC generating circuit 211 generates an FLC based on the received combination (Last, Run, Level), and outputs the generated FLC to the selecting circuit 215d. This output continues until a time T443.

At the time T420, the escape mode judging circuit 218d detects the clock signal 432. The escape mode judging circuit 218d judges whether the type of the code to be assigned to the combination (Last, Run, Level) included in the data G is a normal VLC, RMAX VLC, or something else. The escape mode judging circuit 218d generates a second mode signal to the control circuit 206d, and a combination (Last, selected Run, Level absolute value) to the VLC retrieving unit 207d, as a result of the judgment. This output continues until a time T441.

At a time T421, the control circuit 206d receives the second mode signal, and outputs a selecting instruction that is determined based on the first and second mode signals, to the register 208d. This output continues until a time T451.

At a time T422, the VLC retrieving unit 207d receives the combination (Last, selected Run, Level absolute value) from the escape mode judging circuit 218d, and attempts to read a VLC, from the VLC table 251, corresponding to the received combination (Last, selected Run, Level absolute value). If there is a corresponding VLC on the VLC table 251, the VLC retrieving unit 207d outputs the read VLC to the register 208d. If there is no corresponding VLC on the VLC table 251, the VLC retrieving unit 207d outputs a VLC error signal to the register 208d. This output continues until the time T442. The VLC referred here is a second VLC, and the register 208d stores the second VLC on the second storing unit.

At the time T430, the register 208d detects the clock signal 433, and receives the selecting instruction from the control circuit 206d. Based on the received selecting instruction, the register 208d reads one of the first VLC and second VLC stored thereon, and outputs the read one of the first VLC and second VLC, to the normal VLC generating circuit 214, LMAX VLC generating circuit 213, and RMAX VLC generating circuit 212. This output continues until the time T460.

At a time T432, the normal VLC generating circuit 214, LMAX VLC generating circuit 213, and RMAX VLC generating circuit 212 receive the VLC from the register 208d. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the selecting circuit 215d. This output continues until a time T462.

At the time T430, the control circuit 206d detects the clock signal 433, and outputs a selecting instruction to the selecting circuit 215d. This output continues until the time T460. The control circuit 206*d* generates the selecting instruction based on the first and second mode signals received from the escape mode judging circuit 218*d*. After outputting the selecting instruction to the selecting circuit 215*d*, the control circuit 206*d* outputs a data output instruction to the data obtaining unit 201 at a time T431. This output continues until a time T444.

At a time T433, the selecting circuit 215*d* receives the selecting instruction from the control circuit 206*d*. In accordance with the received selecting instruction, the selecting circuit 215*d* selects one of the normal VLC, LMAX VLC, RMAX VLC, and FLC, as the code assigned to the combination (Last, Run, Level). The selecting circuit 215*d* then outputs the selected code to the buffer included in the recording and transmitting system. This output continues until a time T463.

At the time T440, the data obtaining unit 201 detects the clock signal 434, and receives the data output instruction from the control circuit 206*d*. Therefore, the data obtaining unit 201 outputs a new set of a Sign value, a Level value, a Level absolute value, a Run value, and a Last value, to the escape mode judging circuit 218*d* and FLC generating circuit 211. This output continues until the time T470. The output Sign value, Level value, Level absolute value, Run value, and Last value are collectively referred to as data H.

The data obtaining unit 201, escape mode judging circuit 218*d*, . . . selecting circuit 215*d* in the variable-length coding circuit 200*d* perform the same procedure for the data H as for the data G. Consequently, the variable-length coding circuit 200*d* generates and outputs a code corresponding to a combination (Last, Run, Level) included in the data H within three clock cycles.

(5) Summary

As described above, the escape mode judging circuit 218*d* uses the control register 307, first shared comparing circuit 308, shared subtracting circuit 309, second shared comparing circuit 311, shared control circuit 312, shared selecting circuit 313, and shared output circuit 314, in order to judge whether a code to be assigned to a combination (Last, Run, Level) is a normal VLC, an LMAX VLC, or something else, and to judge whether the code to be assigned to the combination (Last, Run, Level) is a normal VLC, an RMAX VLC, or something else. With this construction, the first modification example of the third embodiment can achieve a smaller circuit scale than the third embodiment, where the escape mode judging circuit 218 includes the LMAX judging circuit 202*c* and RMAX judging circuit 216*c*.

3.5 Second Modification Example of Third Embodiment

According to the first modification example of the third embodiment, the control circuit 206*d* preferentially assigns an LMAX VLC to a combination (Last, Run, Level), in a case where both an LMAX VLC and an RMAX VLC are possible. However, the control circuit 206*d* may preferentially assigns an RMAX VLC.

To be specific, when both a first mode signal and a second mode signal indicate "01", the control circuit 206*d* outputs a selecting instruction indicating a second VLC to the register 208*d*, and outputs a selecting instruction indicating the RMAX VLC generating circuit 212 to the selecting circuit 215*d*.

Furthermore, information indicating which one of an LMAX VLC and an RMAX VLC is given priority may be stored in the control circuit 206*d* during the manufacturing process of the variable-length coding circuit 200*d*. Alternatively, the priorities between an LMAX VLC and an RMAX VLC may be determined by a user after the variable-length coding circuit 200*d* is completed.

4. Fourth Embodiment

The following describes an imaging system relating to a fourth embodiment of the present invention.

Similarly to the imaging system 100 relating to the first embodiment, the imaging system relating to the fourth embodiment is constituted by an optical system, a sensor, a converting circuit, an image processing circuit, a recording and transmitting system, a playback system, a timing control circuit, and a system control circuit. Except for a variable-length coding circuit 200*e* included in the recording and transmitting system, the fourth embodiment is the same as the first embodiment. Accordingly, the following only describes the variable-length coding circuit 200*e*.

4.1 Variable-length Coding Circuit 200*e*

The variable-length coding circuit 200*e* judges which one of a normal VLC, an RMAX VLC, an LMAX VLC, and an FLC is to be assigned to a combination (Last, Run, Level), and generates a code based on the result of the judgment. The following describes a code generating operation of the variable-length coding circuit 200*e*, and a construction to realize the code generating function.

(Operation of Variable-length Coding Circuit 200*e*)

Figure 20:
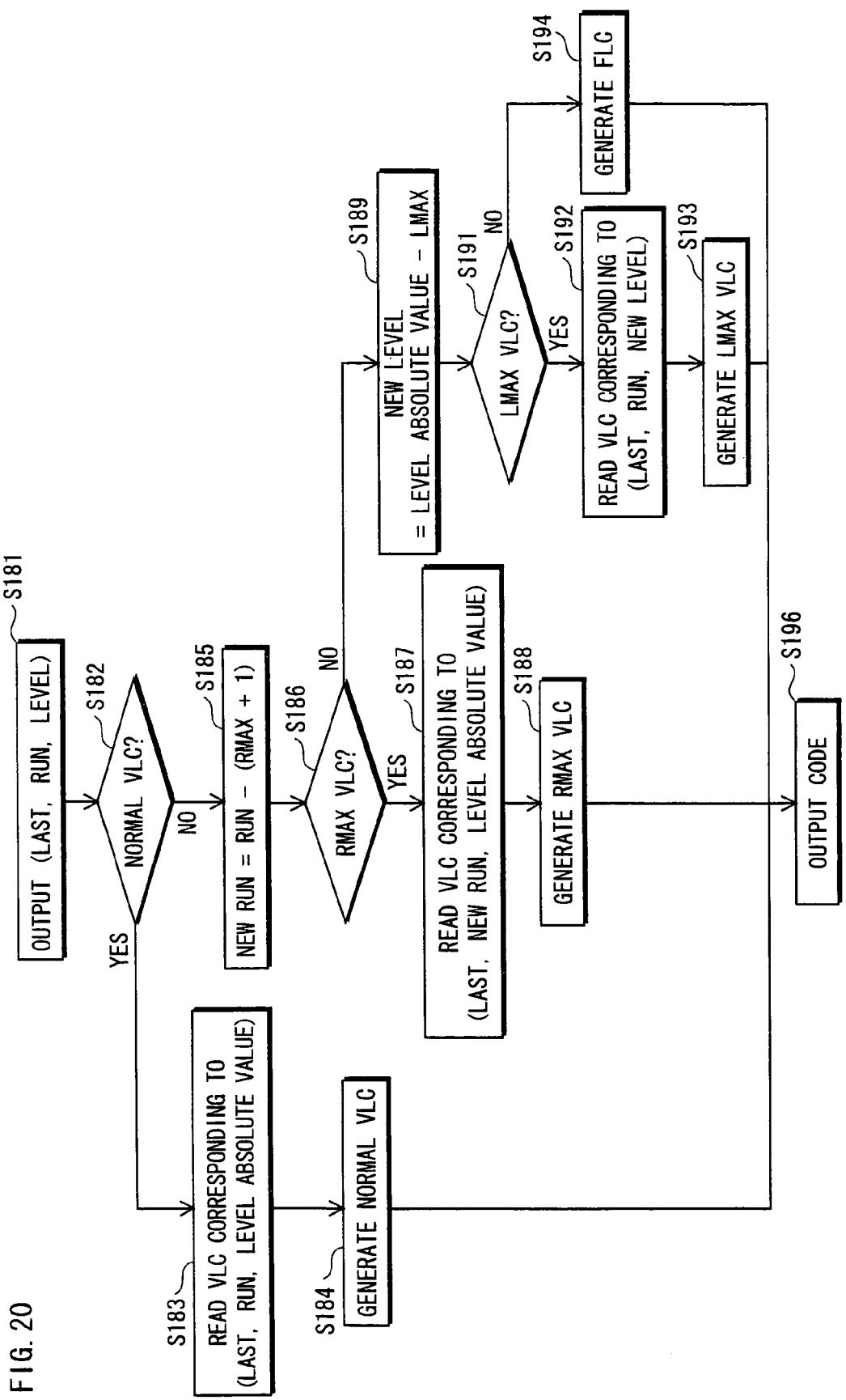
FIG. 20 is a flow chart illustrating an operation of a variable-length coding circuit 200e relating to a fourth embodiment.

The following describes an operation of the variable-length coding circuit 200*e*, with reference to a flow chart shown in FIG. 20.

The variable-length coding circuit 200*e* starts a code generating operation, with an output of data including a combination (Last, Run, Level) to the circuits included in the variable-length coding circuit 200*e* (step S181). To start with, the variable-length coding circuit 200*e* judges whether a code to be assigned to the combination (Last, Run, Level) is a normal VLC or not, by comparing the Run value and an RMAX (step S182). When judging the code to be a normal VLC (step S182:YES), the variable-length coding circuit 200*e* reads a VLC corresponding a combination (Last, Run, Level absolute value) from a VLC table (step S183), and generates a normal VLC based on the read VLC (step S184). After this, the variable-length coding circuit 200*e* outputs the generated normal VLC (step S196).

When judging the code not to be a normal VLC (step S182:NO), the variable-length coding circuit 200*e* calculates New Run=the Run value−(the RMAX+1) (step S185). Then, the variable-length coding circuit 200*e* judges whether the code to be assigned to the combination (Last, Run, Level) is an RMAX VLC, by comparing the calculated New Run with the RMAX (step S186). When judging the code to be an RMAX VLC (step S186:YES), the variable-length coding circuit 200*e* reads a VLC corresponding to a combination (Last, New Run, Level absolute value) from the VLC table (step S187). The variable-length coding circuit 200*e* generates an RMAX VLC based on the read VLC (step S188), and outputs the generated RMAX VLC (step S196).

When judging the code not to be an RMAX VLC in the step S186, the variable-length coding circuit 200*e* calculates New Level=the Level absolute value−an LMAX (step S189). The variable-length coding circuit 200*e* judges whether the code to be assigned to the combination (Last, Run, Level) is an LMAX VLC, by comparing the calculated New Level with the LMAX (step S191). When judging the code to be an LMAX VLC (step S191:YES), the variable-length coding circuit 200*e* reads a VLC corresponding to a combination (Last, Run, New Level) from the VLC table (step S192). The variable-length coding circuit 200*e* generates an LMAX VLC based on the read VLC (step S193), and outputs the generated LMAX VLC (step S196).

When judging the code not to be an LMAX VLC in the step S191, the variable-length coding circuit 200e generates an FLC (step S194), and outputs the generated FLC (step S196).

(Construction of Variable-length Coding Circuit 200e)

Figure 21:
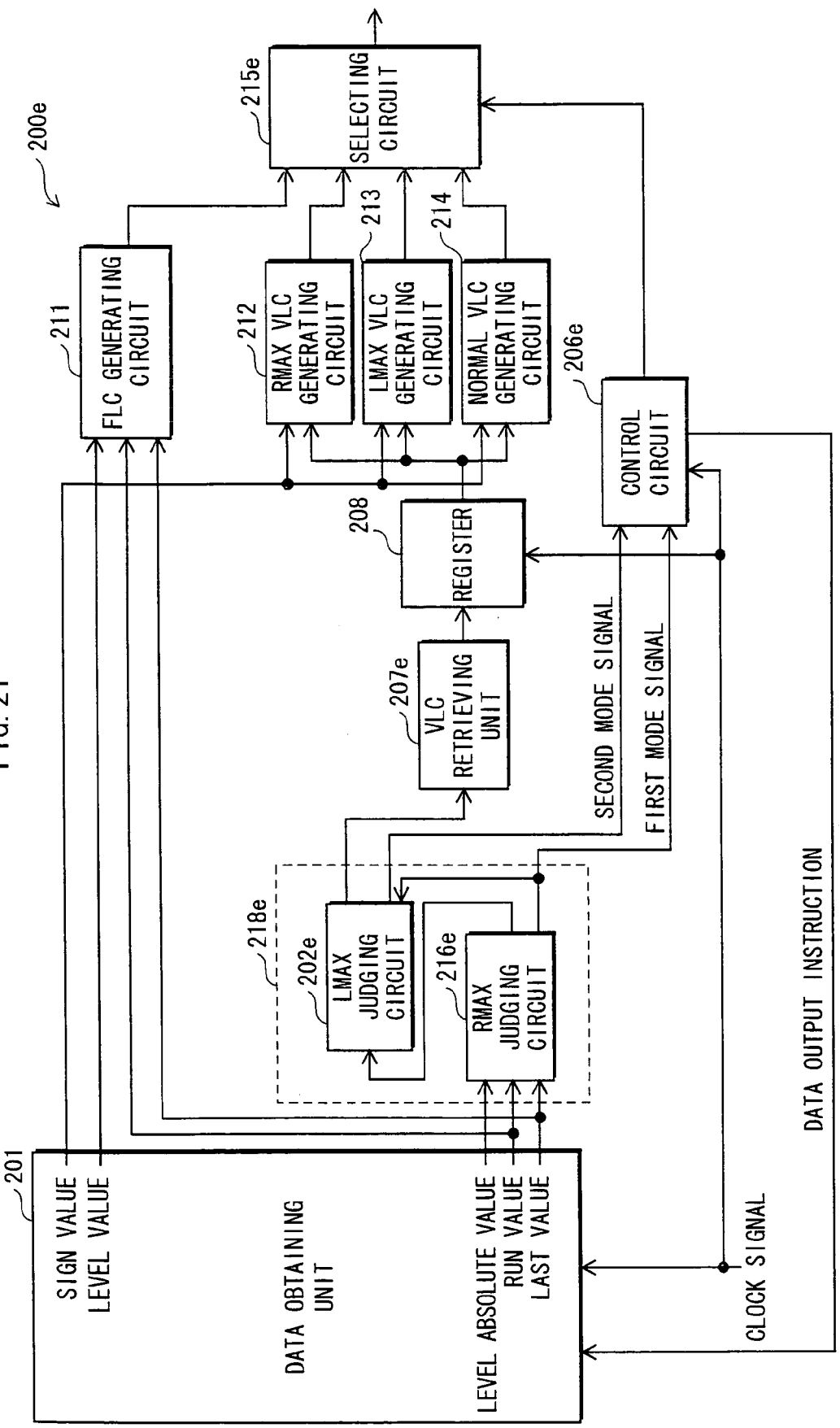
FIG. 21 is a block diagram illustrating a construction of the variable-length coding circuit 200e.

As shown in FIG. 21, the variable-length coding circuit 200e is constituted by the data obtaining unit 201, a control circuit 206e, a VLC retrieving unit 207e, the register 208, the FLC generating circuit 211, the RMAX VLC generating circuit 212, the LMAX VLC generating circuit 213, the normal VLC generating circuit 214, a selecting circuit 215e, and an escape mode judging circuit 218e. The escape mode judging circuit 218e includes an LMAX judging circuit 202e and an RMAX judging circuit 216e.

The data obtaining unit 201, register 208, FLC generating circuit 211, RMAX VLC generating circuit 212, LMAX VLC generating circuit 213, and normal VLC generating circuit 214 have the same constructions and perform the same operations as in the first embodiment. Therefore, these constituents are not described in the following. Also, the VLC retrieving unit 207e and selecting circuit 215e are the same as the VLC retrieving unit 207c and selecting circuit 215c relating to the third embodiment.

(1) Escape Mode Judging Circuit 218e

As shown in FIG. 21, the escape mode judging circuit 218e is constituted by the RMAX judging circuit 216e and LMAX judging circuit 202e.

The RMAX judging circuit 216e is the same as the RMAX judging circuit 216 relating to the second embodiment in terms of construction and operation. In detail, the RMAX judging circuit 216e receives a Last value, a Run value, and a Level absolute value from the data obtaining unit 201, and outputs a mode signal and a combination (Last, selected Run, Level absolute value). Here, the RMAX judging circuit 216e outputs the mode signal and combination (Last, selected Run, Level absolute value) to the LMAX judging circuit 202e, and outputs the mode signal to the control circuit 206e. For better intelligibility, the mode signal output by the RMAX judging circuit 216e is referred to as a first mode signal, and a mode signal output by the LMAX judging circuit 202e is referred to as a second mode signal.

The LMAX judging circuit 202e is constituted by an LMAX retrieving unit, a first comparing circuit, a subtracting circuit, a second comparing circuit, a selecting circuit, a judgment control circuit, and an output circuit, similarly to the LMAX judging circuit 202 relating to the first embodiment.

The LMAX retrieving unit, first comparing circuit, subtracting circuit, second comparing circuit, selecting circuit, and output circuit respectively perform the same operations on the combination (Last, selected Run, Level absolute value) output from the RMAX judging circuit 216e, as the LMAX retrieving unit 231, first comparing circuit 232, subtracting circuit 233, second comparing circuit 234, selecting circuit 236, and output circuit 238 included in the LMAX judging circuit 202 relating to the first embodiment. Thus, the LMAX judging circuit 202e outputs a combination (Last, selected Run, selected Level) to the VLC retrieving unit 207e.

The judgment control circuit receives the first mode signal from the RMAX judging circuit 216e. Also, the judgment control circuit receives a result of comparing the Level absolute value and an LMAX from the first comparing circuit, and receives a result of comparing the LMAX and New Level from the second comparing circuit.

When the received first mode signal indicates "01", the judgment control circuit ignores the comparison results received from the first comparing circuit and second comparing circuit. The judgment control circuit generates a second mode signal "00", and outputs the generated second mode signal "00" to the control circuit 206e and selecting circuit in the LMAX judging circuit 202e.

When the first mode signal received from the RMAX judging circuit 216e indicates "00" or "10", the judgment control circuit performs the same operation as the judgment control circuit 237 included in the LMAX judging circuit 202 relating to the first embodiment. In detail, the judgment control circuit generates a second mode signal based on the comparison results received from the first and second comparing circuits, and outputs the generated second mode signal to the control circuit 206e and selecting circuit included in the LMAX judging circuit 202e.

(2) Control Circuit 206e

The control circuit 206e receives clock signals from the timing control circuit at regular time intervals, and receives a first mode signal and a second mode signal from the escape mode judging circuit 218e.

When receiving the first and second mode signals, the control circuit 206e outputs a selecting instruction to the selecting circuit 215e in synchronization with detection of a next clock signal. The selecting instruction is determined based on a combination of the received first and second mode signals as shown in FIG. 22. FIG. 22 illustrates a correspondence between a combination of first and second mode signals and a selecting instruction output to the selecting circuit 215e.

In the case of a first mode signal "00" and a second mode signal "00", the control circuit 206e outputs a selecting instruction indicating a selection of a signal output from the normal VLC generating circuit 214.

In the case of a first mode signal "01" and a second mode signal "00", the control circuit 206e outputs a selecting instruction indicating a selection of a signal output from the RMAX VLC generating circuit 212.

In the case of a first mode signal "10" and a second mode signal "01", the control circuit 206e outputs a selecting instruction indicating a selection of a signal output from the LMAX VLC generating circuit 213.

In the case of a first mode signal "10" and a second mode signal "10", the control circuit 206e outputs a selecting instruction indicating a selection of a signal output from the FLC generating circuit 211.

It should be noted that there is no such a case where a first mode signal indicates "00" and a second mode signal indicates "01" or "10", considering the constructions of the VLC table 251, LMAX table 261, and RMAX table 266. Similarly, there is no such a case where a first mode signal indicates "10" and a second mode signal indicates "00".

After outputting the selecting instruction which is determined in the manner described above to the selecting circuit 215e, the control circuit 206e outputs a data output instruction, to the data obtaining unit 201.

(3) Operation Cycle of Variable-length Coding Circuit 200e

Figure 23:
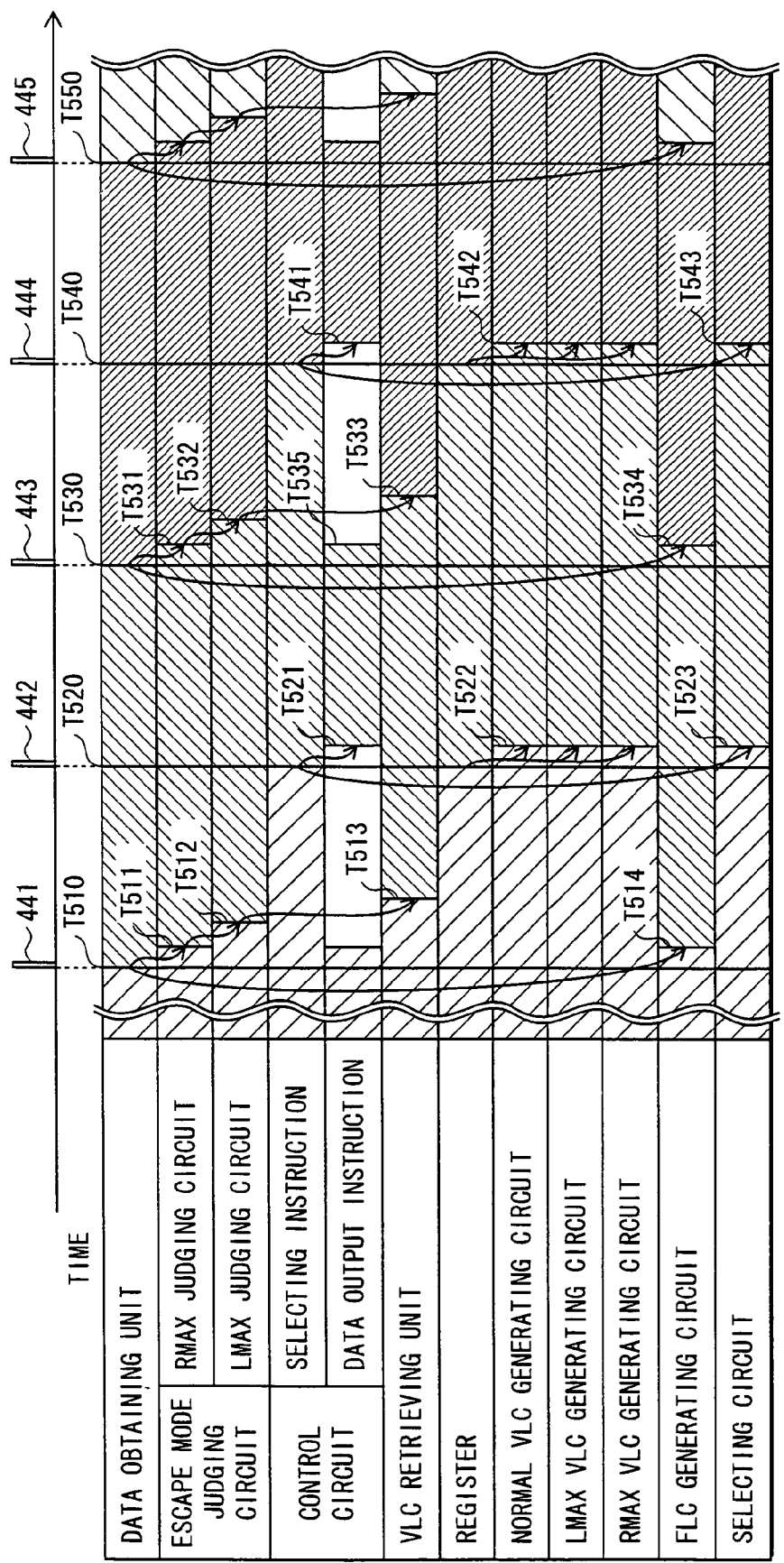
FIG. 23 is a time chart illustrating, in a chronological order, timings of operations of the circuits constituting the variable-length coding circuit 200e.

The following describes an operation cycle of the variable-length coding circuit 200e, with reference to a time chart shown in FIG. 23.

In the time chart shown in FIG. 23, the names of the circuits constituting the variable-length coding circuit 200e are arranged vertically, and a time is plotted horizontally.

This time chart illustrates how pieces of data are sequentially processed, in relation to time.

Clock signals 441, 442, 443, 444 and 445 are supplied at regular time intervals, i.e., at times T510, T520, T530, T540, and T550, to the data obtaining unit 201, control circuit 206e, and register 208. Here, a predetermined time interval between clock signals is referred to as a clock cycle.

The arrow shown in FIG. 23 indicates that an operation performed at a circuit specified by the starting point of the arrow at a particular time causes an operation to start at a different circuit specified by the ending point of the arrow at a particular time.

At the time T510, the data obtaining unit 201 detects the clock signal 441, and outputs a Sign value, a Level value, a Level absolute value, a Run value, and a Last value stored thereon, to the escape mode judging circuit 218e and FLC generating circuit 211. This output continues until the time T530. The output Sign value, Level value, Level absolute value, Run value, and Last value are collectively referred to as data I.

At a time T511, the RMAX judging circuit 216e in the escape mode judging circuit 218e receives the data I. The RMAX judging circuit 216e judges a type of a code to be assigned to a combination (Last, Run, Level). The RMAX judging circuit 216e generates a first mode signal and a combination (Last, selected Run, Level absolute value) as a result of the judgment. The RMAX judging circuit 216e outputs the generated first mode signal to the control circuit 206e, and outputs the generated first mode signal and combination (Last, selected Run, Level absolute value) to the LMAX judging circuit 202e in the escape mode judging circuit 218e. This output continues until a time T531.

At a time T512, the LMAX judging circuit 202e receives the first mode signal and combination (Last, selected Run, Level absolute value) from the RMAX judging circuit 216e. The LMAX judging circuit 202e judges the type of the code to be assigned to the combination (Last, Run, Level), based on the received first mode signal and combination (Last, selected Run, Level absolute value). The LMAX judging circuit 202e generates a second mode signal and a combination (Last, selected Run, selected Level) as a result of the judgment. The LMAX judging circuit 202e outputs the generated second mode signal to the control circuit 206e, and outputs the generated combination (Last, selected Run, selected Level) to the VLC retrieving unit 207e. This output continues until a time T532.

At a time T513, the VLC retrieving unit 207e receives the combination (Last, selected Run, selected Level) from the escape mode judging circuit 218e, and attempts to read a VLC, from the VLC table 251, corresponding to the received combination (Last, selected Run, selected Level). If there is a corresponding VLC on the VLC table 251, the VLC retrieving unit 207e outputs the read VLC to the register 208. If there is no corresponding VLC on the VLC table 251, the VLC retrieving unit 207e outputs a VLC error signal to the register 208. This output continues until a time T533.

At a time T514, the FLC generating circuit 211 receives the data I from the data obtaining unit 201. The FLC generating circuit 211 generates an FLC based on the combination (Last, Run, Level) included in the data I, and outputs the generated FLC to the selecting circuit 215e. This output continues until a time T534.

The register 208 receives the VLC from the VLC retrieving unit 207e, and stores thereon the received VLC temporarily. At the time T520, the register 208 detects the clock signal 442. The register 208 then outputs the stored VLC to the normal VLC generating circuit 214, LMAX VLC generating circuit 213, and RMAX VLC generating circuit 212. This output continues until the time T540.

At a time T522, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the selecting circuit 215e. This output continues until a time T542.

At the time T520, the control circuit 206e detects the clock signal 442, and outputs a selecting instruction based on the first and second mode signals received from the escape mode judging circuit 218e, to the selecting circuit 215e. This output continues until the time T540. After outputting the selecting instruction to the selecting circuit 215e, the control circuit 206e outputs a data output instruction to the data obtaining unit 201 at a time T521. This output continues until a time T535.

At a time T523, the selecting circuit 215e receives the selecting instruction from the control circuit 206e. In accordance with the received selecting instruction, the selecting circuit 215e selects and outputs one of the normal VLC, LMAX VLC, RMAX VLC, and FLC, to the buffer included in the recording and transmitting system. This output continues until a time T543.

At the time T530, the data obtaining unit 201 detects the clock signal 443, and receives the data output instruction from the control circuit 206e. When receiving the data output instruction, the data obtaining unit 201 outputs a new set of a Sign value, a Level value, a Level absolute value, a Run value, and a Last value, to the escape mode judging circuit 218e and FLC generating circuit 211. This output continues until the time T550. The output Sign value, Level value, Level absolute value, Run value, and Last value are collectively referred to as data J.

The escape mode judging circuit 218e, control circuit 206e, . . . selecting circuit 215e perform the same procedure for the data J as for the data I. Consequently, the variable-length coding circuit 200e generates and outputs a code corresponding to a combination (Last, Run, Level) included in the data J within two clock cycles.

4.2 Summary

According to the variable-length coding circuit 200e relating to the fourth embodiment, the RMAX judging circuit 216e and LMAX judging circuit 202e included in the escape mode judging circuit 218e judge which one of a normal VLC, an LMAX VLC, an RMAX VLC, and an FLC is to be assigned to a combination (Last, Run, Level). The escape mode judging circuit 218e appropriately selects a combination (Last, selected Run, selected Level) based on the judgment. The variable-length coding circuit 200e reads a VLC corresponding to the selected combination (Last, selected Run, selected Level) from the VLC table 251, and generates a code.

As explained above, the RMAX judging circuit 216e is placed before the LMAX judging circuit 202e. In this way, when an RMAX VLC and an LMAX VLC are both possible, an RMAX VLC can be preferentially assigned to a combination (Last, Run, Level).

5. Fifth Embodiment

The following describes an imaging system relating to a fifth embodiment of the present invention.

Similarly to the imaging system 100 relating to the first embodiment, the imaging system relating to the fifth embodiment is constituted by an optical system, a sensor, a converting circuit, an image processing circuit, a recording and transmitting system, a playback system, a timing control circuit, and a system control circuit. Except for a variable-length coding circuit 200f included in the recording and transmitting system, the imaging system relating to the fifth embodiment has the same construction as the imaging system 100 relating to the first embodiment. Accordingly, the following only describes the variable-length coding circuit 200f, which characterizes the fifth embodiment.

5.1 Variable-length Coding Circuit 200f

According to the variable-length coding circuit 200f relating to the fifth embodiment, an LMAX judging circuit and an RMAX judging circuit operate in parallel. The variable-length coding circuit 200f judges which one of a normal VLC, an LMAX VLC, an RMAX VLC, and an FLC is to be assigned to a combination (Last, Run, Level). Based on the result of the judgment, the variable-length coding circuit 200f generates a code to be assigned to the combination (Last, Run, Level). The following describes a code generating operation of the variable-length coding circuit 200f, and a construction to realize the code generating function.

(Operation of Variable-length Coding Circuit 200f)

Figure 24:
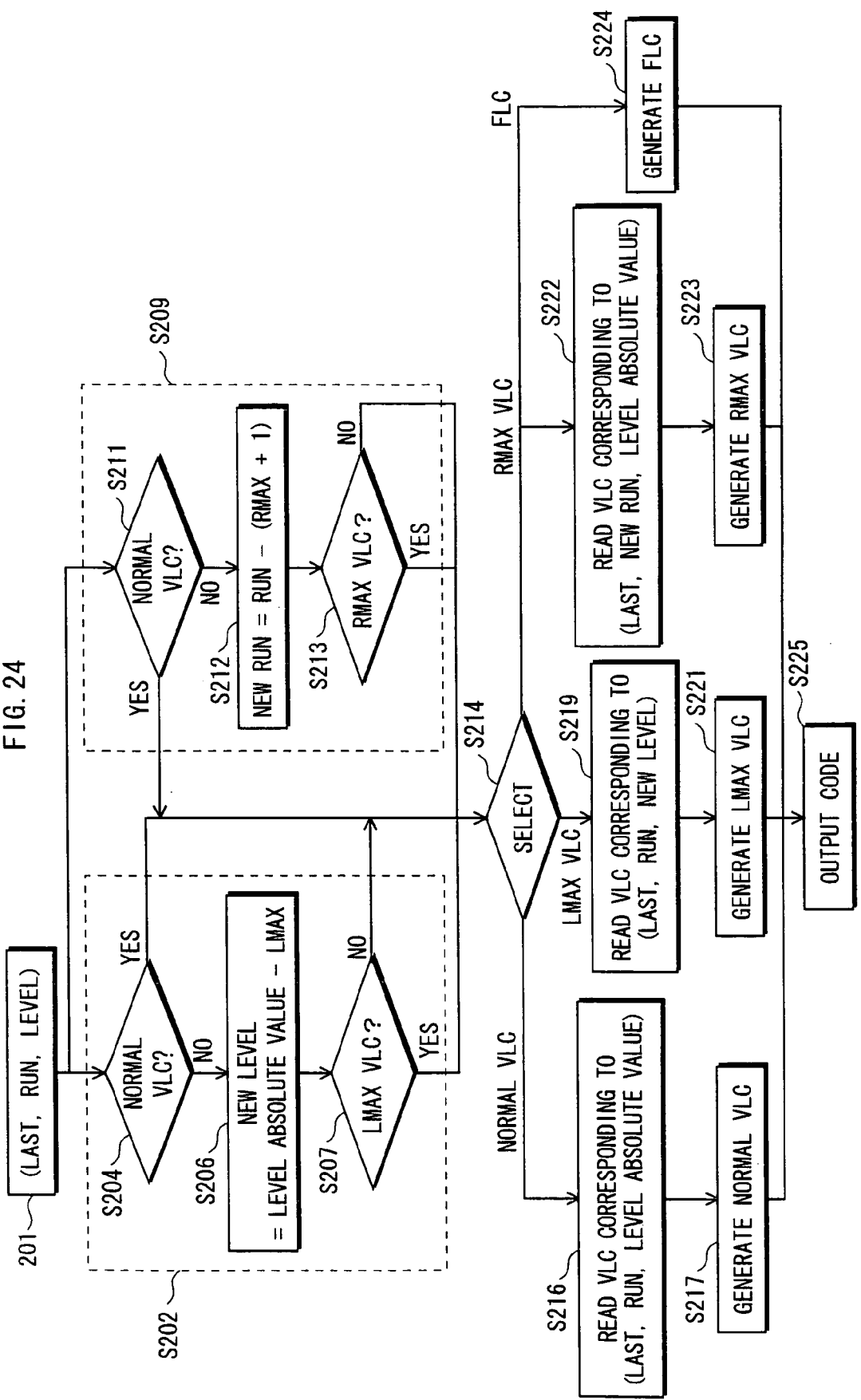
FIG. 24 is a flow chart illustrating an operation of a variable-length coding circuit 200f relating to a fifth embodiment.

The following describes an operation of the variable-length coding circuit 200f, with reference to a flow chart shown in FIG. 24.

The variable-length coding circuit 200f starts a code generating operation, with an output of data including a combination (Last, Run, Level) to the circuits included in the variable-length coding circuit 200f (step S201). To start with, an LMAX judging circuit (described later) judges a type of a code to be assigned to the combination (Last, Run, Level) (step S202). In parallel to the step S202, an RMAX judging circuit (described later) also judges the type of the code to be assigned to the combination (Last, Run, Level) (step S209).

In the step S202, in detail, the LMAX judging circuit judges whether the code to be assigned to the combination (Last, Run, Level) is a normal VLC or not, by comparing a Level absolute value and an LMAX corresponding to the pair of (Last, Run) (step S204). When judging the code not to be a normal VLC (step S204:NO), the LMAX judging circuit calculates New Level=the Level absolute value–the LMAX (step S206). Then, the LMAX judging circuit judges whether the code to be assigned to the combination (Last, Run, Level) can be an LMAX VLC generated according to the first escape mode, by comparing the calculated New Level with the LMAX (step S207).

In the step S209, in detail, the RMAX judging circuit judges whether the code to be assigned to the combination (Last, Run, Level) is a normal VLC or not, by comparing the Run value and an RMAX corresponding to the pair of (Last, Level absolute value) (step S211). When judging the code not to be a normal VLC (step S211:NO), the RMAX judging circuit calculates New Run=the Run value–(the RMAX+1) (step S212). Then, the RMAX judging circuit judges whether the code to be assigned to the combination (Last, Run, Level) can be an RMAX VLC generated according to the second escape mode, by comparing the calculated New Run with the RMAX (step S213).

The variable-length coding circuit 200f selects the type of the code to be assigned to the combination (Last, Run, Level), based on the result of the judgment made by the LMAX judging circuit (step S202), and the result of the judgment made by the RMAX judging circuit (step S209) (step S214).

When selecting a normal VLC, the variable-length coding circuit 200f reads a VLC corresponding to a combination (Last, Run, Level absolute value) (step S216). The variable-length coding circuit 200f generates a normal VLC based on the read VLC (step S217), and outputs the generated normal VLC as the code assigned to the combination (Last, Run, Level) (step S225).

When selecting an LMAX VLC, the variable-length coding circuit 200f reads a VLC corresponding to a combination (Last, Run, New Level) (step S219). The variable-length coding circuit 200f generates an LMAX VLC based on the read VLC (step S221), and outputs the generated LMAX VLC as the code assigned to the combination (Last, Run, Level) (step S225).

When selecting an RMAX VLC, the variable-length coding circuit 200f reads a VLC corresponding to a combination (Last, New Run, Level absolute value) (step S222). The variable-length coding circuit 200f generates an RMAX VLC based on the read VLC (step S223), and outputs the generated RMAX VLC as the code assigned to the combination (Last, Run, Level) (step S225).

When selecting an FLC, the variable-length coding circuit 200f generates an FLC based on the combination (Last, Run, Level) (step S224), and outputs the generated FLC as the code assigned to the combination (Last, Run, Level) (step S225).

(Construction of Variable-length Coding Circuit 200f)

Figure 25:
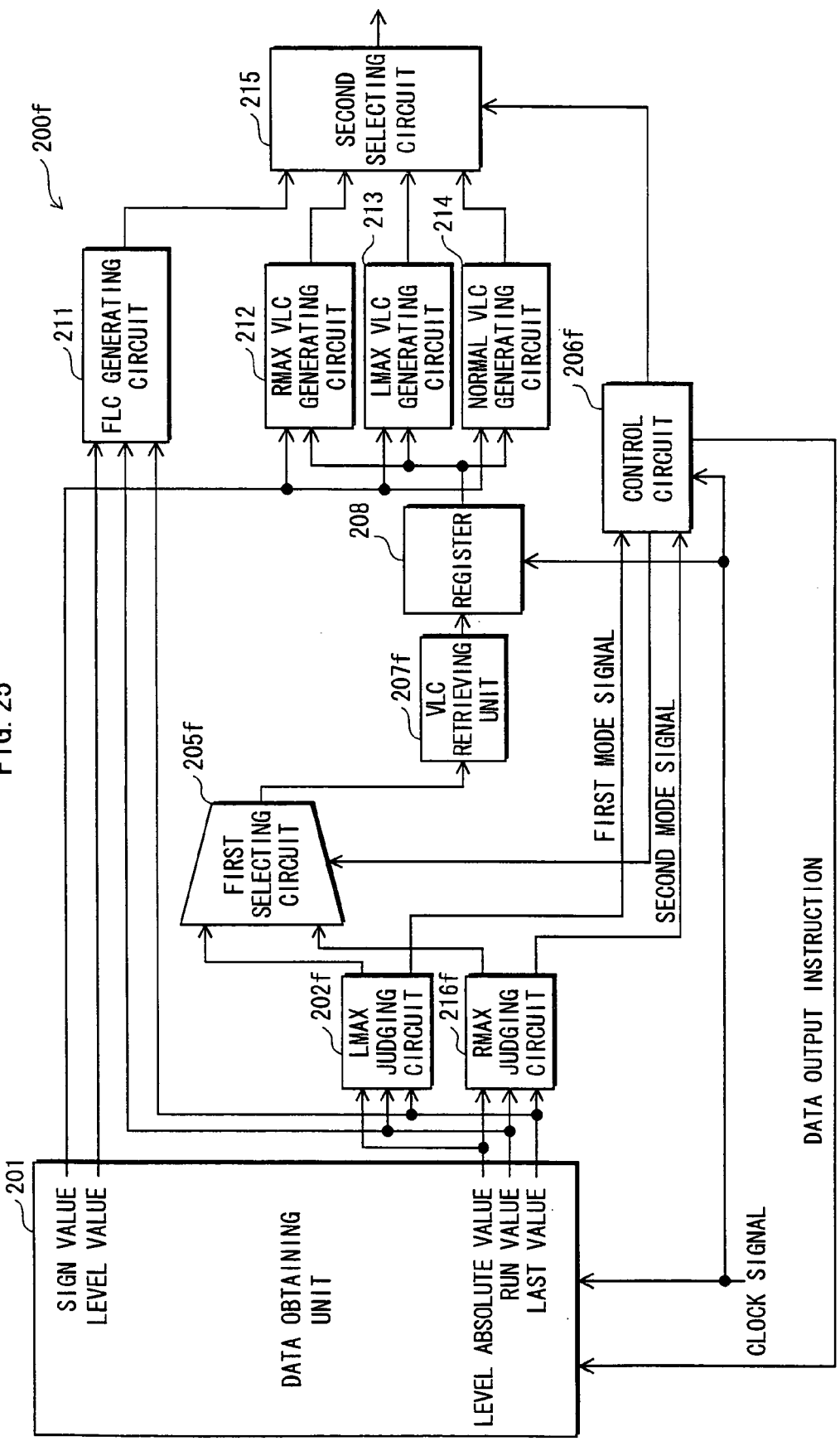
FIG. 25 is a block diagram illustrating a construction of the variable-length coding circuit 200f.

As shown in FIG. 25, the variable-length coding circuit 200f is constituted by the data obtaining unit 201, an LMAX judging circuit 202f, a first selecting circuit 205f, a control circuit 206f, a VLC retrieving unit 207f, the register 208, the FLC generating circuit 211, the RMAX VLC generating circuit 212, the LMAX VLC generating circuit 213, the normal VLC generating circuit 214, the second selecting circuit 215, and an RMAX judging circuit 216f.

The register 208, FLC generating circuit 211, RMAX VLC generating circuit 212, LMAX VLC generating circuit 213, normal VLC generating circuit 214, and second selecting circuit 215 have the same constructions, and perform the same operations as in the first embodiment. Therefore, these constituents are not described here. Also, the VLC retrieving unit 207f is the same as the VLC retrieving unit 207c relating to the third embodiment in terms of construction and operation, and is accordingly not described here.

(1) LMAX Judging Circuit 202f and RMAX Judging Circuit 216f

The LMAX judging circuit 202f has the same construction as the LMAX judging circuit 202 relating to the first embodiment. Similarly to the LMAX judging circuit 202, the LMAX judging circuit 202f receives a combination (Last, run, Level absolute value) from the data obtaining unit 201, outputs a combination (Last, Run, selected Level) to the first selecting circuit 205f, and outputs a mode signal to the control circuit 206f.

The RMAX judging circuit 216f has the same construction as the RMAX judging circuit 216 relating to the second embodiment. Similarly to the RMAX judging circuit 216, the RMAX judging circuit 216f receives a combination (Last, run, Level absolute value) from the data obtaining unit 201, outputs a combination (Last, selected Run, Level absolute value) to the first selecting circuit 205*f*, and outputs a mode signal to the control circuit 206*f*.

For better intelligibility, the mode signal output from the LMAX judging circuit 202*f* is referred to as a first mode signal, and the mode signal output from the RMAX judging circuit 216*f* is referred to as a second mode signal.

The first mode signal "00" indicates that a code to be assigned to a combination (Last, Run, Level) is a normal VLC. The first mode signal "01" indicates that an LMAX VLC can be assigned to the combination (Last, Run, Level). The first mode signal "10" indicates that the code to be assigned to the combination (Last, Run, Level) is neither a normal VLC nor LMAX VLC.

The second mode signal "00" indicates that the code to be assigned to the combination (Last, Run, Level) is a normal VLC. The second mode signal "01" indicates that an RMAX VLC can be assigned to the combination (Last, Run, Level). The second mode signal "10" indicates that the code to be assigned to the combination (Last, Run, Level) is neither a normal VLC nor RMAX VLC.

(2) First Selecting Circuit 205*f*

The first selecting circuit 205*f* receives a combination (Last, Run, selected Level) from the LMAX judging circuit 202*f*, and receives a combination (Last, selected Run, Level absolute value) from the RMAX judging circuit 216*f*. Also, the first selecting circuit 205*f* receives a selecting instruction, from the control circuit 206*f*, indicating one of the LMAX judging circuit 202*f* and RMAX judging circuit 216*f*.

When receiving the selecting instruction, the first selecting circuit 205*f* selects one of the combination (Last, Run, selected Level) received from the LMAX judging circuit 202*f* and the combination (Last, selected Run, Level absolute value) received from the RMAX judging circuit 216*f* in accordance with the received selecting instruction, and outputs the selected combination to the VLC retrieving unit 207*f*.

(3) Control Circuit 206*f*

The control circuit 206*f* stores thereon a variety of instructions such as a selecting instruction and a data output instruction.

The control circuit 206*f* receives clock signals from the timing control circuit at regular time intervals. Also, the control circuit 206*f* receives a first mode signal from the LMAX judging circuit 202*f* and a second mode signal from the RMAX judging circuit 216*f*. In accordance with a combination of the received first and second mode signals (see FIG. 26), the control circuit 206*f* outputs a selecting instruction to the first selecting circuit 205*f* and second selecting circuit 215.

FIG. 26 illustrates selecting instructions output from the control circuit 206*f* to the first selecting circuit 205*f* and second selecting circuit 215, which are determined according to a combination of a first mode signal and a second mode signal. The word "LMAX" in the SELECTING INSTRUCTION (FIRST SELECTING CIRCUIT) section indicates that a selecting instruction output to the first selecting circuit 205*f* instructs a selection of a combination (Last, Run, selected Level) output from the LMAX judging circuit 202*f*. The word "RMAX" indicates that a selecting instruction output to the first selecting circuit 205*f* instructs a selection of a combination (Last, selected Run, Level absolute value) output from the RMAX judging circuit 216*f*.

The alphabetical letter "N" in the SELECTING INSTRUCTION (SECOND SELECTING CIRCUIT) section indicates that a selecting instruction output to the second selecting circuit 215 instructs a selection of a normal VLC output from the normal VLC generating circuit 214. The letter "L" indicates that a selecting instruction output to the second selecting circuit 215 instructs a selection of an LMAX VLC output from the LMAX VLC generating circuit 213. The letter "R" indicates that a selecting instruction output to the second selecting circuit 215 instructs a selection of an RMAX VLC output from the RMAX VLC generating circuit 212.

Considering the constructions of the VLC table 251, LMAX table 261, and RMAX table 266, there is no such a case where a first mode signal indicates "00", and a second mode signal indicates "01"/or "10". Also, there is no such a case where a first mode signal indicates "01", and a second mode signal indicates "00", and there is no such a case where a first mode signal indicates "10", and a second mode signal indicates "00".

When the received first and second mode signals both indicate "00", the control circuit 206*f* outputs a selecting instruction, to the first selecting circuit 205*f*, indicating a selection of a combination (Last, Run, selected Level) output from the LMAX judging circuit 202*f*. When detecting a clock signal subsequently, the control circuit 206*f* outputs a selecting instruction, to the second selecting circuit 215, indicating a selection of a normal VLC output from the normal VLC generating circuit 214.

When the received first and second mode signals both indicate "01", and when the first and second mode signals respectively indicate "01" and "10", the control circuit 206*f* outputs a selecting instruction, to the first selecting circuit 205*f*, indicating a selection of a combination (Last, Run, selected Level) output from the LMAX judging circuit 202*f*. When detecting a clock signal subsequently, the control circuit 206*f* outputs a selecting instruction, to the second selecting circuit 215, indicating a selection of an LMAX VLC output from the LMAX VLC generating circuit 213.

When the received first and second mode signals respectively indicate "10" and "01", the control circuit 206*f* outputs a selecting instruction, to the first selecting circuit 205*f*, indicating a selection of a combination (Last, selected Run, Level absolute value) output from the RMAX judging circuit 216*f*. When detecting a clock signal subsequently, the control circuit 206*f* outputs a selecting instruction, to the second selecting circuit 215, indicating a selection of an RMAX VLC output from the RMAX VLC generating circuit 212.

When the received first and second mode signals both indicate "10", the control circuit 206*f* does not output a selecting instruction to the first selecting circuit 205*f*. When detecting a next clock signal, the control circuit 206*f* outputs a selecting instruction, to the second selecting circuit 215, indicating a signal output from the FLC generating circuit 211.

After outputting the selecting instruction to the second selecting circuit 215, which is determined according to FIG. 26, the control circuit 206*f* outputs a data output instruction, to the data obtaining unit 201, which instructs an output of new data.

(4) Operation Cycle of Variable-length Coding Circuit 200*f*

Figure 27:
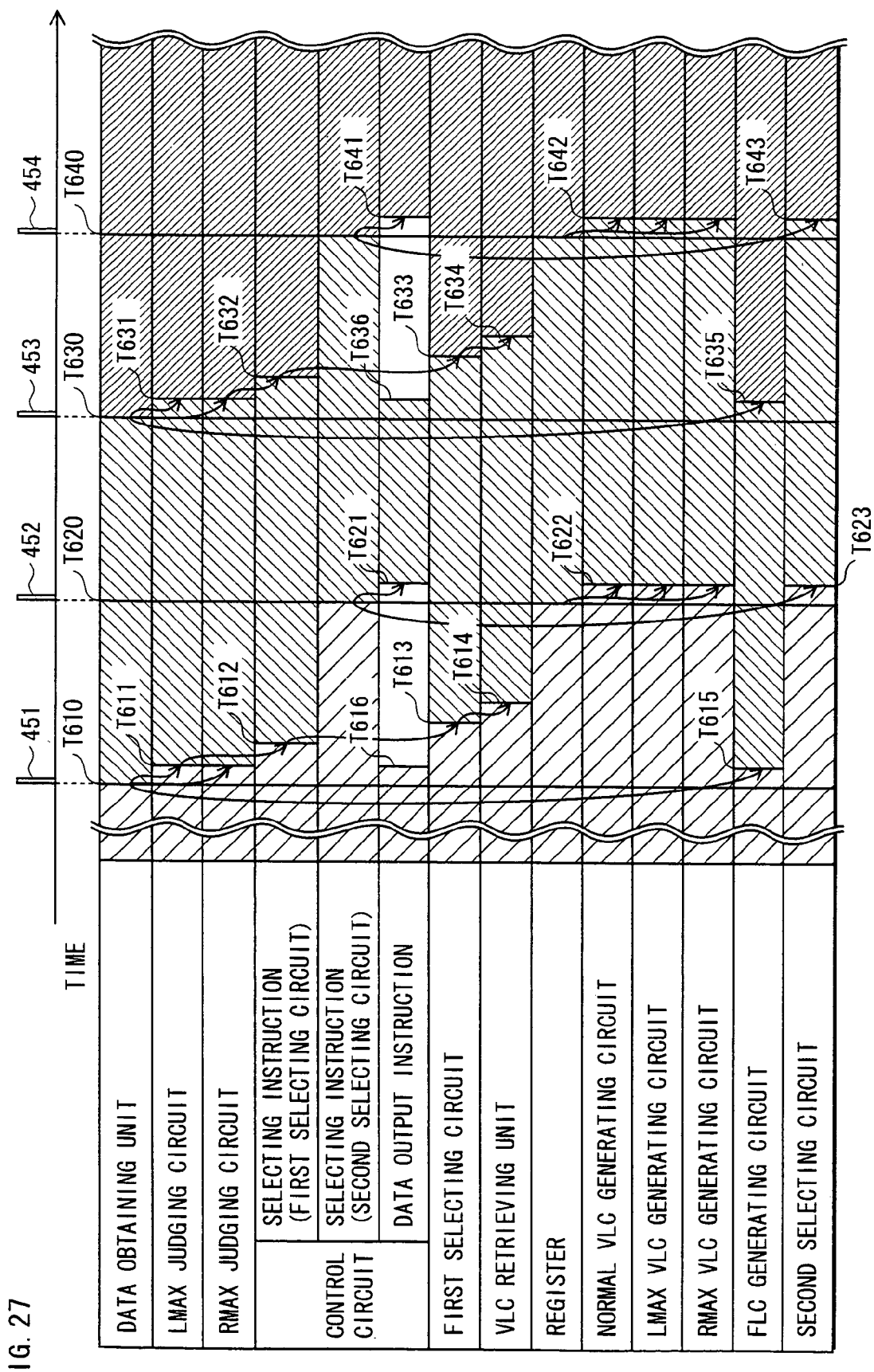
FIG. 27 is a time chart illustrating, in a chronological order, timings of operations of the circuits constituting the variable-length coding circuit 200f.

The following describes an operation cycle of the variable-length coding circuit 200*f*, with reference to a time chart shown in FIG. 27.

In the time chart shown in FIG. 27, the names of the circuits constituting the variable-length coding circuit 200*f* are arranged vertically, and a time is plotted horizontally.

This time chart illustrates how pieces of data are sequentially processed, in relation to time.

Clock signals 451, 452, 453, and 454 are supplied at regular time intervals, i.e., at times T610, T620, T630, and T640, to the data obtaining unit 201, control circuit 206f, and register 208. Note that a predetermined time interval between clock signals is referred to as a clock cycle.

The arrow shown in FIG. 27 indicates that an operation performed at a circuit specified by the starting point of the arrow at a particular time causes an operation to start at a different circuit specified by the ending point of the arrow at a particular time.

At the time T610, the data obtaining unit 201 detects the clock signal 451, and outputs a Sign value, a Level value, a Level absolute value, a Run value, and a Last value stored thereon, to the LMAX judging circuit 202f, RMAX judging circuit 216f, and FLC generating circuit 211. This output continues until the time T630. The output Sign value, Level value, Level absolute value, Run value, and Last value are collectively referred to as data K.

At a time T611, the LMAX judging circuit 202f receives a combination (Last, Run, Level absolute value) included in the data K. The LMAX judging circuit 202f judges a type of a code to be assigned to a combination (Last, Run, Level) included in the data K. The LMAX judging circuit 202f generates a first mode signal and a combination (Last, Run, selected Level) as a result of the judgment. The LMAX judging circuit 202f outputs the generated first mode signal to the control circuit 206f, and outputs the generated combination (Last, Run, selected Level) to the first selecting circuit 205f. This output continues until a time T631.

At the time T611, the RMAX judging circuit 216f also receives the combination (Last, Run, Level absolute value) included in the data K. The RMAX judging circuit 216f judges the type of the code to be assigned to the combination (Last, Run, Level) included in the data K. The RMAX judging circuit 216f generates a second mode signal and a combination (Last, selected Run, Level absolute value) as a result of the judgment. The RMAX judging circuit 216f outputs the generated second mode signal to the control circuit 206f, and outputs the generated combination (Last, selected Run, Level absolute value) to the first selecting circuit 205f. This output continues until the time T631.

At a time T612, the control circuit 206f receives the first mode signal and second mode signal. The control circuit 206f outputs a selecting instruction that is determined according to the combination of the received first and second mode signals, to the first selecting circuit 205f. This output continues until a time T632. Note that the control circuit 206f does not output a selecting instruction to the first selecting circuit 205f when the first and second mode signals both indicate "10".

At a time T613, the first selecting circuit 205f receives the selecting instruction from the control circuit 206f. In accordance with the received selecting instruction, the first selecting circuit 205f selects one of the combination (Last, Run, selected Level) output from the LMAX judging circuit 202f and the combination (Last, selected Run, Level absolute value) output from the RMAX judging circuit 216f, and outputs the selected combination to the VLC retrieving unit 207f. This output continues until a time T633.

At a time T614, the VLC retrieving unit 207f receives, from the first selecting circuit 205f, the selected one of the combination (Last, Run, selected Level) and combination (Last, selected Run, Level absolute value) from the first selecting circuit 205f. The VLC retrieving unit 207f reads, from the VLC table 251, a VLC corresponding to the received one of the combination (Last, Run, selected Level) and combination (Last, selected Run, Level absolute value). The VLC retrieving unit 207f outputs the read VLC to the register 208. This output continues until a time T634.

At a time T615, the FLC generating circuit 211 receives the combination (Last, Run, Level) included in the data K. The FLC generating circuit 211 generates an FLC based on the received combination (Last, Run, Level), and outputs the generated FLC to the second selecting circuit 215. This output continues until a time T635.

At the time T620, the register 208 detects the clock signal 452. The register 208 receives the VLC from the VLC retrieving unit 207f, and stores the received VLC temporarily. The register 208 outputs the stored VLC to the normal VLC generating circuit 214, LMAX VLC generating circuit 213, RMAX VLC generating circuit 212. This output continues until the time T640.

At a time T622, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the second selecting circuit 215. This output continues until a time T642.

At the time T620, the control circuit 206f detects the clock signal 452, and outputs a selecting instruction, to the second selecting circuit 215, which is determined according to the first and second mode signals. This output continues until the time T640. After outputting the selecting instruction to the second selecting circuit 215, the control circuit 206f outputs a data output instruction to the data obtaining unit 201 at a time T621. This output continues until a time T636.

At a time T623, the second selecting circuit 215 receives the selecting instruction from the control circuit 206f. In accordance with the received selecting instruction, the second selecting circuit 215 selects one of the normal VLC, LMAX VLC, RMAX VLC, and FLC, as the code assigned to the combination (Last, Run, Level). The second selecting circuit 215 then outputs the selected code. This output continues until a time T643.

At the time T630, the data obtaining unit 201 detects the clock signal 453, and receives the data output instruction. Therefore, the data obtaining unit 201 outputs a new set of a Sign value, a Level value, a Level absolute value, a Run value, and a Last value, to the LMAX judging circuit 202f, RMAX judging circuit 216f, and FLC generating circuit 211. The output Sign value, Level value, Level absolute value, Run value, and Last value are collectively referred to as data L.

The data obtaining unit 201, LMAX judging circuit 202f, RMAX judging circuit 216f, . . . second selecting circuit 215 in the variable-length coding circuit 200f perform the same procedure for the data L as for the data K. Consequently, the variable-length coding circuit 200f generates and outputs a code corresponding to a combination (Last, Run, Level) included in the data L within two clock cycles.

5.2 Summary

According to the variable-length coding circuit 200f relating to the fifth embodiment, the LMAX judging circuit 202f and RMAX judging circuit 216f operate in parallel. The control circuit 206f judges a type of a code to be assigned to a combination (Last, Run, Level) based on a first mode signal and a second mode signal respectively received from the LMAX judging circuit 202*f* and RMAX judging circuit 216*f*, and outputs a selecting instruction determined based on the judgment, to the first selecting circuit 205*f* and second selecting circuit 215.

Since the LMAX judging circuit 202*f* and RMAX judging circuit 216*f* are arranged in parallel, the variable-length coding circuit 200*f* can achieve a shorter path between the data obtaining unit 201 and second selecting circuit 215. In addition, when judging that the code to be assigned to the combination (Last, Run, Level) is an FLC, the variable-length coding circuit 200*f* does not output a selecting instruction to the first selecting circuit 205*f*. By doing so, the VLC retrieving unit 207*f* does not have to perform an unnecessary operation. This can reduce power consumption.

5.3 Modification Example of Fifth Embodiment

According to the fifth embodiment described above, the control circuit 206*f* preferentially selects an LMAX VLC, in a case where both of an LMAX VLC and an RMAX VLC can be assigned to a combination (Last, Run, Level). However, the control circuit 206*f* may preferentially select an RMAX VLC.

To be specific, when received first and second mode signals both indicate "01", the control circuit 206*f* outputs a selecting instruction, to the first selecting circuit 205*f*, instructing a selection of a combination (Last, selected Run, Level absolute value) output from the RMAX judging circuit 216*f*, and outputs a selecting instruction, to the second selecting circuit 215, instructing a selection of an RMAX VLC output from the RMAX VLC generating circuit 212.

Alternatively, a user may be enabled to determine priorities between an LMAX VLC and an RMAX VLC with a key operation or the like.

6. Sixth Embodiment

The following describes an imaging system relating to a sixth embodiment of the present invention.

The imaging system relating to the sixth embodiment is constituted by an optical system, a sensor, a converting circuit, an imaging processing circuit, the recording and transmitting system 105, a playback system, a timing control circuit, and a system control circuit, similarly to the imaging system 100 relating to the first embodiment. The optical system, sensor, converting circuit, imaging processing circuit, playback system, timing control circuit, and system control circuit are the same as in the first embodiment, and are not explained in the following.

Figure 28:
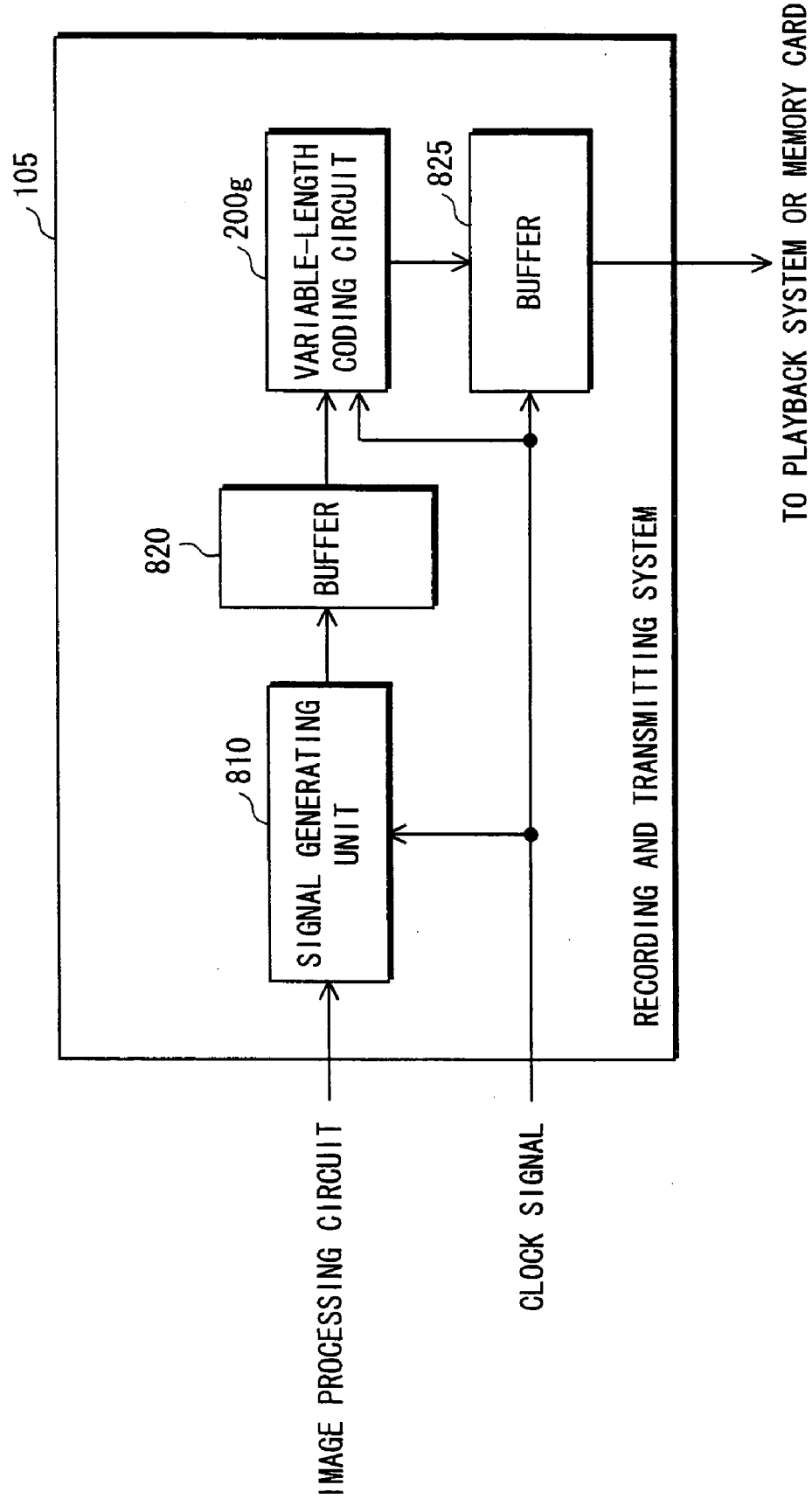
FIG. 28 is a block diagram illustrating a construction of a recording and transmitting system 105.

The recording and transmitting system 105 is constituted by a signal generating unit 810, a buffer 820, a variable-length coding circuit 200*g*, and a buffer 825, as shown in FIG. 28. The recording and transmitting system 105 receives DCT coefficients generated by the image processing circuit, generates variable-length codes based on the received DCT coefficients, and stores thereon the generated variable-length codes. The following specifically describes the constituents of the recording and transmitting system 105 with reference to FIG. 28.

6.1 Buffers 820 and 825

The buffer 820 is formed by using a RAM, and temporarily stores thereon a signal output from the signal generating unit 810.

The buffer 825 is formed by using an SRAM. The buffer 825 temporarily stores thereon a code generated by the variable-length coding circuit 200*g*, and outputs the stored code to an external storage medium such as a memory card and the playback system.

6.2 Signal Generating Unit 810

The signal generating unit 810 has a counter that counts the number of zero DCT coefficients.

The signal generating unit 810 receives clock signals from the timing control circuit at regular time intervals. In synchronization with a timing of a clock signal, the signal generating unit 810 receives a DCT coefficient generated by the image processing circuit. When receiving a DCT coefficient, the signal generating unit 810 judges whether the received DCT coefficient has a value of zero. If the received DCT coefficient has a value of zero, the signal generating unit 810 adds one to the value shown by the counter.

If the received DCT coefficient does not have a value of zero, the signal generating unit 810 judges whether the received DCT coefficient is the last DCT coefficient in a block. If the received DCT coefficient is the last DCT coefficient in the block, the signal generating unit 810 generates a Last value of one. If the received DCT coefficient is not the last DCT coefficient in the block, the signal generating unit 810 generates a Last value of zero. Here, the block is the unit of image processing, and formed by eight pixels and eight lines. The image processing circuit performs a quantizing operation and a DCT operation in the unit of blocks.

After this, the signal generating unit 810 judges whether the received DCT coefficient has a positive or negative value. In the case of a positive value, the signal generating unit 810 generates a Sign value of zero, and designates the value of the received DCT coefficient as a Level value. Also, the signal generating unit 810 designates the value of the received DCT coefficient as a Level absolute value. In the case of a negative value, the signal generating unit 810 generates a Sign value of one, and designates the value of the received DCT coefficient as a Level value. In addition, the signal generating unit 810 designates an absolute value of the received DCT coefficient as a Level absolute value.

In addition, the signal generating unit 810 designates the value shown by the counter as a Run value. Subsequently, the signal generating unit 810 writes the generated Sign value, Last value, Run value, Level value, and Level absolute value, into the buffer 820.

6.3 Variable-length Coding Circuit 200*g*

The variable-length coding circuit 200*g* stores thereon a threshold value n and a threshold value m. If a Run value is judged to be equal to or smaller than at least one of the threshold values n and m, the variable-length coding circuit 200*g* judges a type of a code to be assigned to a combination (Last, Run, Level), and generates the code based on the result of the judgment.

If the Run value is judged to exceed both of the threshold values n and m, the variable-length coding circuit 200*g* generates the code to be assigned to the combination (Last, Run, Level), using a conventional method. To be specific, the variable-length coding circuit 200*g* attempts to read a VLC corresponding to a combination (Last, Run, Level absolute value). If there is the corresponding VLC, the variable-length coding circuit 200*g* generates a normal VLC based on the read VLC. If there is no corresponding VLC, the variable-length coding circuit 200*g* sequentially tries the code generating operations according to the first to third escape modes. The following describes a code generating operation of the variable-length coding circuit 200*g*, and a construction to realize the code generating function.

(Operation of Variable-length Coding Circuit 200g)

Figure 29:
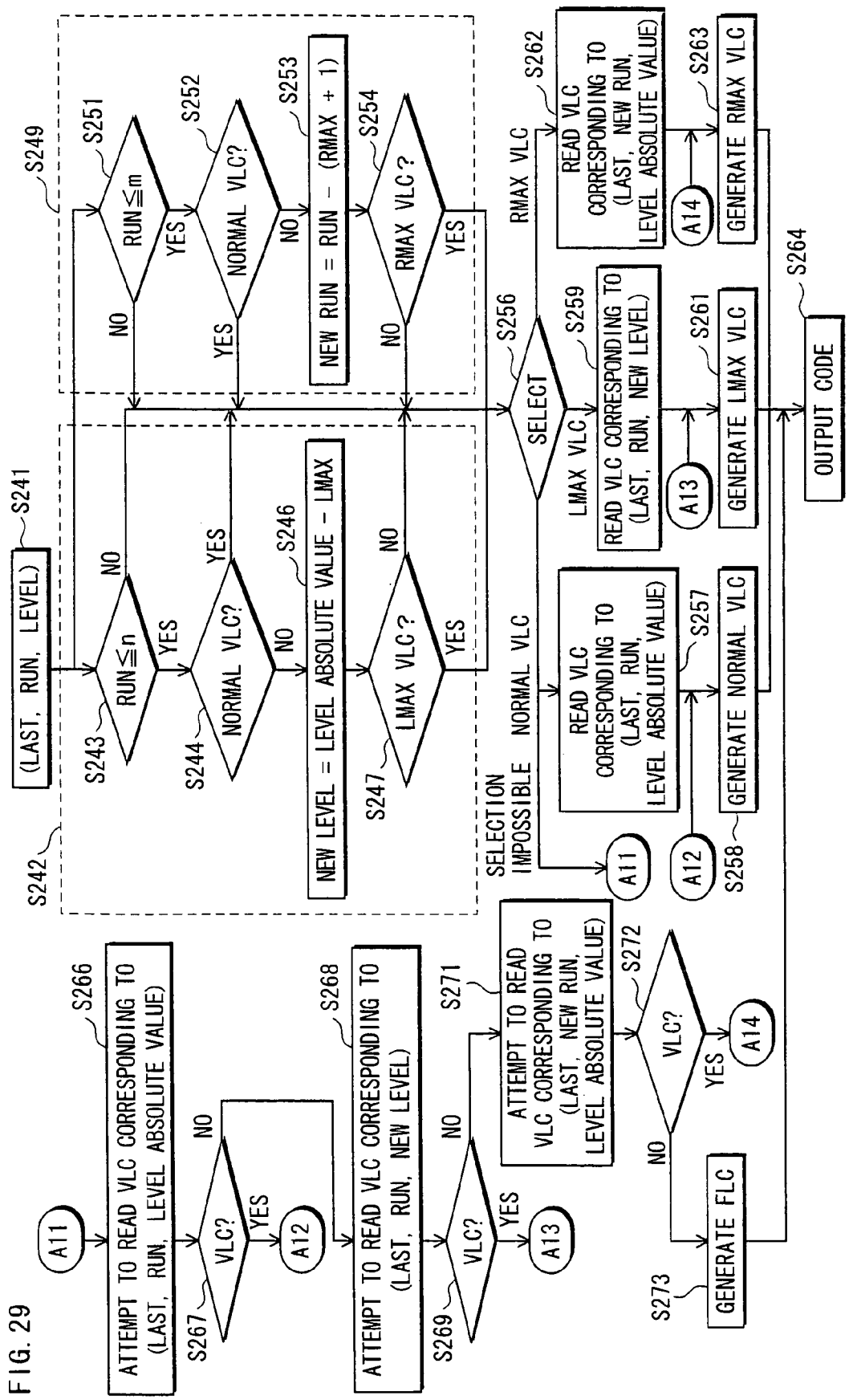
FIG. 29 is a flow chart illustrating an operation of a variable-length coding circuit 200g relating to a sixth embodiment.

The following describes an operation of the variable-length coding circuit 200g with reference to a flow chart shown in FIG. 29.

The variable-length coding circuit 200g starts a code generating operation, with an output of data including a combination (Last, Run, Level) to the circuits included in the variable-length coding circuit 200g (step S241). Then, an LMAX judging unit 202g (described later) judges a type of a code to be assigned to the combination (Last, Run, Level) (step S242). In parallel to the step S242, an RMAX judging unit 216g (described later) also judges the type of the code to be assigned to the combination (Last, Run, Level) (step S249).

In the step S242, the LMAX judging unit 202g determines whether to judge the type of the code to be assigned to the combination (Last, Run, Level), by comparing the Run value and threshold value n (step S243). When the Run value>n (step S243:NO), the LMAX judging unit 202g does not perform a subsequent operation from a step S244 to a step S247. When the Run value≦n (step S243:YES), the LMAX judging unit 202g judges whether the code to be assigned to the combination (Last, Run, Level) is a normal VLC or not, by comparing an LMAX and a Level absolute value (step S244). When judging the code not to be a normal VLC (step S244:NO), the LMAX judging unit 202g calculates New Level=the Level absolute value−the LMAX (step S246). The LMAX judging unit 202g then judges whether the code to be assigned to the combination (Last, Run, Level) can be an LMAX VLC, by comparing the calculated New Level with the LMAX (step S247).

In the step S249, the RMAX judging unit 216g determines whether to judge the type of the code to be assigned to the combination (Last, Run, Level), by comparing the Run value and threshold value m (step S251). When the Run value>m (step S251:NO), the RMAX judging unit 216g does not perform a subsequent operation from a step S252 to a step S254.

When the Run value≦m (step S251:YES), the RMAX judging unit 216g judges whether the code to be assigned to the combination (Last, Run, Level) is a normal VLC or not, by comparing an RMAX and the Run value (step S252). When judging the code not to be a normal VLC (step S252:NO), the RMAX judging unit 216g calculates New Run=the Run value−(the RMAX+1) (step S253). The RMAX judging unit 216g then judges whether the code to be assigned to the combination (Last, Run, Level) can be an RMAX VLC, by comparing the calculated New Run with the RMAX (step S254).

Subsequently, the variable-length coding circuit 200g selects the type of the code to be assigned to the combination (Last, Run, Level), based on the judgment results made in the steps S242 and S249 (step S256).

When selecting a normal VLC, the variable-length coding circuit 200g reads a VLC corresponding to a combination (Last, Run, Level absolute value) (step S257). The variable-length coding circuit 200g generates a normal VLC based on the read VLC (step S258), and outputs the generated normal VLC as the code assigned to the combination (Last, Run, Level) (step S264).

When selecting an LMAX VLC, the variable-length coding circuit 200g reads a VLC corresponding to a combination (Last, Run, New Level) (step S259). The variable-length coding circuit 200g generates an LMAX VLC based on the read VLC (step S261), and outputs the generated LMAX VLC as the code assigned to the combination (Last, Run, Level) (step S264).

When selecting an RMAX VLC, the variable-length coding circuit 200g reads a VLC corresponding to a combination (Last, New Run, Level absolute value) (step S262). The variable-length coding circuit 200g generates an RMAX VLC based on the read VLC (step S263), and outputs the generated RMAX VLC as the code assigned to the combination (Last, Run, Level) (step S264).

When judging that selection is not possible based on the judgment results made by the LMAX judging unit 202g and RMAX judging unit 216g, the variable-length coding circuit 200g attempts to read a VLC corresponding to the combination (Last, Run, Level absolute value), from a VLC table (step S266). If there is the corresponding VLC on the VLC table (step S267: YES), the variable-length coding circuit 200g next performs the step S258.

If there is no corresponding VLC on the VLC table (step S267:NO), the variable-length coding circuit 200g calculates the New Level=the Level absolute value−the LMAX, and attempts to read a VLC corresponding to the combination (Last, Run, New Level) (step S268). If there is the corresponding VLC on the VLC table (step S269:YES), the variable-length coding circuit 202g next performs the step S261.

If there is no corresponding VLC on the VLC table (step S269:NO), the variable-length coding circuit 200g calculates the New Run=the Run value−(the RMAX+1), and attempts to read a VLC corresponding to the combination (Last, New Run, Level absolute value)(step S271). If there is the corresponding VLC on the VLC table (step S272: YES), the variable-length coding circuit 200g next performs the step S263.

If there is no corresponding VLC on the VLC table (step S272:NO), the variable-length coding circuit 200g generates an FLC based on the combination (Last, Run, Level) (step S273), and outputs the generated FLC as the code assigned to the combination (Last, Run, Level) (step S264).

(Construction of Variable-length Coding Circuit 200g)

Figure 30:
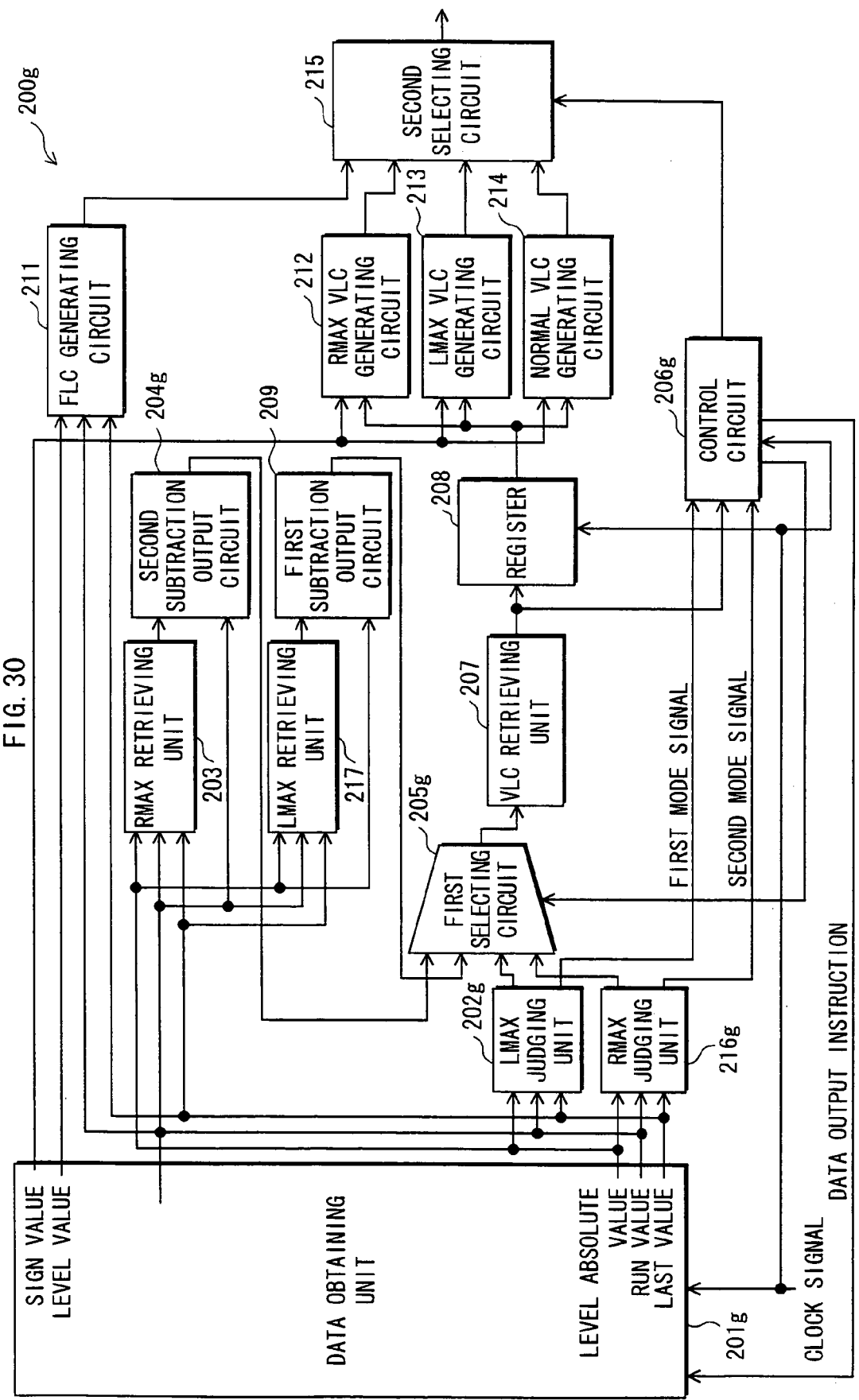
FIG. 30 is a block diagram illustrating a construction of the variable-length coding circuit 200g.

As shown in FIG. 30, the variable-length coding circuit 200g is constituted by a data obtaining unit 201g, the LMAX judging unit 202g, the RMAX retrieving unit 203, a second subtraction output circuit 204g, a first selecting circuit 205g, a control circuit 206g, the VLC retrieving unit 207, the register 208, a first subtraction output circuit 209, the FLC generating circuit 211, the RMAX VLC generating circuit 212, the LMAX VLC generating circuit 213, the normal VLC generating circuit 214, the second selecting circuit 215, the RMAX judging unit 216g, and the LMAX retrieving unit 217.

The RMAX retrieving unit 203, VLC retrieving unit 207, register 208, FLC generating circuit 211, RMAX VLC generating circuit 212, LMAX VLC generating circuit 213, normal VLC generating circuit 214, and second selecting circuit 215 have the same constructions and perform the same operations as in the first embodiment, and therefore are not described in the following. The LMAX retrieving unit 217 is the same as in the second embodiment. Also, the second subtraction output circuit 204g is the same as the subtraction output circuit 204 relating to the first embodiment, and the first subtraction output circuit 209 is the same as the subtraction output circuit 204b relating to the second embodiment. Therefore, the first and second subtraction output circuits 209 and 204g are not explained in the following.

(1) Data Obtaining Unit 201g

The data obtaining unit 201g receives clock signals from the timing control circuit at regular time intervals. Furthermore, the data obtaining unit 201g receives a data output instruction from the control circuit 206g.

When detecting a clock signal and receiving a data output instruction, the data obtaining unit 201g reads a Sign value, a Last value, a Run value, a Level value, and a Level absolute value, from the buffer 820. The data obtaining unit 201g outputs the read Sign value, Last value, Run value, Level value, and Level absolute value, to the LMAX judging unit 202g, RMAX judging unit 216g, LMAX retrieving unit 217, first subtraction output circuit 209, RMAX retrieving unit 203, second subtraction output circuit 204g, and FLC generating circuit 211.

(2) LMAX Judging Unit 202g

Figure 31A:
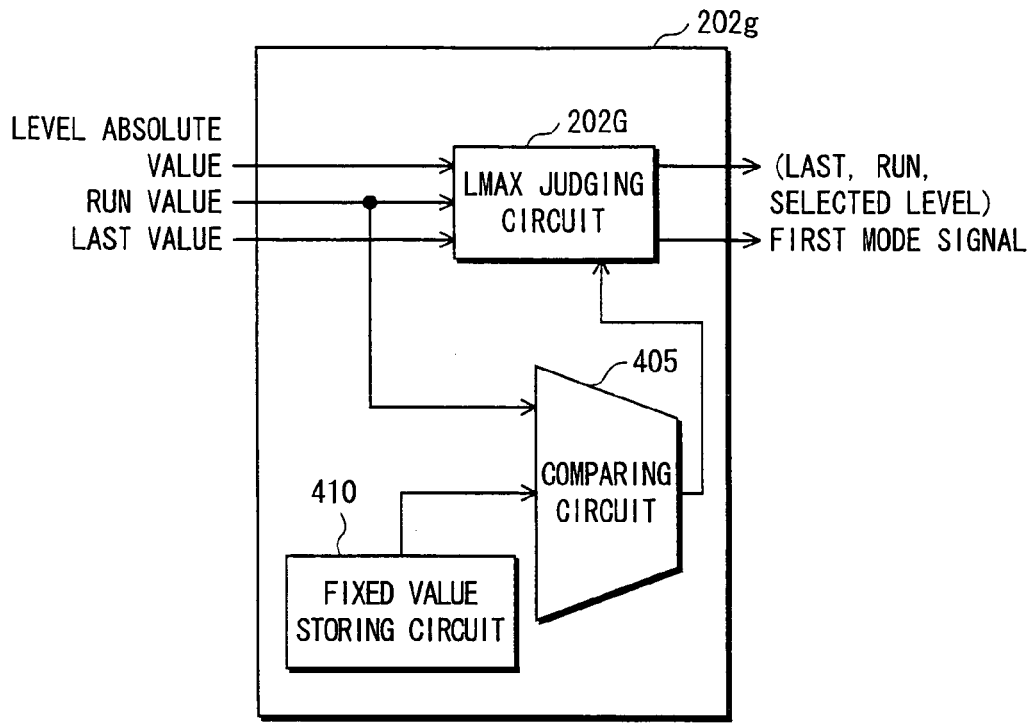
FIGS. 31A and 31B are block diagrams respectively illustrating a construction of an LMAX judging unit 202g and a construction of an RMAX judging unit 216g.

As shown in FIG. 31A, the LMAX judging unit 202g is constituted by an LMAX judging circuit 202G, a comparing circuit 405, and a fixed value storing circuit 410.

(i) Fixed Value Storing Circuit 410

The fixed value storing circuit 410 stores thereon the threshold value n. The threshold value n is a predetermined integer in a range of $0 \leq n < 63$. The threshold value n is determined by characteristics of image data processed by the imaging system.

Here, the threshold value n may be stored in the fixed value storing circuit 410 during the manufacturing process of the variable-length coding circuit 200g. Alternatively, the threshold value n may be written by a user's operation after the variable-length coding circuit 200g is completed.

(ii) Comparing Circuit 405

The comparing circuit 405 receives a Run value from the data obtaining unit 201g. When receiving the Run value, the comparing circuit 405 reads the threshold value n from the fixed value storing circuit 410. The comparing circuit 405 compares the read threshold value n with the Run value, and outputs the result of the comparison to the LMAX judging circuit 202G.

(iii) LMAX Judging Circuit 202G

Similarly to the LMAX judging circuit 202 relating to the first embodiment, the LMAX judging circuit 202G is constituted by an LMAX retrieving unit, a first comparing circuit, a subtracting circuit, a second comparing circuit, a selecting circuit, a judgment control circuit, and an output circuit. The LMAX retrieving unit, first comparing circuit, subtracting circuit, second comparing circuit, selecting circuit, and output circuit respectively perform the same operations as the LMAX retrieving unit 231, first comparing circuit 232, subtracting circuit 233, second comparing circuit 234, selecting circuit 236, and output circuit 238 included in the LMAX judging circuit 202.

The judgment control circuit receives a result of comparing the threshold value n and a Run value from the comparing circuit 405.

When the received comparison result indicates the Run value$\leq$n, the judgment control circuit generates a mode signal based on comparison results received from the first comparing circuit and second comparing circuit, and outputs the generated mode signal to the selecting circuit and control circuit 206g, similarly to the judgment control circuit 237 relating to the first embodiment.

When the comparison result received from the comparing circuit 405 indicates the Run value>n, the judgment control circuit ignores the comparison results received from the first and second comparing circuits, generates a mode signal "10", and outputs the generated mode signal "10" to the selecting circuit and control circuit 206g. For better intelligibility, the mode signal output from the LMAX judging unit 202g is referred to as a first mode signal.

Here, a first mode signal of "00" indicates that a code to be assigned to a combination (Last, Run, Level) is a normal VLC. A first mode signal of "01" indicates that an LMAX VLC can be generated to be assigned to a combination (Last, Run, Level). A first mode signal of "10" indicates that the type of the code to be assigned to the combination (Last, Run, Level) is not known since the LMAX judging unit 202g does not judge the type of the code to be assigned to the combination (Last, Run, Level).

(3) RMAX Judging Unit 216g

Figure 31B:
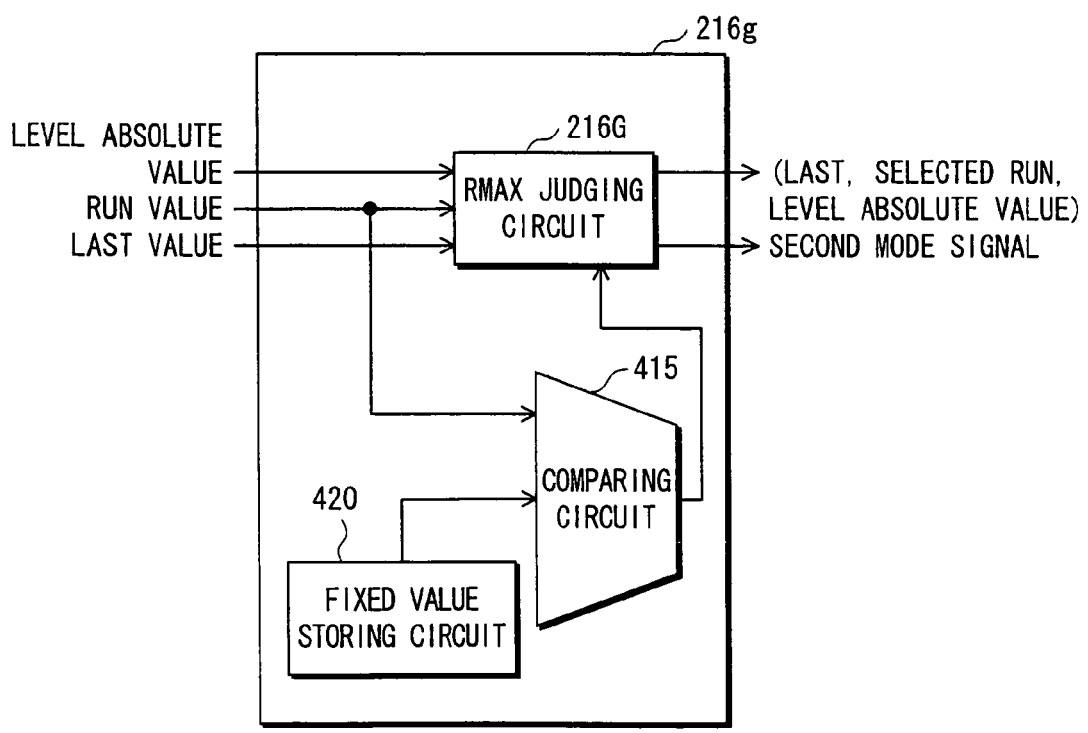

As shown in FIG. 31B, the RMAX judging unit 216g is constituted by an RMAX judging circuit 216G, a comparing circuit 415, and a fixed value storing circuit 420.

(i) Fixed Value Storing Circuit 420

The fixed value storing circuit 420 stores thereon the threshold value m. The threshold value m is a predetermined integer in a range of $0 \leq m < 63$. The threshold value m is determined by characteristics of image data processed by the imaging system.

Here, the threshold value m may be stored in the fixed value storing circuit 420 during the manufacturing process of the variable-length coding circuit 200g. Alternatively, the threshold value m may be written by a user's operation after the variable-length coding circuit 200g is completed.

(ii) Comparing Circuit 415

The comparing circuit 415 receives a Run value from the data obtaining unit 201g. When receiving the Run value, the comparing circuit 415 reads the threshold value m from the fixed value storing circuit 420. The comparing circuit 415 compares the read threshold value m with the Run value, and outputs the result of the comparison to the RMAX judging circuit 216G.

(iii) RMAX Judging Circuit 216G

Similarly to the RMAX judging circuit 216 relating to the second embodiment, the RMAX judging circuit 216G is constituted by an RMAX retrieving unit, a first comparing circuit, a subtracting circuit, a second comparing circuit, a selecting circuit, a judgment control circuit, and an output circuit. The RMAX retrieving unit, first comparing circuit, subtracting circuit, second comparing circuit, selecting circuit, and output circuit respectively perform the same operations as the RMAX retrieving unit 281, first comparing circuit 282, subtracting circuit 283, second comparing circuit 284, selecting circuit 286, and output circuit 288 included in the RMAX judging circuit 216. Therefore, these constituents are not described in the following.

The judgment control circuit receives a result of comparing the threshold value m and a Run value from the comparing circuit 415.

When the received comparison result indicates the Run value$\leq$m, the judgment control circuit generates a mode signal based on comparison results received from the first and second comparing circuits, and outputs the generated mode signal to the selecting circuit and control circuit 206g, similarly to the judgment control circuit 287 in the second embodiment.

When the comparison result received from the comparing circuit 415 indicates the Run value>m, the judgment control circuit ignores the comparison results received from the first and second comparing circuits, generates a mode signal "10", and outputs the generated mode signal "10" to the selecting circuit and control circuit 206g. For better intelligibility, the mode signal output from the RMAX judging unit 216g is referred to as a second mode signal.

Here, a second mode signal of "00" indicates that a code to be assigned to a combination (Last, Run, Level) is a normal VLC. A second mode signal of "01" indicates that an RMAX VLC can be generated to be assigned to a combination (Last, Run, Level). A second mode signal of "10" indicates that a type of a code to be assigned to a combination (Last, Run, Level) is not known since the RMAX judging unit 216g does not judge the type of the code to be assigned to the combination (Last, Run, Level.

(4) First Selecting Circuit 205g

The first selecting circuit 205g receives a combination (Last, Run, selected Level) from the LMAX judging unit 202g, receives a combination (Last, selected Run, Level absolute value) from the RMAX judging unit 216g, receives a combination (Last, Run, New Level) from the first subtraction output circuit 209, and receives a combination (Last, New Run, Level absolute value) from the second subtraction output circuit 204g. Furthermore, the first selecting circuit 205g receives, from the control circuit 206g, a selecting instruction indicating a selection of one of the combination (Last, Run, selected Level), combination (Last, selected Run, Level absolute value), combination (Last, Run, New Level), and combination (Last, New Run, Level absolute value).

When receiving the selecting instruction, the first selecting circuit 205g selects one of the combination (Last, Run, selected Level), combination (Last, selected Run, Level absolute value), combination (Last, Run, New Level), and combination (Last, New Run, Level absolute value) in accordance with the received selecting instruction, and outputs the selected combination to the VLC retrieving unit 207.

(5) Control Circuit 206g

The control circuit 206g stores thereon a variety of instructions such as a selecting instruction and a data output instruction.

The control circuit 206g receives clock signals from the timing control circuit at regular time intervals. Furthermore, the control circuit 206g receives a first mode signal from the LMAX judging unit 202g, and a second mode signal from the RMAX judging unit 216g. Also, the control circuit 206g receives an OK signal or VLC error signal from the VLC retrieving unit 207.

The control circuit 206g outputs a selecting instruction that is determined according to a combination of the first and second mode signals as shown in FIG. 32.

FIG. 32 illustrates selecting instructions output from the control circuit 206g to the first selecting circuit 205g and second selecting circuit 215, which are determined according to a combination of the first and second mode signals. The word "LMAX" in the SELECTING INSTRUCTION (FIRST SELECTING CIRCUIT) section in FIG. 32 indicates that a selecting instruction output to the first selecting circuit 205g instructs a selection of a combination (Last, Run, selected Level) output from the LMAX judging unit 202g. The word "RMAX" indicates that a selecting instruction output to the first selecting circuit 205g instructs a selection of a combination (Last, selected Run, Level absolute value) output from the RMAX judging unit 216g.

The alphabetical letter "N" in the SELECTING INSTRUCTION (SECOND SELECTING CIRCUIT) section indicates that a selecting instruction output to the second selecting circuit 215 instructs a selection of a normal VLC output from the normal VLC generating circuit 214. The letter "L" indicates that a selecting instruction output to the second selecting circuit 215 instructs a selection of an LMAX VLC output from the LMAX VLC generating circuit 213. The letter "R" indicates that a selecting instruction output to the second selecting circuit 215 instructs a selection of an RMAX VLC output from the RMAX VLC generating circuit 212.

The following describes an operation performed by the control circuit 206g with reference to FIG. 32.

(i) First Mode Signal "00" and Second Mode Signal "00" or "10"

When the first and second mode signals both indicate "00", and when the first mode signal indicates "00" and the second mode signal indicates "10", the control circuit 206g outputs a selecting instruction, to the first selecting circuit 205g, indicating a selection of a combination (Last, Run, selected Level) output from the LMAX judging unit 202g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of a normal VLC output from the normal VLC generating circuit 214.

After this, the control circuit 206g outputs a data output instruction, to the data obtaining unit 201g, requesting an output of new data.

(ii) First Mode Signal "01" and Second Mode Signal "01" or "10"

When the first and second mode signals both indicate "10", and when the first mode signal indicates "01" and the second mode signal indicates "10", the control circuit 206g outputs a selecting instruction, to the first selecting circuit 205g, indicating a selection of a combination (Last, Run, selected Level) output from the LMAX judging unit 202g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of an LMAX VLC output from the LMAX VLC generating circuit 213.

After this, the control circuit 206g outputs a data output instruction to the data obtaining unit 201g.

(iii) First Mode Signal "10" and Second Mode Signal "00"

When the first mode signal indicates "10" and the second mode signal indicates "00", the control circuit 206g outputs a selecting instruction, to the first selecting circuit 205g, indicating a selection of a combination (Last, selected Run, Level absolute value) output from the RMAX judging unit 216g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of a normal VLC output from the normal VLC generating circuit 214.

After this, the control circuit 206g outputs a data output instruction to the data obtaining unit 201g.

(iv) First Mode Signal "10" and Second Mode Signal "01"

When the first mode signal indicates "10" and the second mode signal indicates "01", the control circuit 206g outputs a selecting instruction, to the first selecting circuit 205g, indicating a selection of a combination (Last, selected Run, Level absolute value) output from the RMAX judging unit 216g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of an RMAX VLC output from the RMAX VLC generating circuit 212.

After this, the control circuit 206g outputs a data output instruction to the data obtaining unit 201g.

(v) First Mode Signal "10" and Second Mode Signal "10"

When the first and second mode signals both indicate "10", the control circuit 206g outputs a selecting instruction, to the first selecting circuit 205g, indicating a selection of a combination (Last, Run, selected Level) output from the LMAX judging unit 202g. After this, the control circuit 206g receives, from the VLC retrieving unit 207, an OK signal indicating that a VLC has been successfully read, or VLC error signal indicating that there is no corresponding VLC.

When receiving an OK signal, the control circuit 206g outputs a selecting instruction, to the second selecting circuit 215, indicating a selection of a normal VLC output from the normal VLC generating circuit 214. After this, the control circuit 206g outputs a data output instruction to the data obtaining unit 201g.

When receiving a VLC error signal, the control circuit 206g performs a control so that the variable-length coding circuit 200g performs an operation according to the first escape mode, as explained in the following section (v-1).

(v-1) First Escape Mode

When receiving a VLC error signal, the control circuit 206g performs a control so that the variable-length coding circuit 200g performs a code generating operation according to the first escape mode. In detail, the control circuit 206g outputs a selecting instruction, to the first selecting circuit 205g, indicating a selection of a combination (Last, Run, New Level) output from the first subtraction output circuit 209.

After this, the control circuit 206g receives an OK signal or VLC error signal from the VLC retrieving unit 207. When receiving an OK signal, the control circuit 206g outputs a selecting instruction, to the second selecting circuit 215, indicating a selection of an LMAX VLC output from the LMAX VLC generating circuit 213, in synchronization with detection of a new clock signal. After this, the control circuit 206g outputs a data output instruction to the data obtaining unit 201g.

When receiving a VLC error signal from the VLC retrieving unit 207, the control circuit 206g performs a control so that the variable-length coding circuit 200g performs a code generating operation according to the second escape mode explained in the following section (v-2).

(v-2) Second Escape Mode

When receiving a VLC error signal in the code generating operation according to the first escape mode, the control circuit 206g performs a control so that the variable-length coding circuit 200g performs a code generating operation according to the second escape mode. In detail, the control circuit 206g outputs a selecting instruction, to the first selecting circuit 205g, indicating a selection of a combination (Last, New Run, Level absolute value) output from the second subtraction output circuit 204g, in synchronization with detection of a new clock signal. After this, the control circuit 206g receives an OK signal or VLC error signal from the VLC retrieving unit 207.

When receiving an OK signal, the control circuit 206g outputs a selecting instruction, to the second selecting circuit 215, indicating a selection of an RMAX VLC output from the RMAX VLC generating circuit 212, in synchronization with detection of a new clock signal. After this, the control circuit 206g outputs a data output instruction to the data obtaining unit 201g.

When receiving a VLC error signal from the VLC retrieving unit 207, the control circuit 206g performs a control so that the variable-length coding circuit 200g performs a code generating operation according to the third escape mode explained in the following section (v-3).

(v-3) Third Escape Mode

When receiving a VLC error signal in the code generating operation according to the second escape mode, the control circuit 206g performs a control so that the variable-length coding circuit 200g performs a code generating operation according to the third escape mode. In detail, the control circuit 206g outputs a selecting instruction, to the second selecting circuit 215, indicating a selection of an FLC output from the FLC generating circuit 211 in synchronization with detection of a new clock signal.

After this, the control circuit 206g outputs a data output instruction to the data obtaining unit 201g.

(6) Operation Cycle of Variable-length Coding Circuit 200g

Figure 33:
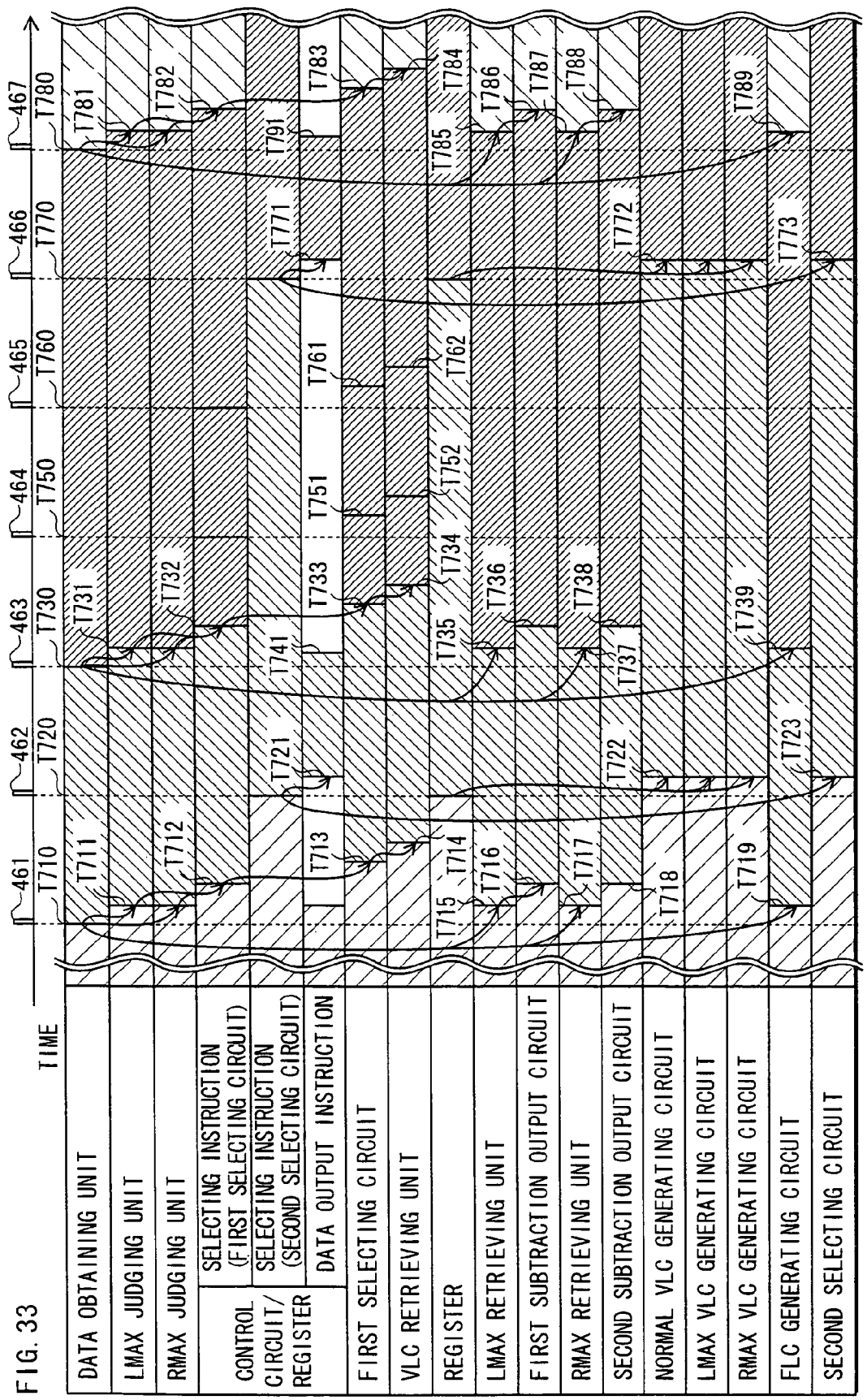
FIG. 33 is a time chart illustrating, in a chronological order, timings of operations of the circuits constituting the variable-length coding circuit 200g.

The following describes an operation cycle of the variable-length coding circuit 200g, with reference to a time chart shown in FIG. 33.

In the time chart shown in FIG. 33, the names of the circuits constituting the variable-length coding circuit 200g are arranged vertically, and a time is plotted horizontally. This time chart illustrates how pieces of data are sequentially processed, in relation to time.

Clock signals 461, 462, 463, . . . 467 are supplied at regular time intervals, i.e., at times T710, T720, T730, . . . T780 to the data obtaining unit 201g, control circuit 206g, and register 208. Note that a predetermined time interval between clock signals is referred to as a clock cycle.

The arrow shown in FIG. 33 indicates that an operation performed at a circuit specified by the starting point of the arrow at a particular time causes an operation to start at a different circuit specified by the ending point of the arrow at a particular time.

At the time T710, the data obtaining unit 201g detects the clock signal 461, and reads a Sign value, a Level value, a Level absolute value, a Run value, and a Last value from the buffer 820. The data obtaining unit 201g outputs the read Sign value, Level value, Level absolute value, Run value, and Last value, to the LMAX judging unit 202g, RMAX judging unit 216g, LMAX retrieving unit 217, first subtraction output circuit 209, RMAX retrieving unit 203, second subtraction output circuit 204g, and FLC generating circuit 211. This output continues until the time T730. The output Sign value, Level value, Level absolute value, Run value, and Last value are collectively referred to as data M. Here, suppose the Run value included in the data M satisfies the following conditions: the Run value$\leq$n and the Run value$\leq$m, and a code to be assigned to a combination (Last, Run, Level) is other than an FLC.

At a time T711, the LMAX judging unit 202g receives a combination (Last, Run, Level absolute value) included in the data M. Since the Run value$\leq$n, the LMAX judging unit 202g judges a type of the code to be assigned to the combination (Last, Run, Level). As a result of the judgment, the LMAX judging unit 202g generates a first mode signal and a combination (Last, Run, selected Level). The LMAX judging unit 202g outputs the generated first mode signal to the control circuit 206g, and outputs the generated combination (Last, Run, selected Level) to the first selecting circuit 205g. This output continues until a time T731.

At the time T711, the RMAX judging unit 216g receives the combination (Last, Run, Level absolute value) included in the data M. Since the Run value≦m, the RMAX judging unit 216g judges the type of the code to be assigned to the combination (Last, Run, Level). As a result of the judgment, the RMAX judging unit 216g generates a second mode signal and a combination (Last, selected Run, Level absolute value). The RMAX judging unit 216g outputs the generated second mode signal to the control circuit 206g, and outputs the generated combination (Last, selected Run, Level absolute value) to the first selecting circuit 205g. This output continues until the time T731.

Since the code to be assigned to the combination (Last, Run, Level) included in the data M is assumed to be other than an FLC, at least one of the output first and second mode signals indicates a value other than "10".

At a time T712, the control circuit 206g receives the first and second mode signals, and outputs a selecting instruction in accordance with the received first and second mode signals to the first selecting circuit 205g. This output continues until a time T732.

At a time T715, the LMAX retrieving unit 217 receives the Last value, Run value, and Level absolute value included in the data M from the data obtaining unit 201g. The LMAX retrieving unit 217 reads an LMAX corresponding to the received pair of the Last value and Run value, and outputs the read LMAX, and the Last value and Run value to the first subtraction output circuit 209. This output continues until a time T735.

At a time T716, the first subtraction output circuit 209 receives the LMAX, Last value, and Run value from the LMAX retrieving unit 217, receives the Level absolute value from the data obtaining unit 201g, and calculates New Level=the Level absolute value−the LMAX. After this, the first subtraction output circuit 209 outputs a combination (Last, Run, New Level) to the first selecting circuit 205g. This output continues until a time T736.

At a time T717, the RMAX retrieving unit 203 receives the Last value, Run value, and Level absolute value included in the data M from the data obtaining unit 201g. The RMAX retrieving unit 203 reads an RMAX corresponding to the received pair of the Last value and Level absolute value, and outputs the read RMAX, and the Last value and Level absolute value to the second subtraction output circuit 204g. This output continues until a time T737.

At a time T718, the second subtraction output circuit 204g receives the RMAX, Last value, and Level absolute value from the RMAX retrieving unit 203, receives the Run value from the data obtaining unit 201g, and calculates New Run=the Run value−(the RMAX+1). After this, the second subtraction output circuit 204g outputs a combination (Last, New Run, Level absolute value) to the first selecting circuit 205g. This output continues until a time T738.

At a time T713, the first selecting circuit 205g receives the selecting instruction from the control circuit 206g. In accordance with the received selecting instruction, the first selecting circuit 205g selects one of the combination (Last, Run, selected Level), combination (Last, selected Run, Level absolute value), combination (Last, Run, New Level), and combination (Last, New Run, Level absolute value), and outputs the selected combination to the VLC retrieving unit 207. This output continues until a time T733.

At a time T714, the VLC retrieving unit 207 receives, from the first selecting circuit 205g, one of the combination (Last, Run, selected Level), combination (Last, selected Run, Level absolute value), combination (Last, Run, New Level), and combination (Last, New Run, Level absolute value). The VLC retrieving unit 207 reads a VLC corresponding to the received combination from the VLC table 251, and outputs the read VLC to the register 208. This output continues until a time T734.

At a time T719, the FLC generating circuit 211 receives the combination (Last, Run, Level) included in the data M from the data obtaining unit 201g. Based on the received combination (Last, Run, Level), the FLC generating circuit 211 generates an FLC, and outputs the generated FLC to the second selecting circuit 215. This output continues until a time T739.

At the time T720, the register 208 detects the clock signal 462, receives the VLC from the VLC retrieving unit 207, and stores thereon the received VLC temporarily. The register 208 then outputs the stored VLC to the normal VLC generating circuit 214, LMAX VLC generating circuit 213, and RMAX VLC generating circuit 212. This output continues until the time T770.

At a time T722, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the second selecting circuit 215. This output continues until a time T772.

At the time T720, the control circuit 206g detects the clock signal 462, and outputs a selecting instruction, to the second selecting circuit 215, which is determined based on the first and second mode signals. This output continues until the time T770.

After outputting a selecting instruction to the second selecting circuit 215, the control circuit 206g outputs a data output instruction to the data obtaining unit 201g at a time T721. This output continues until a time T741.

At a time T723, the second selecting circuit 215 receives the selecting instruction from the control circuit 206g. In accordance with the received selecting instruction, the second selecting circuit 215 selects one of the normal VLC, LMAX VLC, RMAX VLC, and FLC, and outputs the selected code to the buffer 825. This output continues until a time T773.

At the time T730, the data obtaining unit 201g detects the clock signal 463, and receives the data output instruction from the control circuit 206g. When receiving the data output instruction, the data obtaining unit 201g reads a next set of a Sign value, a Last value, a Run value, a Level value, a Level absolute value from the buffer 820. The data obtaining unit 201g outputs the read Sign value, Last value, Run value, Level value, and Level absolute value. This output continues until the time T780. The output Sign value, Last value, Run value, Level value, and Level absolute value are collectively referred to as data N. Here, suppose the Run value included in the data N is larger than the threshold values n and m, and a code to be assigned to a combination (Last, Run, Level) included in the data N is an RMAX VLC.

At the time T731, the LMAX judging unit 202g receives a combination (Last, Run, Level absolute value) included in the data N. Since the Run value>n, the LMAX judging unit 202g does not judge a type of the code to be assigned to the combination (Last, Run, Level). After this, the LMAX judging unit 202g designates the Level absolute value as the selected Level, and generates a first mode signal "10" and a combination (Last, Run, selected Level). The LMAX judging unit 202g outputs the generated first mode signal "10" to the control circuit 206g, and outputs the generated combination (Last, Run, selected Level) to the first selecting circuit 205g. This output continues until a time T781.

At the time T731, the RMAX judging unit 216g receives the combination (Last, Run, Level absolute value) included in the data N. Since the Run value>m, the RMAX judging unit 216g does not judge the type of the code to be assigned to the combination (Last, Run, Level). After this, the RMAX judging unit 216g designates the received Run value as the selected Run, and generates a second mode signal "10" and a combination (Last, selected Run, Level absolute value). The RMAX judging unit 216g outputs the generated second mode signal to the control circuit 206g, and outputs the generated combination (Last, selected Run, Level absolute value) to the first selecting circuit 205g. This output continues until the time T781.

At the time T732, the control circuit 206g receives the first and second mode signals both indicating "10", and outputs a selecting instruction that is determined in accordance with the received first and second mode signals, to the first selecting circuit 205g. This output continues until a time T750. The selecting instruction indicates a selection of the combination (Last, Run, selected Level) output from the LMAX judging unit 202g.

At a time T735, the LMAX retrieving unit 217 receives the Last value, Run value, and Level absolute value included in the data N from the data obtaining unit 201g. The LMAX retrieving unit 217 reads an LMAX corresponding to the received pair of the Last value and Run value, and outputs the read LMAX, and the Last value and Run value to the first subtraction output circuit 209. This output continues until a time T785.

At a time T736, the first subtraction output circuit 209 receives the LMAX, Last value, and Run value from the LMAX retrieving unit 217, receives the Level absolute value from the data obtaining unit 201g, and calculates New Level=the Level absolute value–the LMAX. After this, the first subtraction output circuit 209 outputs a combination (Last, Run, New Level) to the first selecting circuit 205g. This output continues until a time T786.

At a time T737, the RMAX retrieving unit 203 receives the Last value, Run value, and Level absolute value included in the data N from the data obtaining unit 201g. The RMAX retrieving unit 203 reads an RMAX corresponding to the received pair of the Last value and Level absolute value, and outputs the read RMAX, and the Last value and Level absolute value to the second subtraction output circuit 204g. This output continues until a time T787.

At a time T738, the second subtraction output circuit 204g receives the RMAX, Last value, and Level absolute value from the RMAX retrieving unit 203, receives the Run value from the data obtaining unit 201g, and calculates New Run=the Run value–(the RMAX+1). After this, the second subtraction output circuit 204g outputs a combination (Last, New Run, Level absolute value) to the first selecting circuit 205g. This output continues until a time T788.

At a time T733, the first selecting circuit 205g receives the selecting instruction from the control circuit 206g. In accordance with the received selecting instruction, the first selecting circuit 205g selects the combination (Last, Run, selected Level) from the combination (Last, Run, selected Level), combination (Last, selected Run, Level absolute value), combination (Last, Run, New Level), and combination (Last, New Run, Level absolute value), and outputs the selected combination (Last, Run, selected Level) to the VLC retrieving unit 207. This output continues until a time T751.

At a time T734, the VLC retrieving unit 207 receives the combination (Last, Run, selected Level) from the first selecting circuit 205g. The VLC retrieving unit 207 attempts to read a VLC corresponding to the received combination (Last, Run, selected Level), from the VLC table 251. Because of the above-mentioned condition of the data N, there is no corresponding VLC on the VLC table 251. Accordingly, the VLC retrieving unit 207 outputs a VLC error signal to the control circuit 206g and register 208. This output continues until a time T752.

At a time T739, the FLC generating circuit 211 receives the combination (Last, Run, Level) included in the data N from the data obtaining unit 201g. Based on the received combination (Last, Run, Level), the FLC generating circuit 211 generates an FLC, and outputs the generated FLC to the second selecting circuit 215. This output continues until a time T789.

At the time T750, the control circuit 206g detects the clock signal 464, and receives the VLC error signal from the VLC retrieving unit 207. When receiving the clock signal 464 and VLC error signal, the control circuit 206g outputs a selecting instruction, to the first selecting circuit 205g, indicating a selection of a combination (Last, Run, New Level) output from the first subtraction output circuit 209. This output continues until the time T760.

At a time T751, the first selecting circuit 205g receives the selecting instruction from the control circuit 206g. In accordance with the received selecting instruction, the first selecting circuit 205g outputs the combination (Last, Run, New Level) output from the first subtraction output circuit 209, to the VLC retrieving unit 207. This output continues until a time T761.

At a time T752, the VLC retrieving unit 207 receives the combination (Last, Run, New Level) from the first selecting circuit 205g. The VLC retrieving unit 207 attempts to read a VLC corresponding to the received combination (Last, Run, New Level) from the VLC table 251. Because of the above-mentioned condition of the data N, there is no corresponding VLC on the VLC table 251. Accordingly, the VLC retrieving unit 207 outputs a VLC error signal to the control circuit 206g and register 208. This output continues until a time T762.

At the time T760, the control circuit 206g detects the clock signal 465, and receives the VLC error signal from the VLC retrieving unit 207. When receiving the clock signal 465 and VLC error signal, the control circuit 206g outputs a selecting instruction, to the first selecting circuit 205g, indicating a selection of a combination (Last, New Run, Level absolute value) output from the second subtraction output circuit 204g. This output continues until a time T782.

At a time T761, the first selecting circuit 205g receives the selecting instruction from the control circuit 206g. In accordance with the received selecting instruction, the first selecting circuit 205g outputs the combination (Last, New Run, Level absolute value) output from the second subtraction output circuit 204g, to the VLC retrieving unit 207. This output continues until a time T783.

At a time T762, the VLC retrieving unit 207 receives the combination (Last, New Run, Level absolute value) from the first selecting circuit 205g. The VLC retrieving unit 207 reads a VLC corresponding to the received combination (Last, New Run, Level absolute value) from the VLC table 251. The VLC retrieving unit 207 outputs the read VLC to the register 208, and outputs an OK signal indicating that a VLC has been successfully read, to the control circuit 206g. This output continues until a time T784.

At the time T770, the register 208 detects the clock signal 466, and receives the VLC from the VLC retrieving unit 207. The register 208 stores thereon the received VLC temporarily. After this, the register 208 continuously outputs the stored VLC to the normal VLC generating circuit 214, LMAX VLC generating circuit 213, and RMAX VLC generating circuit 212.

At a time T772, the normal VLC generating circuit 214, LMAX VLC generating circuit 213, and RMAX VLC generating circuit 212 receive the VLC from the register 208. The normal VLC generating circuit 214, LMAX VLC generating circuit 213, and RMAX VLC generating circuit 212 respectively generate a normal VLC, an LMAX VLC, and an RMAX VLC, using the received VLC, and output the generated normal VLC, LMAX VLC, and RMAX VLC to the second selecting circuit 215. This output continues until a next VLC is received.

At the time T770, the control circuit 206g detects the clock signal 466, and receives the OK signal from the VLC retrieving unit 207. After this, the control circuit 206g continuously outputs a selecting instruction, to the second selecting circuit 215, indicating the RMAX VLC generating circuit 212. After outputting the selecting instruction to the second selecting circuit 215, at a time T771, the control circuit 206g outputs a data output instruction requesting an output of new data to the data obtaining unit 201g. This output continues until a time T791.

At the time T780, the data obtaining unit 201g detects the clock signal 467, and receives the data output instruction. When receiving the data output instruction, the data obtaining unit 201g reads a next set of a Sign value, a Last value, a Run value, a Level value, a Level absolute value from the buffer 820. The data obtaining unit 201g outputs the read Sign value, Last value, Run value, Level value, and Level absolute value. The output Sign value, Last value, Run value, Level value, and Level absolute value are collectively referred to as data P.

If the Run value included in the data P satisfies the conditions of the Run value≦n and the Run value≦m, and a type of a code to be assigned to a combination (Last, Run, Level) included in the data P is other than an FLC, the variable-length coding circuit 200g performs the same procedure for the data P as for the data M, to generate and output a code within two clock cycles.

If the type of the code to be assigned to the combination (Last, Run, Level) included in the data P is an FLC, or if the Run value>n and the Run value>m, the variable-length coding circuit 200g searches the VLC table 251 for a VLC corresponding to a combination (Last, Run, Level absolute value), a VLC corresponding to a combination (Last, Run, New Level), and a VLC corresponding to a combination (Last, New Run, Level absolute value), in this order. This is the procedure performed for the data N. In this case, the variable-length coding circuit 200g generates and outputs the code within two to four clock cycles.

6.4 Summary

According to the recording and transmitting system 105 in the imaging system relating to the sixth embodiment, the signal generating unit 810 continuously receives one DCT coefficient per clock signal. If the received DCT coefficient has a value of zero, the signal generating unit 810 increments the number of continuous zero DCT coefficients by one. If the received DCT coefficient has a value other than zero, the signal generating unit 810 generates and writes a Sign value, a Last value, a Run value, a Level value, and a Level absolute value into the buffer 820.

The data obtaining unit 201g in the variable-length coding circuit 200g reads, one-by-one, a set of a Sign value, a Last value, a Run value, a Level value, and a Level absolute value from the buffer 820, and outputs the read set to the constituents of the variable-length coding circuit 200g.

The variable-length coding circuit 200g stores thereon the threshold value n and threshold value m. If the Run value≦n or the Run value≦m, the variable-length coding circuit 200g judges a type of a code to be assigned to a combination (Last, Run, Level) output from the data obtaining unit 201g. Based on the result of the judgment, the variable-length coding circuit 200g generates and outputs the code within two clock cycles.

If the Run value>n and the Run value>m, the variable-length coding circuit 200g does not judge the type of the code. Instead, the variable-length coding circuit 200g attempts to read a VLC corresponding to a combination (Last, Run, Level absolute value) according to a conventional method. If there is a corresponding VLC on the VLC table 251, the variable-length coding circuit 200g generates and outputs a normal VLC based on the read VLC. If there is no corresponding VLC on the VLC table 251, the variable-length coding circuit 200g tries code generating operations according to the first to third escape modes, in this order. In this case, it takes two (at the shortest) to four (at the longest) clock cycles to generate the code.

As mentioned above, a Run value indicates the number of continuous zero DCT coefficients. Therefore, the larger a Run value is, the longer time is required to generate a set of a Sign value, a Last value, a Run value, a Level value, and a Level absolute value.

According to the sixth embodiment, a time necessary for the variable-length coding circuit 200g to generate a code is, on average, long in the case where a Run value is larger than both of the threshold values n and m, and short in the case where a Run value is smaller than either of the threshold values n and m. Considering this, by determining the threshold values n and m appropriately, it is possible to achieve a good balance between a time required for the signal generating unit 810 to generate data and a time required for the variable-length coding circuit 200g to generate a code.

As described above, the LMAX judging unit 202g judges a type of a code to be assigned to a combination (Last, Run, Level), only when the Run value is equal to or smaller than the threshold value n. This means that the LMAX retrieving unit in the LMAX judging circuit 202G is required to store only pieces of LMAX information with Run indicating a value equal to or smaller than the threshold value n, out of the plurality of pieces of LMAX information included in the LMAX table 261. As a result, an LMAX detecting unit with a smaller circuit scale can be attained.

6.5 Modification Example of Sixth Embodiment

According to the variable-length coding circuit 200g described above, the LMAX judging unit 202g compares a Run value with the threshold value n, and the RMAX judging unit 216g compares the Run value with the threshold value m.

In the sixth embodiment, when the Run value>n, the LMAX judging unit 202g unconditionally outputs a first mode signal "10". Even though the Run value≦n, the LMAX judging unit 202g outputs a first mode signal "10" in a case where a comparison result output from the first comparing circuit in the LMAX judging circuit 202G indicates an LMAX<a Level absolute value, and a comparison result output from the second comparing circuit in the LMAX judging circuit 202G indicates the LMAX<New Level. Alternatively, however, when the Run value>n, the LMAX judging unit 202g may output a first mode signal "11".

In this way, the first mode signal "10" indicates that a code to be assigned to a combination (Last, Run, Level) is neither a normal VLC nor LMAX VLC, and the first mode signal "11" indicates that a type of the code to be assigned to the combination (Last, Run, Level) is not known since the LMAX judging unit 202g does not judge the type of the code to be assigned to the combination (Last, Run, Level).

In the sixth embodiment, when the Run value>m, the RMAX judging unit 216g unconditionally outputs a second mode signal "10". Even though the Run value≦m, the RMAX judging unit 216g outputs a second mode signal "10" in a case where a comparison result output from the first comparing circuit in the RMAX judging circuit 216G indicates an RMAX<the Run value, and a comparison result output from the second comparing circuit in the RMAX judging circuit 216G indicates the RMAX<New Run. Alternatively, however, when the Run value>m, the RMAX judging unit 216g may output a second mode signal "11".

In this way, the second mode signal "10" indicates that the code to be assigned to the combination (Last, Run, Level) is neither a normal VLC nor RMAX VLC, and the second mode signal "11" indicates that the type of the code to be assigned to the combination (Last, Run, Level) is not known since the RMAX judging unit 216g does not judge the type of the code to be assigned to the combination (Last, Run, Level).

(1) Control Circuit 206g

In the case of the above-described alternative construction, the control circuit 206g outputs selecting instructions that are determined based on a first mode signal and a second mode signal as shown in FIG. 34, to the first selecting circuit 205g and second selecting circuit 215.

FIG. 34 illustrates selecting instructions output from the control circuit 206g to the first selecting circuit 205g and second selecting circuit 215, which are determined according to a combination of first and second mode signals. The word "LMAX" in the SELECTING INSTRUCTION (FIRST SELECTING CIRCUIT) section in FIG. 34 indicates that a selecting instruction output to the first selecting circuit 205g instructs a selection of a combination (Last, Run, selected Level) output from the LMAX judging unit 202g. The word "RMAX" indicates that a selecting instruction output to the first selecting circuit 205g instructs a selection of a combination (Last, selected Run, Level absolute value) output from the RMAX judging unit 216g.

The alphabetical letter "N" in the SELECTING INSTRUCTION (SECOND SELECTING CIRCUIT) section indicates that a selecting instruction output to the second selecting circuit 215 instructs a selection of a normal VLC output from the normal VLC generating circuit 214. The letter "L" indicates that a selecting instruction output to the second selecting circuit 215 instructs a selection of an LMAX VLC output from the LMAX VLC generating circuit 213. The letter "R" indicates that a selecting instruction output to the second selecting circuit 215 instructs a selection of an RMAX VLC output from the RMAX VLC generating circuit 212. The letter "F" indicates that a selecting instruction output to the second selecting circuit 215 instructs a selection of an FLC output from the FLC generating circuit 211.

Considering the constructions of the VLC table 251, LMAX table 261, and RMAX table 266, there is no such a case where a first mode signal indicates "00", and a second mode signal indicates "01" or "10". Also, there is no such a case where a first mode signal indicates "01", and a second mode signal indicates "00", and there is no such a case where a first mode signal indicates "10", and a second mode signal indicates "00".

The following describes operations of the control circuit 206g, with reference to FIG. 34.

(i) In a case where a first mode signal indicates "00" and a second mode signal indicates "00" or "11", the control circuit 206g outputs a selecting instruction, to the first selecting circuit 205g, indicating a selection of a combination (Last, Run, selected Level) output from the LMAX judging unit 202g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of a normal VLC output from the normal VLC generating circuit 214.

After this, the control circuit 206g outputs a data output instruction, to the data obtaining unit 201g, requesting an output of new data.

(ii) In a case where the first mode signal indicates "01", and the second mode signal indicates "01", "10", or "11", the control circuit 206g outputs a selecting instruction, to the first selecting circuit 205g, indicating a selection of a combination (Last, Run, selected Level) output from the LMAX judging unit 202g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of an LMAX VLC output from the LMAX VLC generating circuit 213.

After this, the control circuit 206g outputs a data output instruction to the data obtaining unit 201g.

(iii) In a case where the first mode signal indicates "10" or "11", and the second mode signal indicates "01", the control circuit 206g outputs a selecting instruction, to the first selecting circuit 205g, indicating a selection of a combination (Last, selected Run, Level absolute value) output from the RMAX judging unit 216g. After this, the control circuit 206g receives an OK signal, from the VLC retrieving unit 207, indicating a VLC has been successfully read.

When detecting a clock signal after receiving the OK signal, the control circuit 206g outputs a selecting instruction, to the second selecting circuit 215, indicating a selection of an RMAX VLC output from the RMAX VLC generating circuit 212.

After this, the control circuit 206g outputs a data output instruction to the data obtaining unit 201g.

(iv) In a case where the first and second mode signals both indicate "10", the control circuit 206g determines not to output a selecting instruction to the first selecting circuit 205g. After this, the control circuit 206g receives a new clock signal from the timing control circuit. When receiving the new clock signal, the control circuit 206g outputs a selecting instruction, to the second selecting circuit 215, indicating a selection of an FLC output from the FLC generating circuit 211. After this, the control circuit 206g outputs a data output instruction to the data obtaining unit 201g.

(v) In a case where the first mode signal indicates "10", and the second mode signal indicates "11", and in a case where the first mode signal indicates "11", and the second mode signal indicates "10" or "11", the control circuit 206g performs the operation described in the section (v) of 6.3 (5).

(vi) In a case where the first mode signal indicates "11", and the second mode signal indicates "00", the control circuit 206g outputs a selecting instruction, to the first selecting circuit 205g, indicating a selection of a combination (Last, selected Run, Level absolute value) output from the RMAX judging unit 216g. After this, the control circuit 206g receives an OK signal that indicates a VLC has been successfully read, from the VLC retrieving unit 207.

When detecting a clock signal after receiving the OK signal, the control circuit 206g outputs a selecting instruction, to the second selecting circuit 215, indicating a selection of a normal VLC output from the normal VLC generating circuit 214.

After this, the control circuit 206g outputs a data output instruction to the data obtaining unit 201g.

(2) Summary

According to the above alternative construction, when a Run value≦n or the Run value≦m, the variable-length coding circuit 200g judges whether a code to be assigned to a combination (Last, Run, Level) is a normal VLC, an LMAX VLC, an RMAX VLC, or an FLC, and thus generates the code within two clock cycles. In other words, the present modification example is different from the sixth embodiment in that, as long as the Run value≦n, or the Run value≦m, the code to be assigned to the combination (Last, Run, Level) is generated within two clock cycles, even if it is an FLC.

According to the modification example, a long time period to generate the code is realized only when the Run value is larger than both of the threshold values n and m. Therefore, the present modification example can more appropriately control a balance between a time period required by the signal generating unit 810 to generate data and a time period required by the variable-length coding circuit 200g to generate the code.

In addition, when a code to be assigned to a combination (Last, Run, Level) is judged to be an FLC, the control circuit 206g does not output a selecting instruction to the first selecting circuit 205g, and simply instructs the second selecting circuit 215 to select an FLC. This construction can shorten a time period required to generate an FLC and reduce power consumption.

7. Seventh Embodiment

The following describes an imaging system relating to a seventh embodiment of the present invention.

The imaging system relating to the seventh embodiment is constituted by an optical system, a sensor, a converting circuit, an imaging processing circuit, a recording and transmitting system, a playback system, a timing control circuit, and a system control circuit, similarly to the imaging system 100 relating to the first embodiment. The seventh embodiment is the same as the sixth embodiment, except for a variable-length coding circuit included in the recording and transmitting system. Therefore, the following only describes the variable-length coding circuit, which characterizes the seventh embodiment.

7.1 Variable-length Coding Circuit

The variable-length coding circuit stores thereon a threshold value K in relation to a Level absolute value, in addition to the threshold values n and m described in the sixth embodiment. When a Level absolute value exceeds the threshold value K, the variable-length coding circuit skips the comparison of a Run value with the threshold values n and m, and the judgment of a type of a code to be assigned to a combination (Last, Run, Level). Alternatively, the variable-length coding circuit generates an FLC based on the combination (Last, Run, Level), and outputs the generated FLC as the code assigned to the combination (Last, Run, Level). The following describes a code generating operation of the variable-length coding circuit, and a construction to realize the code generating function.

(Operation of Variable-length Coding Circuit)

Figure 35:
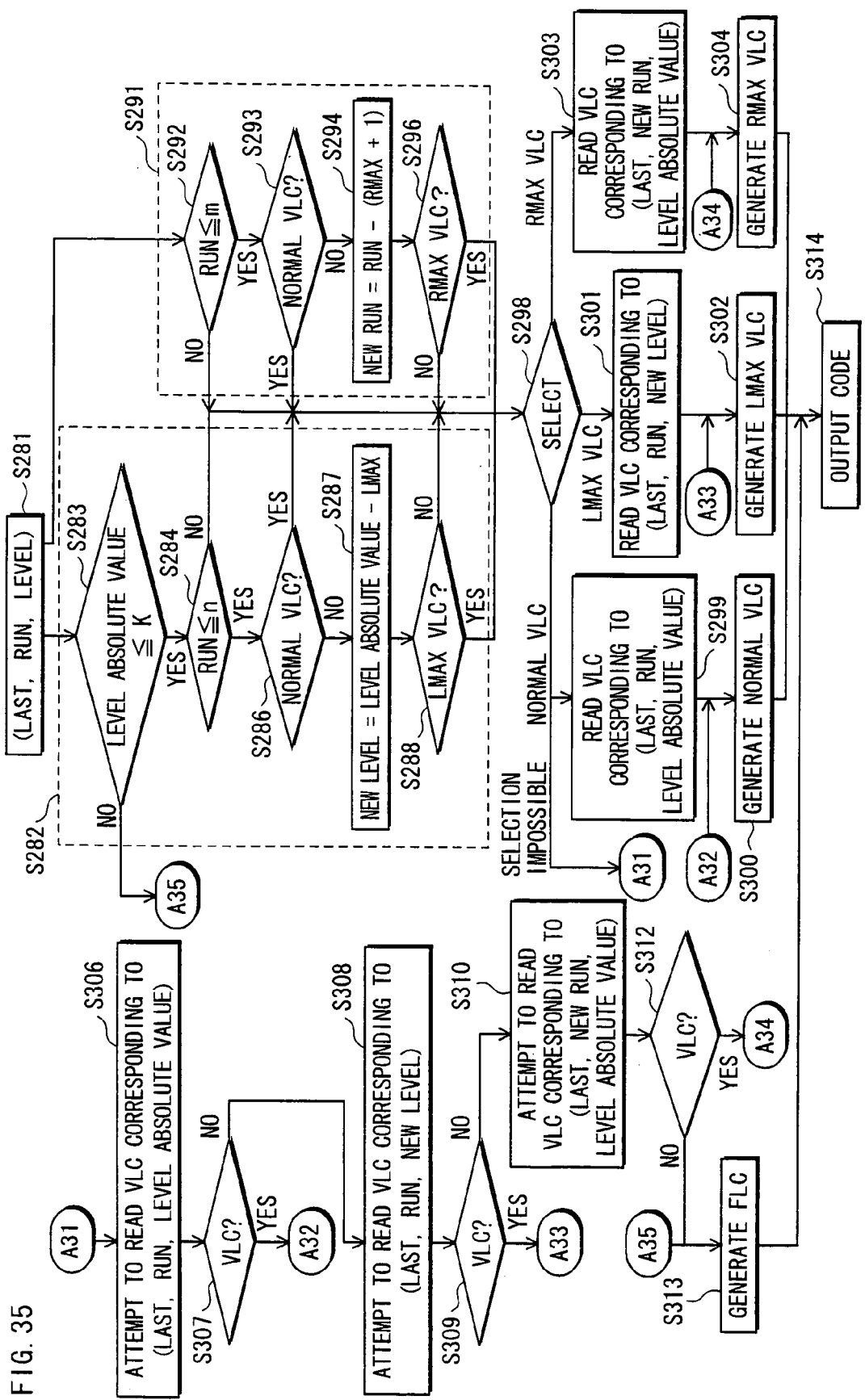
FIG. 35 is a flow chart illustrating an operation of a variable-length coding circuit relating to a seventh embodiment.

The following describes an operation of the variable-length coding circuit relating to the seventh embodiment with reference to a flow chart shown in FIG. 35.

The variable-length coding circuit starts a code generating operation, with an output of data including a combination (Last, Run, Level) to the circuits included in the variable-length coding circuit (step S281). Then, an LMAX judging unit (described later) in the variable-length coding circuit judges a type of a code to be assigned to the combination (Last, Run, Level) (step S282). In parallel to the step S282, an RMAX judging unit (described later) in the variable-length coding circuit also judges the type of the code to be assigned to the combination (Last, Run, Level) (step S291).

In the step S282, the LMAX judging unit first compares a Level absolute value and the threshold value K, in order to judge whether to skip a procedure starting from a step S284 and proceed to generate an FLC (step S283). When the Level absolute value>K (step S283:NO), the LMAX judging unit does not judge the type of the code, and the variable-length coding circuit ignores a result of the judgment made by the RMAX judging unit, to proceed to perform a step S313. When the Level absolute value≦K (step S283: YES), the LMAX judging unit compares the Run value and the threshold value n in order to determine whether to judge the type of the code (step S284). When the Run value>n (step S284:NO), the LMAX judging unit does not judge the type of the code. When the Run value≦n (step S284:YES), the LMAX judging unit judges whether the code to be assigned to the combination (Last, Run, Level) is a normal VLC or not, by comparing an LMAX and the Level absolute value (step S286). When judging the code not to be a normal VLC (step S286:NO), the LMAX judging unit calculates New Level=the Level absolute value−the LMAX (step S287). The LMAX judging unit then judges whether the code to be assigned to the combination (Last, Run, Level) can be an LMAX VLC, by comparing the calculated New Level with the LMAX (step S288).

In the step S291, the RMAX judging unit first determines whether to judge the type of the code to be assigned to the combination (Last, Run, Level), by comparing the Run value and threshold value m (steps 292). When the Run value>m (step S292:NO), the RMAX judging unit does not judge the type of the code.

When the Run value≦m (step S292:YES), the RMAX judging unit judges whether the code to be assigned to the combination (Last, Run, Level) is a normal VLC or not, by comparing an RMAX and the Run value (step S293). When judging the code not to be a normal VLC (step S293:NO), the RMAX judging unit calculates New Run=the Run value−(the RMAX+1) (step S294). The RMAX judging unit then judges whether the code to be assigned to the combination (Last, Run, Level) can be an RMAX VLC, by comparing the calculated New Run with the RMAX (step S296).

If the Level absolute value≦K in the step S283, the variable-length coding circuit then selects the type of the code to be assigned to the combination (Last, Run, Level), based on the judgment results made in the steps S282 and S291 (step S298).

When selecting a normal VLC, the variable-length coding circuit reads a VLC corresponding to a combination (Last, Run, Level absolute value) (step S299). The variable-length coding circuit generates a normal VLC based on the read VLC (step S300), and outputs the generated normal VLC as the code assigned to the combination (Last, Run, Level) (step S314).

When selecting an LMAX VLC, the variable-length coding circuit reads a VLC corresponding to a combination (Last, Run, New Level) (step S301). The variable-length coding circuit generates an LMAX VLC based on the read VLC (step S302), and outputs the generated LMAX VLC as the code assigned to the combination (Last, Run, Level) (step S314).

When selecting an RMAX VLC, the variable-length coding circuit reads a VLC corresponding to a combination (Last, New Run, Level absolute value) (step S303). The variable-length coding circuit generates an RMAX VLC based on the read VLC (step S304), and outputs the generated RMAX VLC as the code assigned to the combination (Last, Run, Level) (step S314).

When judging that selection is not possible since the LMAX judging unit and RMAX judging unit do not make judgment, which is because the Run value>n and the Run value>m, the variable-length coding circuit attempts to read a VLC corresponding to the combination (Last, Run, Level absolute value), from a VLC table (step S306). If there is the corresponding VLC on the VLC table (step S307: YES), the variable-length coding circuit next performs the step S300.

If there is no corresponding VLC on the VLC table (step S307:NO), the variable-length coding circuit calculates the New Level=the Level absolute value−the LMAX, and attempts to read a VLC corresponding to the combination (Last, Run, New Level) (step S308). If there is the corresponding VLC on the VLC table (step S309:YES), the variable-length coding circuit next performs the step S302.

If there is no corresponding VLC on the VLC table (step S309:NO), the variable-length coding circuit calculates the New Run=the Run value−(the RMAX+1), and attempts to read a VLC corresponding to the combination (Last, New Run, Level absolute value) (step S310). If there is the corresponding VLC on the VLC table (step S312:YES), the variable-length coding circuit next performs the step S304.

If there is no corresponding VLC on the VLC table (step S312:NO), the variable-length coding circuit generates an FLC based on the combination (Last, Run, Level) (step S313), and outputs the generated FLC as the code assigned to the combination (Last, Run, Level) (step S314).

(Construction of Variable-length Coding Circuit)

Similarly to the variable-length coding circuit 200g relating to the sixth embodiment, the variable-length coding circuit relating to the seventh embodiment is constituted by a data obtaining unit, the LMAX judging unit, an RMAX retrieving unit, a second subtraction output circuit, a first selecting circuit, a control circuit, a VLC retrieving unit, a register, a first subtraction output circuit, an FLC generating circuit, an RMAX VLC generating circuit, an LMAX VLC generating circuit, a normal VLC generating circuit, a second selecting circuit, the RMAX judging unit, and an LMAX retrieving unit.

The data obtaining unit, RMAX retrieving unit, second subtraction output circuit, first selecting circuit, VLC retrieving unit, register, first subtraction output circuit, FLC generating circuit, RMAX VLC generating circuit, LMAX VLC generating circuit, normal VLC generating circuit, second selecting circuit, RMAX judging unit, and LMAX retrieving unit respectively have the same constructions and perform the same operations as the data obtaining unit 201g, RMAX retrieving unit 203, second subtraction output circuit 204g, first selecting circuit 205g, VLC retrieving unit 207, register 208, first subtraction output circuit 209, FLC generating circuit 211, RMAX VLC generating circuit 212, LMAX VLC generating circuit 213, normal VLC generating circuit 214, second selecting circuit 215, RMAX judging unit 216g, and LMAX retrieving unit 217. Therefore, the following does not describe these constituents, and only explains the control circuit and LMAX judging unit, which characterize the seventh embodiment.

(1) LMAX Judging Unit

Similarly to the LMAX judging unit 202g relating to the sixth embodiment, the LMAX judging unit is constituted by an LMAX judging circuit, a comparing circuit, and a fixed value storing circuit.

(i) Fixed Value Storing Circuit

The fixed value storing circuit stores thereon the threshold value n, and threshold value K. The threshold value K is an integer in a range of 0<K<256.

The threshold value n has been explained in the sixth embodiment.

(ii) Comparing Circuit

The comparing circuit receives a Level absolute value and a Run value from the data obtaining unit.

When receiving the Level absolute value and Run value, the comparing circuit reads the threshold values K and n from the fixed value storing circuit. The comparing circuit compares the read threshold value n with the Run value, and the threshold value K with the Level absolute value. The comparing circuit then outputs the comparison results to the LMAX judging circuit.

(iii) LMAX Judging Circuit

Similarly to the LMAX judging circuit 202 relating to the first embodiment, the LMAX judging circuit is constituted by an LMAX retrieving unit, a first comparing circuit, a subtracting circuit, a second comparing circuit, a selecting circuit, a judgment control circuit, and an output circuit.

The judgment control circuit receives a result of comparing the threshold value n and a Run value, and a result of comparing the threshold value K and a Level absolute value, from the comparing circuit. In addition, the judgment control circuit receives a result of comparing an LMAX and the Level absolute value from the first comparing circuit, and a result of comparing the LMAX and New Level from the second comparing circuit.

When the received comparison result between the Level absolute value and threshold value K indicates the Level absolute value>K, the judgment control circuit ignores the comparison result between the Run value and threshold value n received from the comparing circuit, and the comparison results from the first and second comparing circuits in the LMAX judging circuit, and generates a mode signal "11". The judgment control circuit outputs the generated mode signal "11" to the selecting circuit in the LMAX judging circuit, and the control circuit.

When the received comparison result between the Level absolute value and threshold value K indicates the Level absolute value≦K, the judgment control circuit performs the same operation as in the sixth embodiment. In detail, the judgment control circuit generates a mode signal indicating one of "00", "01", and "10", based on the comparison result between the Run value and threshold value n, and the comparison results output from the first and second comparing circuits in the LMAX judging circuit. The judgment control circuit then outputs the generated mode signal to the selecting circuit in the LMAX judging circuit and the control circuit.

The selecting circuit receives the Level absolute value from the data obtaining unit, the New Level from the subtracting circuit, and the mode signal from the judgment control circuit.

When the received mode signal indicates one of "00", "10", and "11", the selecting circuit outputs the Level absolute value received from the data obtaining unit, as a selected level, to the output circuit. When the received mode signal indicates "01", the selecting circuit outputs the New Level received from the subtracting circuit, as a selected level, to the output circuit.

For better intelligibility, the mode signal output from the LMAX judging unit is referred to as a first mode signal, and the mode signal output from the RMAX judging unit is referred to as a second mode signal.

Here, a first mode signal of "00" indicates that a code to be assigned to a combination (Last, Run, Level) is a normal VLC. A first mode signal of "01" indicates that an LMAX VLC can be generated to be assigned to a combination (Last, Run, Level). A first mode signal of "10" indicates that a type of a code to be assigned to a combination (Last, Run, Level) is not known since the LMAX judging unit does not judge the type of the code to be assigned to the combination (Last, Run, Level). A first mode signal "11" indicates a code to be assigned to a combination (Last, Run, Level) is an FLC.

(2) Control Circuit

The control circuit receives clock signals from the timing control circuit at regular time intervals. Furthermore, the control circuit receives a first mode signal from the LMAX judging unit, and a second mode signal from the RMAX judging unit.

When the received first mode signal indicates "11", the control circuit ignores the second mode signal, and outputs a selecting instruction, to the second selecting circuit, indicating a selection of an FLC output from the FLC generating circuit. After outputting the selecting instruction to the second selecting circuit, the control circuit outputs a data output instruction, to the data obtaining unit, requesting an output of new data.

When the received first mode signal indicates other than "11", the control circuit outputs selecting instructions, to the first and second selecting circuits, which are determined by a combination of the first and second mode signals, as in the sixth embodiment. In this case, the control circuit performs the same operations as the control circuit 206g relating to the sixth embodiment. Therefore, the operations are not explained here.

7.2 Summary

As described above, the variable-length coding circuit relating to the seventh embodiment stores thereon the threshold value K. When a Level absolute value output from the data obtaining unit is larger than the threshold value K, the variable-length coding circuit unconditionally selects and outputs an FLC generated based on a combination (Last, Run, Level), as a code assigned to the combination (Last, Run, Level).

According to the VLC table 251, LMAX table 261, and RMAX table 266 shown in FIG. 4, the maximum Level absolute value is 27 in the VLC table 251, and there is no RMAX corresponding to a Level absolute value larger than 27 in the RMAX table 266. Accordingly, when a Level absolute value is larger than 54, a code to be assigned to a combination (Last, Run, Level) is always an FLC.

Therefore, by setting the threshold value K at a value larger than 54, the variable-length coding circuit can generate and output an FLC within a short time period, for a combination (Last, Run, Level) to which an FLC is inevitably assigned. This is because the LMAX judging unit and RMAX judging unit do not judge the type of the code to be assigned to such a combination (Last, Run, Level), and the VLC retrieving unit does not attempt to read a VLC corresponding to a combination (Last, Run, Level absolute value), a VLC corresponding to a combination (Last, Run, New Level), and a VLC corresponding to a combination (Last, New Run, Level absolute value). Consequently, the variable-length coding circuit can achieve reduced power consumption.

8. Eighth Embodiment

The following describes an imaging system relating to an eighth embodiment of the present invention.

The imaging system relating to the eighth embodiment has the same construction and performs the same operation as the imaging system relating to the seventh embodiment, except for a variable-length coding circuit included in a recording and transmitting system. Therefore, the following only describes the variable-length coding circuit, which characterizes the eighth embodiment, and does not explain the other constituents.

8.1 Variable-length Coding Circuit

The variable-length coding circuit stores thereon a threshold value L in relation to a Run value, in addition to the threshold values n, m and K described in the seventh embodiment. When a Run value exceeds the threshold value L, the variable-length coding circuit skips the comparison of the Run value with the threshold values n and m, and the judgment of a type of a code to be assigned to a combination (Last, Run, Level). Alternatively, the variable-length coding circuit generates an FLC based on the combination (Last, Run, Level), and outputs the generated FLC as the code assigned to the combination (Last, Run, Level). The following describes a code generating operation of the variable-length coding circuit, and a construction to realize the code generating function.

(Operation of Variable-length Coding Circuit)

Figure 36:
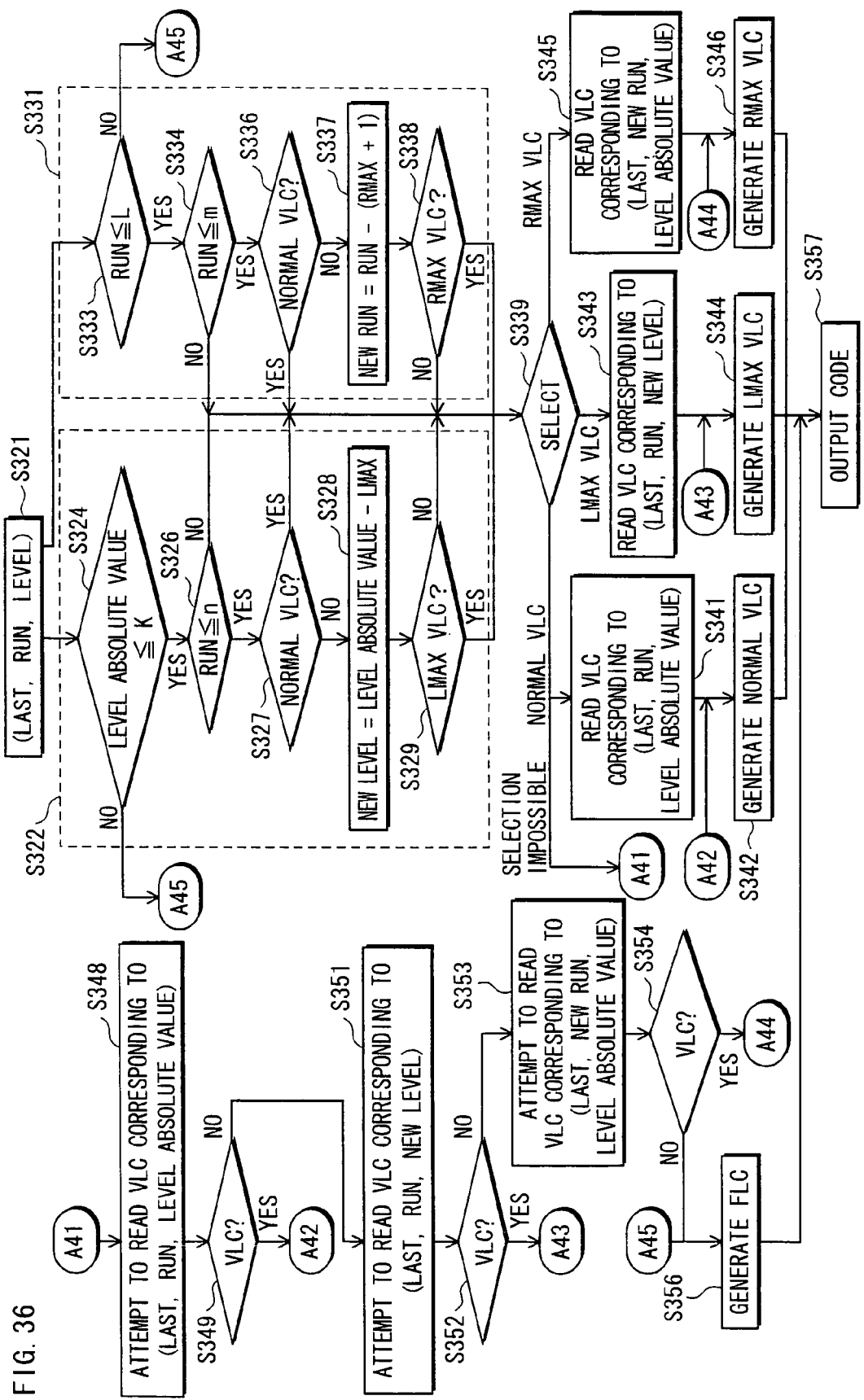
FIG. 36 is a flow chart illustrating an operation of a variable-length coding circuit relating to an eighth embodiment.

The following describes an operation of the variable-length coding circuit relating to the eighth embodiment with reference to a flow chart shown in FIG. 36.

The variable-length coding circuit starts a code generating operation, with an output of data including a combination (Last, Run, Level) to the circuits included in the variable-length coding circuit (step S321). Then, an LMAX judging unit in the variable-length coding circuit judges a type of a code to be assigned to the combination (Last, Run, Level) (step S322). In parallel to the step S322, an RMAX judging unit in the variable-length coding circuit also judges the type of the code to be assigned to the combination (Last, Run, Level) (step S331).

In the step S322, the LMAX judging unit first compares a Level absolute value and the threshold value K, in order to judge whether to skip a procedure starting from a step S326 and proceed to generate an FLC (step S324). When the Level absolute value>K (step S324:NO), the LMAX judging unit does not judge the type of the code, and the variable-length coding circuit ignores a result of the judgment made by the RMAX judging unit, to proceed to perform a step S356. When the Level absolute value≦K (step S324: YES), the LMAX judging unit compares the Run value and the threshold value n in order to determine whether to judge the type of the code (step S326). When the Run value>n (step S326:NO), the LMAX judging unit does not judge the type of the code. When the Run value≦n (step S326:YES), the LMAX judging unit judges whether the code to be assigned to the combination (Last, Run, Level) is a normal VLC or not, by comparing an LMAX and the Level absolute value (step S327). When judging the code not to be a normal VLC (step S327:NO), the LMAX judging unit calculates New Level=the Level absolute value–the LMAX (step S328). The LMAX judging unit then judges whether the code to be assigned to the combination (Last, Run, Level) can be an LMAX VLC, by comparing the calculated New Level with the LMAX (step S329).

In the step S331, the RMAX judging unit first judges whether to skip judgment of the type of the code and proceed to generate an FLC, by comparing the Run value and threshold value L (step S333). When the Run value>L (step S333:NO), the RMAX judging unit skips the judging operation of the type of the code starting from a step S334, and ignores the result of the judgment made by the LMAX judging unit, to proceed to perform the step S356.

When the Run value≦L (step S333:YES), the RMAX judging unit compares the Run value and threshold value m, in order to determine whether to judge the type of the code (step S334). When the Run value>m (step S334:NO), the RMAX judging unit does not judge the type of the code.

When the Run value≦m (step S334:YES), the RMAX judging unit judges whether the code to be assigned to the combination (Last, Run, Level) is a normal VLC or not, by comparing an RMAX and the Run value (step S336). When judging the code not to be a normal VLC (step S336:NO), the RMAX judging unit calculates New Run=the Run value–(the RMAX+1) (step S337). The RMAX judging unit then judges whether the code to be assigned to the combination (Last, Run, Level) can be an RMAX VLC, by comparing the calculated New Run with the RMAX (step S338).

If the Level absolute value≦K in the step S324, and the Run value≦L in the step S333, the variable-length coding circuit then selects the type of the code to be assigned to the combination (Last, Run, Level), based on the judgment results made in the steps S322 and S331 (step S339).

When selecting a normal VLC, the variable-length coding circuit reads a VLC corresponding to a combination (Last, Run, Level absolute value) (step S341). The variable-length coding circuit generates a normal VLC based on the read VLC (step S342), and outputs the generated normal VLC as the code assigned to the combination (Last, Run, Level) (step S357).

When selecting an LMAX VLC, the variable-length coding circuit reads a VLC corresponding to a combination (Last, Run, New Level) (step S343). The variable-length coding circuit generates an LMAX VLC based on the read VLC (step S344), and outputs the generated LMAX VLC as the code assigned to the combination (Last, Run, Level) (step S357).

When selecting an RMAX VLC, the variable-length coding circuit reads a VLC corresponding to a combination (Last, New Run, Level absolute value) (step S345). The variable-length coding circuit generates an RMAX VLC based on the read VLC (step S346), and outputs the generated RMAX VLC as the code assigned to the combination (Last, Run, Level) (step S357).

When judging that selection is not possible since the LMAX judging unit and RMAX judging unit do not make judgment, which is because the Run value>n and the Run value>m, the variable-length coding circuit attempts to read a VLC corresponding to the combination (Last, Run, Level absolute value), from a VLC table (step S348). If there is the corresponding VLC on the VLC table (step S349:YES), the variable-length coding circuit next performs the step S342.

If there is no corresponding VLC on the VLC table (step S349: NO), the variable-length coding circuit calculates the New Level=the Level absolute value–the LMAX, and attempts to read a VLC corresponding to the combination (Last, Run, New Level) (step S351). If there is the corresponding VLC on the VLC table (step S352:YES), the variable-length coding circuit next performs the step S344.

If there is no corresponding VLC on the VLC table (step S352: NO), the variable-length coding circuit calculates the New Run=the Run value–(the RMAX+1), and attempts to read a VLC corresponding to the combination (Last, New Run, Level absolute value) (step S353). If there is the corresponding VLC on the VLC table (step S354:YES), the variable-length coding circuit next performs the step S346.

If there is no corresponding VLC on the VLC table (step S354:NO), the variable-length coding circuit generates an FLC based on the combination (Last, Run, Level) (step S356), and outputs the generated FLC as the code assigned to the combination (Last, Run, Level) (step S357).

(Construction of Variable-length Coding Circuit)

The variable-length coding circuit relating to the eighth embodiment has the same construction and performs the same operation as the variable-length coding circuit relating to the seventh embodiment, except for a control circuit and the RMAX judging-unit. Therefore, the following only explains the control circuit and RMAX judging unit.

(1) RMAX Judging Unit

Similarly to the RMAX judging unit 216g relating to the sixth embodiment, the RMAX judging unit is constituted by an RMAX judging circuit, a comparing circuit, and a fixed value storing circuit.

(i) Fixed Value Storing Circuit

The fixed value storing circuit stores thereon the threshold value m, and threshold value L. The threshold value m has been explained in the sixth embodiment.

The threshold value L is an integer in a range of 0≦L<64.

(ii) Comparing Circuit

The comparing circuit receives a Run value.

When receiving the Run value, the comparing circuit reads the threshold values L and m from the fixed value storing circuit. The comparing circuit compares the read threshold value m with the Run value, and the threshold value L with the Run value. The comparing circuit then outputs the comparison results to the RMAX judging circuit.

(iii) RMAX Judging Circuit

Similarly to the RMAX judging circuit 216G relating to the sixth embodiment, the RMAX judging circuit is constituted by an RMAX retrieving unit, a first comparing circuit, a subtracting circuit, a second comparing circuit, a selecting circuit, a judgment control circuit, and an output circuit. The RMAX retrieving unit, first comparing circuit, subtracting circuit, second comparing circuit, and output circuit respectively have the same construction and perform the same operations as their corresponding constituents in the RMAX judging circuit 216G relating to the sixth embodiment.

The judgment control circuit in the RMAX judging circuit receives a result of comparing the threshold value m and a Run value, and a result of comparing the threshold value L and the Run value, from the comparing circuit. In addition, the judgment control circuit receives a result of comparing an RMAX and the Run value from the first comparing circuit in the RMAX judging circuit, and a result of comparing the RMAX and New Run from the second comparing circuit.

When the received comparison result between the Run value and threshold value L indicates the Run value>L, the judgment control circuit unconditionally generates a second mode signal "11", and outputs the generated second mode signal "11" to the selecting circuit in the RMAX judging circuit, and the control circuit.

When the received comparison result between the Run value and threshold value L indicates the Run value≦L, the judgment control circuit performs the same operation as the judgment control circuit in the RMAX judging circuit 216G relating to the sixth embodiment. In detail, the judgment control circuit generates a second mode signal, based on the comparison result between the Run value and threshold value m, and the comparison results output from the first and second comparing circuits in the RMAX judging circuit. The judgment control circuit then outputs the generated second mode signal to the selecting circuit in the RMAX judging circuit and the control circuit.

(2) Control Circuit

The control circuit unconditionally outputs a selecting instruction indicating a selection of an FLC output from the FLC generating circuit, to the second selecting circuit, if at least one of a first mode signal received from the LMAX judging unit and a second mode signal received from the RMAX judging unit indicates "11".

When neither the first nor second mode signal indicates "11", the control circuit operates in accordance with the received first and second mode signals, in the same manner as the control circuit 206g relating to the sixth embodiment.

8.2 Summary

According to the VLC table 251, LMAX table 261, and RMAX table 266 shown in FIG. 4, the maximum Run value is 20 in the VLC table 251, and there is no LMAX corresponding to a Run value larger than 20 in the LMAX table 261. Accordingly, when a Run value is larger than 40, a code to be assigned to a combination (Last, Run, Level) is always an FLC.

Therefore, by setting the threshold value L at a value larger than 40, the variable-length coding circuit can generate and output an FLC within a short time period, for a combination (Last, Run, Level) to which an FLC is inevitably assigned. This is because the RMAX judging unit and LMAX judging unit do not judge the type of the code to be assigned to such a combination (Last, Run, Level), and the VLC retrieving unit does not attempt to read a VLC corresponding to a combination (Last, Run, Level absolute value), a VLC corresponding to a combination (Last, Run, New Level), and a VLC corresponding to a combination (Last, New Run, Level absolute value).

9. Other Modification Examples

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

(1) The above-described first to eighth embodiments and their modification examples may be modified in the following manner. An FLC register is provided between the data obtaining unit and FLC generating circuit, in order to store thereon a combination (Last, Run, Level) temporarily. Furthermore, a Sign register is provided between the data obtaining unit and the RMAX VLC generating circuit, LMAX VLC generating circuit, and normal VLC generating circuit, in order to store thereon a Sign value temporarily. With such a construction, a code to be assigned to the combination (Last, Run, Level) can be generated and output within a time period shorter, by one clock cycle, than the time period mentioned in the above embodiments and their modification examples.

The following specifically explains this modification example taking the first embodiment as an example.

(1-a) Construction of Variable-length Coding Circuit 200

Figure 38:
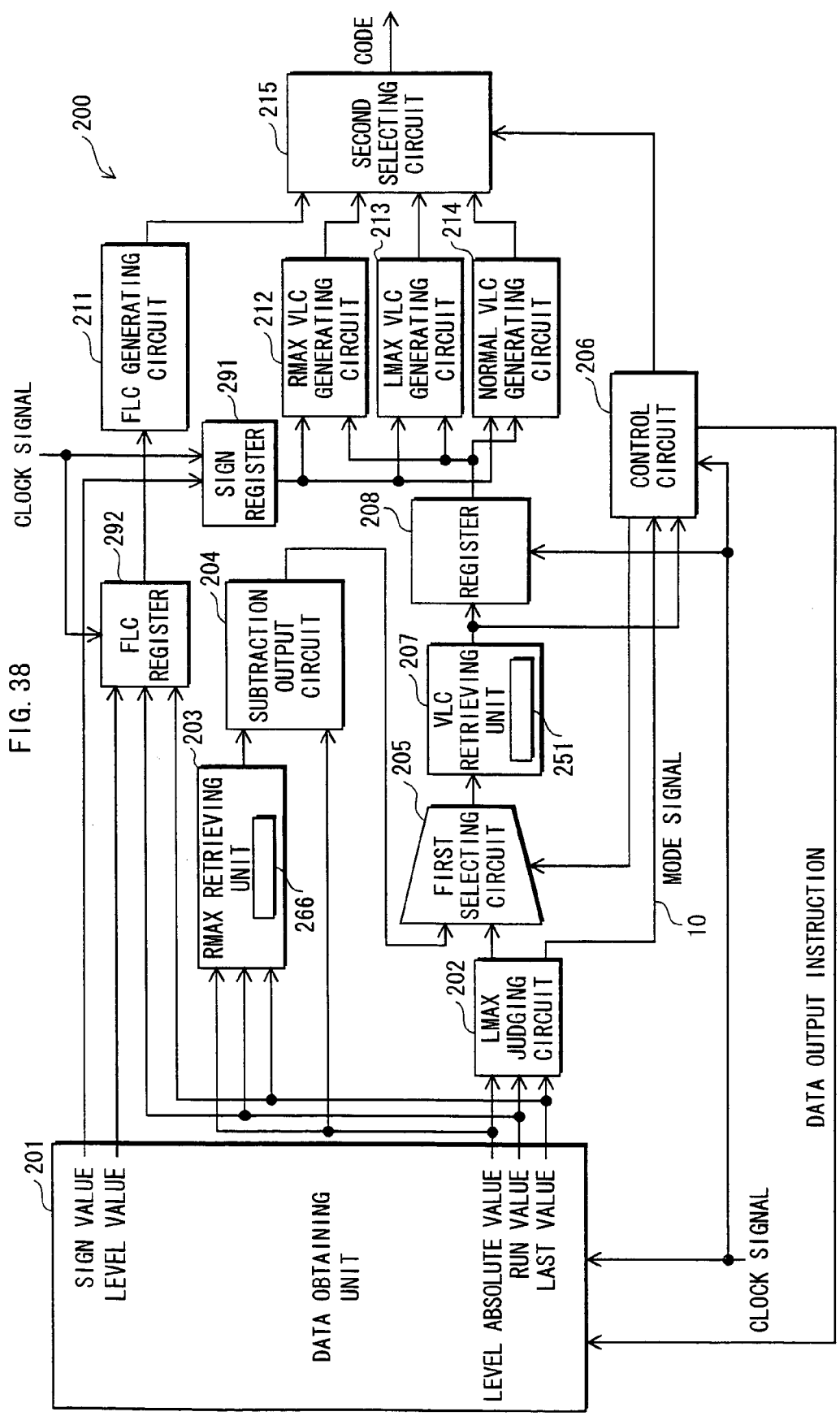
FIG. 38 is a block diagram illustrating a construction of the variable-length coding circuit 200 which has been modified in accordance with a modification example (1)

When the modification example is applied to the first embodiment, the variable-length coding circuit 200 further includes an FLC register 292, and a Sign register 291 as shown in FIG. 38.

The FLC register 292 receives clock signals from the timing control circuit 108 at regular time intervals. Also, the FLC register 292 receives a combination (Last, Run, Level) from the data obtaining unit 201.

When receiving the combination (Last, Run, Level), the FLC register 292 stores thereon the received combination (Last, Run, Level) temporarily. When receiving a new clock signal after this, the FLC register 292 outputs the stored combination (Last, Run, Level) to the FLC generating circuit 211.

The Sign register 291 receives clock signals from the timing control circuit 108 at regular time intervals. Also, the Sign register 291 receives a Sign value from the data obtaining unit 201.

When receiving the Sign value, the Sign register 291 stores thereon the received Sign value temporarily. When receiving a new clock signal after this, the Sign register 291 outputs the stored Sign value to the RMAX VLC generating circuit 212, LMAX VLC generating circuit 213, and normal VLC generating circuit 214.

According to the first embodiment, the control circuit 206 outputs a data output instruction to the data obtaining unit 201 after outputting a selecting instruction to the second selecting circuit 215. According to the present modification example, however, the control circuit 206 outputs a data output instruction to the data obtaining unit 201, after receiving an OK signal or VLC error signal from the VLC retrieving unit 207.

The other circuits are not modified, and therefore not explained here.

(1-b) Operation Cycle of Variable-length Coding Circuit 200

Figure 39:
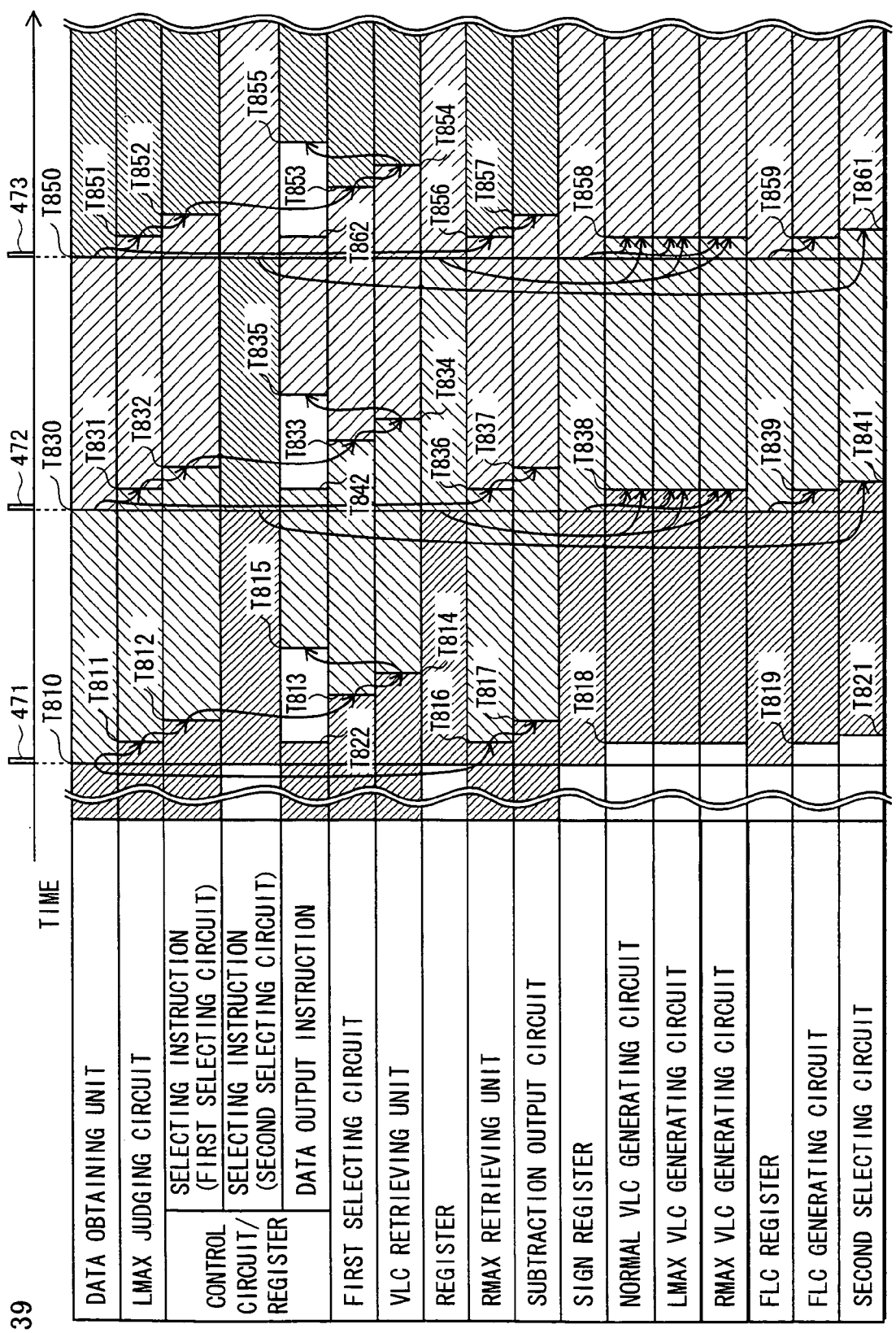
FIG. 39 is a time chart illustrating, in a chronological order, timings of operations of the circuits constituting the variable-length coding circuit 200 which has been modified in accordance with the modification example (1).

The following describes an operation cycle of the variable-length coding circuit 200 to which the FLC register 292 and Sign register 291 are added, with reference to a time chart shown in FIG. 39.

In the time chart shown in FIG. 39, the names of the circuits constituting the variable-length coding circuit 200 are arranged vertically, and a time is plotted horizontally. This time chart illustrates how pieces of data are sequentially processed, in relation to time.

Clock signals 471, 472, and 473 are supplied at regular time intervals, i.e., at times T810, T830, and T850 to the data obtaining unit 201, control circuit 206, register 208, Sign register 291, and FLC register 292.

At the time T810, the data obtaining unit 201 detects the clock signal 471, and outputs a stored set of a Sign value, a Level value, a Level absolute value, a Run value, and a Last value, to the LMAX judging circuit 202, RMAX retrieving unit 203, subtraction output circuit 204, FLC register 292, and Sign register 291. This output continues until the time T830. The output Sign value, Level value, Level absolute value, Run value, and Last value are collectively referred to as data P.

At a time T811, the LMAX judging circuit 202 receives a combination (Last, Run, Level absolute value) included in the data P. The LMAX judging circuit 202 judges a type of a code to be assigned to a combination (Last, Run, Level) included in the data P, based on the received combination (Last, Run, Level absolute value). The LMAX judging circuit 202 generates a mode signal and a combination (Last, Run, selected Level) as a result of the judgment. The LMAX judging circuit 202 outputs the generated mode signal to the control circuit 206, and outputs the generated combination (Last, Run, selected Level) to the first selecting circuit 205. This output continues until a time T831.

At a time T812, the control circuit 206 receives the mode signal, and outputs a selecting instruction in accordance with the received mode signal to the first selecting circuit 205. This output continues until a time T832.

At a time T816, the RMAX retrieving unit 203 receives the combination (Last, Run, Level absolute value) included in the data P from the data obtaining unit 201. The RMAX retrieving unit 203 reads an RMAX, and outputs the read RMAX to the subtraction output circuit 204. This output continues until a time T836.

At a time T817, the subtraction output circuit 204 receives the RMAX from the RMAX retrieving unit 203. The subtraction output circuit 204 calculates New Run based on the received RMAX, and outputs a combination (Last, New Run, Level absolute value) including the calculated New Run, to the first selecting circuit 205. This output continues until a time T837.

At a time T813, the first selecting circuit 205 receives the selecting instruction from the control circuit 206. In accordance with the received selecting instruction, the first selecting circuit 205 selects and outputs one of the combination (Last, New Run, Level absolute value) and the combination (Last, Run, selected Level) to the VLC retrieving unit 207. This output continues until a time T833.

At a time T814, the VLC retrieving unit 207 receives one of the combination (Last, New Run, Level absolute value) and the combination (Last, Run, selected Level) from the first selecting circuit 205, and attempts to read a corresponding VLC from the VLC table 251. If there is a corresponding VLC on the VLC table 251, the VLC retrieving unit 207 outputs the read VLC to the register 208, and outputs an OK signal to the control circuit 206. This output continues until a time T834. If there is no corresponding VLC on the VLC table 251, the VLC retrieving unit 207 outputs a VLC error signal to the control circuit 206 and register 208. This output also continues until the time T834.

At a time T815, the control circuit 206 receives one of an OK signal and a VLC error signal from the VLC retrieving unit 207. When receiving one of the OK signal and VLC error signal, the control circuit 206 outputs a data output instruction to the data obtaining unit 201. This output continues until a time T842.

The register 208 receives the VLC from the VLC retrieving unit 207, and temporarily stores thereon the received VLC. At the time T830, the register 208 detects the clock signal 472, and outputs the stored VLC to the normal VLC generating circuit 214, LMAX VLC generating circuit 213, and RMAX VLC generating circuit 212. This output continues until the time T850.

The Sign register 291 receives the Sign value included in the data P from the data obtaining unit 201, and temporarily stores thereon the received Sign value. At the time T830, the Sign register 291 detects the clock signal 472, and outputs the stored Sign value to the normal VLC generating circuit 214, LMAX VLC generating circuit 213, and RMAX VLC generating circuit 212. This output continues until the time T850.

At a time T838, the normal VLC generating circuit 214, LMAX VLC generating circuit 213, and RMAX VLC generating circuit 212 receive the VLC from the register 208, and receives the Sign value from the Sign register 291. By using the received VLC and Sign value, the normal VLC generating circuit 214, LMAX VLC generating circuit 213, and RMAX VLC generating circuit 212 respectively generate a normal VLC, an LMAX VLC, and an RMAX VLC, and output the generated normal VLC, LMAX VLC, and RMAX VLC to the second selecting circuit 215. This output continues until a time T858.

The FLC register 292 receives the combination (Last, Run, Level) included in the data P from the data obtaining unit 201, and temporarily stores thereon the received combination (Last, Run, Level). At the time T830, the FLC register 292 detects the clock signal 472, and outputs the stored combination (Last, Run, Level) to the FLC generating circuit 211. This output continues until the time T850.

At a time T839, the FLC generating circuit 211 receives the combination (Last, Run, Level) included in the data P from the FLC register 292. The FLC generating circuit 211 generates an FLC based on the received combination (Last, Run, Level), and outputs the generated FLC to the second selecting circuit 215. This output continues until a time T859.

At the time T830, the control circuit 206 detects the clock signal 472, and outputs, to the second selecting circuit 215, a selecting instruction based on the OK signal or VLC error signal received from the VLC retrieving unit 207, and the mode signal received from the LMAX judging circuit 202. This output continues until the time T850.

At a time T841, the second selecting circuit 215 receives the selecting instruction from the control circuit 206. In accordance with the selecting instruction, the second selecting circuit 215 selects and outputs one of the normal VLC, LMAX VLC, RMAX VLC, and FLC, to the buffer included in the recording and transmitting system 105. This output continues until a time T861.

At the time T830, the data obtaining unit 201 detects the clock signal 472, and receives the data output instruction from the control circuit 206. Therefore, the data obtaining unit 201 outputs a new set of a Sign value, a Level value, a Level absolute value, a Run value, and a Last value, to the LMAX judging circuit 202, RMAX retrieving unit 203, subtraction output circuit 204, FLC register 292, and Sign register 291. This output continues until the time T850. The output Sign value, Level value, Level absolute value, Run value, and Last value are collectively referred to as data Q.

The LMAX judging circuit 202, control circuit 206, . . . second selecting circuit 215 perform the same procedure for the data Q as for the data P. Consequently, the variable-length coding circuit 200 generates and outputs a code corresponding to a combination (Last, Run, Level) included in the data Q within two clock cycles.

(1-c) Effects

According to the variable-length coding circuit 200 described above, in the initial clock cycle, the register 208, FLC register 292, and Sign register 291 respectively store thereon the VLC, the combination (Last, Run, Level) included in the data P, and the Sign value included in the data P. In the second clock cycle, the FLC generating circuit 211, RMAX VLC generating circuit 212, LMAX VLC generating circuit 213, and normal VLC generating circuit 214 respectively generate and output the FLC, RMAX VLC, LMAX VLC, and normal VLC, by using the data stored in the register 208, data stored in the FLC register 292, and data stored in the Sign register 291. In this way, between the time T830 and the time T850, the variable-length coding circuit 200 can perform the initial clock cycle operation for the new data Q, in parallel with the second clock cycle operation for the data P.

By performing, in parallel, the second clock cycle operation for the data P, and the initial clock cycle operation for the data Q that immediately follows the data P, the variable-length coding circuit 200 relating to the present modification example can shorten a time period, by approximately one clock cycle, required to generate and output a code, when compared with the variable-length coding circuit 200 without the FLC register 292 and Sign register 291.

When this modification example is applied to the second to eighth embodiments, an FLC, an RMAX VLC, an LMAX VLC, and a normal VLC are generated with the use of data stored in the register, data stored in the FLC register, and data stored in the Sign register. Therefore, the code generating operations corresponding to the data P and data Q which are consecutively output from the data obtaining unit can be performed partly in parallel. As a result, a time period required to generate and output a code can be also shortened by approximately one clock cycle.

(2) The following describes a case where the modification example (1) is applied to the third to fifth embodiments. The VLC retrieving unit outputs a VLC error signal or OK signal to the control circuit. When receiving the VLC error signal or OK signal from the VLC retrieving unit, the control circuit outputs a data output instruction to the data obtaining unit.

With such a construction, the data obtaining unit outputs data every clock cycle (every two clock cycles in the modification example of the third embodiment). As a consequence, a time period required to generate and output a code can be shortened by approximately one clock cycle, when compared with a case where the FLC register and Sign register are not provided.

(3) The following describes a case where the modification example (1) is applied to the sixth embodiment. The data obtaining unit outputs a combination (Last, Run, Level). When the Run value≦n or the Run value≦m, the control circuit 206g outputs a data output instruction to the data obtaining unit 201g on reception of a VLC error signal or OK signal. In response to the data output instruction, the data obtaining unit 201g outputs a next combination (Last, Run, Level). This enables the second clock cycle operation for the combination to be performed in parallel with the initial clock cycle operation for the next combination. As a result, high-speed processing can be achieved.

When the Run value>n and the Run value>m, the control circuit 206g outputs a data output instruction after outputting a selecting instruction to the second selecting circuit 215, as in the sixth embodiment. In this case, a long time is realized to output a code.

(4) The following describes a case where the modification example (1) is applied to the seventh embodiment. When a Level absolute value>K, or when a Run value>m and the Run value>n, the control circuit outputs a data output instruction after outputting a selecting instruction to the second selecting circuit, as in the seventh embodiment.

When the Level absolute value≦K, the Run value≦m, and the Run value≦n, the control circuit outputs a data output instruction to the data obtaining unit on reception of a VLC error signal or OK signal. In this way, code generating operations for consecutive pieces of data can be performed partly in parallel, which results in higher-speed processing.

(5) The following describes a case where the modification example (1) is applied to the eighth embodiment. When a Level absolute value>K, when a Run value>L, or when the Run value>m and the Run value>n, the control circuit outputs a data output instruction after outputting a selecting instruction to the second selecting circuit, as in the eighth embodiment.

When the Level absolute value≦K, the Run value≦L, the Run value≦m, and the Run value≦n, the control circuit outputs a data output instruction to the data obtaining unit on reception of a VLC error signal or OK signal. In this way, code generating operations for consecutive pieces of data can be performed partly in parallel, which results in higher-speed processing.

(6) According to the above-described first to eighth embodiments and their modification examples, the data obtaining unit receives clock signals at regular time intervals from the timing control circuit. Alternatively, however, the data obtaining unit may receive clock signals only when required to output new data.

Figure 37:
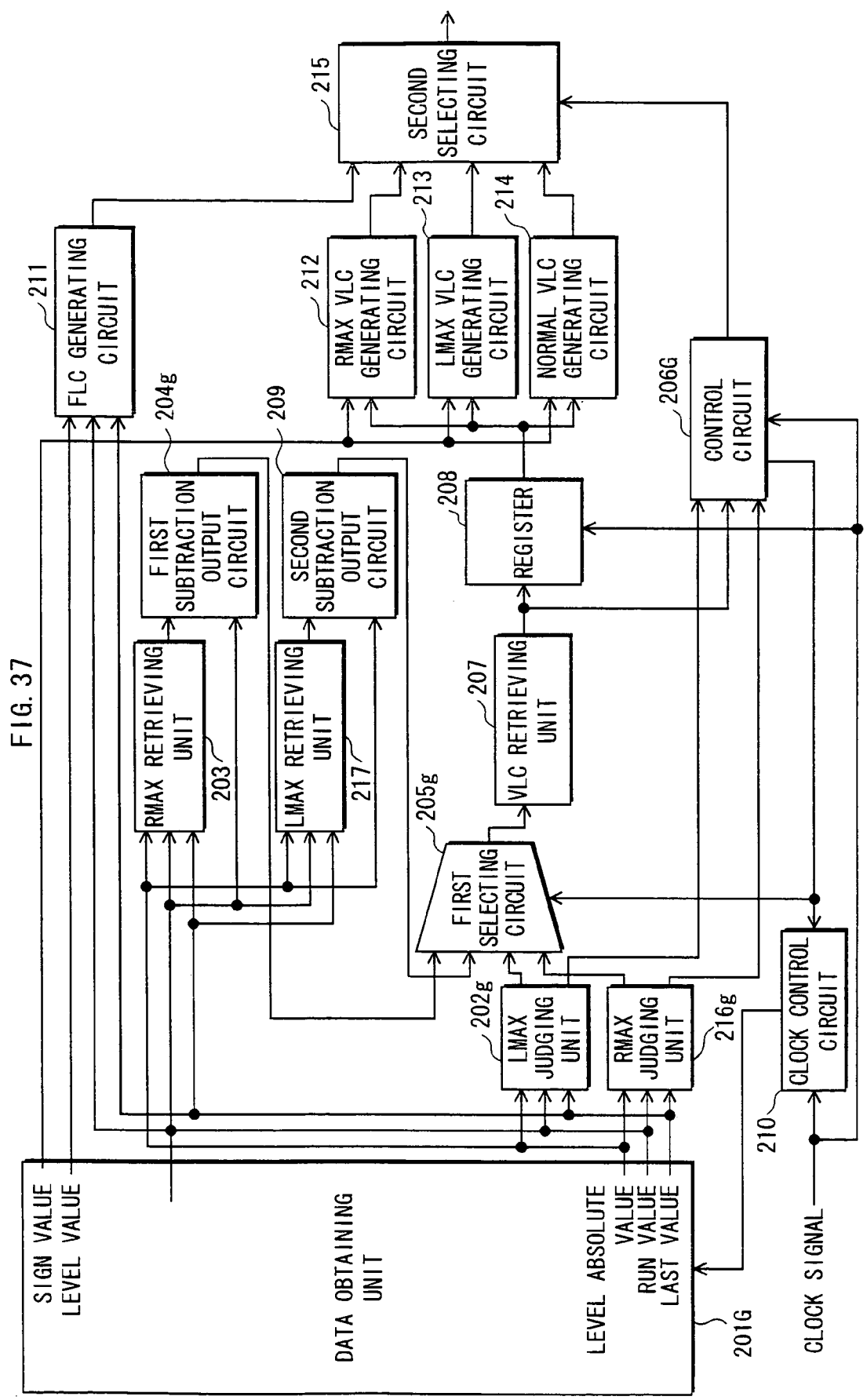
FIG. 37 is a block diagram illustrating a construction of a variable-length coding circuit relating to a modification example (6)

The following specifically explains this modification example by using the sixth embodiment as an example. Here, the variable-length coding circuit 200g includes a data obtaining unit 201G and a control circuit 206G, in place of the data obtaining unit 201g and control circuit 206g, and additionally has a clock control circuit 210, as shown in FIG. 37.

The control circuit 206G outputs a selecting instruction to the second selecting circuit 215 by performing the same procedure as the control circuit 206g relating to the sixth embodiment. After outputting the selecting instruction to the second selecting circuit 215, the control circuit 206G outputs a signal output instruction, to the clock control circuit 210, instructing an output of a clock signal.

The clock control circuit 210 receives clock signals at regular time intervals from the timing control circuit. Also, the clock control circuit 210 receives the signal output instruction from the control circuit 206G. When receiving the signal output instruction, the clock control circuit 210 outputs one clock signal, which the clock control circuit 210 subsequently receives, to the data obtaining unit 201G.

Every time the data obtaining unit 210G receives the clock signal from the clock control circuit 210, the data obtaining unit 201G reads a new set of a Sign value, a Last value, a Run value, a Level value, and a Level absolute value from the buffer 820, and outputs the read Sign value, Last value, Run value, Level value, and Level absolute value to the circuits in the variable-length coding circuit 200g.

The data obtaining unit 201G is formed by using a flip flop circuit and other circuits. When receiving a clock signal, these circuits perform a predetermined operation, and therefore consume power.

As described in the sixth embodiment, the variable-length coding circuit 200g generates and outputs a code to be assigned to a combination (Last, Run, Level) within two to four clock cycles. However, the data obtaining unit 201G reads new data from the buffer 820 in the initial clock cycle, and just continues outputting the read data to the circuits in the variable-length coding circuit 200g until the variable-length coding circuit 200g completes generating the code. Therefore, by providing the clock control circuit 210 which can reduce the number of clock signals input into the data obtaining unit 210G as many as possible, the data obtaining unit 201G can achieve lower power consumption than the data obtaining unit 201g.

(7) According to the above description, the LMAX judging circuit 202c relating to the third embodiment, the LMAX judging circuit 202e relating to the fourth embodiment, the LMAX judging circuit 202f relating to the fifth embodiment, and the LMAX judging circuit 202G relating to the sixth embodiment have the same construction as the LMAX judging circuit 202 relating to the first embodiment. However, the LMAX judging circuits 202c, 202e, 202f, and 202G may be configured to include the shift unit 235, similarly to the LMAX judging circuit 202b shown in FIG. 6B.

Furthermore, the RMAX judging circuit 216c relating to the third embodiment, the RMAX judging circuit 216e relating to the fourth embodiment, the RMAX judging circuit 216f relating to the fifth embodiment, and the RMAX judging circuit 216G relating to the sixth embodiment have the same construction as the RMAX judging circuit 216 relating to the second embodiment. However, the RMAX judging circuits 216c, 216e, 216f, and 216G may be configured to include the shift unit 285, similarly to the RMAX judging circuit 216b shown in FIG. 10B.

(8) According to the seventh embodiment, the LMAX judging unit is constituted by the fixed value storing circuit, comparing circuit, and LMAX judging circuit, similarly to the LMAX judging unit 202g relating to the sixth embodiment, and the comparing circuit compares a Run value with the threshold value n and comparing a Level absolute value with the threshold value K. However, an additional comparing circuit may be provided with the LMAX judging unit.

In this case, the two comparing circuits are arranged in parallel. Thus, one of the comparing circuits receives a Run value from the data obtaining unit, and reads the threshold value n from the fixed value storing circuit, so as to compare the read threshold value n and Run value, and output a result of the comparison to the LMAX judging circuit.

The other comparing circuit receives a Level absolute value from the data obtaining unit, and reads the threshold value K from the fixed value storing circuit, so as to compare the read threshold value K and Level absolute value.

(9) Also, the RMAX judging unit relating to the eighth embodiment may include two comparing circuits arranged in parallel. Thus, one of the comparing circuits compares a Run value and the threshold value m, and the other comparing circuit compares the Run value and the threshold value L.

With the two comparing circuits being provided in parallel so as to perform two comparing operations at the same time as described above, the LMAX judging unit and RMAX judging unit can achieve higher-speed processing.

(10) According to the third to eighth embodiments, the LMAX judging circuit judges whether a code to be assigned to a combination (Last, Run, Level) is a normal VLC or not, based on a result of comparison performed by the first comparing circuit, and judges whether the code to be assigned to the combination (Last, Run, Level) is an LMAX VLC or not, based on a result of comparison performed by the second comparing circuit.

Similarly, the RMAX judging circuit judges whether the code to be assigned to the combination (Last, Run, Level) is a normal VLC or not, based on a result of comparison performed by the first comparing circuit, and judges whether the code to be assigned to the combination (Last, Run, Level) is an RMAX VLC or not, based on a result of comparison performed by the second comparing circuit.

According to the third to eighth embodiments, the variable-length coding circuit includes both the LMAX judging circuit and RMAX judging circuit, and whether the code to be assigned to the combination (Last, Run, Level) is a normal VLC or not is judged by both the LMAX judging circuit and RMAX judging circuit. Hence, the first comparing circuit of one of the LMAX judging circuit and RMAX judging circuit can be omitted.

The following describes this modification example, taking a case where the first comparing circuit included in the RMAX judging circuit 216f relating to the fifth embodiment is omitted, as an example.

The RMAX retrieving unit, subtracting circuit, second comparing circuit, selecting circuit, and output circuit included in the RMAX judging circuit 216f respectively perform the same operations as in the fifth embodiment.

The judgment control circuit in the RMAX judging circuit 216f receives a result of comparing an RMAX and New Run from the second comparing circuit. When the received comparison result indicates the RMAX≧the New Run, the judgment control circuit outputs a second mode signal "01", to the selecting circuit and control circuit 206f, indicating a code to be assigned to a combination (Last, Run, Level) can be an RMAX VLC.

When the received comparison result indicates the RMAX<the New Run, the judgment control circuit outputs a second mode signal "10", to the selecting circuit and control circuit 206f, indicating the code to be assigned to the combination (Last, Run, Level) is other than an RMAX VLC.

When the first mode signal received from the LMAX judging circuit 202f indicates "00", the control circuit 206f ignores the second mode signal, outputs a selecting instruction, to the first selecting circuit 205f, instructing a selection of a combination (Last, Run, selected Level) output from the LMAX judging circuit 202f, and outputs a selecting instruction, to the second selecting circuit 215, instructing a selection of a normal VLC output from the normal VLC generating circuit 214.

When the received first mode signal indicates "01", the control circuit 206f ignores the second mode signal, outputs a selecting instruction, to the first selecting circuit 205f, instructing a selection of a combination (Last, Run, selected Level) output from the LMAX judging circuit 202f, and outputs a selecting instruction, to the second selecting circuit 215, instructing a selection of an LMAX VLC output from the LMAX VLC generating circuit 213.

When the received first mode signal indicates "10" and the received second mode signal indicates "01", or when the first mode signal indicates "10" and the second mode signal indicates "10", the control circuit 206f performs the same operation as in the fifth embodiment.

(11) According to the third to eighth embodiments and their modification examples, the LMAX judging circuit in the variable-length coding circuit has the same construction as the LMAX judging circuit 202 relating to the first embodiment. Alternatively, however, the LMAX judging circuit may have the same construction as the LMAX judging circuit 202b relating to the modification example of the first embodiment.

Similarly, the RMAX judging circuit has the same construction as the RMAX judging circuit 216 relating to the second embodiment. Alternatively, however, the RMAX judging circuit may have the same construction as the RMAX judging circuit 216b relating to the modification example of the second embodiment.

(12) The present invention may provide a method to execute each of the above-described first to eighth embodiments and their modification examples.

(13) The above embodiments and modification examples may be freely combined.

INDUSTRIAL APPLICABILITY

The present invention can be commercially, continuously and recurrently utilized in a variety of industries, such as production and sales industry of digital data including images and sounds, production and sales industry of electronic appliances having digital data compressing and coding functions, an industry that uses digital data, for example, broadcasting industry, and an industry of providing contents via a network.

What is claimed is:

1. A coding apparatus that outputs a code corresponding to input data, comprising:
   a storing unit storing a boundary value corresponding to a group, the group being made up of a plurality of input data candidates that have a same property, the group being divided into (i) a code presence sub-group made up of one or more input data candidates which have a corresponding variable-length code on a code table, and (ii) a code absence sub-group made up of one or more input data candidates which do not have a corresponding variable-length code on the code table, the boundary value indicating a boundary between the code presence sub-group and the code absence sub-group;
   an obtaining unit operable to obtain input data;
   a first judging unit operable to judge whether the obtained input data belongs to the group;
   a reading unit operable to, if the first judging unit judges affirmatively, read the boundary value from the storing unit;
   a second judging unit operable to judge whether the obtained input data is included in the code presence sub-group, using the read boundary value; and
   a generating unit operable to, if the second judging unit judges negatively, generate and output a substitute code in substitution for a variable-length code corresponding to the obtained input data.

2. The coding apparatus of claim 1, wherein
   the obtained input data and the plurality of input data candidates each include at least a first coefficient and a second coefficient,
   the plurality of input data candidates making up the group have first coefficients of a same absolute value,
   the boundary value is a maximum among absolute values of second coefficients of the input data candidates making up the code presence sub-group, and
   the second judging unit compares an absolute value of a second coefficient of the obtained input data with the boundary value to judge whether the obtained input data is included in the code presence sub-group.

3. The coding apparatus of claim 2, wherein
   when the second judging unit judges that the obtained input data is not included in the code presence sub-group,
   the generating unit
   (i) performs a first subtraction on the obtained input data using the boundary value to generate first subtraction data, and uses the boundary value to judge whether the first subtraction data is included in the code presence sub-group, and
   (ii) if judging affirmatively, extracts a variable-length code corresponding to the first subtraction data from the code table, and generates the substitute code including the extracted variable-length code, a first subtraction defining code indicating the first subtraction has been performed, and a sign code indicating whether one of first and second coefficients of the obtained input data is positive or negative.

4. The coding apparatus of claim 3, wherein
   the generating unit performs the first subtraction on the absolute value of the second coefficient of the obtained input data to calculate a subtracted second coefficient,
   the generated first subtraction data includes the first coefficient of the obtained input data and the subtracted second coefficient, and
   the generating unit compares the calculated subtracted second coefficient with the boundary value, and if the subtracted second coefficient is equal to or smaller than the boundary value, judges that the first subtraction data is included in the code presence sub-group.

5. The coding apparatus of claim 3, wherein
   the generating unit performs the first subtraction on the absolute value of the second coefficient of the obtained input data to calculate a subtracted second coefficient,
   the generated first subtraction data includes the first coefficient of the obtained input data and the subtracted second coefficient, and
   the generating unit generates an intermediate value by doubling the boundary value, and subtracting the doubled boundary value from the absolute value of the second coefficient of the obtained input data, and if the generated intermediate value is zero or smaller, judges that the first subtraction data is included in the code presence sub-group.

6. The coding apparatus of claim 5, wherein
   the generating unit doubles the boundary value by shifting the boundary value by one bit.

7. The coding apparatus of claim 3, wherein
   the storing unit further stores thereon an alternate boundary value for an alternate group made up of a plurality of input data candidates having second coefficients of a same absolute value,
   the alternate group is divided into (i) an alternate code presence sub-group made up of one or more input data candidates which have a corresponding variable-length code on the code table, and (ii) an alternate code absence sub-group made up of one or more input data candidates which do not have a corresponding variable-length code on the code table, and the alternate boundary value indicates a boundary between the alternate code presence sub-group and the alternate code absence sub-group, when the second judging unit judges that the obtained input data is not included in the code presence sub-group, and the generating unit judges that the first subtraction data is not included in the code presence sub-group, the generating unit (i) judges whether the obtained input data belongs to the alternate group, (ii) if judging affirmatively, reads the alternate boundary value from the storing unit, performs a second subtraction on the obtained input data using the read alternate boundary value to generate second subtraction data, makes an attempt to read a variable-length code corresponding to the second subtraction data from the code table, and (iii) if the reading attempt is successful, generates the substitute code including the read variable-length code, a second subtraction defining code indicating the second subtraction has been performed, and the sign code indicating whether one of the first and second coefficients of the obtained input data is positive or negative.

8. The coding apparatus of claim 3, wherein the storing unit further stores thereon an alternate boundary value for an alternate group made up of a plurality of input data candidates having second coefficients of a same absolute value, the alternate group is divided into (i) an alternate code presence sub-group made up of one or more input data candidates which have a corresponding variable-length code on the code table, and (ii) an alternate code absence sub-group made up of one or more input data candidates which do not have a corresponding variable-length code on the code table, and the alternate boundary value indicates a boundary between the alternate code presence sub-group and the alternate code absence sub-group, when the second judging unit judges that the obtained input data is not included in the code presence sub-group, and the generating unit judges that the first subtraction data is not included in the code presence sub-group, the generating unit (i) uses the second coefficient of the obtained input data to judge whether the obtained input data belongs to the alternate group, (ii) if judging affirmatively, reads the alternate boundary value from the storing unit, performs a second subtraction on the obtained input data using the read alternate boundary value to generate second subtraction data, and uses the alternate boundary value to judge whether the generated second subtraction data is included in the alternate code presence sub-group, and (iii) if judging affirmatively, extracts a variable-length code corresponding to the second subtraction data from the code table, and generates the substitute code including the extracted variable-length code, and a second subtraction defining code indicating the second subtraction has been performed, and the sign code indicating whether one of the first and second coefficients of the obtained input data is positive or negative.

9. The coding apparatus of claim 8, wherein the alternate boundary value is a maximum of absolute values of first coefficients of the input data candidates making up the alternate code presence sub-group, the generating unit performs the second subtraction on the absolute value of the first coefficient of the obtained input data to calculate a subtracted first coefficient, the generated second subtraction data includes the calculated subtracted first coefficient and the second coefficient of the obtained input data, and the generating unit compares the subtracted first coefficient with the alternate boundary value to judge whether the second subtraction data is included in the alternate code presence sub-group.

10. The coding apparatus of claim 8, wherein in a case where the second judging unit judges that the obtained input data is not included in the code presence sub-group, and the generating unit judges that the first subtraction data is not included in the code presence sub-group, and that the second subtraction data is not included in the alternate code presence sub-group, the generating unit generates the substitute code including the obtained input data and an input data defining code indicating the obtained input data is included.

11. The coding apparatus of claim 2, wherein a block image constituted by a predetermined number of pixels is subjected to orthogonal transformation, so that a block formed by the predetermined number of coefficients arranged in a matrix is generated, and the obtained input data and the plurality of input data candidates each include (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block.

12. The coding apparatus of claim 11, wherein the obtained input data and the plurality of input data candidates each include a Run value as the first coefficient, and a Level value as the second coefficient, the plurality of input data candidates making up the group have a same pair of a Last value and a Run value, the boundary value is an LMAX which is a maximum among absolute values of Level values of the input data candidates making up the code presence sub-group, and the second judging unit compares an absolute value of a Level value of the obtained input data with the LMAX, and if the absolute value of the Level value of the obtained input data is larger than the LMAX, judges that the obtained input data is not included in the code presence sub-group.

13. The coding apparatus of claim 12, wherein when the second judging unit judges that the obtained input data is not included in the code presence sub-group, the generating unit (i) subtracts the LMAX from the absolute value of the Level value of the obtained input data, to calculate New Level, and generates first subtraction data including a Last value and a Run value of the obtained input data and the calculated New Level, (ii) compares the New Level with the LMAX, to judge whether the first subtraction data is included in the code presence sub-group, and (iii) if judging affirmatively, extracts a variable-length code corresponding to the first subtraction data from the code table, and generates the substitute code including the extracted variable-length code, a first subtraction defining code indicating the subtraction has been performed, and a sign code indicating whether the Level value of the obtained input data is positive or negative.

14. The coding apparatus of claim 12, wherein
when the second judging unit judges that the obtained input data is not included in the code presence sub-group, the generating unit
(i) subtracts the LMAX from the absolute value of the Level value of the obtained input data, to calculate New Level, and generates first subtraction data including a Last value and a Run value of the obtained input data and the calculated New Level,
(ii) doubles the LMAX, and compares the absolute value of the Level value of the obtained input data with the doubled LMAX to judge whether the first subtraction data is included in the code presence sub-group, and
(iii) if judging affirmatively, extracts a variable-length code corresponding to the first subtraction data from the code table, and generates the substitute code including the extracted variable-length code, a first subtraction defining code indicating the subtraction has been performed, and a sign code indicating whether the Level value of the obtained input data is positive or negative.

15. The coding apparatus of claim 11, wherein
the obtained input data and the plurality of input data candidates each include a Level value as the first coefficient, and a Run value as the second coefficient,
the plurality of input data candidates making up the group have a same pair of a Last value and an absolute value of a Level value,
the boundary value is an RMAX which is a maximum among Run values of the input data candidates making up the code presence sub-group, and
the second judging unit compares a Run value of the obtained input data with the RMAX, and if the Run value of the obtained input data is larger than the RMAX, judges that the obtained input data is not included in the code presence sub-group.

16. The coding apparatus of claim 15, wherein
when the second judging unit judges that the obtained input data is not included in the code presence sub-group, the generating unit
(i) subtracts a value obtained by adding 1 to the RMAX, from the Run value of the obtained input data, to calculate New Run, and generates second subtraction data including a Last value and an absolute value of a Level value of the obtained input data, and the calculated New Run,
(ii) compares the New Run with the RMAX to judge whether the second subtraction data is included in the code presence sub-group, and
(iii) if judging affirmatively, extracts a variable-length code corresponding to the second subtraction data from the code table, and generates the substitute code including the extracted variable-length code, a second subtraction defining code indicating the subtraction has been performed, and a sign code indicating whether the Level value of the obtained input data is positive or negative.

17. The coding apparatus of claim 15, wherein
when the second judging unit judges that the obtained input data is not included in the code presence sub-group, the generating unit
(i) subtracts a value obtained by adding 1 to the RMAX, from the Run value of the obtained input data, to calculate New Run, and generates second subtraction data including a Last value and an absolute value of a Level value of the obtained input data, and the calculated New Run,
(ii) doubles the RMAX, and compares the Run value with a value obtained by adding 1 to the doubled RMAX, to judge whether the second subtraction data is included in the code presence sub-group, and
(iii) if judging affirmatively, extracts a variable-length code corresponding to the second subtraction data from the code table, and generates the substitute code including the extracted variable-length code, a second subtraction defining code indicating the subtraction has been performed, and a sign code indicating whether the Level value of the obtained input data is positive or negative.

18. The coding apparatus of claim 11, wherein
the second judging unit stores thereon a predetermined threshold value, and
when judging that a Run value of the obtained input data is equal to or smaller than the predetermined threshold value, the second judging unit makes the judgment.

19. The coding apparatus of claim 18, further comprising:
a receiving unit operable to receive an input of the predetermined threshold value, wherein
the second judging unit stores thereon the predetermined threshold value which is received by the receiving unit.

20. The coding apparatus of claim 1, wherein
the obtained input data and the plurality of input data candidates each include at least a first coefficient and a second coefficient,
the second judging unit stores thereon a predetermined fixed-length code threshold value, and
when an absolute value of a first coefficient of the obtained input data exceeds the fixed-length code threshold value, the second judging unit does not make the judgment, and the generating unit generates the substitute code including the obtained input data and an input data defining code indicating the obtained input data is included.

21. The coding apparatus of claim 20, wherein
a block image constituted by a predetermined number of pixels is subjected to orthogonal transformation, so that a block formed by the predetermined number of coefficients arranged in a matrix is generated, and
the obtained input data and the plurality of input data candidates each include (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block.

22. The coding apparatus of claim 21, wherein
the obtained input data and the plurality of input data candidates each include a Level value as the first coefficient, and
when an absolute value of a Level value of the obtained input data exceeds the fixed-length code threshold value, the second judging unit does not make the judgment.

23. The coding apparatus of claim 21, wherein
the obtained input data and the plurality of input data candidates each include a Run value as the first coefficient, and
when a Run value of the obtained input data exceeds the fixed-length code threshold value, the second judging unit does not make the judgment.

24. The coding apparatus of claim 1, further comprising:
a clock control unit operable to suspend and resume inputting a clock signal into the obtaining unit.

25. The coding apparatus of claim 1, wherein
the code table is defined by the MPEG-4 format.

26. A coding apparatus that outputs a code corresponding to input data, comprising:
an obtaining unit operable to obtain input data including at least a first coefficient and a second coefficient;
a first storing unit storing a first boundary value corresponding to a first group, the first group being made up of a plurality of input data candidates which each have at least a first coefficient and a second coefficient and have first coefficients of a same absolute value, the first group being divided into (i) a first code presence sub-group made up of one or more input data candidates which have a corresponding variable-length code on a code table, and (ii) a first code absence sub-group made up of one or more input data candidates which do not have a corresponding variable-length code on the code table, the first boundary value indicating a boundary between the first code presence sub-group and the first code absence sub-group;
a first judging unit operable to judge whether the obtained input data belongs to the first group, and if judging affirmatively, read the first boundary value from the first storing unit;
a second judging unit operable to judge whether the obtained input data and first equivalent data equivalent to the obtained input data are included in the first code present sub-group, using the first boundary value;
a second storing unit storing a second boundary value corresponding to a second group, the second group being made up of a plurality of input data candidates which each have at least a first coefficient and a second coefficient and have second coefficients of a same absolute value, the second group being divided into (a) a second code presence sub-group made up of one or more input data candidates which have a corresponding variable-length code on the code table, and (b) a second code absence sub-group made up of one or more input data candidates which do not have a corresponding variable-length code on the code table, the second boundary value indicating a boundary between the second code presence sub-group and the second code absence sub-group;
a third judging unit operable to judge whether the obtained input data belongs to the second group, and if judging affirmatively, read the second boundary value from the second storing unit;
a fourth judging unit operable to judge whether the obtained input data and second equivalent data equivalent to the obtained input data are included in the second code presence sub-group, using the second boundary value;
a judgment control unit operable to select one of judgment results obtained by the second and fourth judging units; and
a generating unit operable to
(I), if the selected judgment result is affirmative, generate and output a code based on the selected judgment result,
(II), if the selected judgment result is negative, refer to the unselected judgment result,
(III), if the unselected judgment result is affirmative, generate and output a code based on the unselected judgment result, and
(IV), if the unselected judgment result is negative, output the obtained input data and an input data defining code indicating the obtained input data is included.

27. The coding apparatus of claim 26, wherein
when judging that the obtained input data is not included in the first code presence sub-group, the second judging unit (i) performs a first subtraction on the obtained input data with a use of the first boundary value, to generate first subtraction data, as the first equivalent data, and (ii) uses the first boundary value to judge whether the generated first subtraction data is included in the first code presence sub-group, and
when judging that the obtained input data is not included in the second code presence sub-group, the fourth judging unit (a) performs a second subtraction on the obtained input data with a use of the second boundary value, to generate second subtraction data, as the second equivalent data, and (b) uses the second boundary value to judge whether the generated second subtraction data is included in the second code presence sub-group.

28. The coding apparatus of claim 27, wherein
the second judging unit makes the judgment before the fourth judging unit makes the judgment, and
the judgment control unit selects the judgment result obtained by the second judging unit.

29. The coding apparatus of claim 28, wherein
when the second judging unit judges that the first subtraction data is included in the first code presence sub-group, the fourth judging unit does not judge whether the second subtraction data is included in the second code presence sub-group.

30. The coding apparatus of claim 27, wherein
the second judging unit and fourth judging unit make the respective judgments in parallel.

31. The coding apparatus of claim 30, wherein
the judgment control unit preferentially selects the judgment result obtained by the second judging unit.

32. The coding apparatus of claim 30, further comprising:
a receiving unit operable to receive a priority instruction indicating which one of the judgment result obtained by the second judging unit and the judgment result obtained by the fourth judging unit is preferentially selected, wherein
the judgment control unit preferentially selects one of the judgment result obtained by the second judging unit and the judgment result obtained by the fourth judging unit, in accordance with the priority instruction.

33. The coding apparatus of claim 30, wherein
when the judgment control unit selects the judgment result obtained by the second judging unit,
if the selected judgment result obtained by the second judging unit indicates that the obtained input data is not included in the first code presence sub-group, but that the first subtraction data is included in the first code presence sub-group, the generating unit (i) extracts a variable-length code corresponding to the first subtraction data from the code table, and (ii) outputs the extracted variable-length code, a first subtraction defining code indicating the first subtraction has been performed, and a sign code indicating whether one of the first and second coefficients of the obtained input data is positive or negative.

34. The coding apparatus of claim 26, wherein
a block image constituted by a predetermined number of pixels is subjected to orthogonal transformation, so that a block formed by the predetermined number of coefficients arranged in a matrix is generated, and
the obtained input data and the plurality of input data candidates each include (i) a Run value indicating a number of continuous zero coefficients among the predetermined number of coefficients, as the first coefficient, (ii) a Level value indicating a value of a nonzero coefficient following the continuous zero coefficients, as the second coefficient, and (iii) a Last value indicating whether the nonzero coefficient is a last coefficient in the block.

35. The coding apparatus of claim 34, wherein the plurality of input data candidates making up the first group have a same pair of a Last value and a Run value, the first boundary value is an LMAX which is a maximum among absolute values of Level values of the input data candidates making up the first code presence sub-group, if an absolute value of a Level value of the obtained input data is larger than the LMAX, the second judging unit judges that the obtained input data is not included in the first code presence sub-group, the plurality of input data candidates making up the second group have a same pair of a Last value and an absolute value of a Level value, the second boundary value is an RMAX which is a maximum among Run values of the input data candidates making up the second code presence sub-group, and if a Run value of the obtained input data is larger than the RMAX, the fourth judging unit judges that the obtained input data is not included in the second code presence sub-group.

36. The coding apparatus of claim 35, wherein when judging that the obtained input data is not included in the first code presence sub-group, the second judging unit (i) performs a first subtraction on the absolute value of the Level value of the obtained input data by using the LMAX to calculate New Level, (ii) generates, as the first equivalent data, first subtraction data including the calculated New Level and the Run value and a Last value of the obtained input data, and (iii) compares the New Level with the LMAX to judge whether the generated first subtraction data is included in the first code presence sub-group, and when judging that the obtained input data is not included in the second code presence sub-group, the fourth judging unit (a) performs a second subtraction on the Run value of the obtained input data by using the RMAX to calculate New Run, (b) generates, as the second equivalent data, second subtraction data including the calculated New Run and the absolute value of the Level value and the Last value of the obtained input data, and (c) compares the New Run with the RMAX to judge whether the generated second subtraction data is included in the second code presence sub-group.

37. The coding apparatus of claim 36, wherein the second judging unit makes the judgment before the fourth judging unit makes the judgment, and the judgment control unit selects the judgment result obtained by the second judging unit.

38. The coding apparatus of claim 36, wherein the fourth judging unit makes the judgment before the second judging unit makes the judgment, and the judgment control unit selects the judgment result obtained by the fourth judging unit.

39. The coding apparatus of claim 36, wherein the second judging unit and fourth judging unit make the respective judgments in parallel.

40. The coding apparatus of claim 34, wherein the second judging unit stores thereon a predetermined first threshold value, and makes the judgment only when a Run value of the obtained input data is equal to or smaller than the first threshold value, and the fourth judging unit stores thereon a predetermined second threshold value, and makes the judgment only when the Run value of the obtained input data is equal to or smaller than the second threshold value.

41. The coding apparatus of claim 40, wherein the second judging unit outputs, as the judgment result, (i) a normal judgment signal, when judging that the obtained input data is included in the first code presence sub-group, (ii) an equivalent judgment signal, when judging that the obtained input data is not included in the first code presence sub-group, but the first equivalent data is included in the first code presence sub-group, and (iii) a no judgment signal, when not making the judgment or when judging that neither the obtained input data nor the first equivalent data is included in the first code presence sub-group, and the fourth judging unit outputs, as the judgment result, (a) a normal judgment signal, when judging that the obtained input data is included in the second code presence sub-group, (b) an equivalent judgment signal, when judging that the obtained input data is not included in the second code presence sub-group, but the second equivalent data is included in the second code presence sub-group, and (c) a no judgment signal, when not making the judgment or when judging that neither the obtained input data nor the second equivalent data is included in the second code presence sub-group.

42. The coding apparatus of claim 40, wherein the second judging unit outputs, as the judgment result, (i) a no judgment signal, when the Run value of the obtained input data is larger than the first threshold value, (ii) a normal judgment signal, when judging that the obtained input data is included in the first code presence sub-group, (iii) an equivalent judgment signal, when judging that the obtained input data is not included in the first code presence sub-group, but the first equivalent data is included in the first code presence sub-group, and (iv) a different code signal, when judging that neither the obtained input data nor the first equivalent data is included in the first code presence sub-group, and the fourth judging unit outputs, as the judgment result, (a) a no judgment signal, when the Run value of the obtained input data is larger than the second threshold value, (b) a normal judgment signal, when judging that the obtained input data is included in the second code presence sub-group, (c) an equivalent judgment signal, when judging that the obtained input data is not included in the second code presence sub-group, but the second equivalent data is included in the second code presence sub-group, and (d) a different code signal, when judging that neither the obtained input data nor the second equivalent data is included in the second code presence sub-group.

43. The coding apparatus of claim 40, further comprising:
a receiving unit operable to receive an input of the first and second threshold values, wherein
the second judging unit stores thereon the first threshold value received by the receiving unit, and the fourth judging unit stores thereon the second threshold value received by the receiving unit.

44. The coding apparatus of claim 26, wherein
the second judging unit stores thereon a predetermined first fixed-length code threshold value, and
when an absolute value of the first coefficient of the obtained input data exceeds the first fixed-length code threshold value, the second judging unit does not make the judgment, and the generating unit outputs the obtained input data and the input data defining code indicating the obtained input data is included, irrespective of the judgment result obtained by the fourth judging unit.

45. The coding apparatus of claim 44, wherein
the fourth judging unit stores thereon a predetermined second fixed-length code threshold value, and
when an absolute value of the second coefficient of the obtained input data exceeds the second fixed-length code threshold value, the fourth judging unit does not make the judgment, and the generating unit outputs the obtained input data and the input data defining code indicating the obtained input data is included, irrespective of the judgment result obtained by the second judging unit.

46. The coding apparatus of claim 44, wherein
a block image constituted by a predetermined number of pixels is subjected to orthogonal transformation, so that a block formed by the predetermined number of coefficients arranged in a matrix is generated, and
the obtained input data and the plurality of input data candidates each include (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block.

47. The coding apparatus of claim 46, wherein
the obtained input data and the plurality of input data candidates each include a Level value as the first coefficient, and a Run value as the second coefficient,
when an absolute value of a Level value of the obtained input data exceeds the first fixed-length code threshold value, the second judging unit does not make the judgment.

48. The coding apparatus of claim 46, wherein
the obtained input data and the plurality of input data candidates each include a Run value as the first coefficient, and a Level value as the second coefficient,
when a Run value of the obtained input data exceeds the first fixed-length code threshold value, the second judging unit does not make the judgment.

49. The coding apparatus of claim 26, further comprising:
a clock control unit operable to suspend and resume inputting a clock signal into the obtaining unit.

50. The coding apparatus of claim 26, wherein
the code table is defined by the MPEG-4 format.

51. A coding apparatus that outputs a code corresponding to input data including at least a first coefficient and a second coefficient, the coding apparatus comprising:

a storing unit storing a first boundary value corresponding to a first group, and a second boundary value corresponding to a second group,
the first group being made up of a plurality of input data candidates which each have at least a first coefficient and a second coefficient and have first coefficients of a same absolute value, the first group being divided into (i) a first code presence sub-group made up of one or more input data candidates which have a corresponding variable-length code on a code table, and (ii) a first code absence sub-group made up of one or more input data candidates which do not have a corresponding variable-length code on the code table, the first boundary value indicating a boundary between the first code presence sub-group and the first code absence sub-group,
the second group being made up of a plurality of input data candidates which each have at least a first coefficient and a second coefficient and have second coefficients of a same absolute value, the second group being divided into (a) a second code presence sub-group made up of one or more input data candidates which have a corresponding variable-length code on the code table, and (b) a second code absence sub-group made up of one or more input data candidates which do not have a corresponding variable-length code on the code table, the second boundary value indicating a boundary between the second code presence sub-group and the second code absence sub-group;
an obtaining unit operable to obtain input data;
a first judging unit operable to (I) judge whether the obtained input data belongs to the first group, and if judging affirmatively, read the first boundary value from the storing unit, and (II) judge whether the obtained input data belongs to the second group, and if judging affirmatively, read the second boundary value from the storing unit;
a selecting unit operable to select one of the first boundary value and the second boundary value, and output the selected boundary value;
a second judging unit operable to judge whether or not one of the obtained input data and equivalent data equivalent to the obtained input data is included in one of the first code presence sub-group and second code presence sub-group corresponding to the selected boundary value, using the selected boundary value;
a selection control unit operable to instruct the selecting unit to first select the first boundary value and then the second boundary value;
a judgment control unit operable to select one of judgment results respectively made, by the second judging unit, with reference to the first boundary value and the second boundary value; and
a generating unit operable to (A), when the selected judgment result is affirmative, generate and output a code based on the selected judgment result, (B) when the selected judgment result is negative, refer to the unselected judgment result, (C) when the unselected judgment result is affirmative, generate and output a code based on the unselected judgment result, and (D) when the unselected judgment result is negative, output the obtained input data and an input data defining code indicating the obtained input data is included.

52. The coding apparatus of claim 51, wherein
when the selecting unit selects the first boundary value, and the second judging unit judges that the obtained input data is not included in the first code presence sub-group, the second judging unit performs a first subtraction on the obtained input data with a use of the first boundary value to generate, as the equivalent data, first subtraction data, and uses the first boundary value to judge whether the generated first subtraction data is included in the first code presence sub-group, and when the selecting unit selects the second boundary value, and the second judging unit judges that the obtained input data is not included in the second code presence sub-group, the second judging unit performs a second subtraction on the obtained input data with a use of the second boundary value to generate, as the equivalent data, second subtraction data, and uses the second boundary value to judge whether the generated second subtraction data is included in the second code presence sub-group.

53. The coding apparatus of claim 52, wherein the judgment control unit selects the judgment result made with reference to the first boundary value.

54. The coding apparatus of claim 52, further comprising:
a receiving unit operable to receive a priority instruction indicating which one of the judgment result made with reference to the first boundary value and the judgment result made with reference to the second boundary value is preferentially selected, wherein
the judgment control unit preferentially selects one of the judgment result made with reference to the first boundary value and the judgment result made with reference to the second boundary value, in accordance with the priority instruction.

55. The coding apparatus of claim 51, further comprising:
a clock control unit operable to suspend and resume inputting a clock signal into the obtaining unit.

56. The coding apparatus of claim 51, wherein the code table is defined by the MPEG-4 format.

57. A coding method used in a coding apparatus that outputs a code corresponding to input data,
the coding apparatus including a storing unit storing a boundary value corresponding to a group, the group being made up of a plurality of input data candidates that have a same property, the group being divided into (i) a code presence sub-group made up of one or more input data candidates which have a corresponding variable-length code on a code table, and (ii) a code absence sub-group made up of one or more input data candidates which do not have a corresponding variable-length code on the code table, the boundary value indicating a boundary between the code presence sub-group and the code absence sub-group,
the coding method comprising steps of:
obtaining input data;
judging whether the obtained input data belongs to the group;
if the obtained input data is judged to belong to the group, reading the boundary value from the storing unit;
judging whether the obtained input data is included in the code presence sub-group, by using the read boundary value; and
if the obtained input data is judged not to be included in the code present sub-group, generating and outputting a substitute code in substitution for a variable-length code corresponding to the obtained input data.

58. An imaging apparatus comprising:
an image generating unit operable to detect incoming light, and generate image data based on the detected incoming light;
a data generating unit operable to (a) perform orthogonal transformation on each block image, in the generated image data, constituted by a predetermined number of pixels, to generate the predetermined number of coefficients, (b) generate a block by arranging the generated predetermined number of coefficients in a matrix, and (c) generate input data, based on the generated block, including (i) a Run value indicating a number of continuous zero coefficients among the predetermined number of coefficients, (ii) a Level value indicating a value of a nonzero coefficient following the continuous zero coefficients, and (iii) a Last value indicating whether the nonzero coefficient is a last coefficient in the block;
the coding apparatus defined in one of claims 1, 26, and 51; and
a recording unit operable to record thereon the code output from the coding apparatus.

* * * * *